(12) United States Patent
Kim et al.

(10) Patent No.: US 12,557,546 B2
(45) Date of Patent: Feb. 17, 2026

(54) COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Byungku Kim, Suwon-si (KR); Hanill Lee, Suwon-si (KR); Kipo Jang, Suwon-si (KR); Giwook Kang, Suwon-si (KR); Eun Sun Yu, Suwon-si (KR); Sangshin Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 505 days.

(21) Appl. No.: 17/089,995

(22) Filed: Nov. 5, 2020

(65) Prior Publication Data

US 2021/0151688 A1    May 20, 2021

(30) Foreign Application Priority Data

Nov. 14, 2019  (KR) .................. 10-2019-0146077

(51) Int. Cl.
H10K 85/60    (2023.01)
H10K 50/11    (2023.01)
H10K 101/10   (2023.01)

(52) U.S. Cl.
CPC .......... *H10K 85/654* (2023.02); *H10K 50/11* (2023.02); *H10K 2101/10* (2023.02)

(58) Field of Classification Search
None
See application file for complete search history.

(56) References Cited

U.S. PATENT DOCUMENTS

| | | |
|---|---|---|
| 5,061,569 A | 10/1991 | Vanslyke et al. |
| 6,225,467 B1 | 5/2001 | Esteghamatian et al. |

(Continued)

FOREIGN PATENT DOCUMENTS

| | | |
|---|---|---|
| CN | 105378028 A | 3/2016 |
| CN | 107001930 A | 8/2017 |

(Continued)

OTHER PUBLICATIONS

Hsiao-Fan Chen et al. "1,3,5-Triazine derivatives as new electron transport-type host materials for highly efficient green phosphorescent OLEDs", J. Mater. Chem. 2009, vol. 19, p. 8112-8118 (Year: 2009).*

(Continued)

*Primary Examiner* — Seokmin Jeon
(74) *Attorney, Agent, or Firm* — Lee IP Law, P.C.

(57) ABSTRACT

A compound for an organic optoelectronic device, an organic optoelectronic device including the same, and a display device, the compound being represented by Chemical Formula 1:

[Chemical Formula 1]

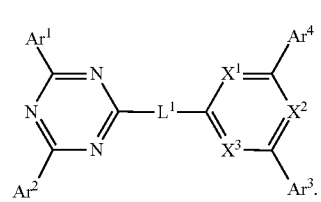

8 Claims, 1 Drawing Sheet

(56) References Cited

U.S. PATENT DOCUMENTS

| | | | |
|---|---|---|---|
| 2002/0034656 A1* | 3/2002 | Thompson | 428/690 |
| 2006/0103298 A1* | 5/2006 | Lee | 313/504 |
| 2007/0202358 A1* | 8/2007 | Sano | 428/690 |
| 2017/0309829 A1 | 10/2017 | Jung et al. | |
| 2017/0317293 A1 | 11/2017 | Kim et al. | |
| 2018/0006238 A1* | 1/2018 | Lee | H01L 51/0067 |
| 2020/0251659 A1* | 8/2020 | Lee | H01L 51/0067 |

FOREIGN PATENT DOCUMENTS

| | | |
|---|---|---|
| JP | 1993-9471 A | 1/1993 |
| JP | 1995-126615 A | 5/1995 |
| JP | 1998-95973 A | 4/1998 |
| JP | 4590020 B1 | 12/2010 |
| JP | 4907090 B2 | 3/2012 |
| JP | 5371404 B2 | 12/2013 |
| JP | 2016-152239 A | 3/2016 |
| KR | 10-2013-0093195 A | 8/2013 |
| KR | 10-1508424 B1 | 7/2015 |
| KR | 10-2016-0069934 A | 6/2016 |
| KR | 10-2016-0082067 A | 7/2016 |
| KR | 10-2016-0126862 A | 11/2016 |
| KR | 10-2017-0001398 A | 1/2017 |
| KR | 10-2017-0094774 A | 3/2017 |
| KR | 10-2017-0076436 A | 7/2017 |
| KR | 10-2017-0092131 A | 8/2017 |
| KR | 10-1847347 B1 | 4/2018 |
| KR | 10-2019-0000011 A | 1/2019 |
| KR | 10-2019-0024640 A | 3/2019 |
| KR | 10-2020-0067058 A | 6/2020 |
| WO | WO 1995/009147 A1 | 4/1995 |
| WO | WO 2003/080760 A1 | 10/2003 |
| WO | WO 2016/195406 A2 | 12/2016 |
| WO | WO 2016/204375 A1 | 12/2016 |

OTHER PUBLICATIONS

Jae-Wook Kang et al. "Silane- and triazine-containing hole and exciton blocking material for high-efficiency phosphorescent organic light emitting diodes" J. Mater. Chem. 2007, vol. 17, p. 3714-3719 (Year: 2007).*

Huiqing Pang et al. "A full-color, low-power, wearable display for mobile applications", SPIE, Mar. 29, 2012 (Year: 2012).*

Chinese Office action and Search Report dated Mar. 29, 2023.

Chinese Office action dated Sep. 15, 2023.

Korean Notice of cancellation dated Sep. 6, 2024.

* cited by examiner

COMPOUND FOR ORGANIC OPTOELECTRONIC DEVICE, COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

Korean Patent Application No. 10-2019-0146077, filed on Nov. 14, 2019, in the Korean Intellectual Property Office, and entitled: "Compound for Organic Optoelectronic Device, Composition for Organic Optoelectronic Device, Organic Optoelectronic Device and Display Device," is incorporated by reference herein in its entirety.

BACKGROUND

1. Field

Embodiments relate to a compound for an organic optoelectronic device, a composition for an organic optoelectronic device, an organic optoelectronic device, and a display device.

2. Description of the Related Art

An organic optoelectronic device (e.g., organic optoelectronic diode) is a device that converts electrical energy into photoenergy, and vice versa.

An organic optoelectronic device may be classified as follows in accordance with its driving principles. One is a photoelectric device where excitons generated by photoenergy are separated into electrons and holes and the electrons and holes are transferred to different electrodes respectively and electrical energy is generated, and the other is a light emitting device to generate photoenergy from electrical energy by supplying a voltage or a current to electrodes.

Examples of the organic optoelectronic device may include an organic photoelectric device, an organic light emitting diode, an organic solar cell, and an organic photo conductor drum.

Among them, the organic light emitting diode (OLED) has recently drawn attention due to an increase in demand for flat panel displays. The organic light emitting diode converts electrical energy into light, and the performance of organic light emitting diode is greatly influenced by the organic materials between electrodes.

SUMMARY

The embodiments may be realized by providing a compound for an organic optoelectronic device, the compound being represented by Chemical Formula 1:

[Chemical Formula 1]

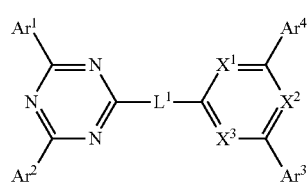

wherein, in Chemical Formula 1, $X^1$ to $X^3$ are independently N or $CR^a$, at least one of $X^1$ to $X^3$ is N, $R^a$ is hydrogen, deuterium, a cyano group, a halogen, a substituted or unsubstituted amine group, a substituted or unsubstituted C1 to C30 alkyl group, a substituted or unsubstituted C6 to C30 aryl group, or a combination thereof, $L^1$ is an unsubstituted biphenylene group or a biphenylene group substituted with deuterium, an unsubstituted C1 to C10 alkyl group, or an unsubstituted C6 to C20 aryl group, $Ar^1$ to $Ar^4$ are independently a substituted or unsubstituted C6 to C30 aryl group, and at least one of $Ar^1$ to $Ar^4$ is a phenyl group substituted with a cyano group.

The embodiments may be realized by providing a composition for an organic optoelectronic device, the composition including a first compound; and a second compound, wherein the first compound is the compound for the organic optoelectronic device according to an embodiment, and the second compound is a compound represented by Chemical Formula 2; or a combination of Chemical Formula 3 and Chemical Formula 4,

[Chemical Formula 2]

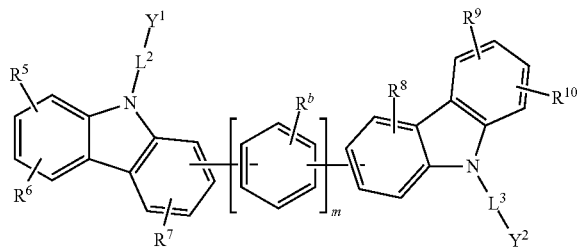

in Chemical Formula 2, $Y^1$ and $Y^2$ are independently a substituted or unsubstituted C6 to C20 aryl group or a substituted or unsubstituted C2 to C30 heterocyclic group, $L^2$ and $L^3$ are independently a single bond or a substituted or unsubstituted C6 to C20 arylene group, $R^b$ and $R^5$ to $R^{10}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group, and m is an integer of 0 to 2;

[Chemical Formula 3]

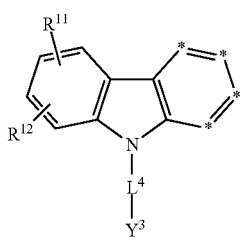

[Chemical Formula 4]

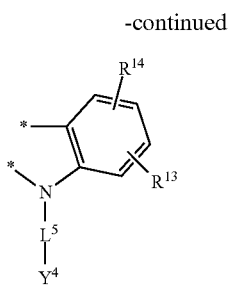

in Chemical Formulas 3 and 4, $Y^3$ and $Y^4$ are independently a substituted or unsubstituted C6 to C20 aryl group or a substituted or unsubstituted C2 to C30 heterocyclic group, two adjacent *s in Chemical Formula 3 are linked to Chemical Formula 4, *s in Chemical Formula 3 not linked to Chemical Formula 4 are independently C-$L^a$-$R^c$, $L^a$, $L^4$, and $L^5$ are independently a single bond or a substituted or unsubstituted C6 to C20 arylene group, and $R^c$ and $R^{11}$ to $R^{14}$ are independently hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group.

The embodiments may be realized by providing an organic optoelectronic device including an anode and a cathode facing each other, and an organic layer between the anode and the cathode, wherein the organic layer includes a light emitting layer, and the light emitting layer includes the compound for an organic optoelectronic device according to an embodiment.

The embodiments may be realized by providing an organic optoelectronic device including an anode and a cathode facing each other, and an organic layer between the anode and the cathode, wherein the organic layer includes a light emitting layer, and the light emitting layer includes the composition for an organic optoelectronic device according to an embodiment.

The embodiments may be realized by providing an organic optoelectronic device including an anode and a cathode facing each other, and an organic layer between the anode and the cathode, wherein the organic layer includes a light emitting layer, and the light emitting layer includes the composition for an organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
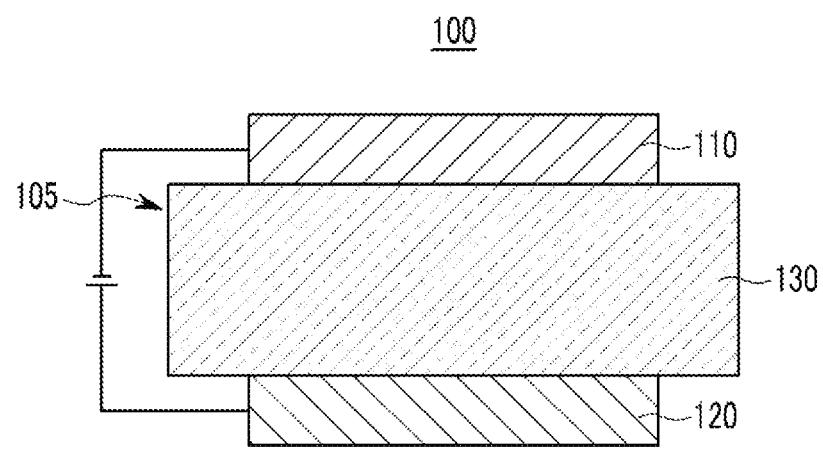
FIGS. 1 and 2 are cross-sectional views of organic light emitting diodes according to embodiments, respectively.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example, when a definition is not otherwise provided, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples, when a definition is not otherwise provided, "substituted" refers to replacement of at least one hydrogen of a substituent or a compound by deuterium, a C1 to C20 alkyl group, a C6 to C30 aryl group, or a cyano group. In addition, in specific examples, when a definition is not otherwise provided, "substituted" refers to replacement of at least one hydrogen of a substituent or a compound by deuterium, a C1 to C5 alkyl group, a C6 to C18 aryl group, or a cyano group. In addition, in specific examples, when a definition is not otherwise provided, "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quarterphenyl group, and the like, and a group in which two or more hydrocarbon aromatic moieties are fused directly or indirectly to provide a non-aromatic fused ring, for example, a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof.

As used herein, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for the organic optoelectronic device according to an embodiment may be represented by Chemical Formula 1.

[Chemical Formula 1]

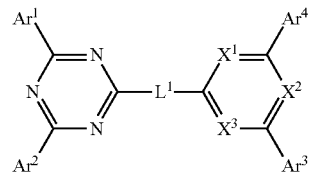

In Chemical Formula 1, $X^1$ to $X^3$ may each independently be, e.g., N or $CR^a$.

In an implementation, at least one of $X^1$ to $X^3$ may be N.

$R^a$ may be or may include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a combination thereof, $L^1$ may be, e.g., an unsubstituted biphenylene group or a biphenylene group substituted with deuterium, an unsubstituted C1 to C10 alkyl group, or an unsubstituted C6 to C20 aryl group.

$Ar^1$ to $Ar^4$ may each independently be or include, e.g., a substituted or unsubstituted C6 to C30 aryl group.

In an implementation, at least one of $Ar^1$ to $Ar^4$ may be, e.g., a phenyl group substituted with a cyano group.

The compound represented by Chemical Formula 1 may include a structure in which a phenyl group into or onto which a cyano group (e.g., an electron-withdrawing group) is introduced or included is present as a substituent of triazine, pyrimidine, or pyridine in the center of a dimer structure in which a triazine-triazine, triazine-pyrimidine, or triazine-pyridine is linked by a biphenylene.

This structure may help secure faster electron transport characteristics by introducing a cyano group, an electron-withdrawing group, while using the improved electronic characteristics of the dimer structure.

Due to the above characteristics, it may be used for an electron injection layer, an electron transport layer, and a light emitting layer in an organic light emitting diode. In an implementation, when used in a light emitting layer, an organic light emitting diode having low driving, long lifespan, and high efficiency characteristics may be implemented.

In an implementation, the compound represented by Chemical Formula 1 may be represented by, e.g., one of Chemical Formula 1A to Chemical Formula 1C.

[Chemical Formula 1A]

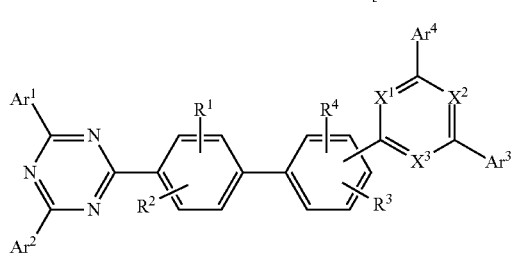

[Chemical Formula 1B]

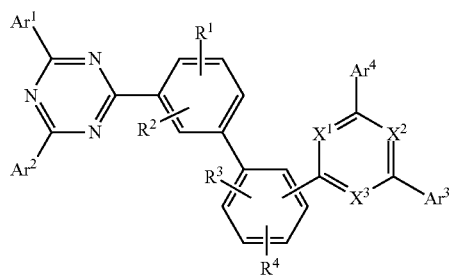

[Chemical Formula 1C]

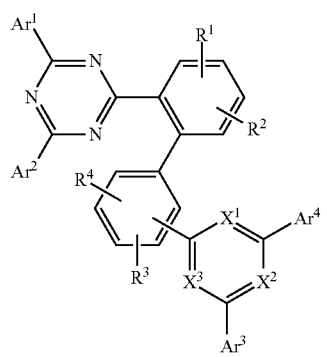

In Chemical Formula 1A to Chemical Formula 1C, $X^1$ to $X^3$, $R^1$ to $R^4$, and $Ar^1$ to $Ar^4$ may be defined the same as described above.

In an implementation, the compound represented by Chemical Formula 1A may be represented by, e.g., one of Chemical Formula 1A-1 to Chemical Formula 1A-12.

[Chemical Formula 1A-1]

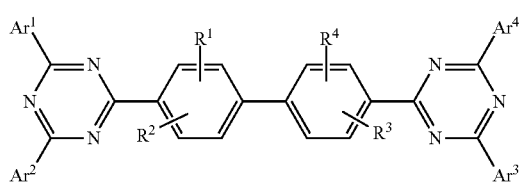

[Chemical Formula 1A-2]

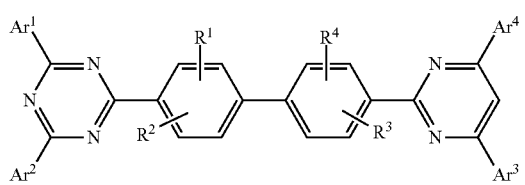

[Chemical Formula 1A-3]

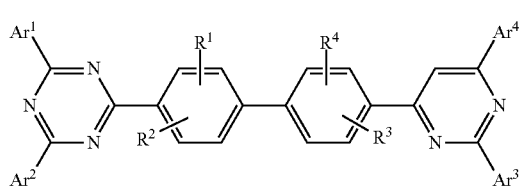

[Chemical Formula 1A-4]

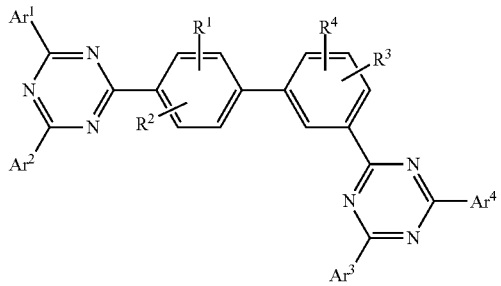

[Chemical Formula 1A-5]

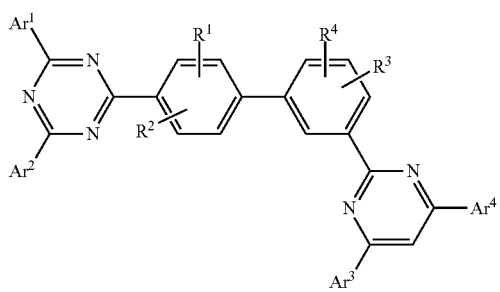

[Chemical Formula 1A-6]

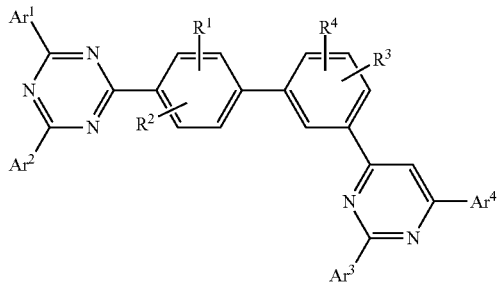

[Chemical Formula 1A-7]

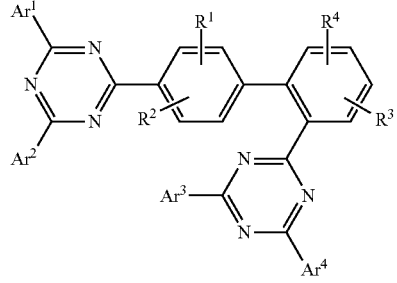

[Chemical Formula 1A-8]

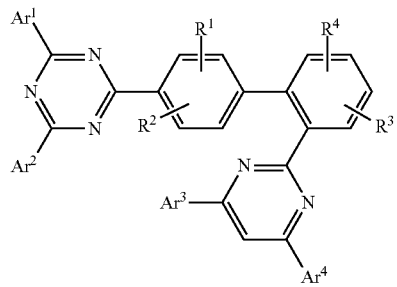

[Chemical Formula 1A-9]

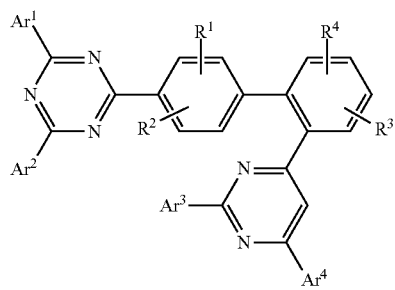

[Chemical Formula 1A-10]

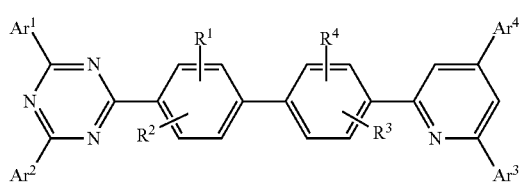

[Chemical Formula 1A-11]

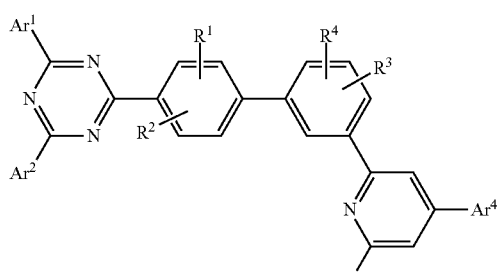

[Chemical Formula 1A-12]

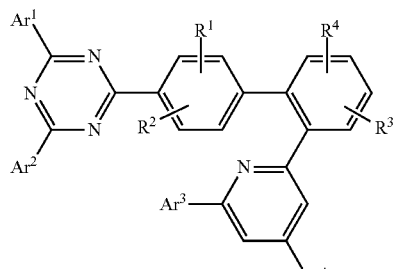

In Chemical Formula 1A-1 to Chemical Formula 1A-12, $R^1$ to $R^4$, and $Ar^1$ to $Ar^4$ may be defined the same as described above.

In an implementation, the compound represented by Chemical Formula 1B may be represented by, e.g., one of Chemical Formula 1B-1 to Chemical Formula 1B-11.

[Chemical Formula 1B-1]

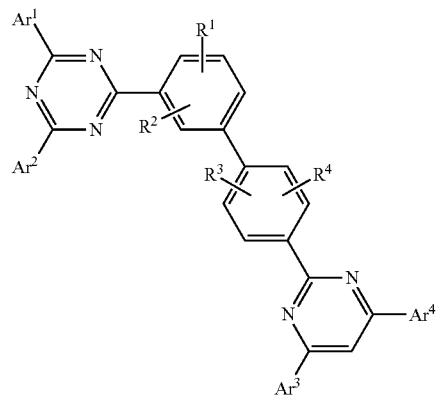

[Chemical Formula 1B-2]

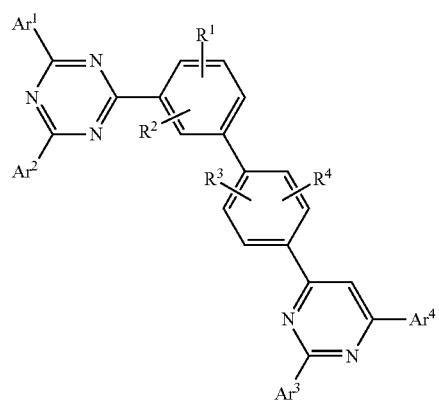

[Chemical Formula 1B-3]

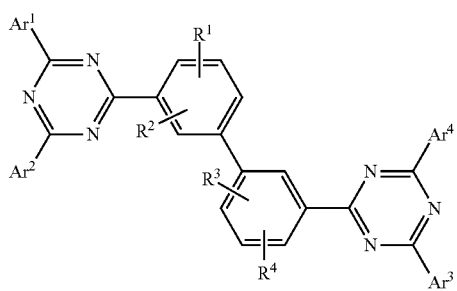

[Chemical Formula 1B-4]

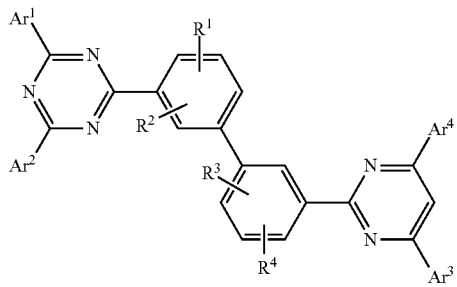

[Chemical Formula 1B-5]

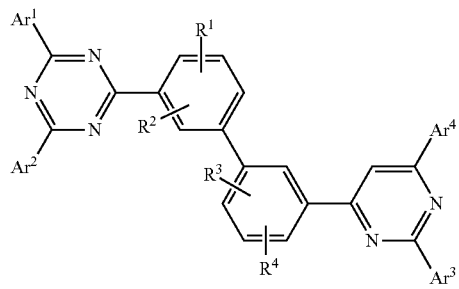

[Chemical Formula 1B-6]

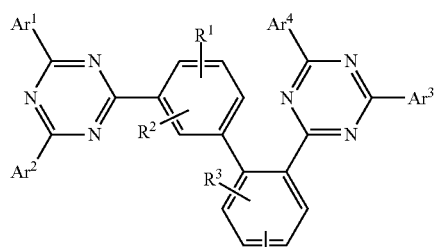

[Chemical Formula 1B-7]

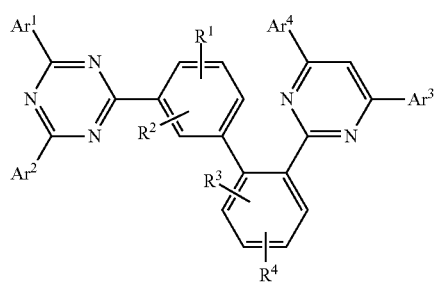

[Chemical Formula 1B-8]

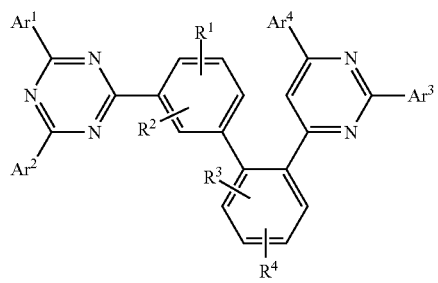

[Chemical Formula 1B-9]

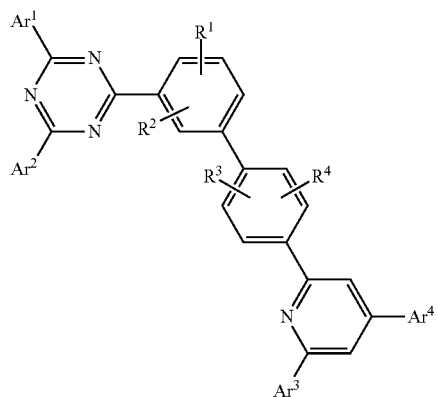

[Chemical Formula 1B-10]

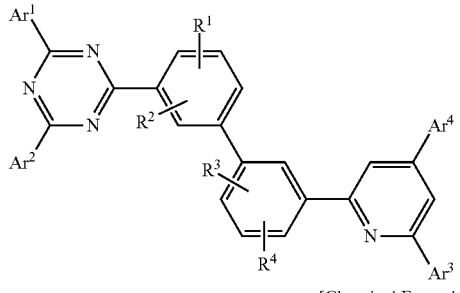

[Chemical Formula 1B-11]

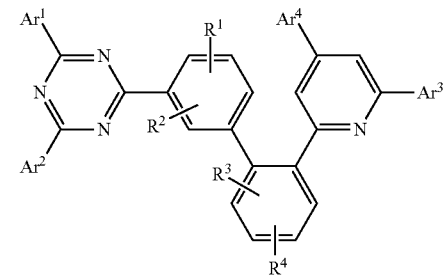

In Chemical Formula 1B-1 to Chemical Formula 1B-11, $R^1$ to $R^4$, and $Ar^1$ to $Ar^4$ may be defined the same as described above.

In an implementation, the compound represented by Chemical Formula 1C may be represented by, e.g., one of Chemical Formula 1C-1 to Chemical Formula 1C-10.

[Chemical Formula 1C-1]

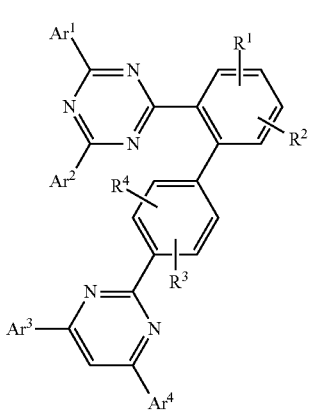

[Chemical Formula 1C-2]

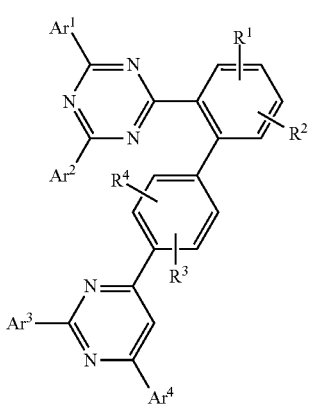

[Chemical Formula 1C-3]

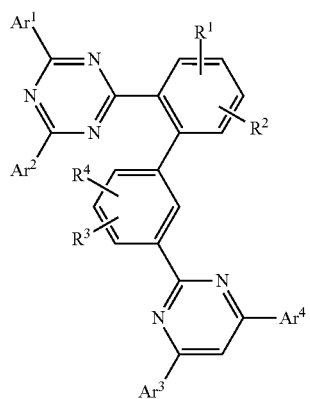

[Chemical Formula 1C-4]

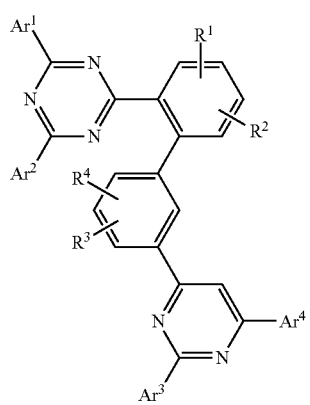

[Chemical Formula 1C-5]

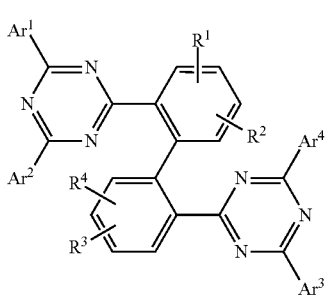

[Chemical Formula 1C-6]

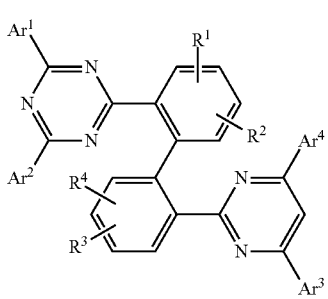

[Chemical Formula 1C-7]

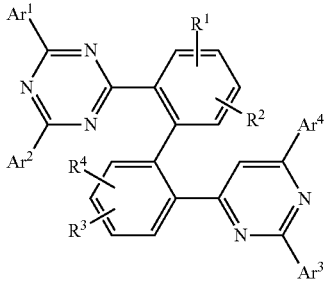

[Chemical Formula 1C-8]

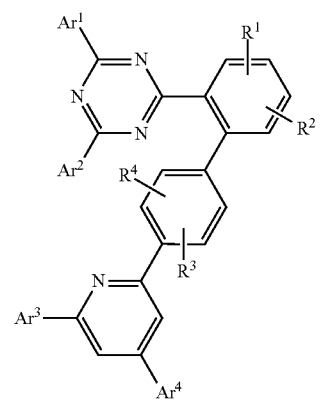

[Chemical Formula 1C-9]

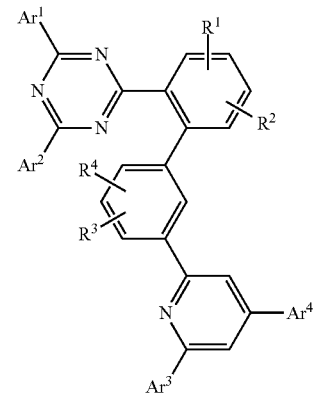

[Chemical Formula 1C-10]

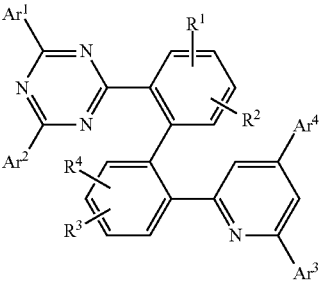

In Chemical Formula 1C-1 to Chemical Formula 1C-10, $R^1$ to $R^4$, and $Ar^1$ to $Ar^4$ may be defined the same as described above.

In an implementation, at least two of $X^1$ to $X^3$ in Chemical Formula 1 may be N.

In an implementation, $X^1$ and $X^3$ may be N, and $X^2$ may be CH in Chemical Formula 1.

In an implementation, each of $X^1$ to $X^3$ in Chemical Formula 1 may be N.

In an implementation, the compound represented by Chemical Formula 1 may be represented by, e.g., Chemical Formula 1A-1, Chemical Formula 1A-4, Chemical Formula 1B-3, or Chemical Formula 1B-4.

In an implementation, $Ar^1$ to $Ar^4$ may each independently be or include, e.g., a substituted or unsubstituted phenyl group, a substituted or unsubstituted biphenyl group or a substituted or unsubstituted naphthyl group.

In an implementation, at least one of $Ar^1$ to $Ar^4$ may be, e.g., a substituent represented by one of Chemical Formula a1 to Chemical Formula a3.

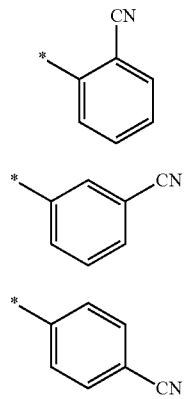

[Chemical Formula a1]

[Chemical Formula a2]

[Chemical Formula a3]

In Chemical Formula a1 to Chemical Formula a3, * is a linking point.

In an implementation, at least one of $Ar^1$ to $Ar^4$ may be represented by Chemical Formula a2 or Chemical Formula a3.

In an implementation, $Ar^1$ to $Ar^4$ may each independently be a group of the following Group I.

In an implementation, at least one of $Ar^1$ to $Ar^4$ may be represented by Chemical Formula a2 or Chemical Formula a3.

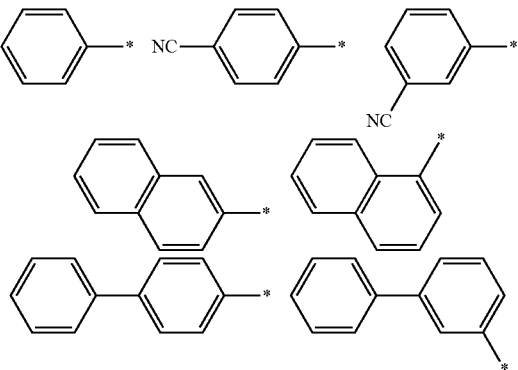

[Group I]

In Group I, * is a linking point.

In an implementation, the compound for an organic optoelectronic device represented by Chemical Formula 1 may be a compound of the following Group 1.

[Group 1]

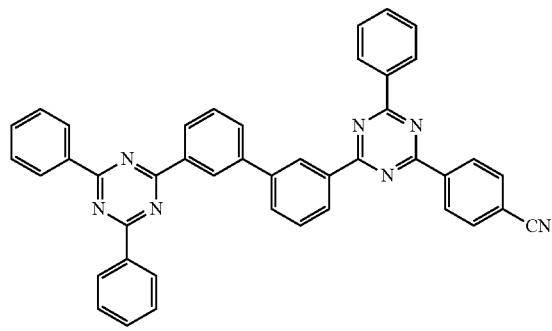

A-1

A-2

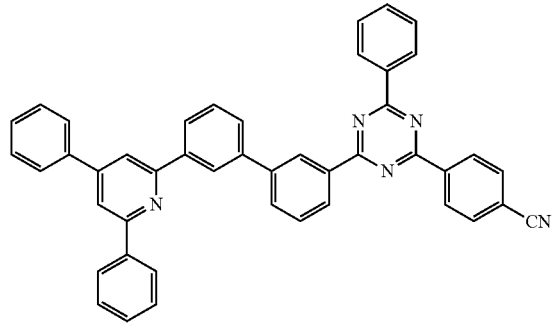

A-3

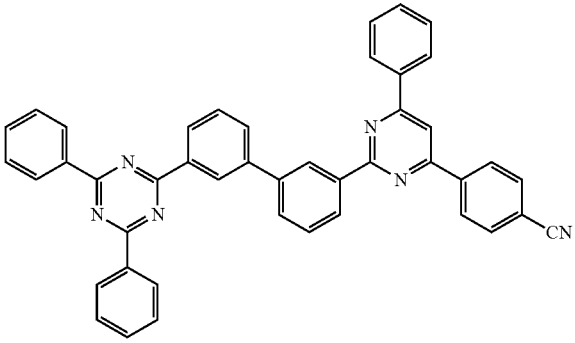

A-4

-continued
A-5
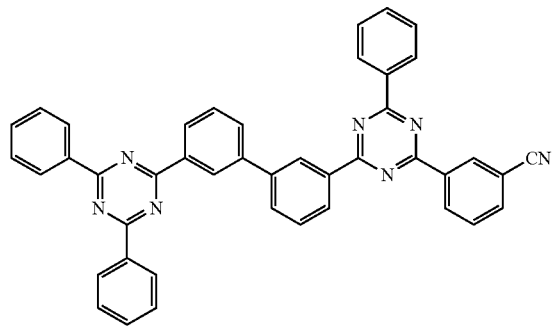
A-6
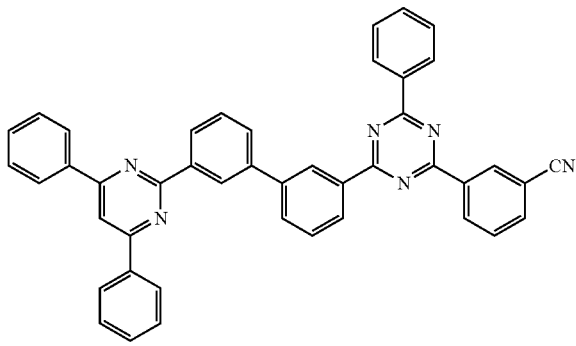
A-7
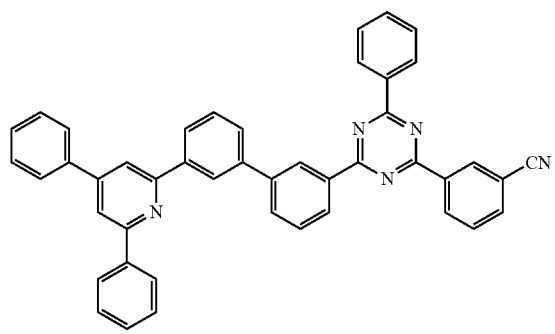
A-8
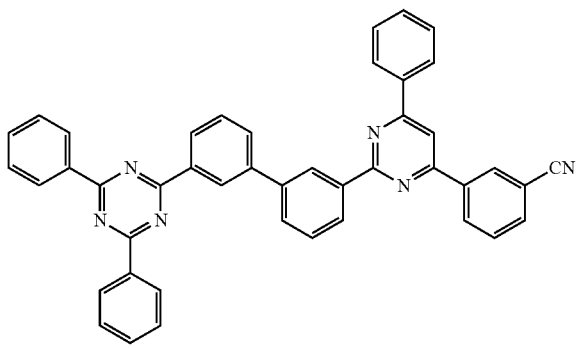
A-9
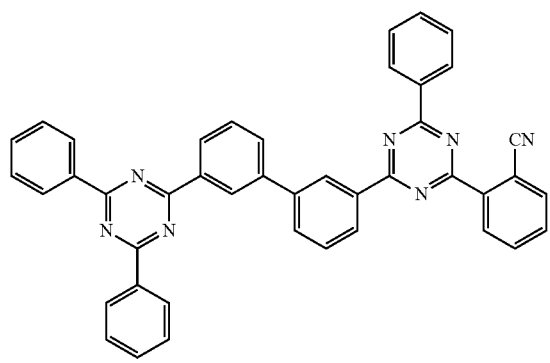
A-10
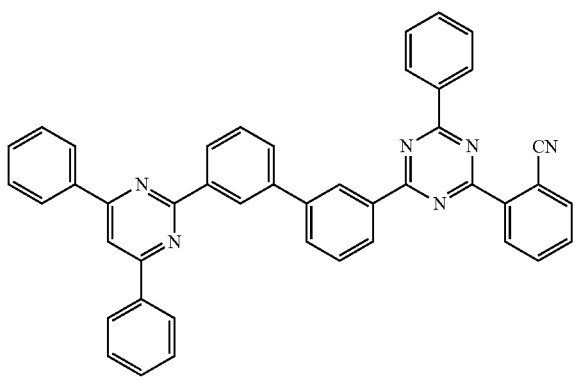
A-11
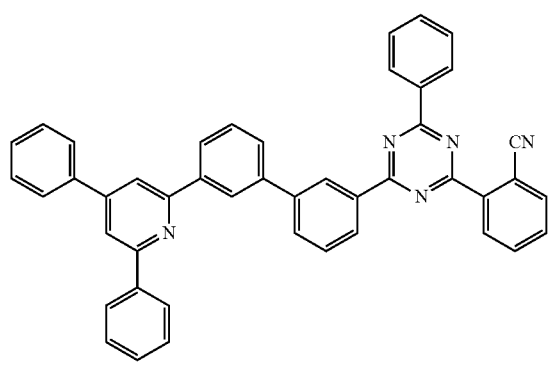
A-12
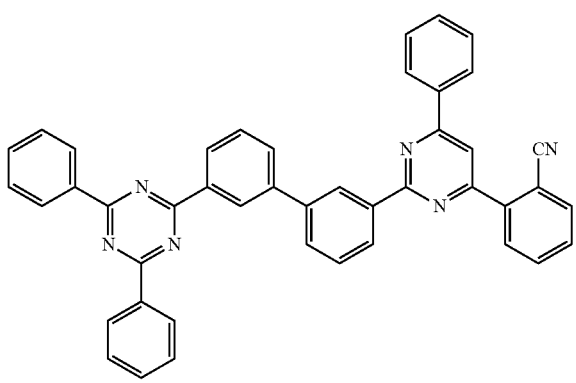

-continued
A-13
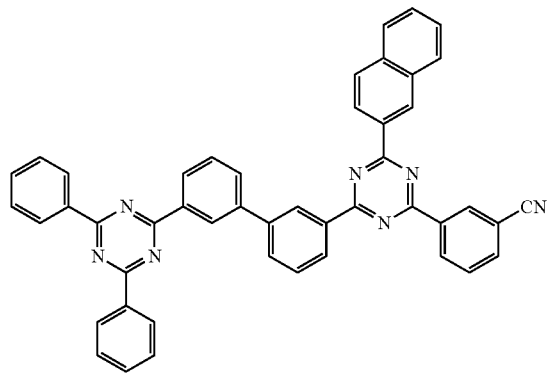
A-14
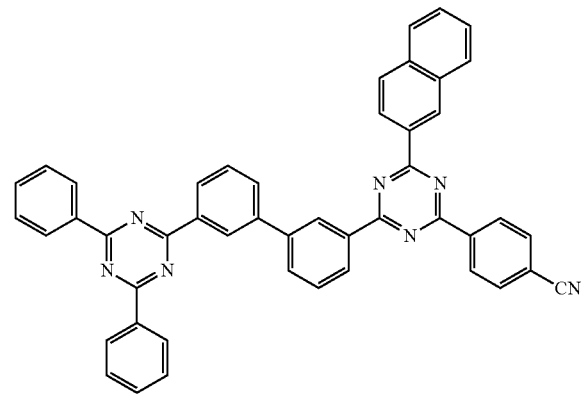
A-15
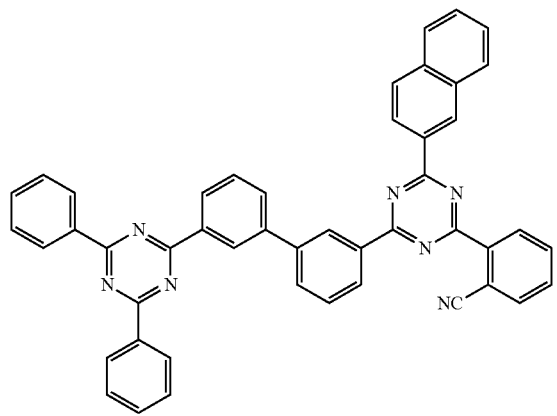
A-16
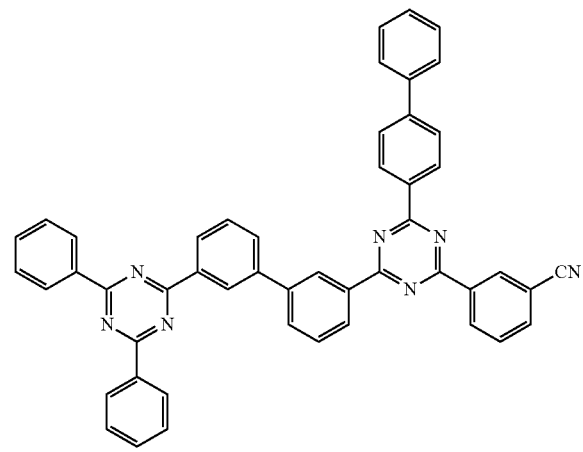
A-17
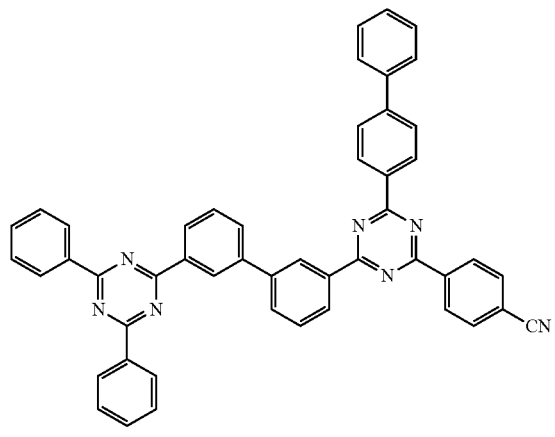
A-18
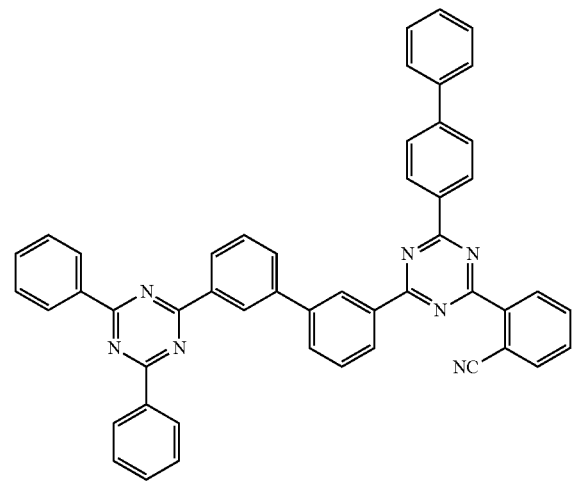

-continued
A-19
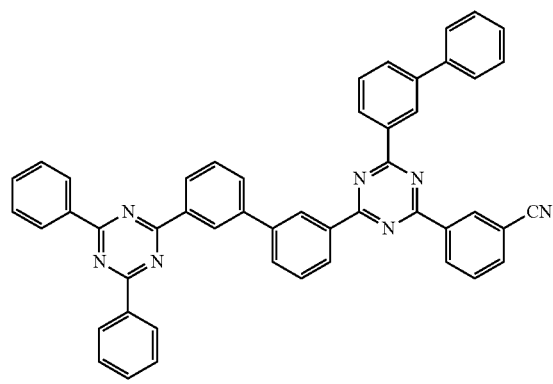
A-20
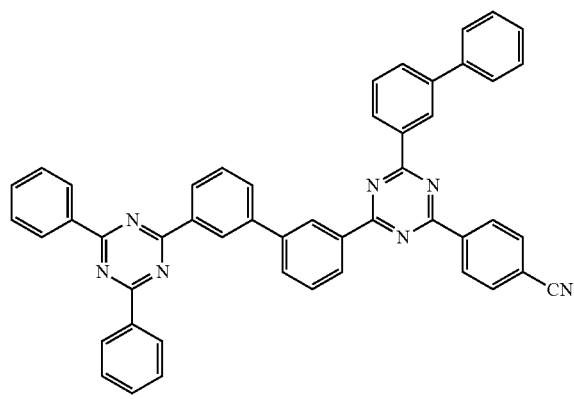
A-21
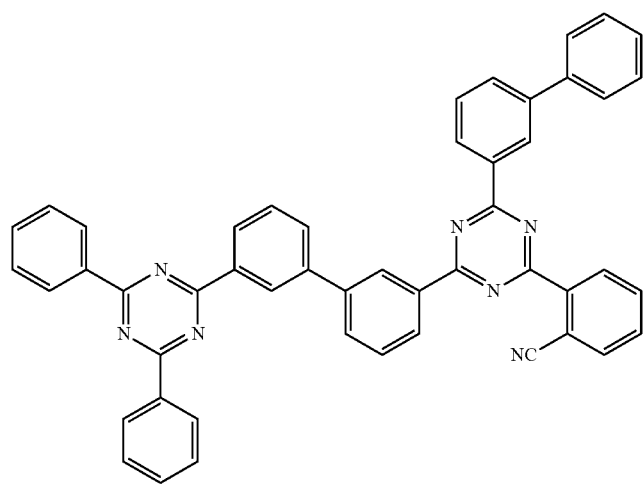
A-22
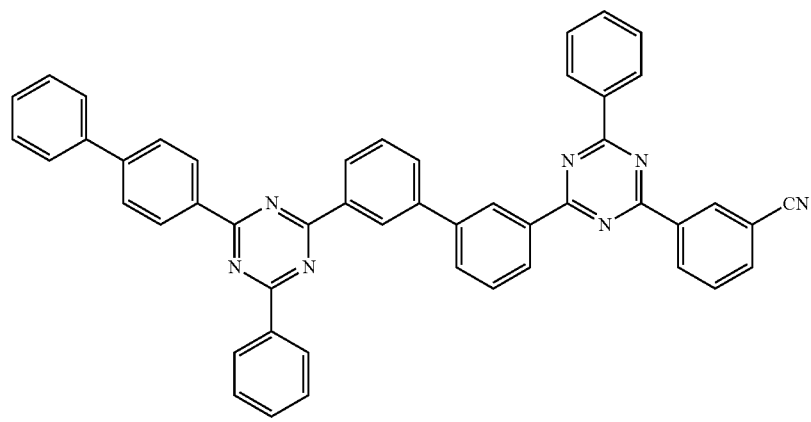

A-23
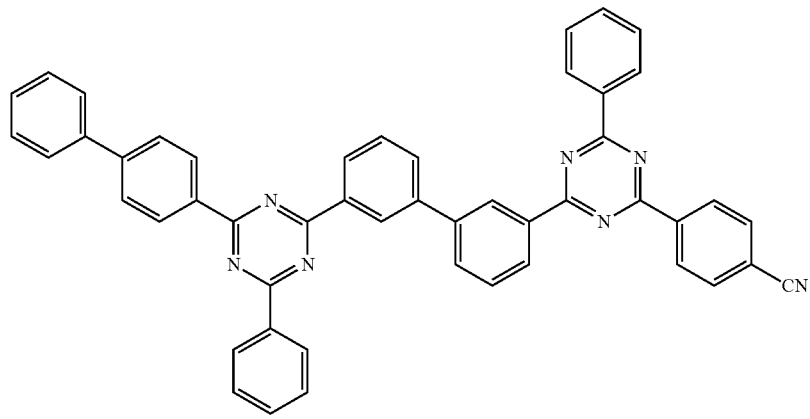
A-24
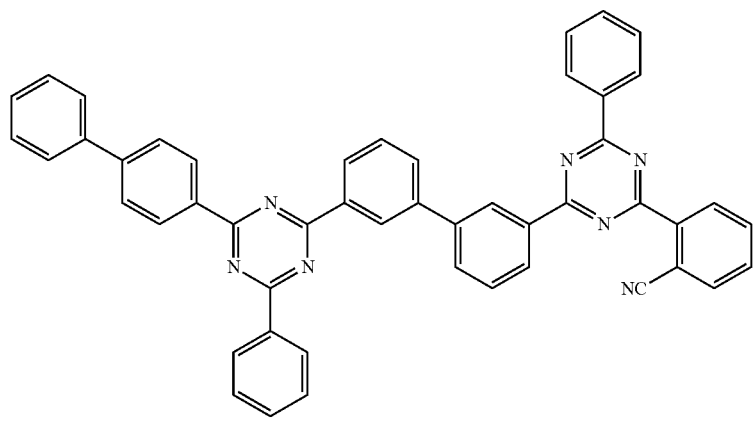
A-25
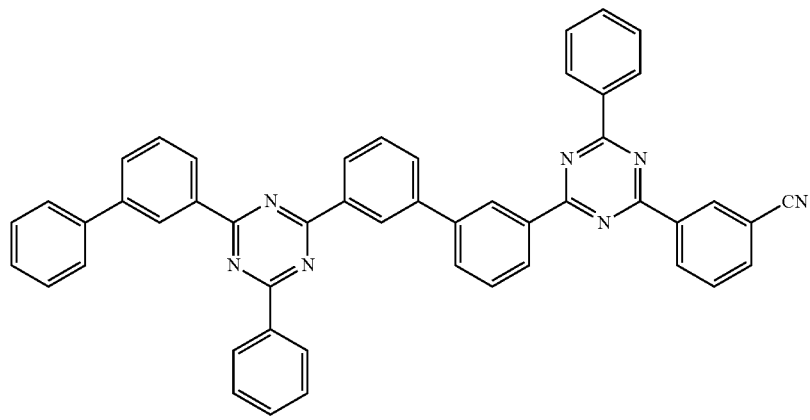

A-26
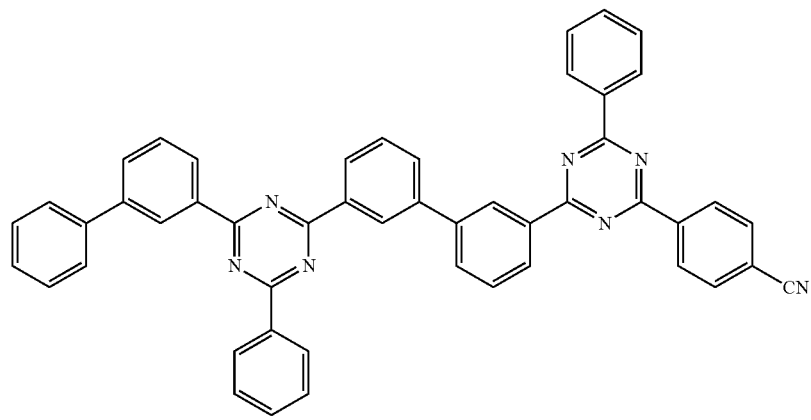
A-27
A-28
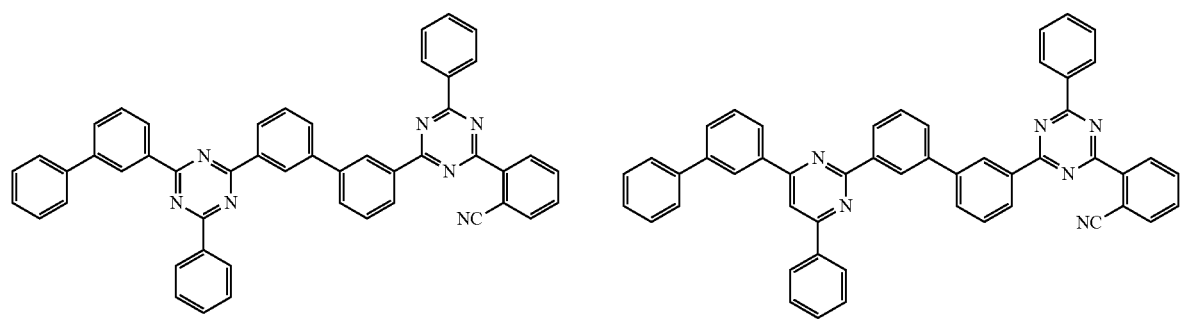
A-29
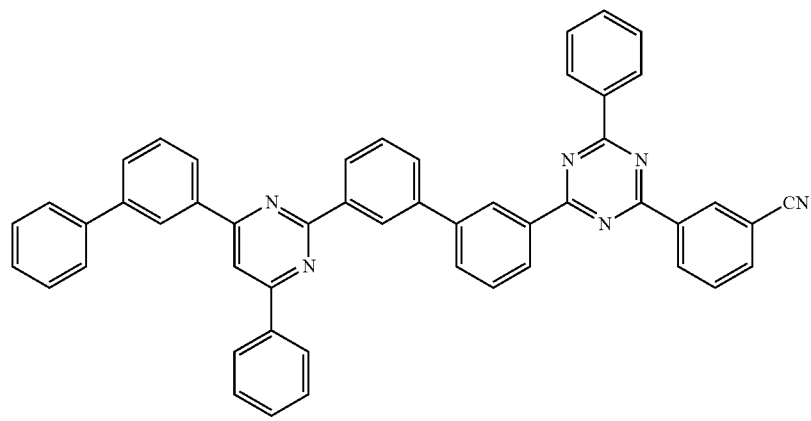
A-30
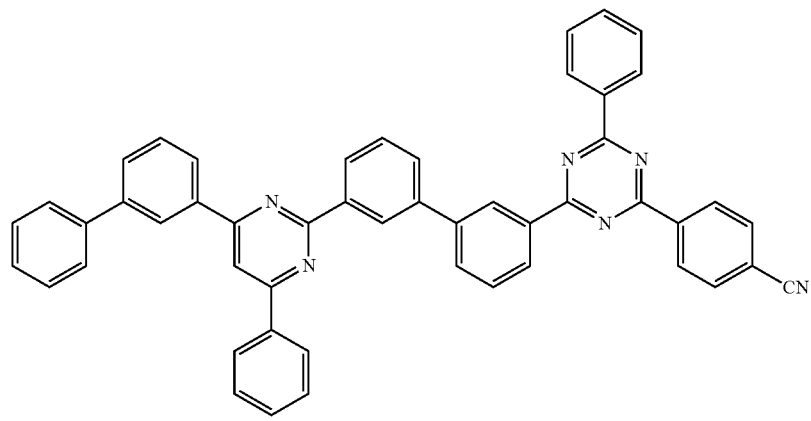

-continued
A-31
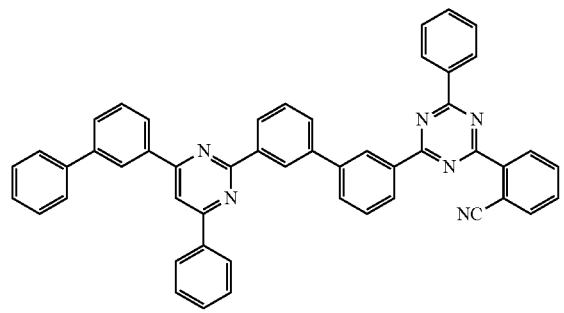
A-32
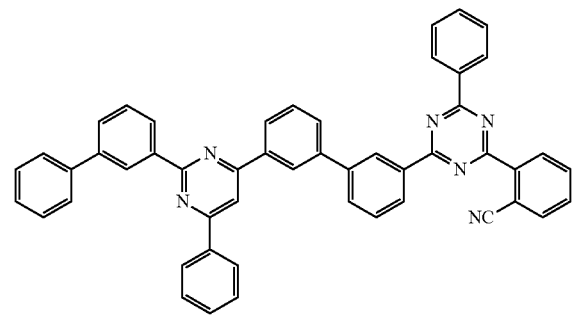
A-33
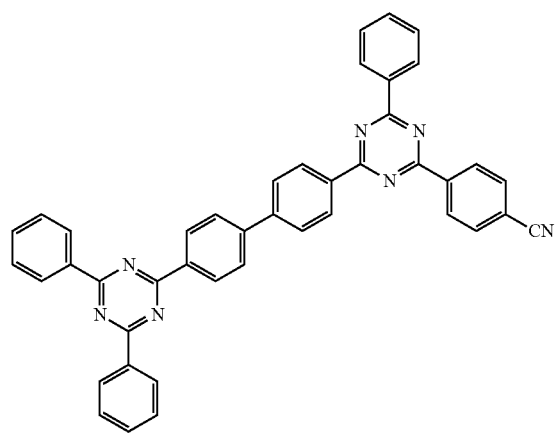
A-34
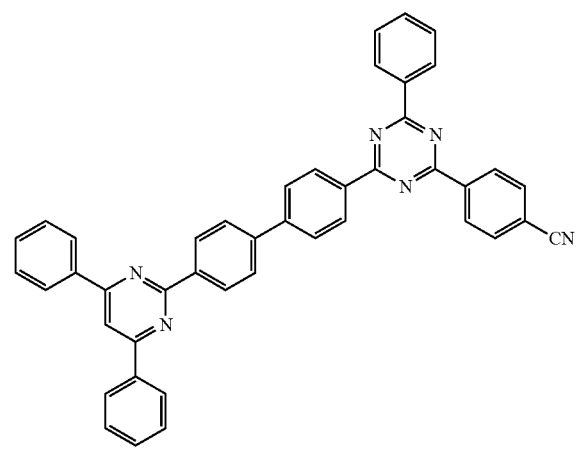
A-35
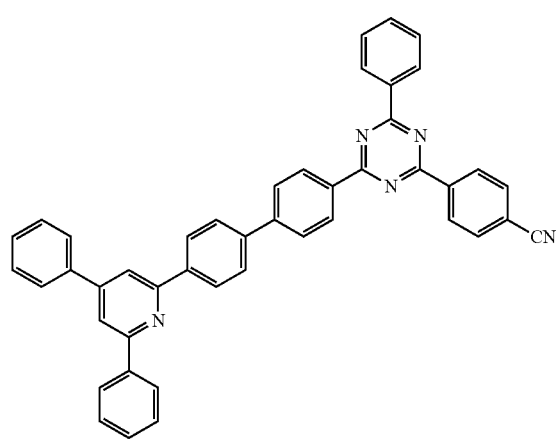
A-36
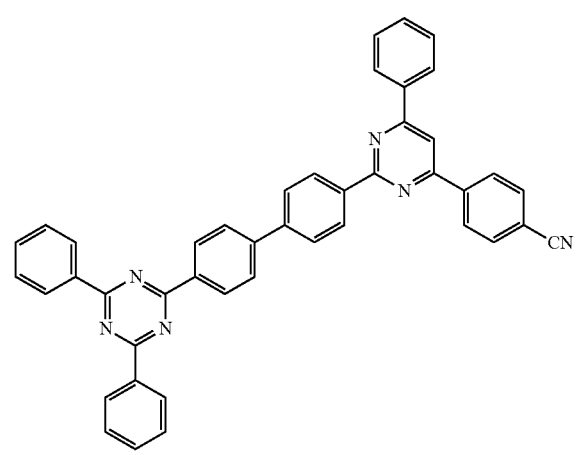

-continued
A-37
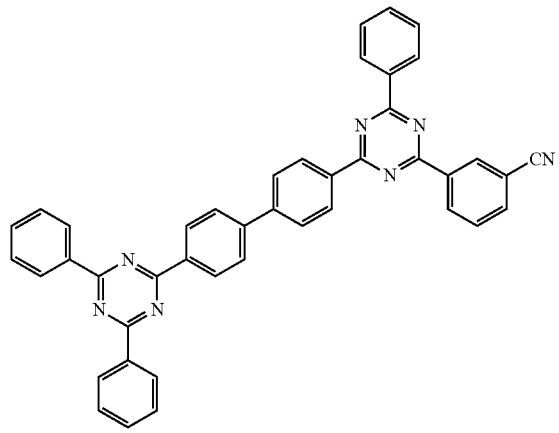
A-38
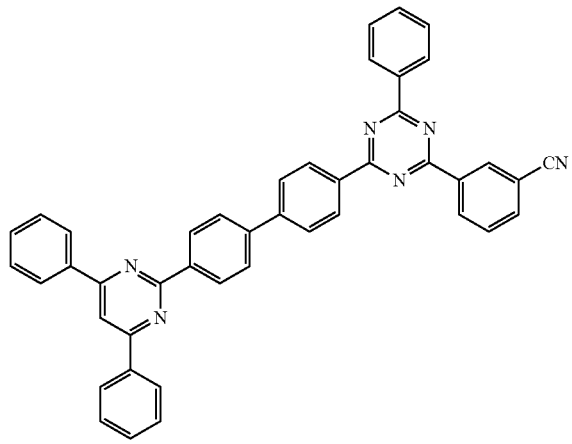
A-39
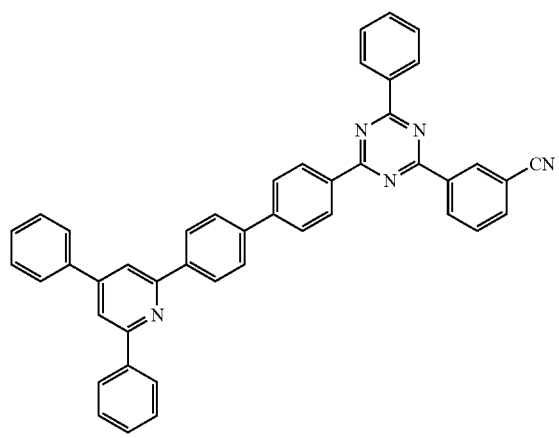
A-40
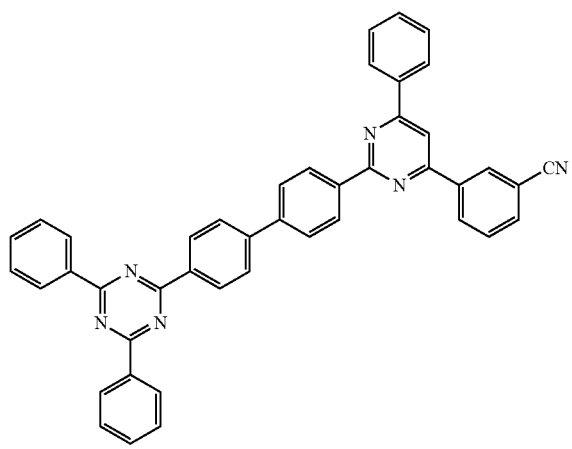
A-41
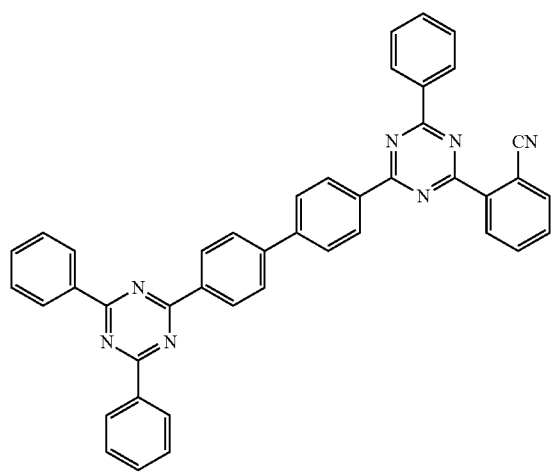
A-42
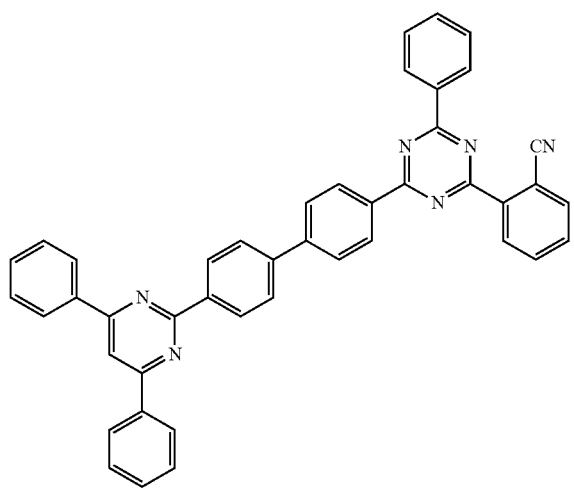

-continued
A-43
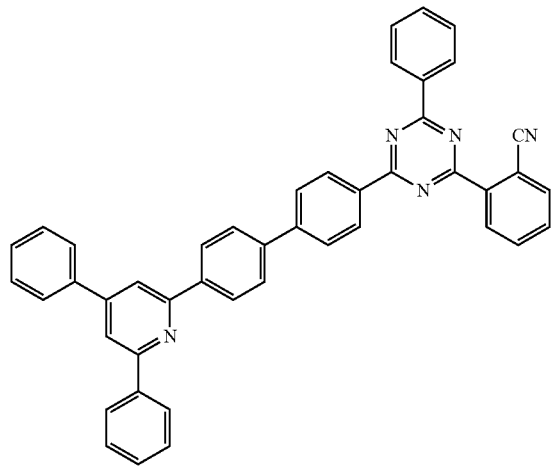
A-44
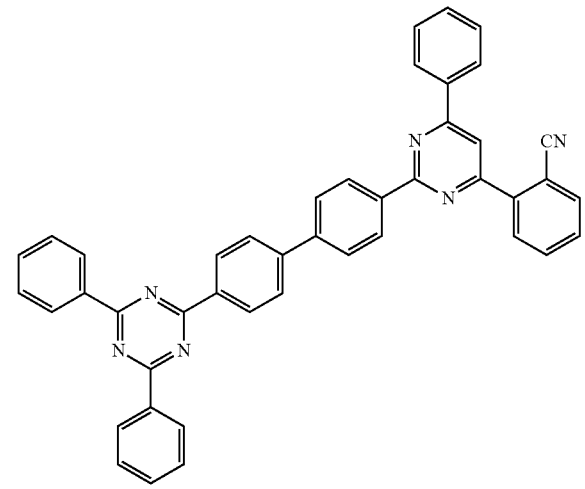
A-45
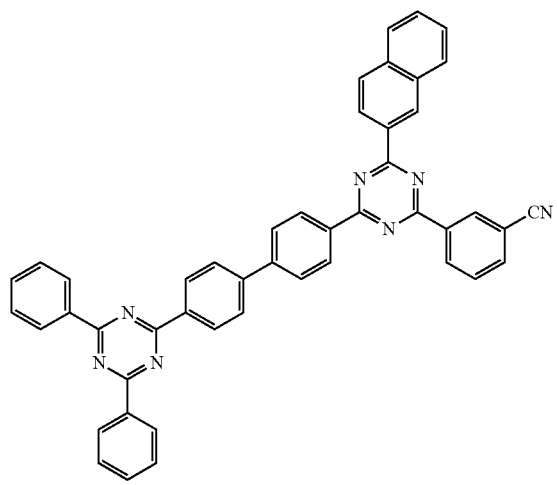
A-46
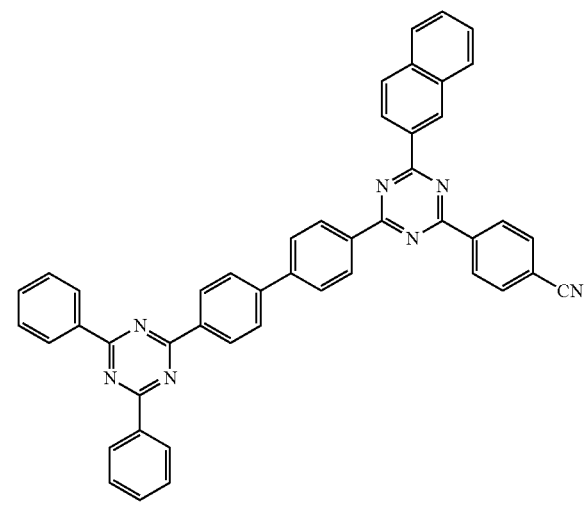
A-47
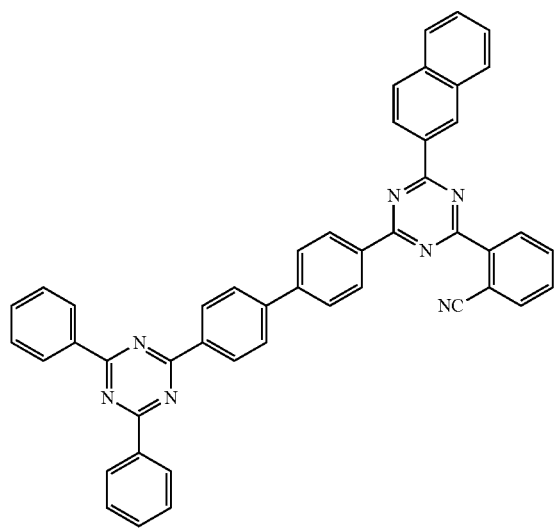
A-48
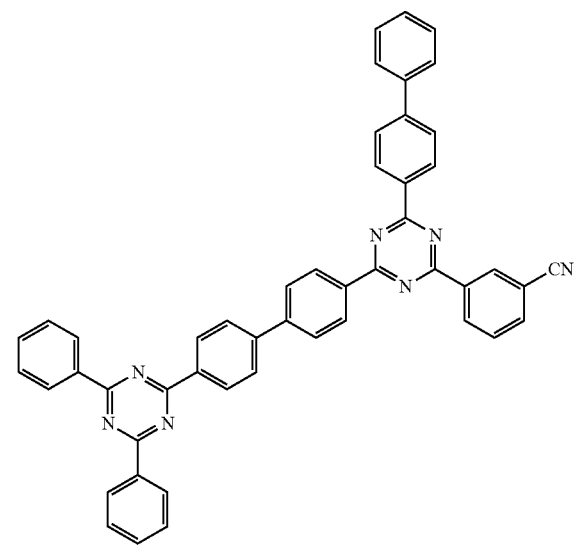

-continued
A-49
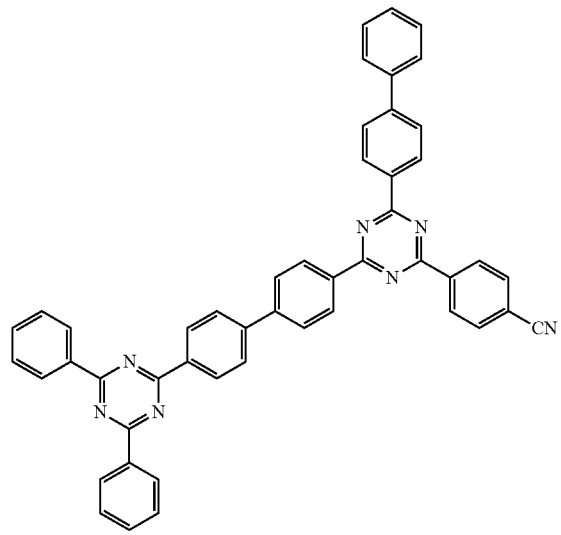
A-50
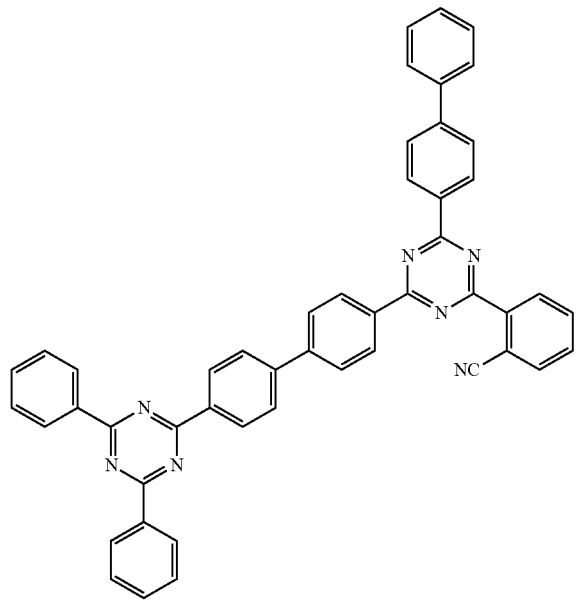
A-51
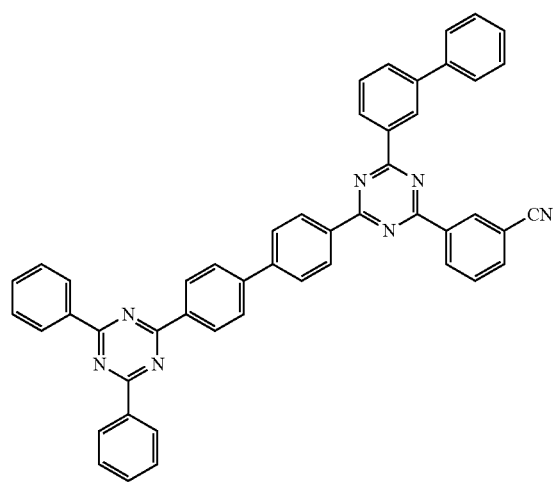
A-52
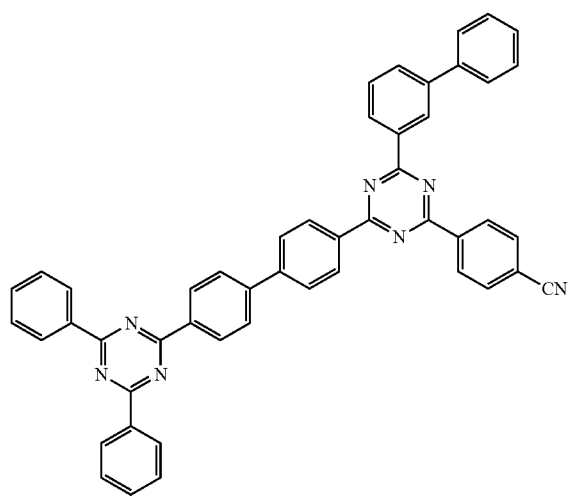

-continued
A-53
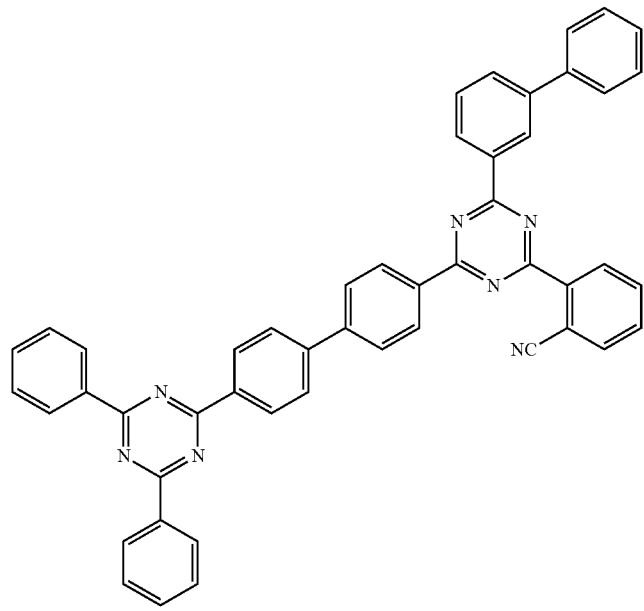
A-54
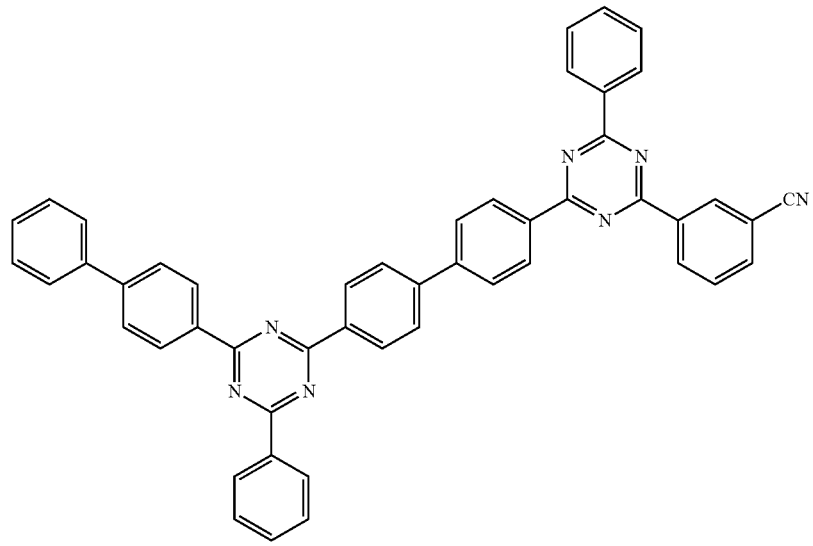

-continued
A-55
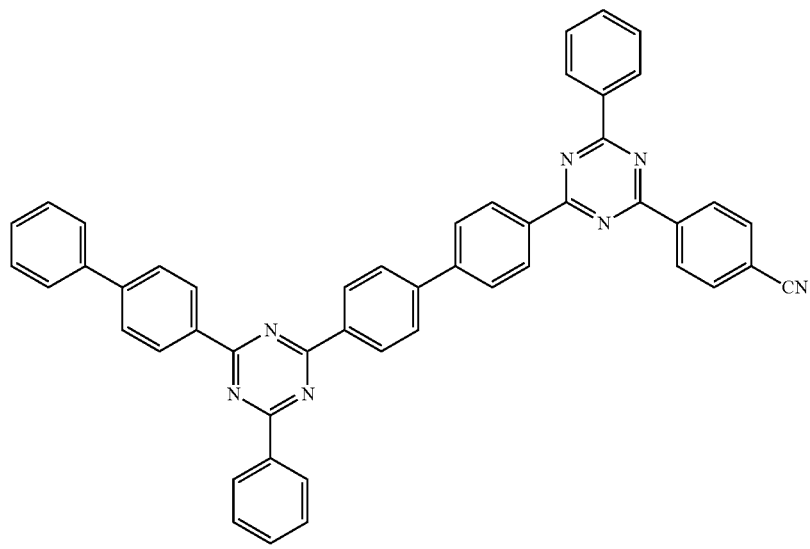
A-56
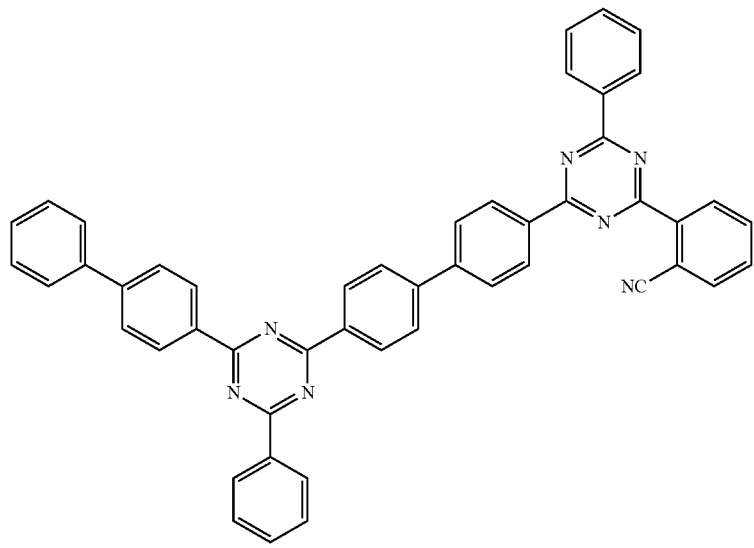
A-57
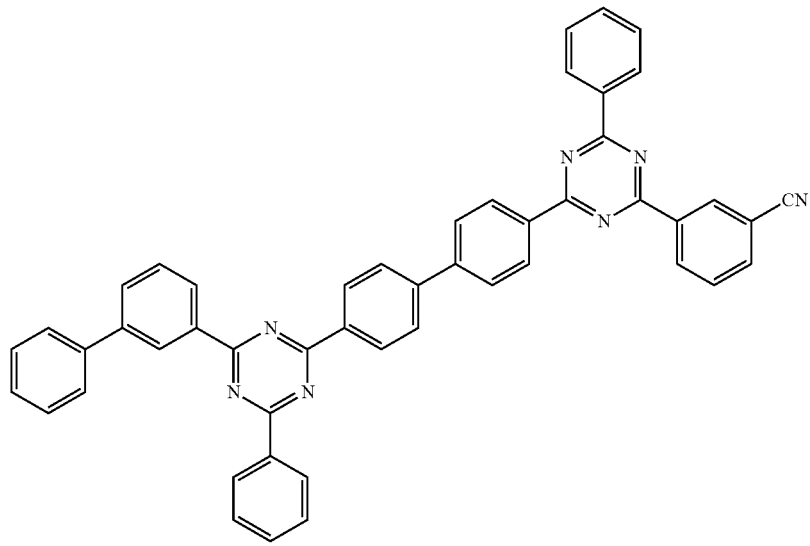

-continued
A-58
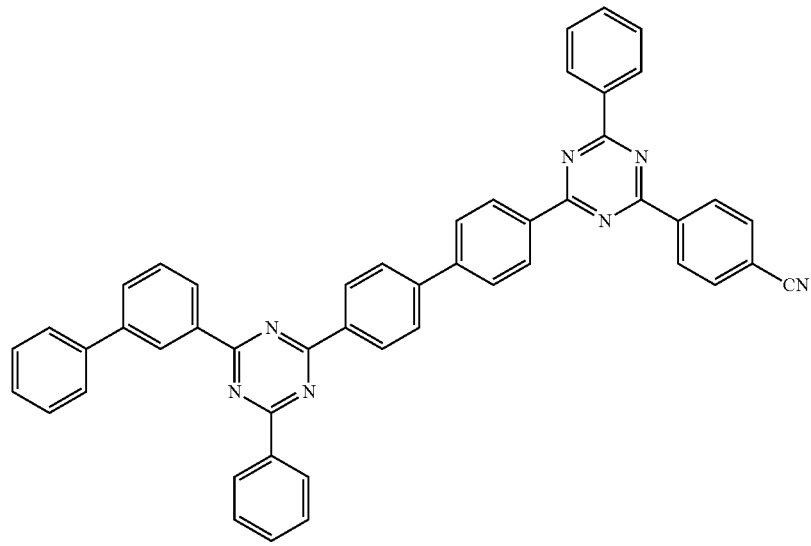
A-59
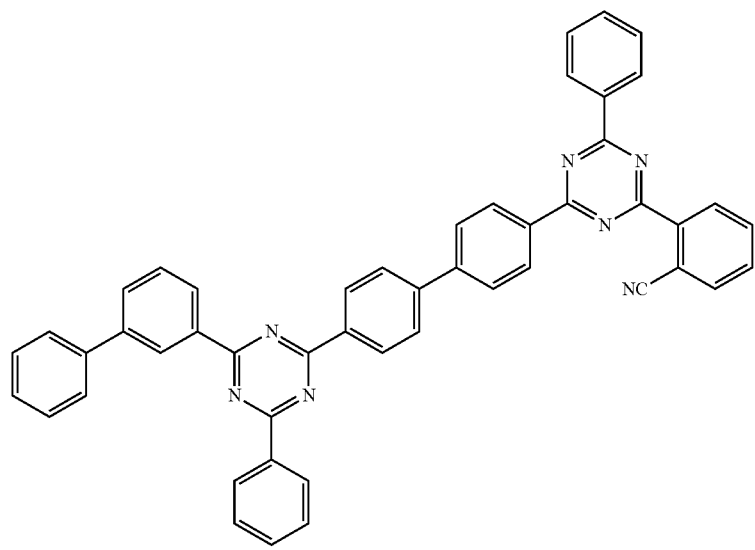
A-60
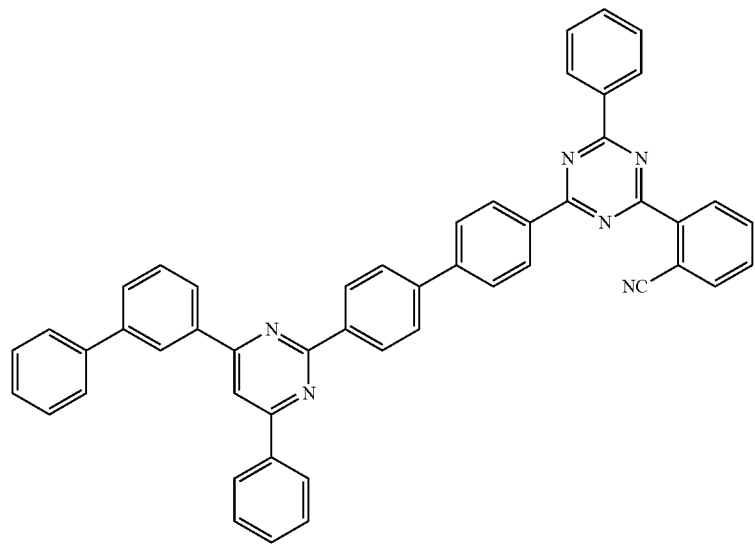

-continued
A-61
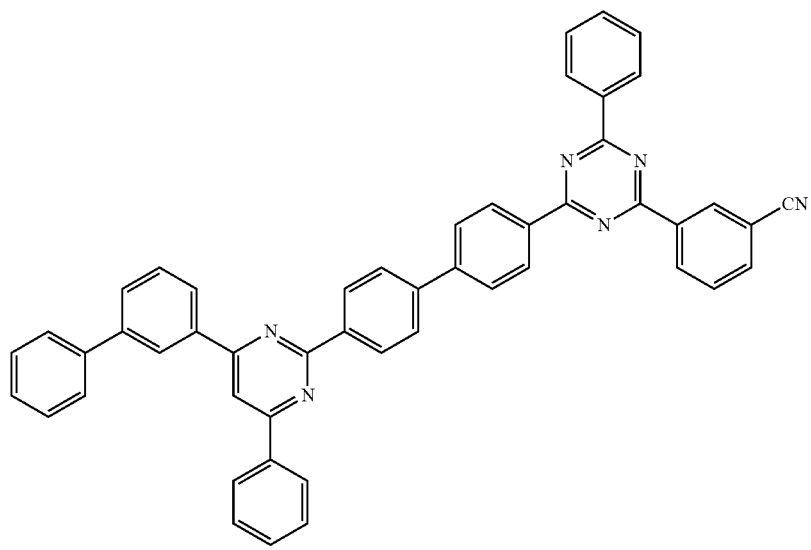
A-62
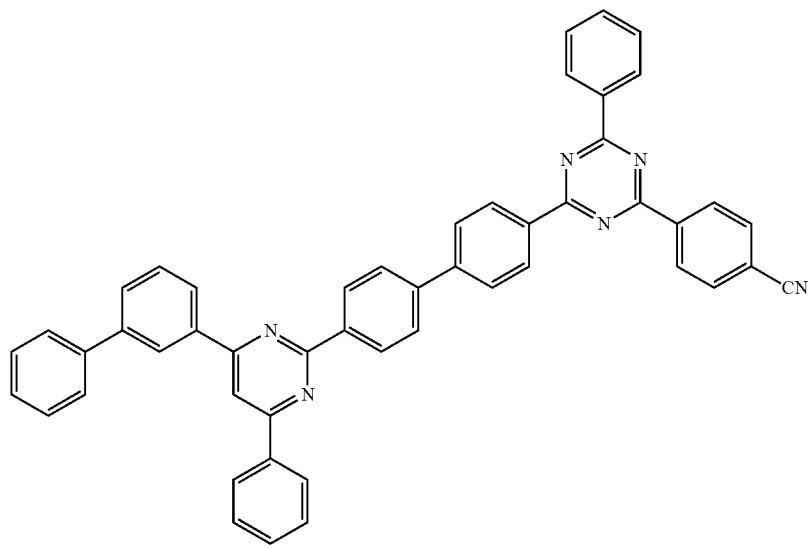
A-63
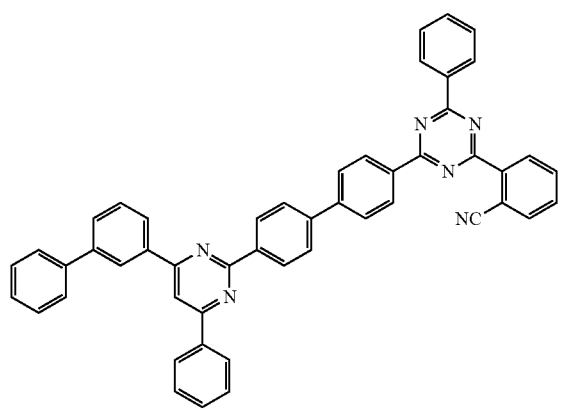
A-64
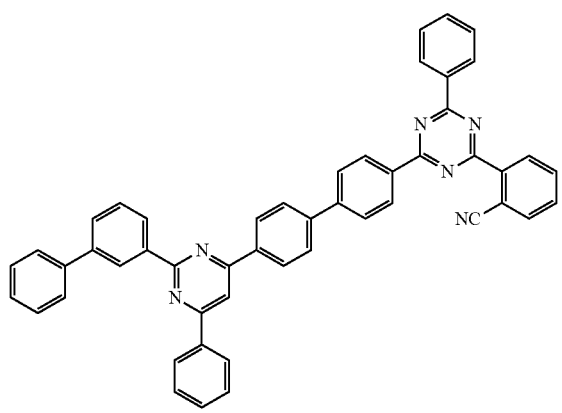

-continued
A-65
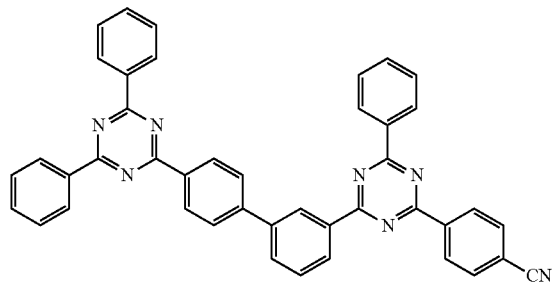
A-66
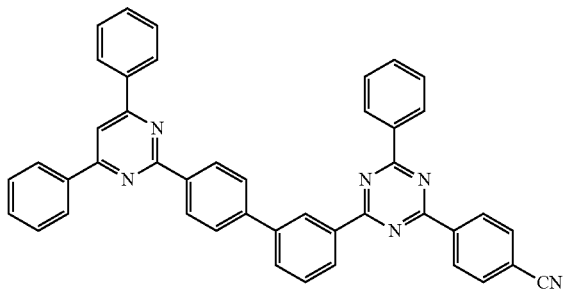
A-67
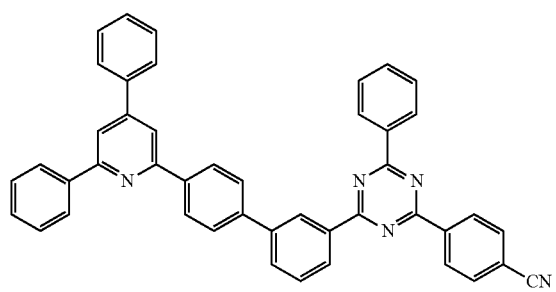
A-68
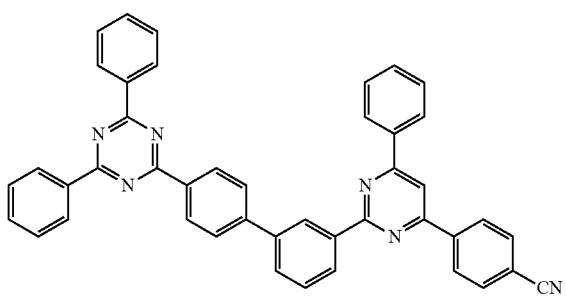
A-69
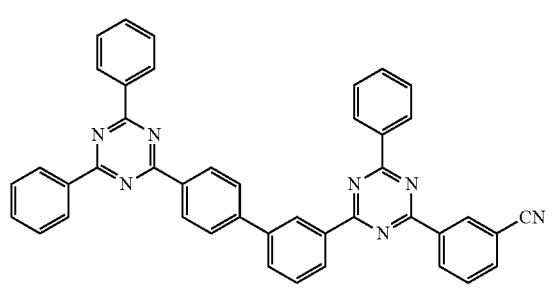
A-70
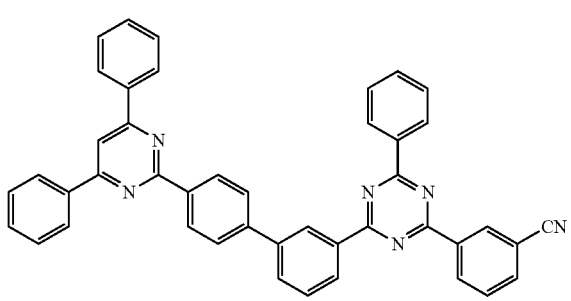
A-71
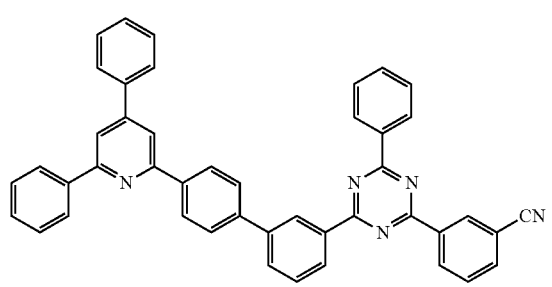
A-72
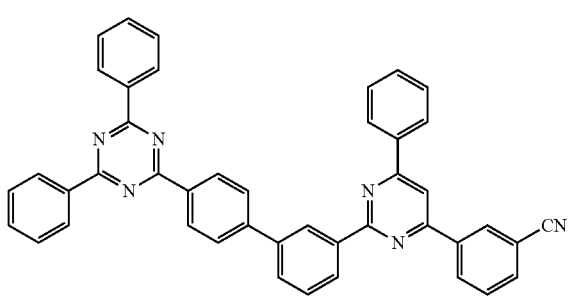
A-73
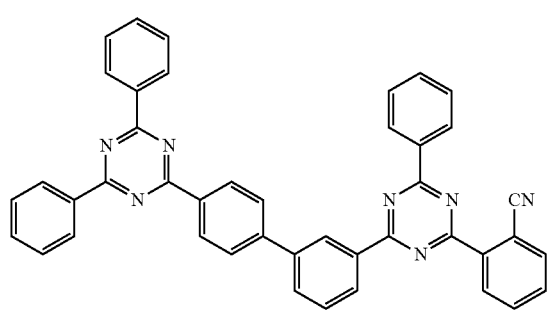
A-74
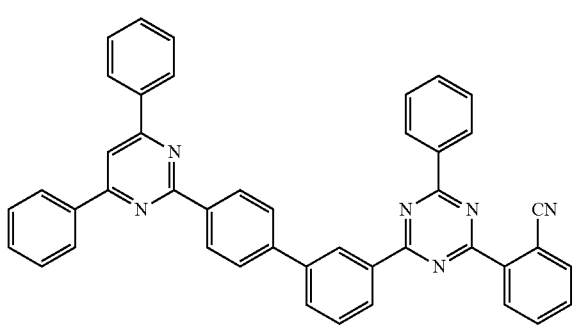

-continued
A-75
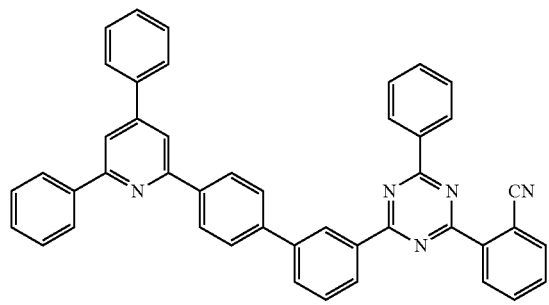
A-76
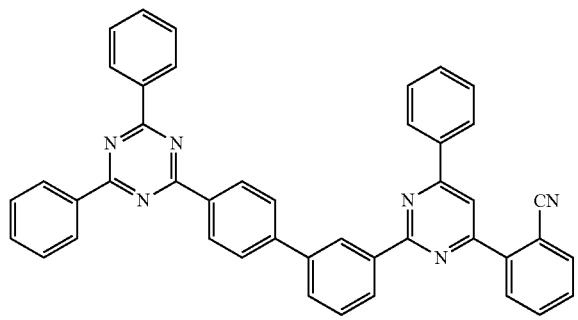
A-77
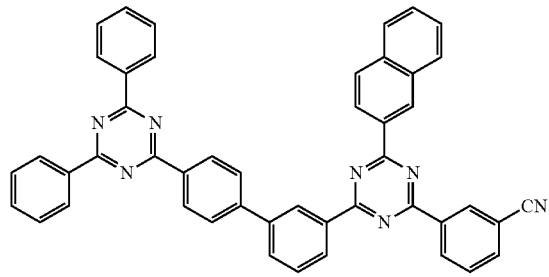
A-78
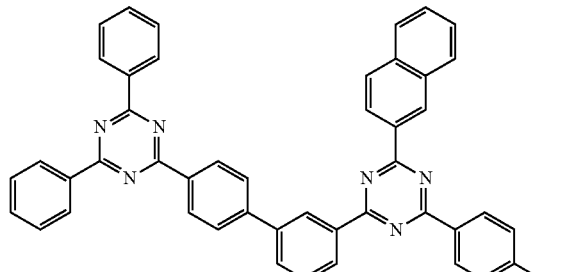
A-79
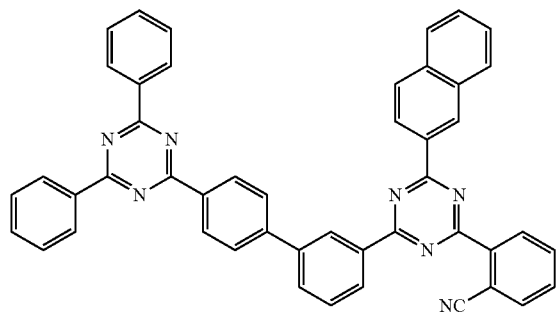
A-80
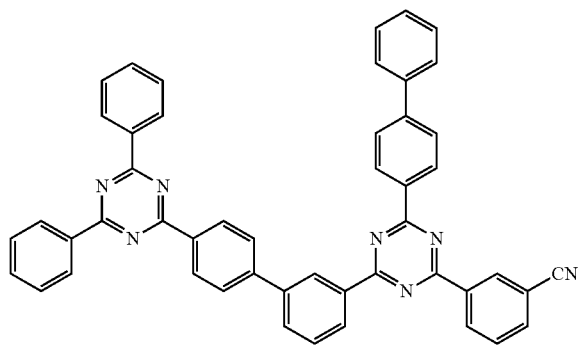
A-81
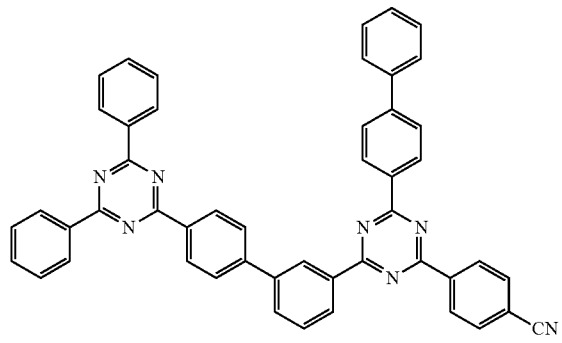
A-82
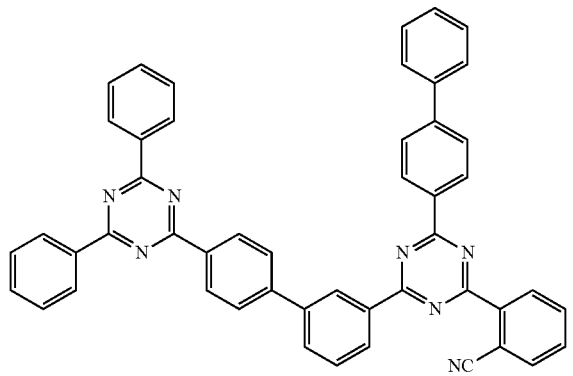

-continued
A-83
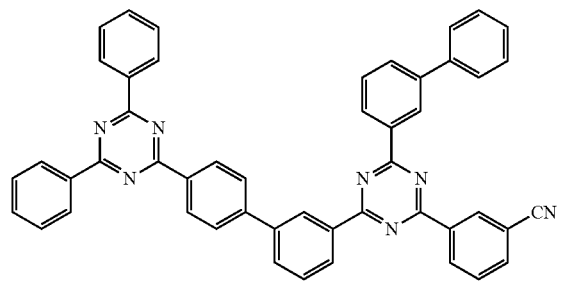
A-84
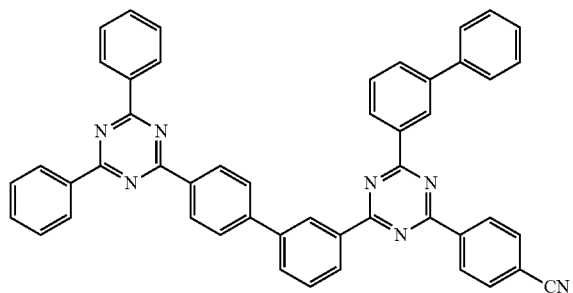
A-85
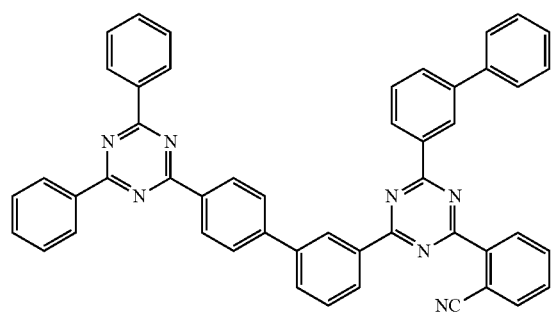
A-86
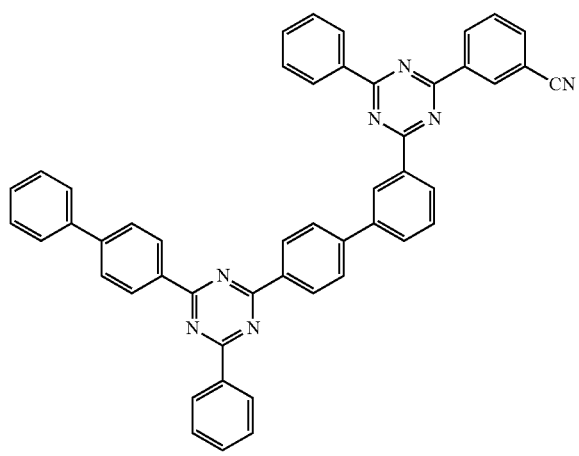
A-87
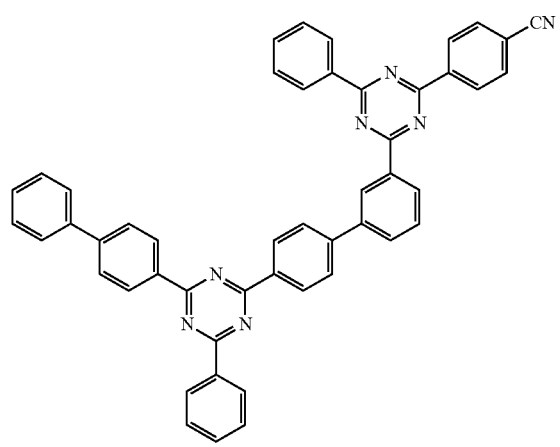
A-88
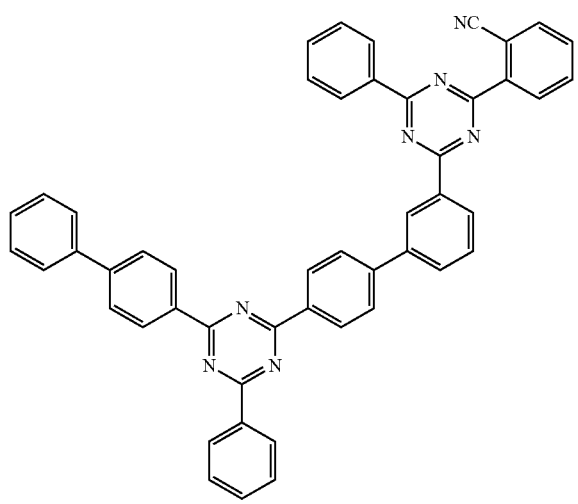

-continued
A-89
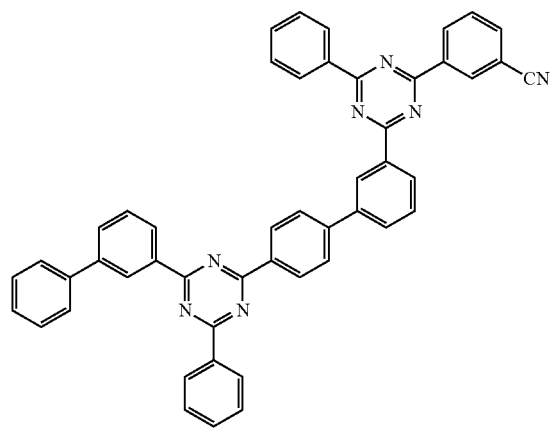
A-90
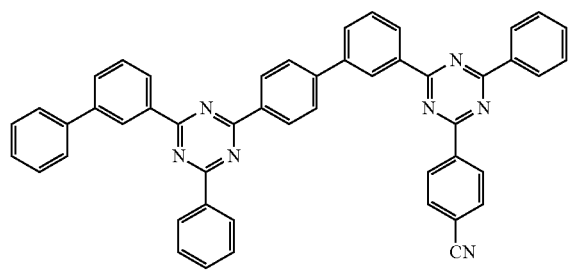
A-91
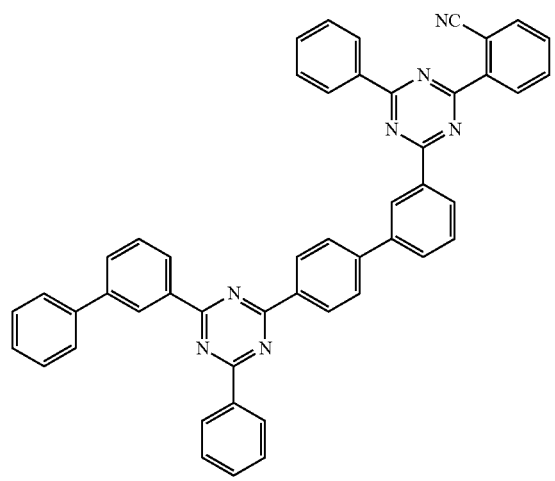
A-92
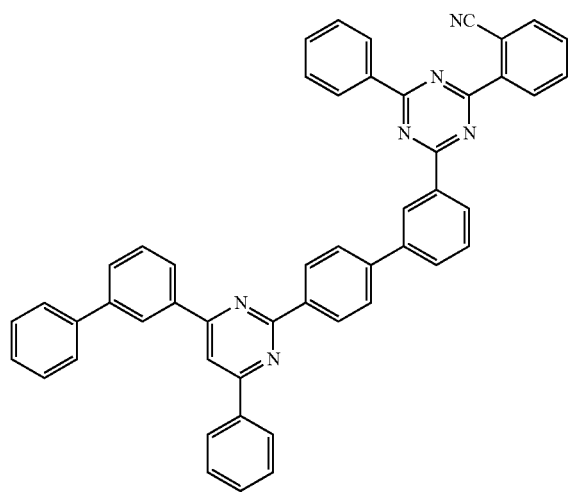
A-93
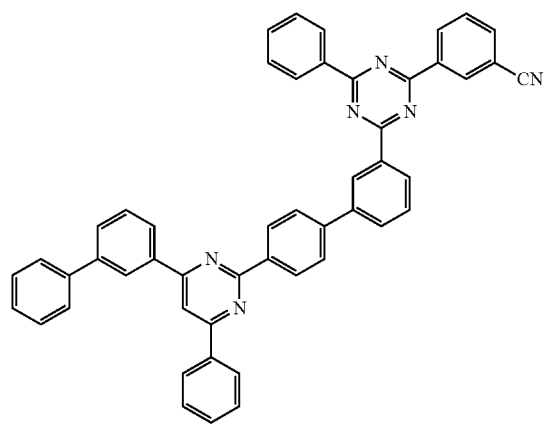
A-94
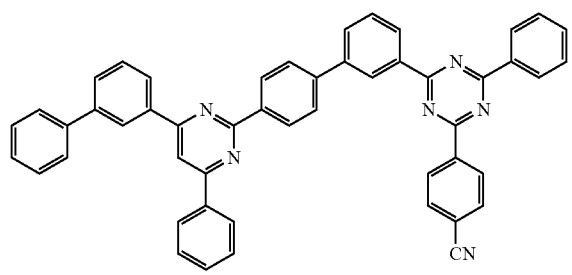

-continued
A-95
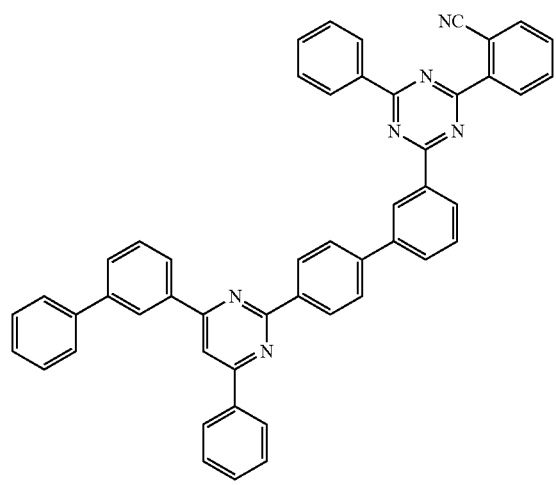
A-96
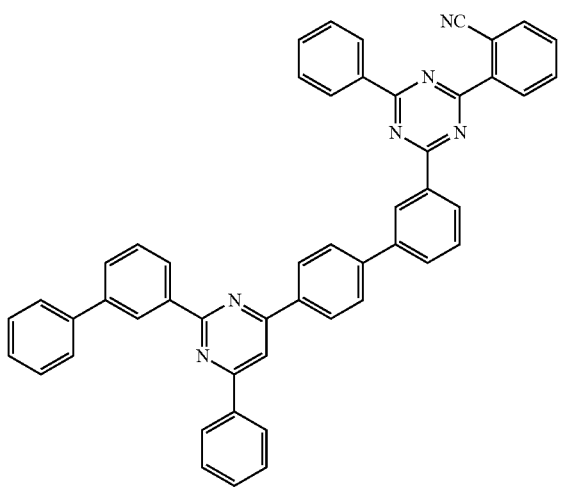
A-97
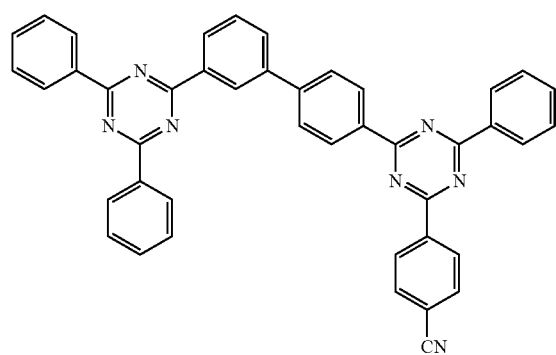
A-98
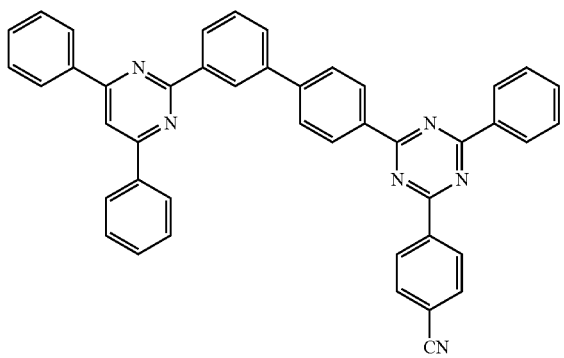
A-99
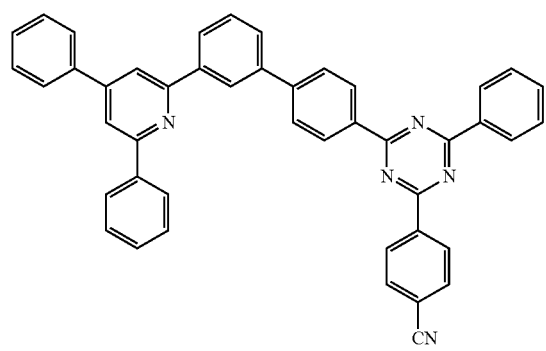
A-100
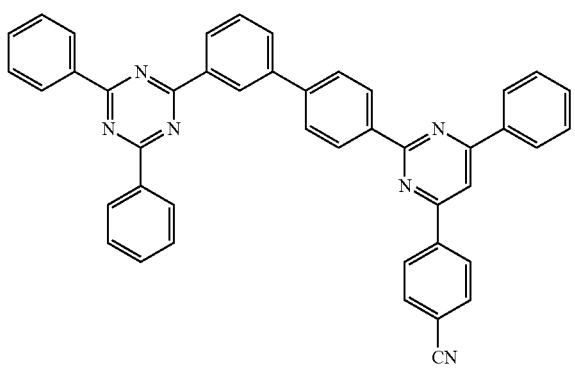
A-101
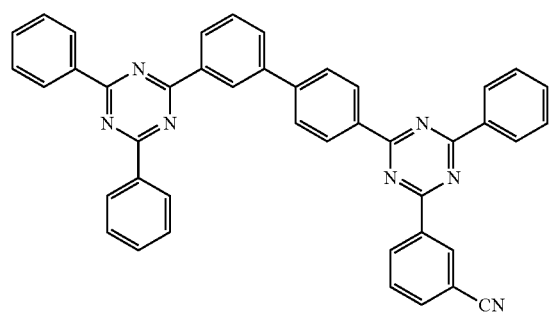
A-102
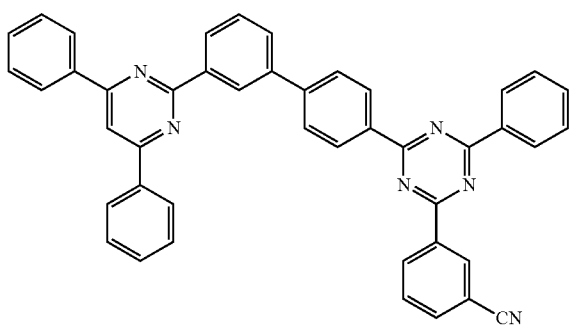

-continued
A-103
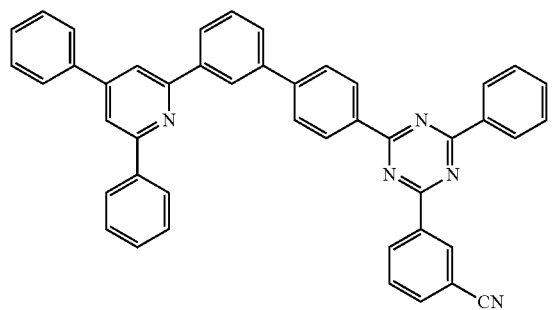
A-104
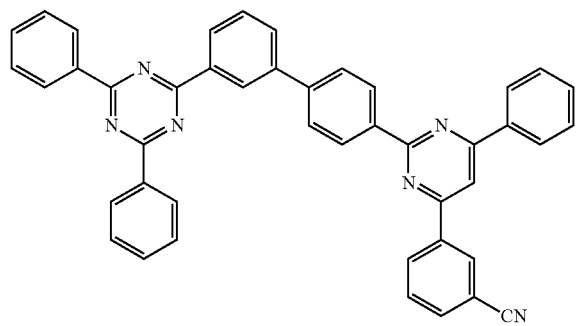
A-105
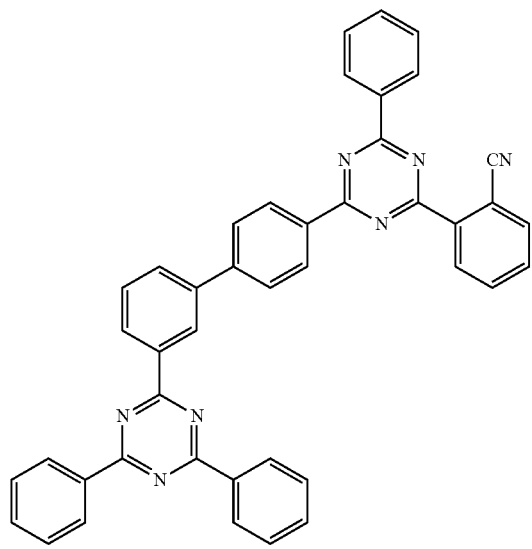
A-106
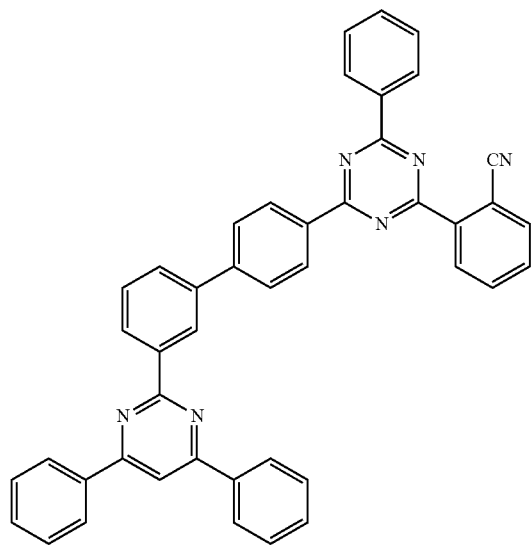
A-107
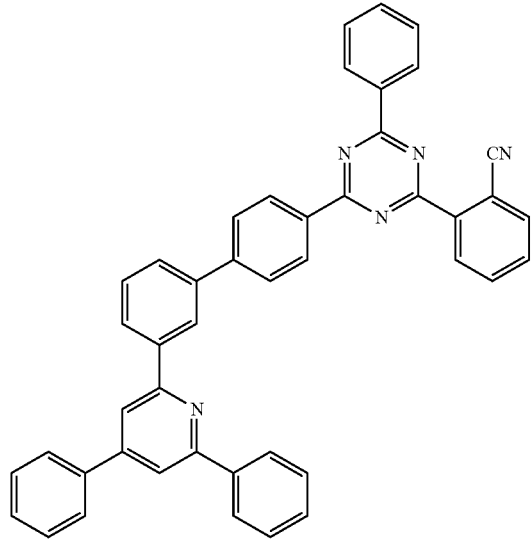
A-108
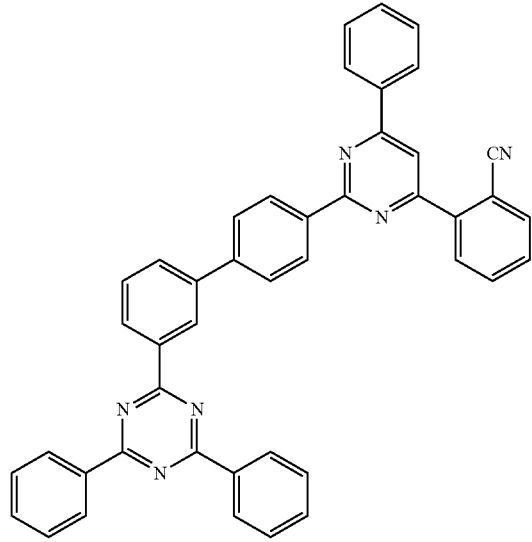

-continued
A-109
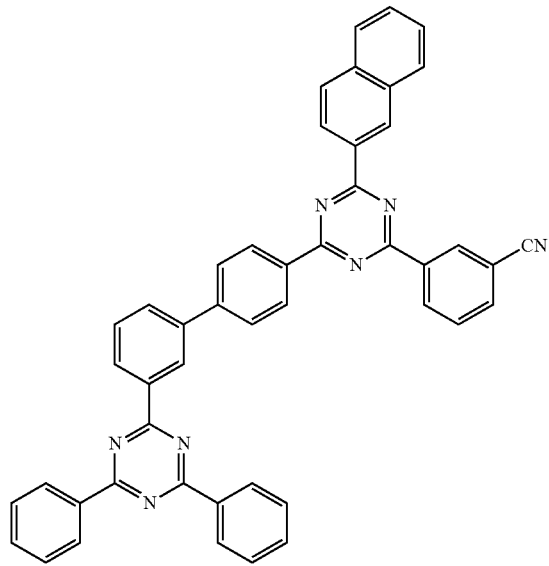
A-110
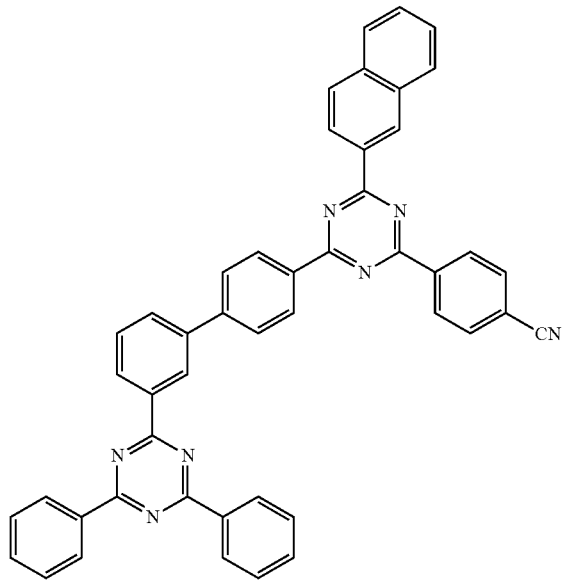
A-111
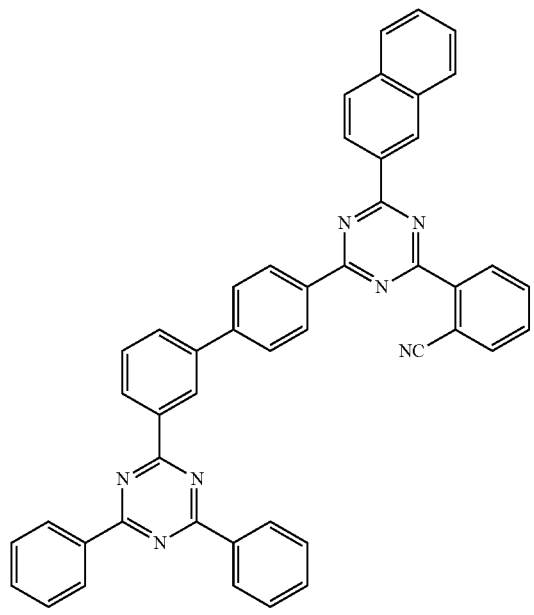
A-112
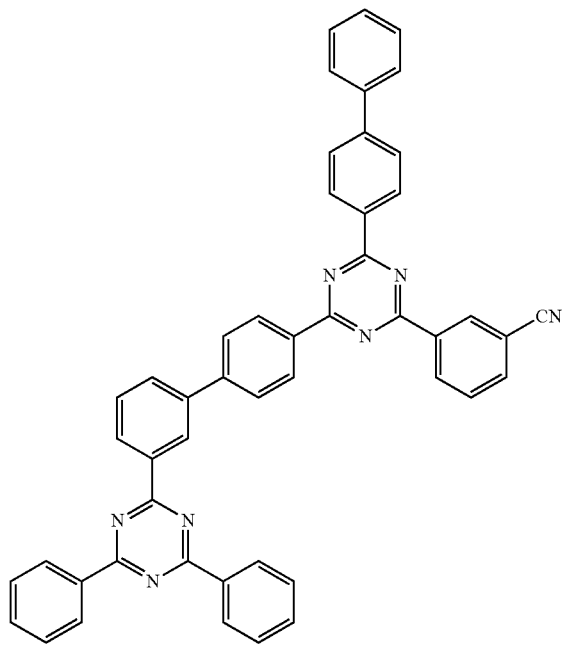

-continued
A-113
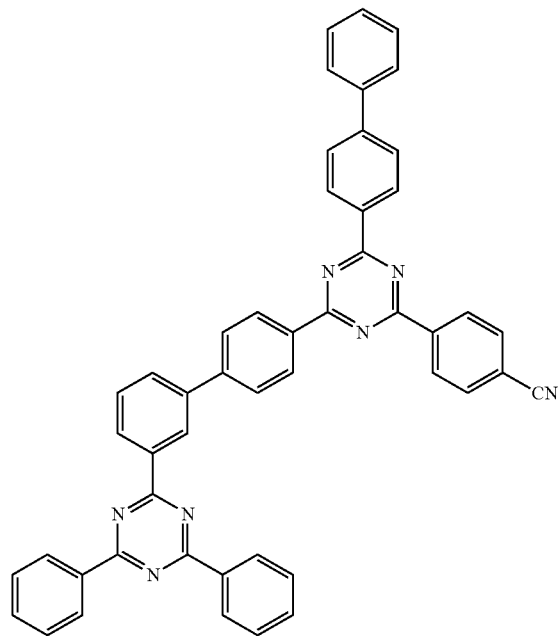
A-114
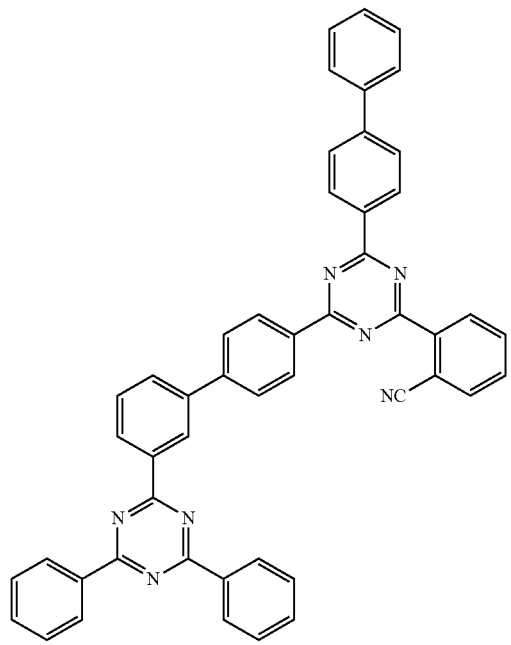
A-115
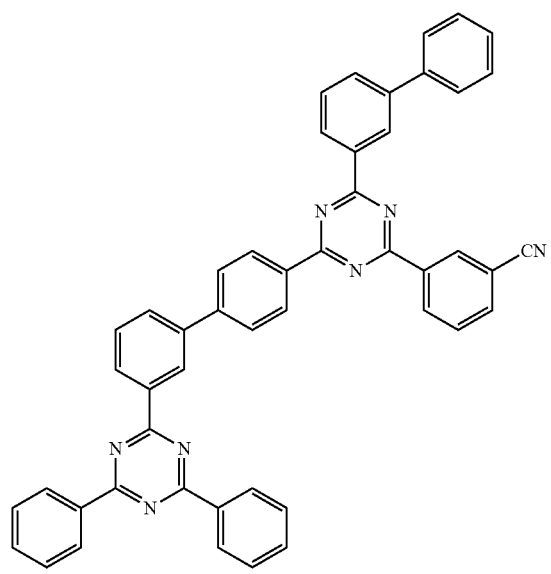
A-116
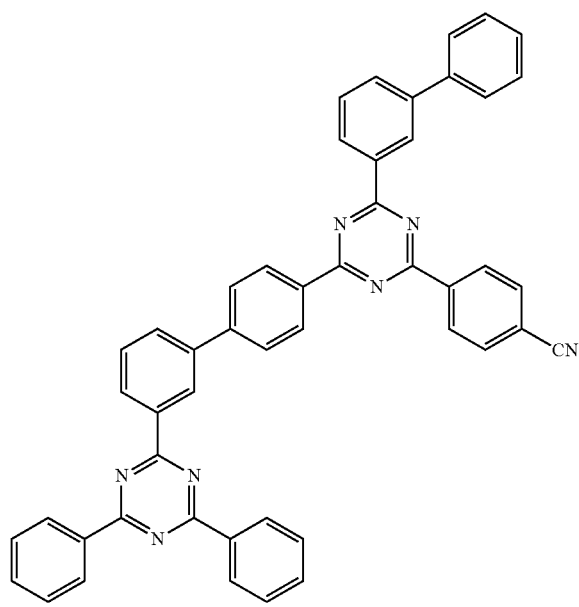

-continued
A-117
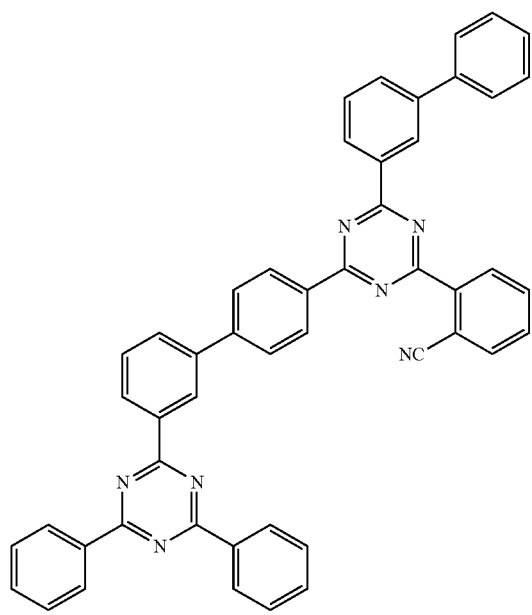
A-118
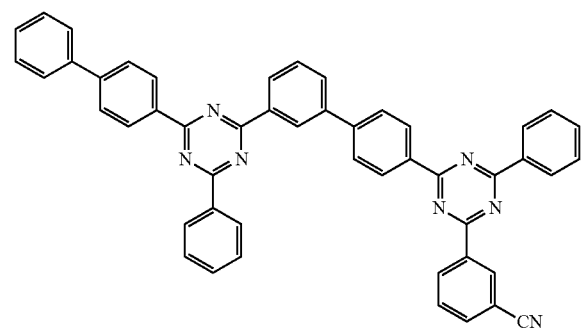
A-119
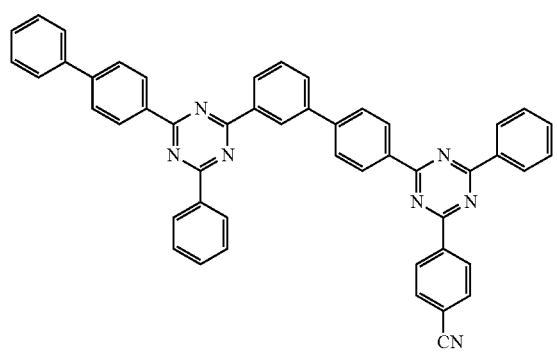
A-120
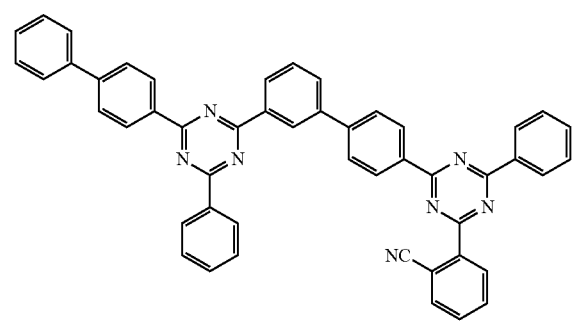
A-121
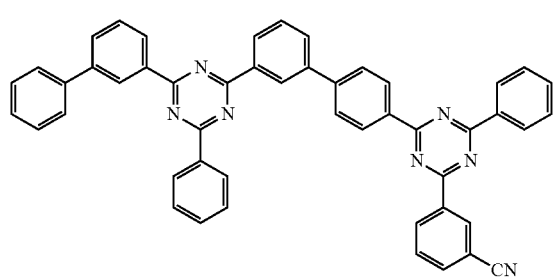
A-122
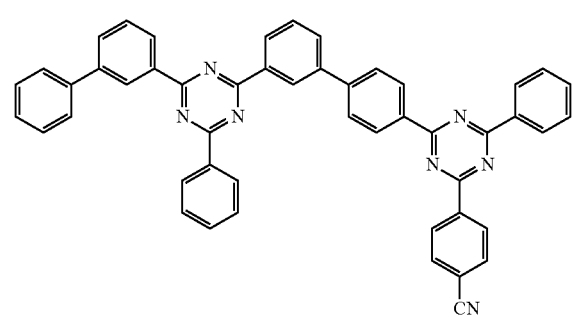
A-123
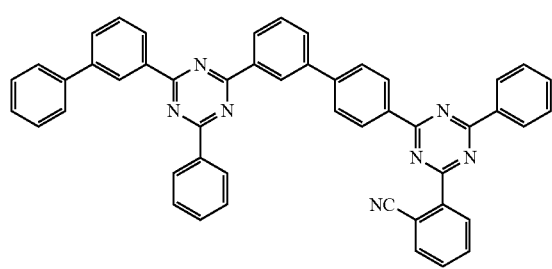
A-124
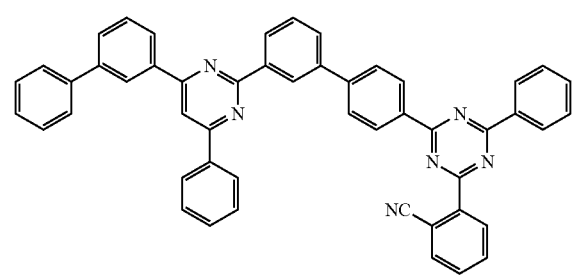

-continued

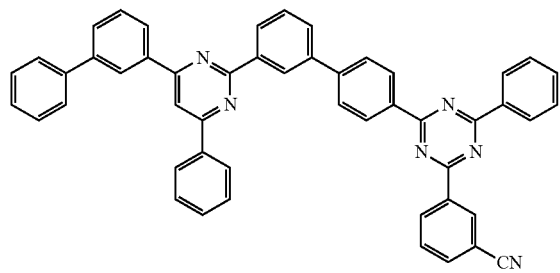

A-125

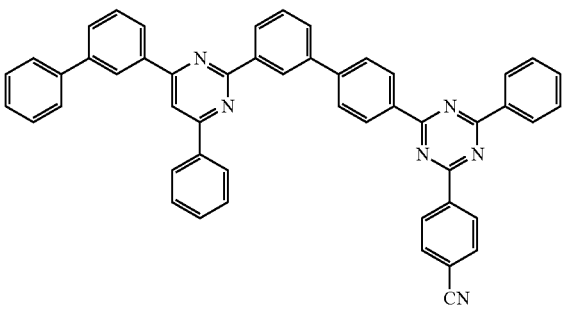

A-126

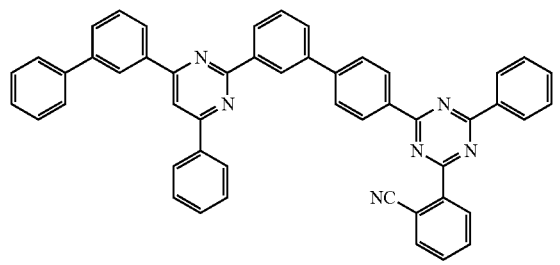

A-127

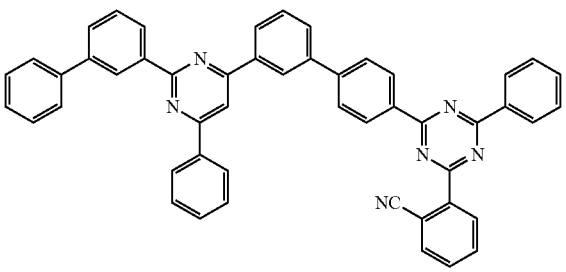

A-128

A composition for the organic optoelectronic device according to an embodiment may include a first compound for an organic optoelectronic device and a second compound for an organic optoelectronic device. In an implementation, the composition may include a mixture of the first compound and the second compound. The first compound may be the compound for the organic optoelectronic device described above and the second compound may be represented by Chemical Formula 2; or a combination of Chemical Formula 3 and Chemical Formula 4.

[Chemical Formula 2]

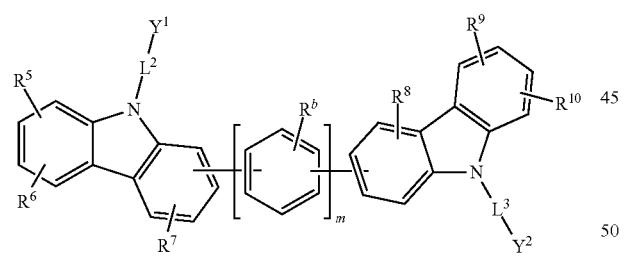

In Chemical Formula 2, $Y^1$ and $Y^2$ may each independently be or include, e.g., a substituted or unsubstituted C6 to C20 aryl group or a substituted or unsubstituted C2 to C30 heterocyclic group.

$L^2$ and $L^3$ may each independently be or include, e.g., a single bond or a substituted or unsubstituted C6 to C20 arylene group, $R^b$ and $R^5$ to $R^{10}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, a substituted or unsubstituted C2 to C30 heterocyclic group.

m may be an integer of 0 to 2;

[Chemical Formula 3]

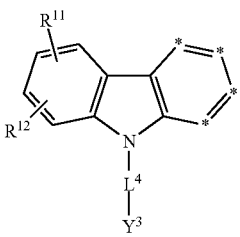

[Chemical Formula 4]

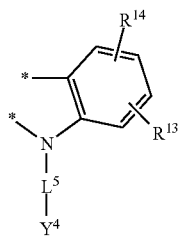

In Chemical Formulae 3 and 4, $Y^3$ and $Y^4$ may each independently be or include, e.g., a substituted or unsubstituted C6 to C20 aryl group or a substituted or unsubstituted C2 to C30 heterocyclic group.

Two adjacent *s in Chemical Formula 3 are linked to Chemical Formula 4, and *s in Chemical Formula 3 not linked to Chemical Formula 4 are independently C-$L^a$-$R^c$.

$L^a$, $L^4$, and $L^5$ may each independently be or include, e.g., a single bond or a substituted or unsubstituted C6 to C20 arylene group, and $R^c$ and $R^{11}$ to $R^{14}$ may each independently be or include, e.g., hydrogen, deuterium, a cyano group, a halogen, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

The second compound may be used or included in a light emitting layer together with the first compound to help increase charge mobility and stability, thereby improving luminous efficiency and life-span characteristics.

In an implementation, $Y^1$ and $Y^2$ of Chemical Formula 2 may each independently be or include, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted triphenylenyl group, a substituted or unsubstituted carbazolyl group, a substituted or unsubstituted dibenzothiophenyl group, a substituted or unsubstituted dibenzofuranyl group, a substituted or unsubstituted fluorenyl group, or a substituted or unsubstituted pyridinyl group.

In an implementation, $L^2$ and $L^3$ of Chemical Formula 2 may each independently be or include, e.g., be a single bond, a substituted or unsubstituted phenylene group, or a substituted or unsubstituted biphenylene group.

In an implementation, $R^5$ to $R^{10}$ of Chemical Formula 2 may each independently be or include, e.g., hydrogen, deuterium, or a substituted or unsubstituted C6 to C12 aryl group.

In an implementation, m may be 0 or 1.

For example, "substituted" of Chemical Formula 2 may refer to replacement of at least one hydrogen by deuterium, a C1 to C4 alkyl group, a C6 to C18 aryl group, or a C2 to C30 heteroaryl group.

In an implementation, the compound represented by Chemical Formula 2 may be represented by one of Chemical Formula 2-1 to Chemical Formula 2-15.

[Chemical Formula 2-1]

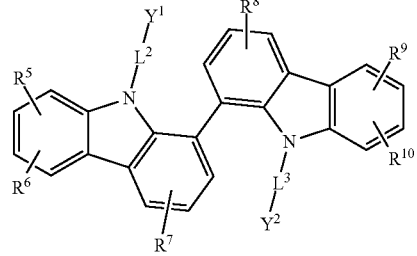

[Chemical Formula 2-2]

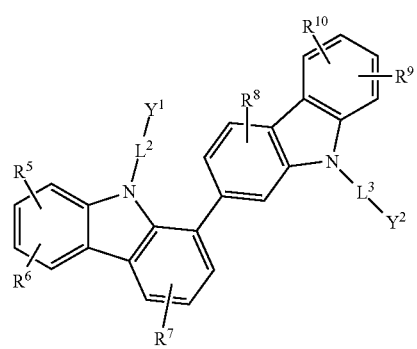

[Chemical Formula 2-3]

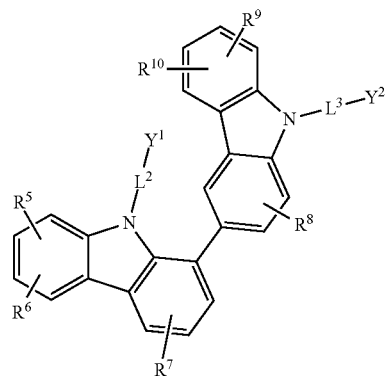

[Chemical Formula 2-4]

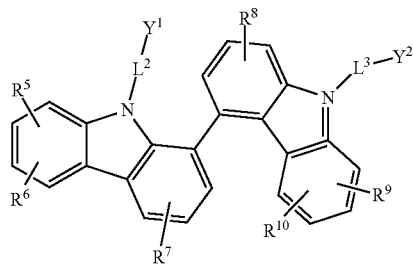

[Chemical Formula 2-5]

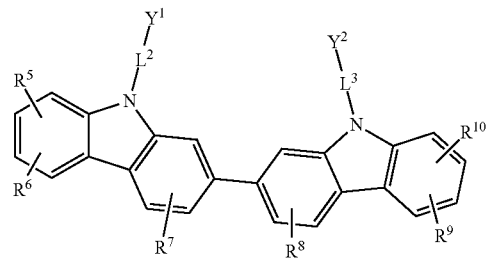

[Chemical Formula 2-6]

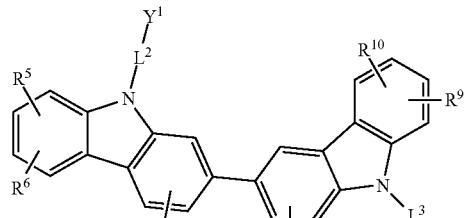

[Chemical Formula 2-7]

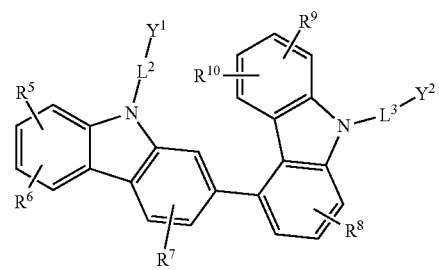

[Chemical Formula 2-8]

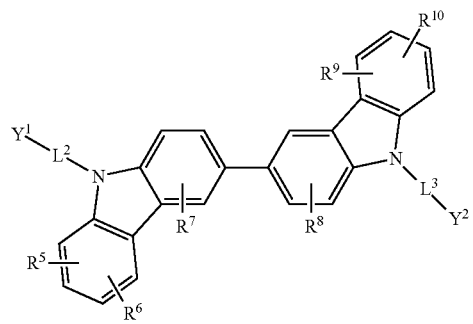

[Chemical Formula 2-9]

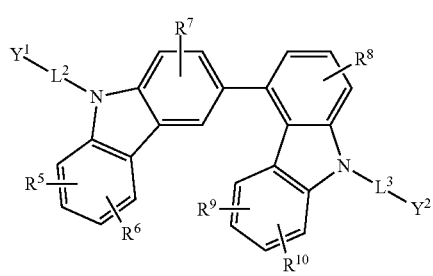

[Chemical Formula 2-10]

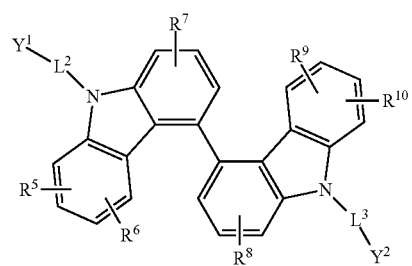

[Chemical Formula 2-11]

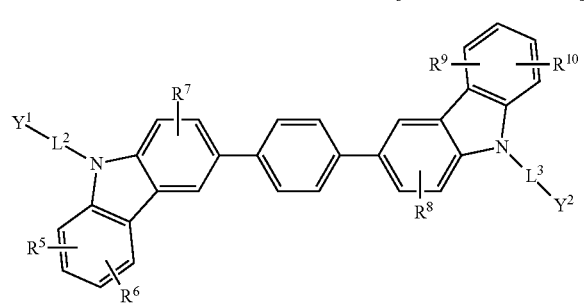

[Chemical Formula 2-12]

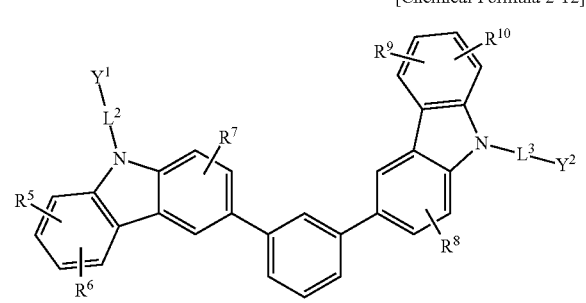

[Chemical Formula 2-13]

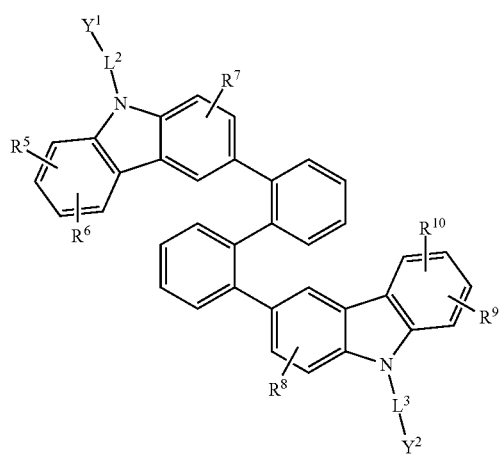

[Chemical Formula 2-14]

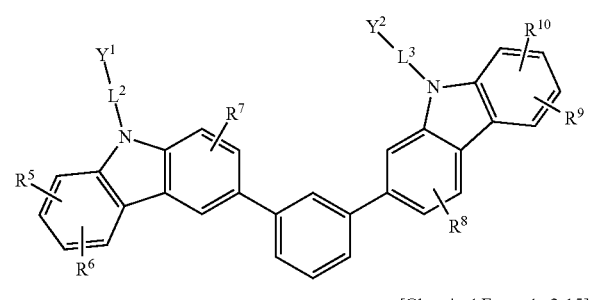

[Chemical Formula 2-15]

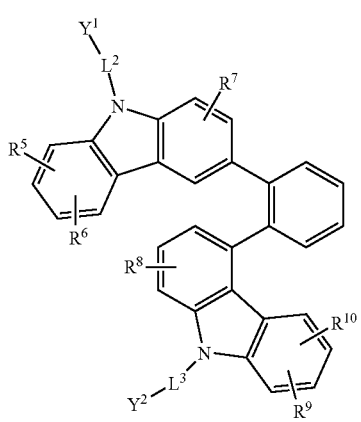

In Chemical Formula 2-1 to Chemical Formula 2-15, $R^5$ to $R^{10}$ may each independently be or include, e.g., hydrogen or a substituted or unsubstituted C6 to C12 aryl group. *-$L^2$-$Y^1$ and *-$L^3$-$Y^2$ may each independently be a moiety of Group II.

[Group II]

D-1

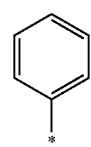

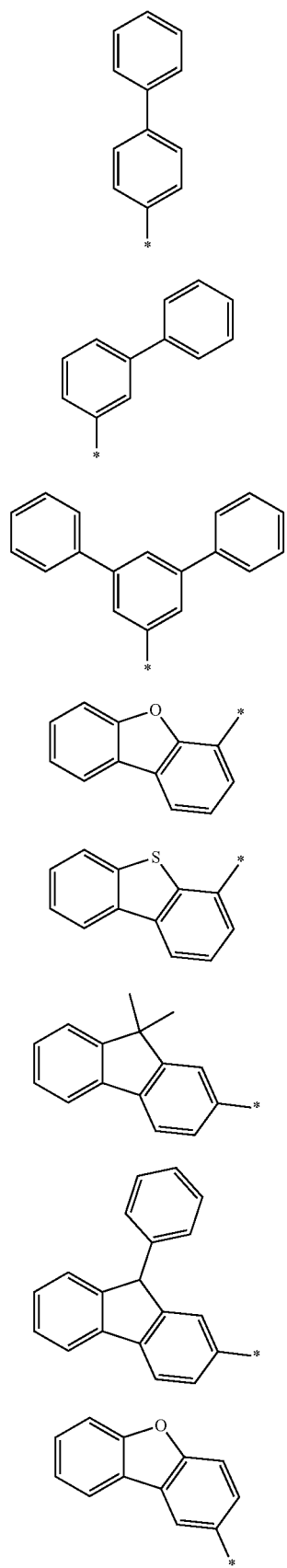
D-2
D-3
D-4
D-5
D-6
D-7
D-8
D-9
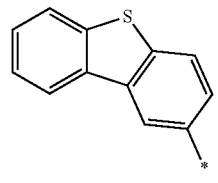
D-10
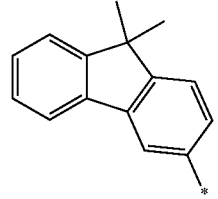
D-11
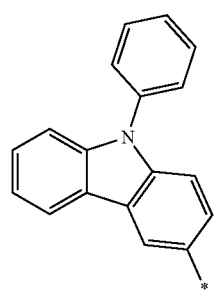
D-12
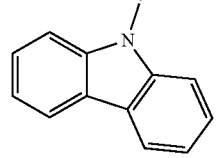
D-13
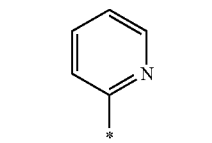
D-14
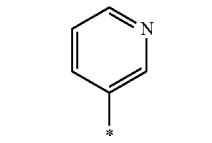
D-15
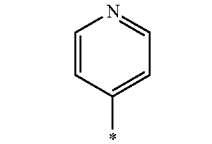
D-16
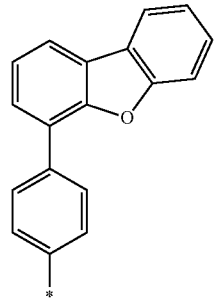
D-17

D-18
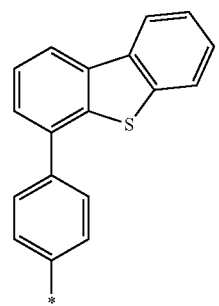
D-19
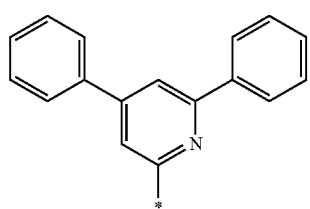
D-20
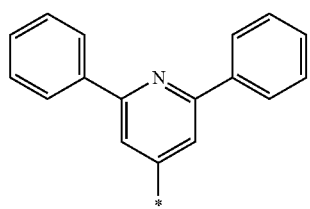
D-21
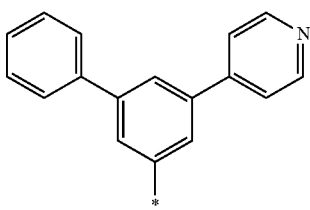
D-22
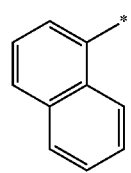
D-23
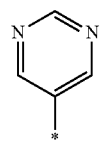
D-24
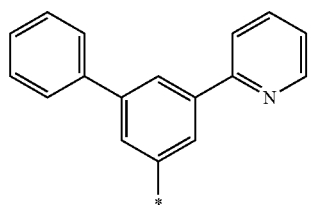
D-25
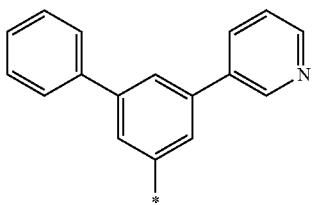
D-26
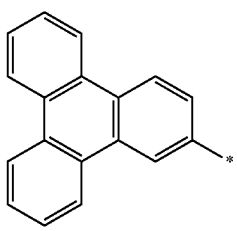
D-27
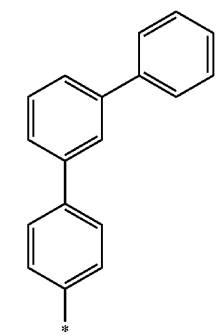
D-28
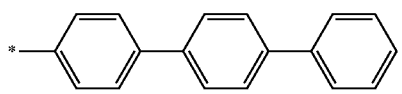
D-29
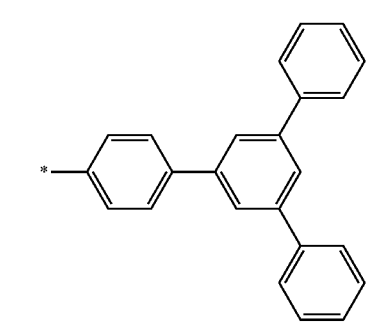
D-30
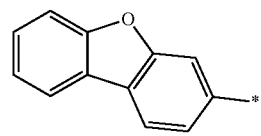
D-31
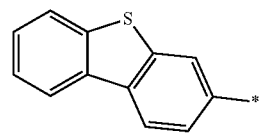

-continued

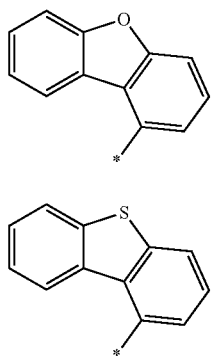

D-32

D-33

In Group II, * is a linking point.

In an implementation, the compound represented by Chemical Formula 2 may be represented by Chemical Formula 2-8.

In an implementation, *-$L^2$-$Y^1$ and *-$L^3$-$Y^2$ of Chemical Formula 2-8 may each independently be a moiety of Group II, e.g., D-1, D-2, or D-3.

In an implementation, both *-$L^2$-$Y^1$ and *-$L^3$-$Y^2$ may be D-2 of Group II.

In an implementation, the second compound represented by the combination of Chemical Formula 3 and Chemical Formula 4 may be represented by Chemical Formula 3A, Chemical Formula 3B, Chemical Formula 3C, Chemical Formula 3D, or Chemical Formula 3E.

[Chemical Formula 3A]

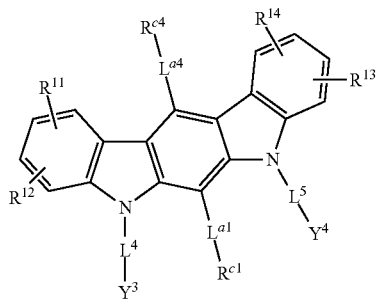

[Chemical Formula 3B]

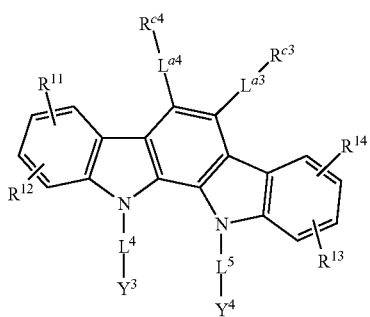

[Chemical Formula 3C]

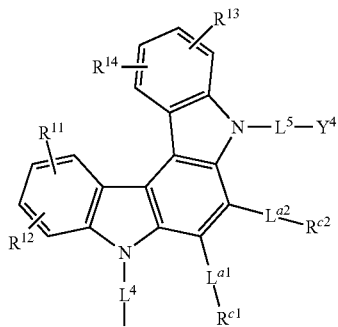

[Chemical Formula 3D]

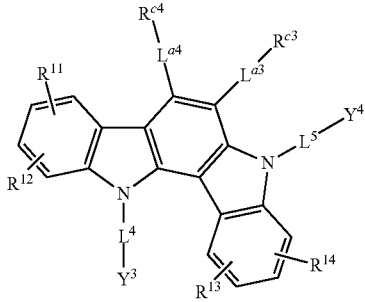

[Chemical Formula 3E]

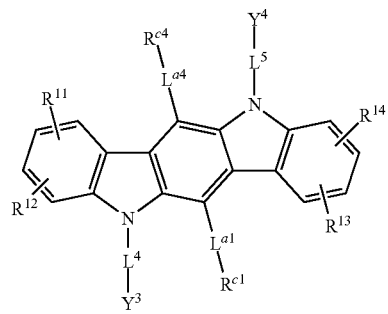

In Chemical Formula 3A to Chemical Formula 3E, $Y^3$ and $Y^4$, $L^4$ and $L^5$, and $R^{11}$ to $R^{14}$ may be defined the same as described above, $L^{a1}$ to $L^{a4}$ may be defined the same as $L^4$ and $L^5$, and $R^{c1}$ to $R^{c4}$ may be defined the same as $R^{11}$ to $R^{14}$.

In an implementation, $Y^3$ and $Y^4$ of Chemical Formulae 3 and 4 may each independently be or include, e.g., a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{11}$ to $R^{14}$ may each independently be or include, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $Y^3$ and $Y^4$ of Chemical Formulae 3 and 4 may each independently be a group of Group III.

[Group III]

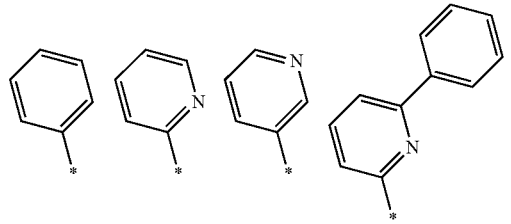
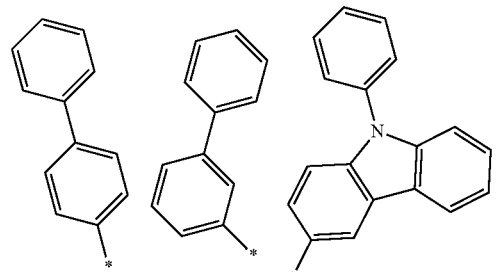
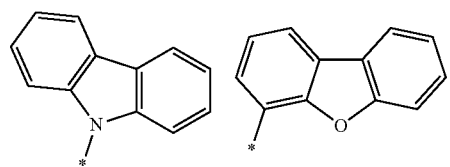
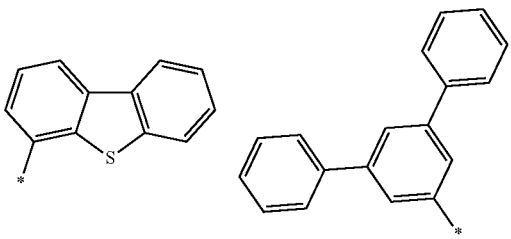
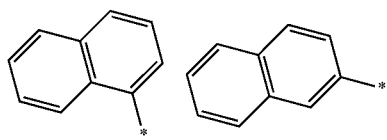
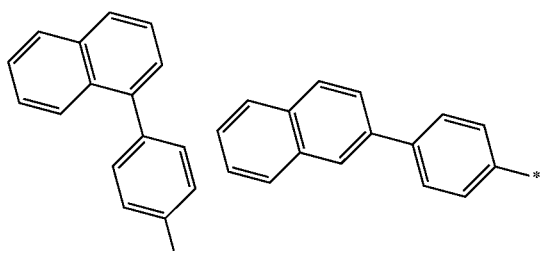
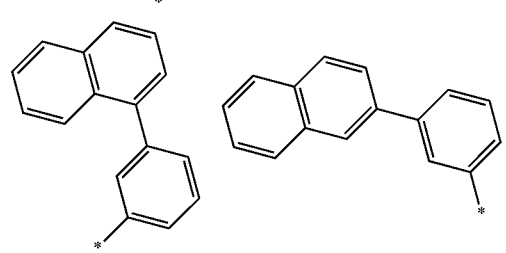

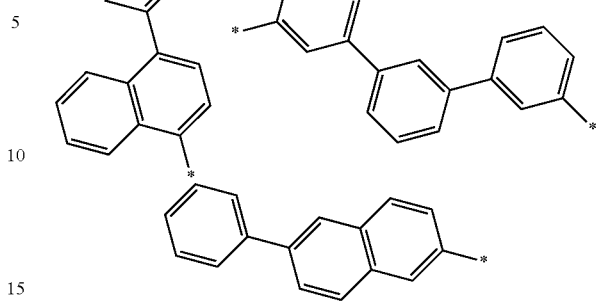

-continued

In Group III, * is each linking point with $L^4$ and $L^5$.

In an implementatione, $R^{c1}$ to $R^{c4}$ and $R^{11}$ to $R^{14}$ may each independently be or include, e.g., hydrogen, deuterium, a cyano group, a substituted or unsubstituted phenyl group, a substituted or unsubstituted biphenyl group, a substituted or unsubstituted pyridinyl group, a substituted or unsubstituted carbazolyl group, a substituted or unsubstituted dibenzofuranyl group, or a substituted or unsubstituted dibenzothiophenyl group.

In an implementation, $R^{c1}$ to $R^{c4}$ and $R^{11}$ to $R^{14}$ may each independently be or include, e.g., hydrogen, deuterium, a cyano group, or a substituted or unsubstituted phenyl group.

In an implementation, $R^{c1}$ to $R^{c4}$ may each be hydrogen, and $R^{11}$ to $R^{14}$ may each independently be hydrogen or an unsubstituted phenyl group.

In an implementation, the second compound for an organic optoelectronic device may be represented by Chemical Formula 3C, and $Y^1$ and $Y^2$ of Chemical Formula 3C may each independently be or include, e.g., a substituted or unsubstituted phenyl group, or a substituted or unsubstituted biphenyl group, $L^4$ and $L^5$ may each independently be or include, e.g., a single bond or a substituted or unsubstituted phenylene group, and $R^{11}$ to $R^{14}$ may each independently be, e.g., hydrogen or an unsubstituted phenyl group.

In an implementation, the second compound for the organic optoelectronic device may be a compound of Group 2.

[Group 2]

[B-1]

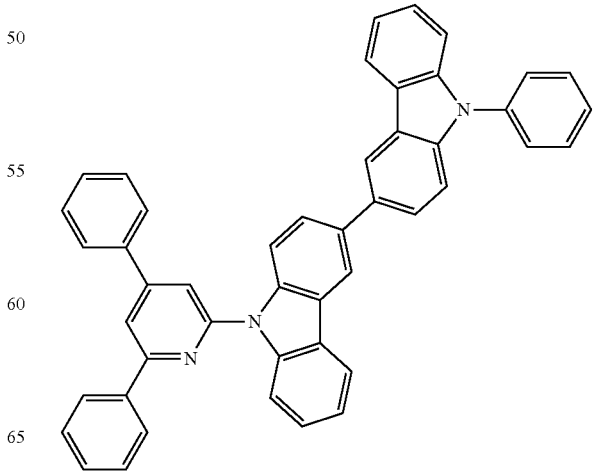

[B-2]
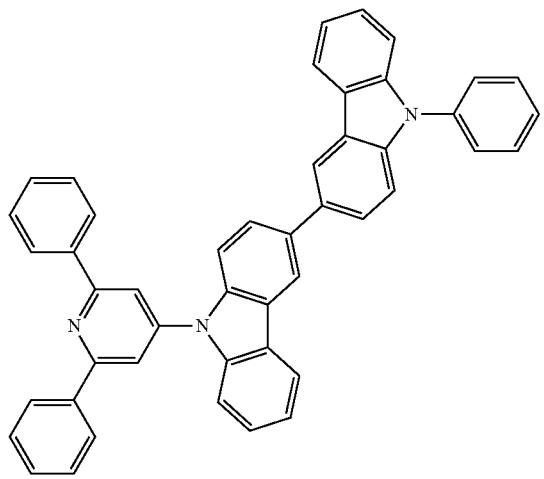
[B-3]
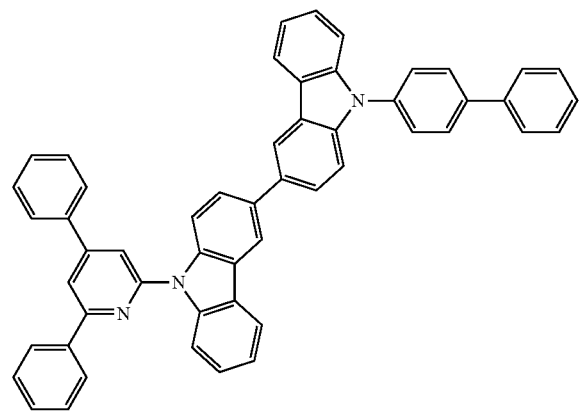
[B-4]
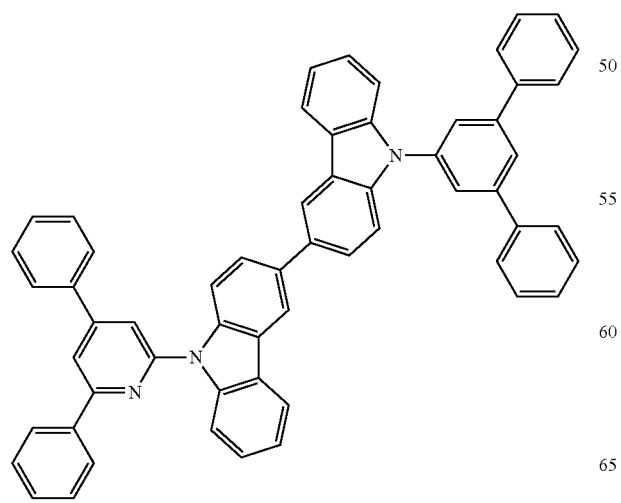
[B-5]
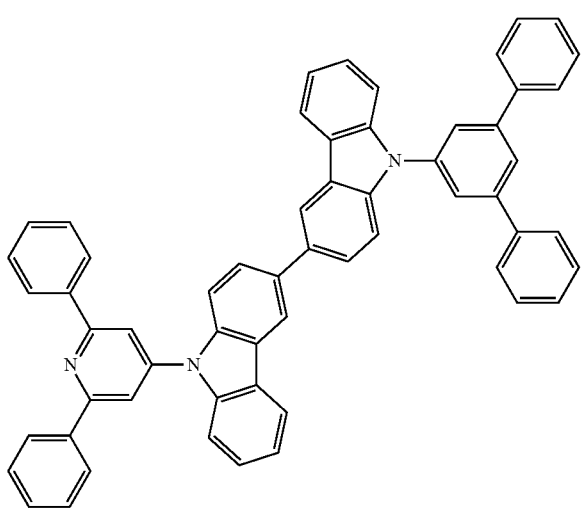
[B-6]
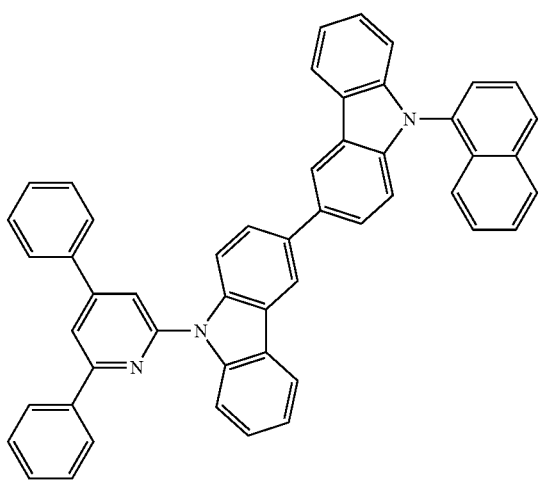
[B-7]
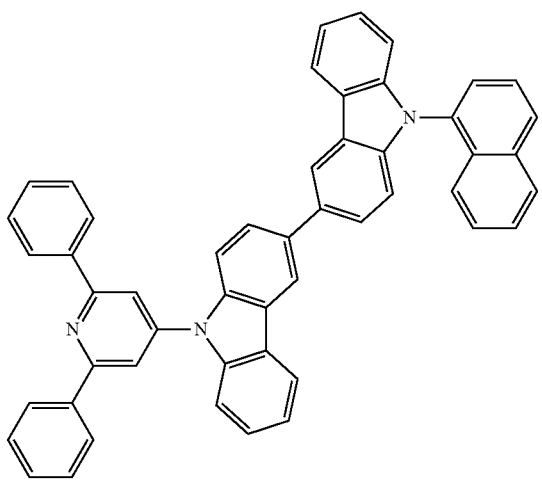

[B-8]
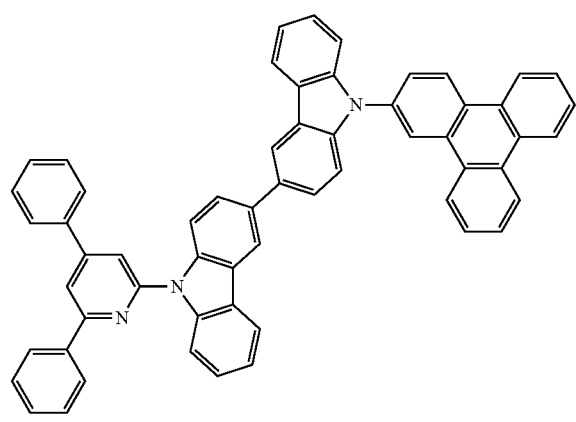
[B-9]
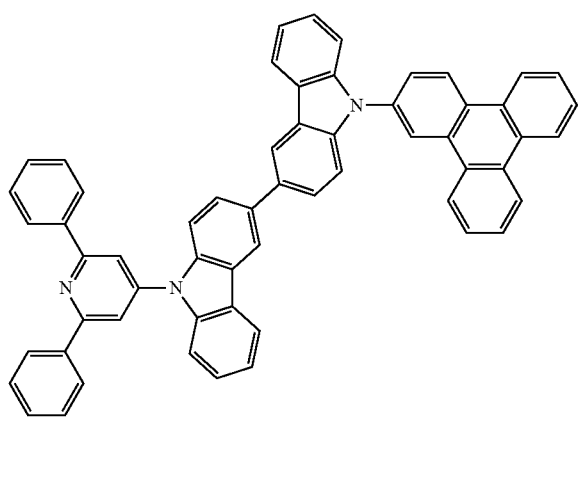
[B-10]
[B-11]
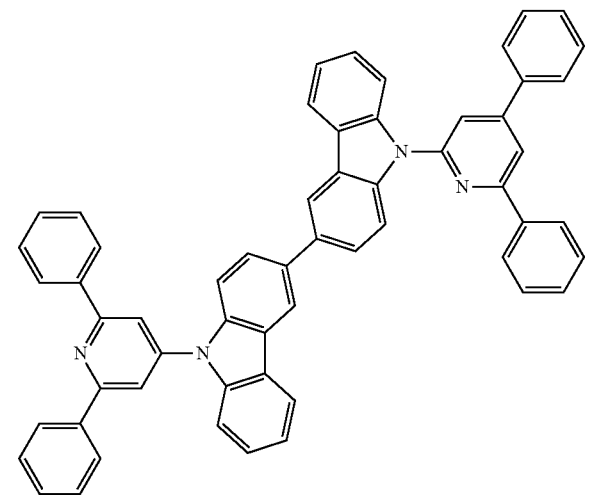
[B-12]
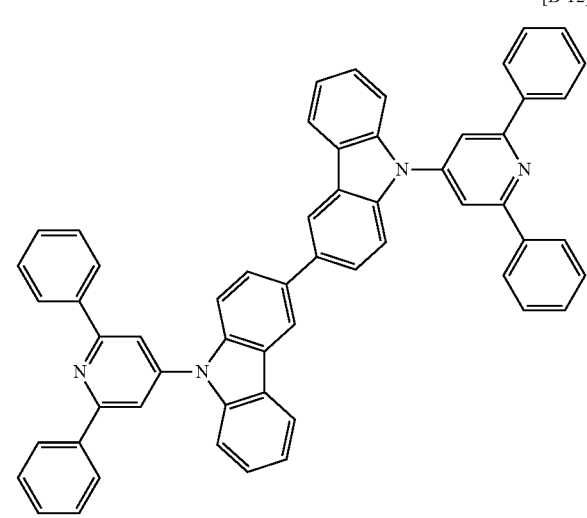
[B-13]
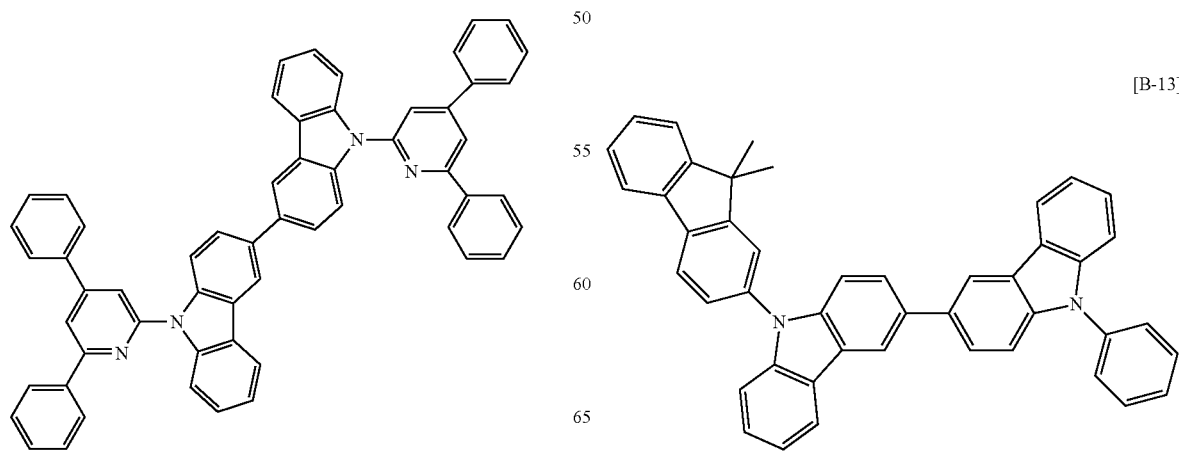

[B-14]
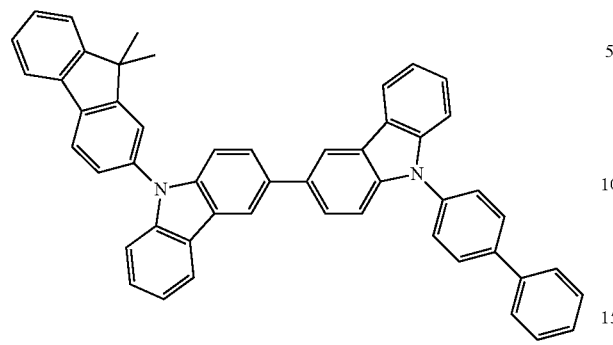
[B-15]
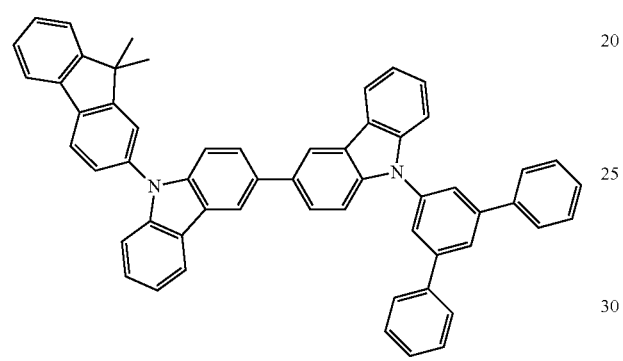
[B-16]
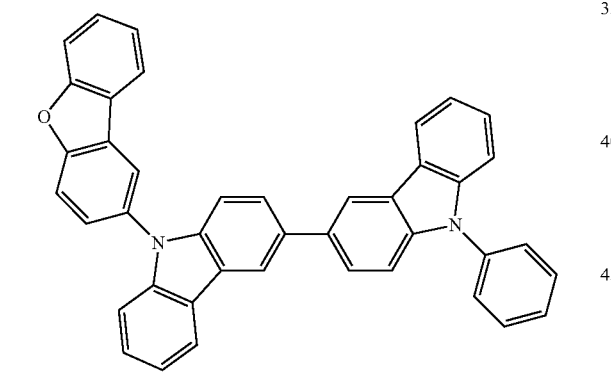
[B-17]
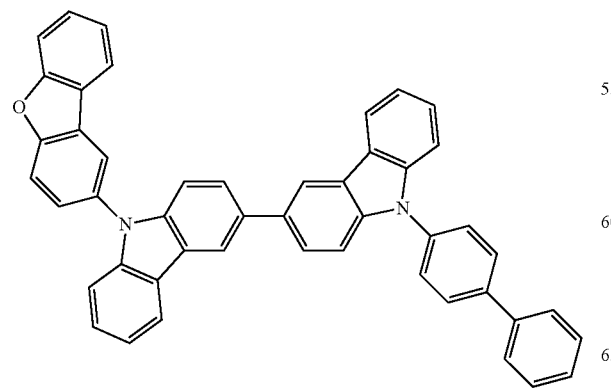
[B-18]
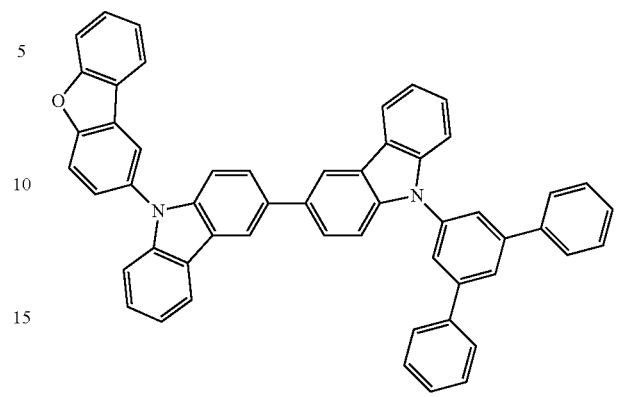
[B-19]
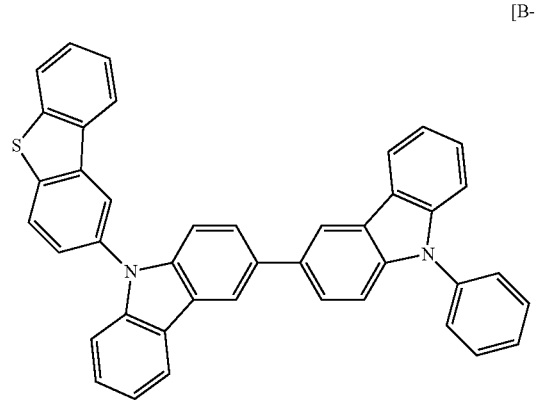
[B-20]
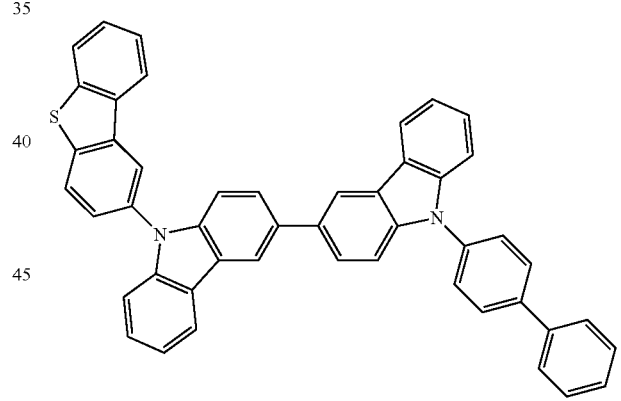
[B-21]
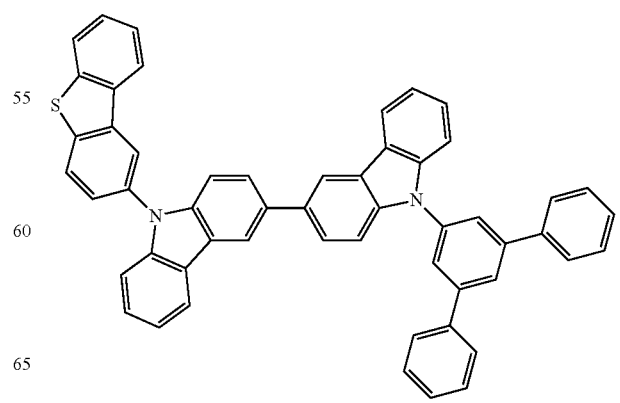

[B-22]
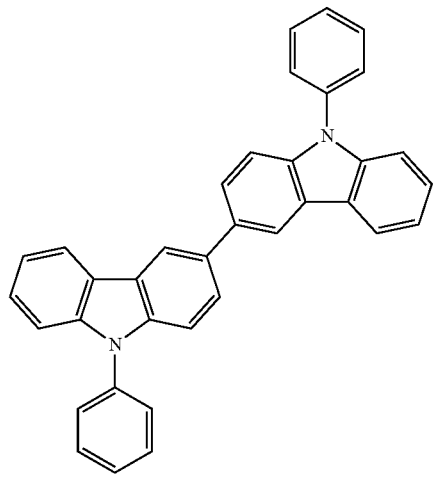
[B-23]
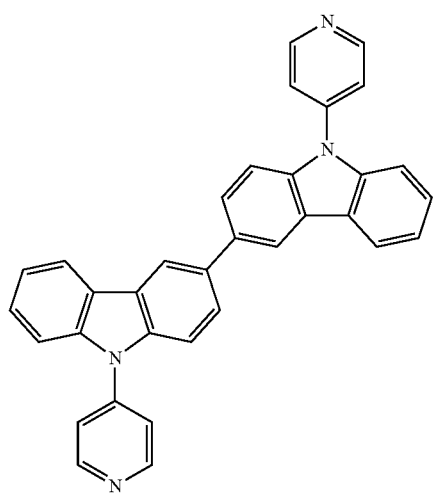
[B-25]
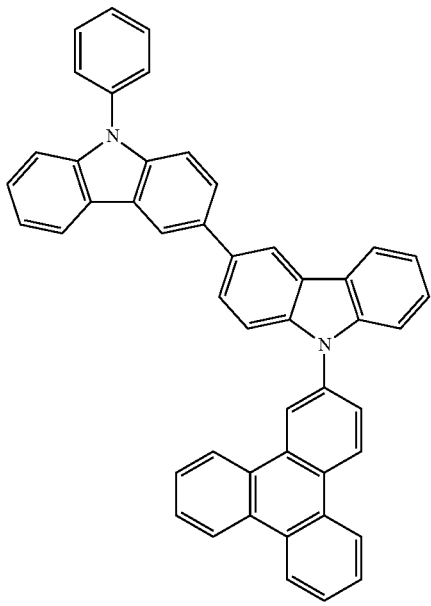
[B-24]
[B-26]
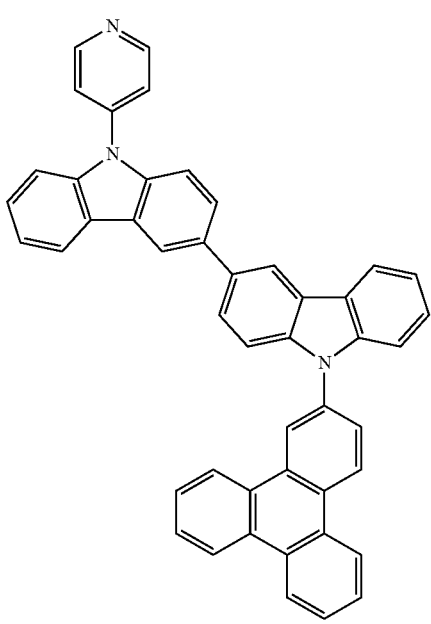

[B-27]
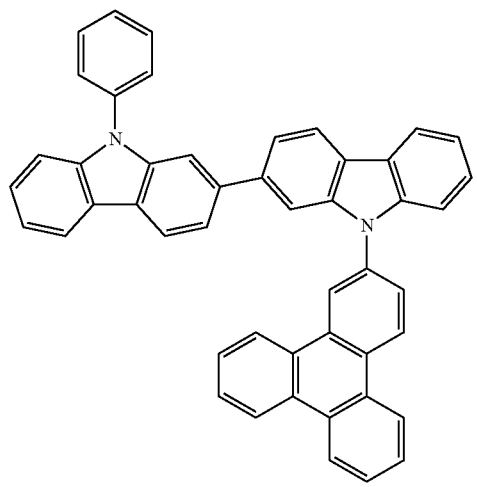
[B-28]
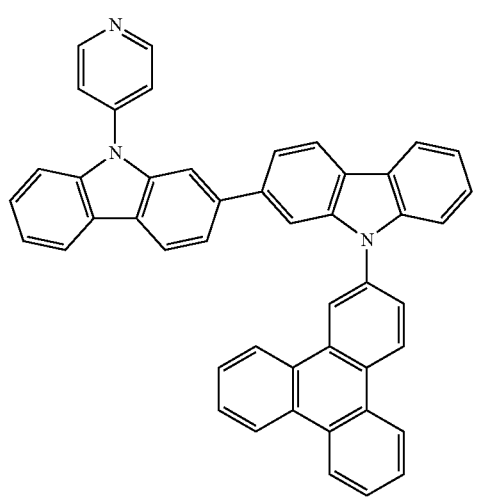
[B-29]
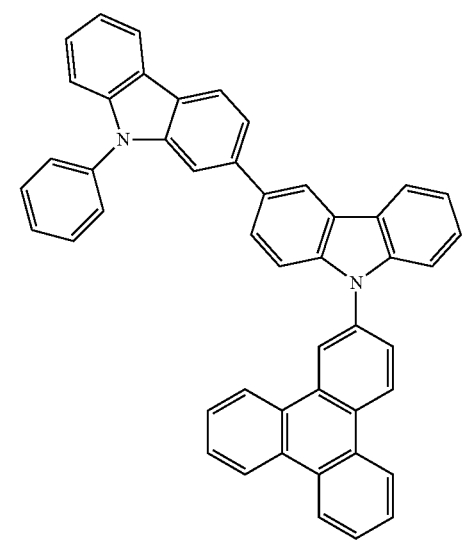
[B-30]
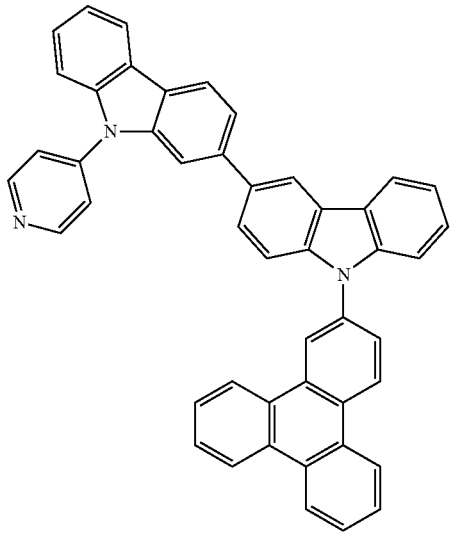
[B-31]
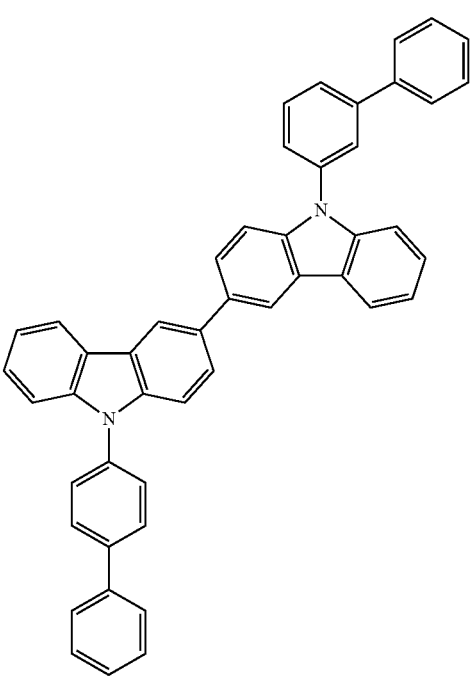

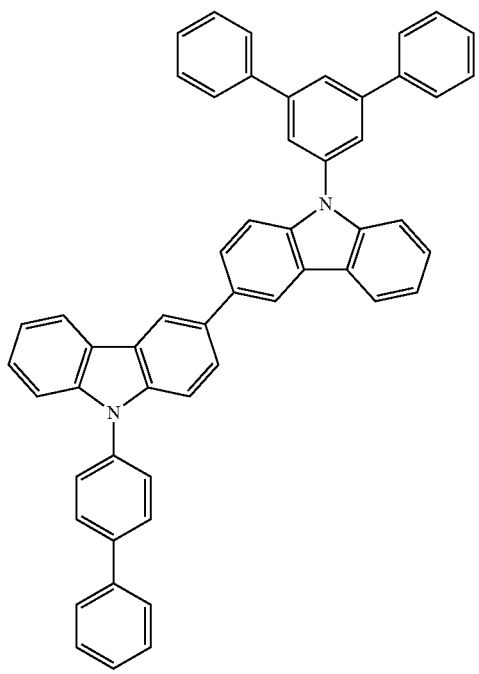
[B-32]
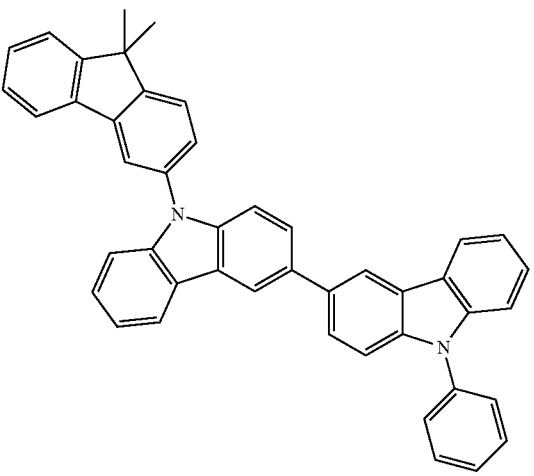
[B-34]
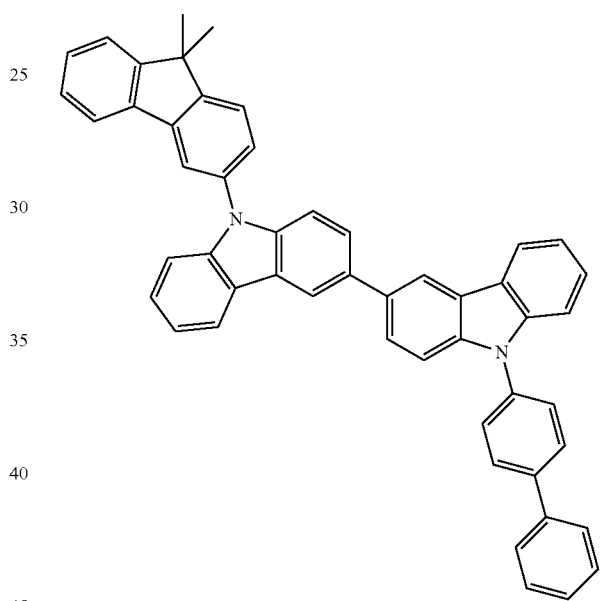
[B-35]
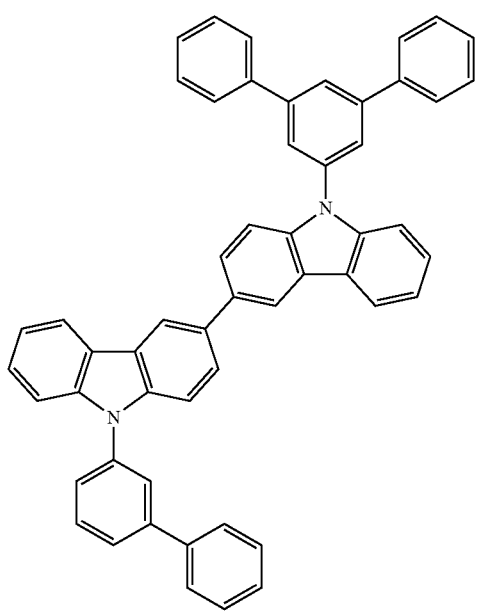
[B-33]
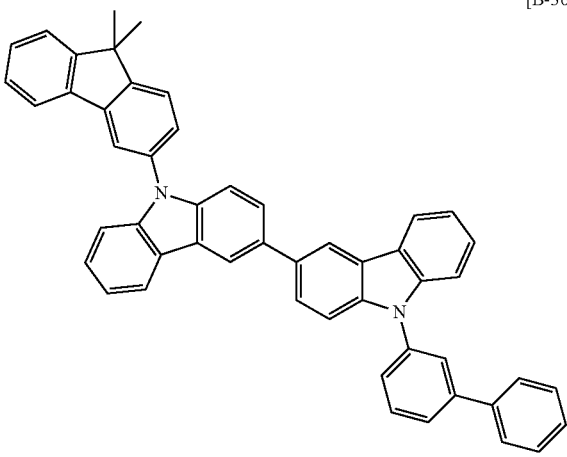
[B-36]

[B-37]
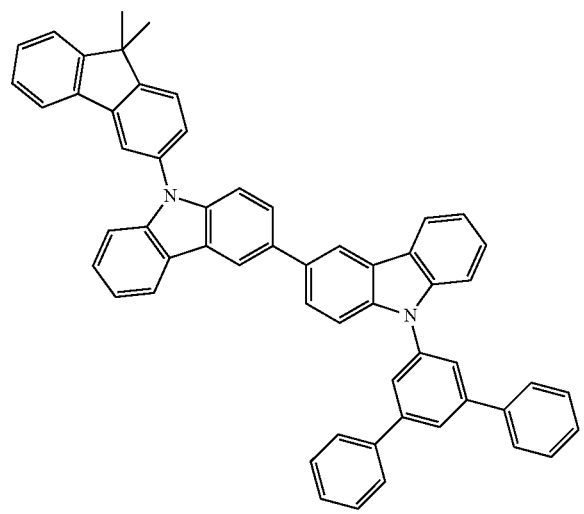
[B-38]
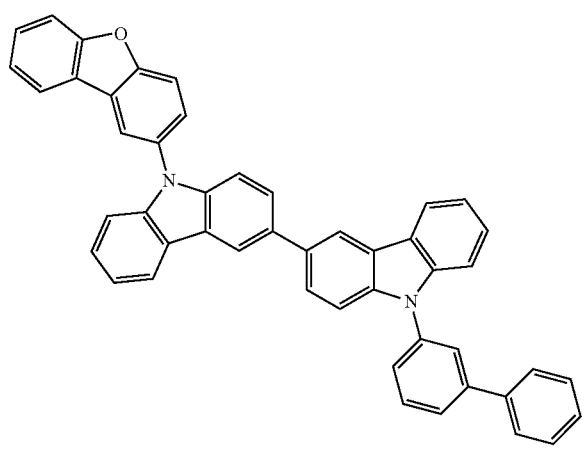
[B-39]
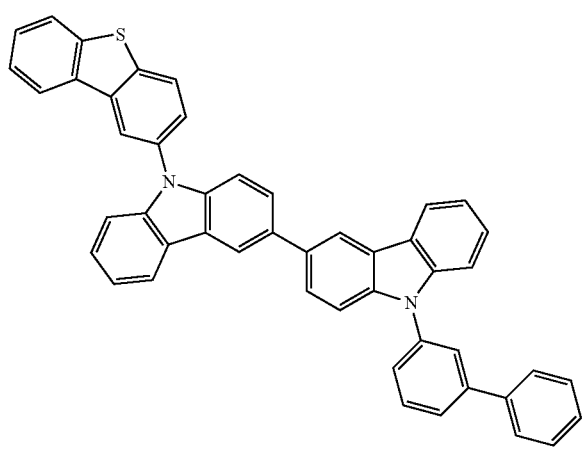
[B-40]
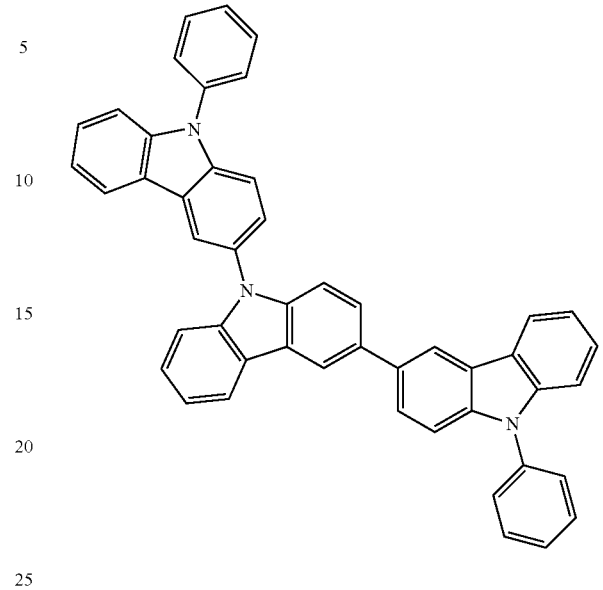
[B-41]
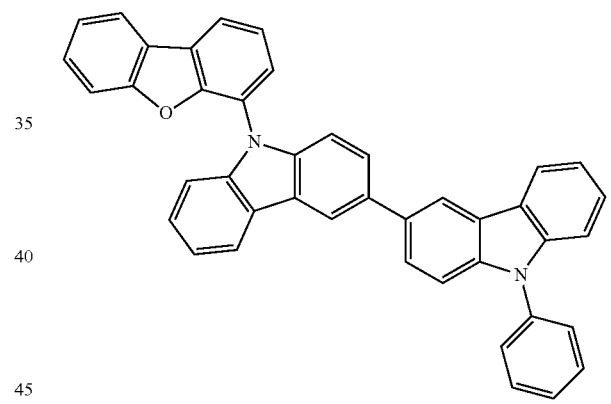
[B-42]
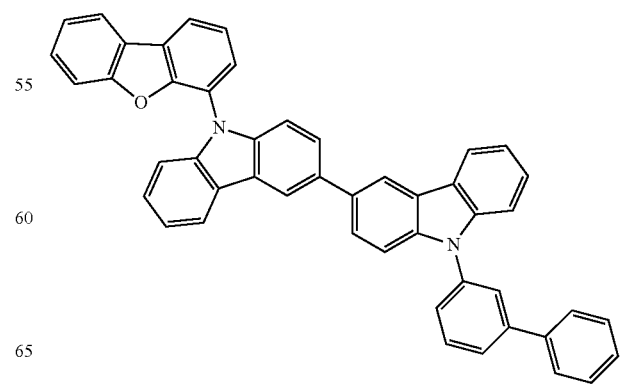

-continued
[B-43]
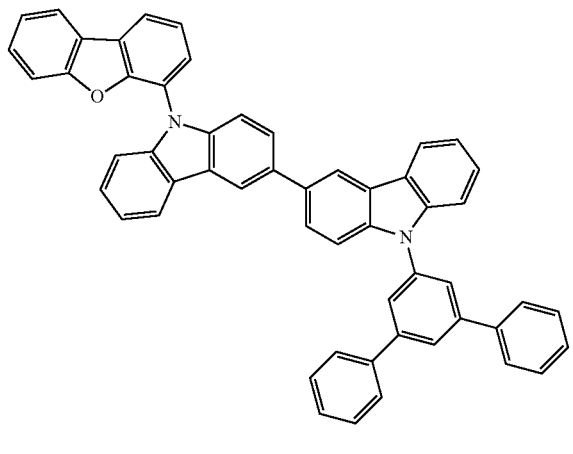
[B-44]
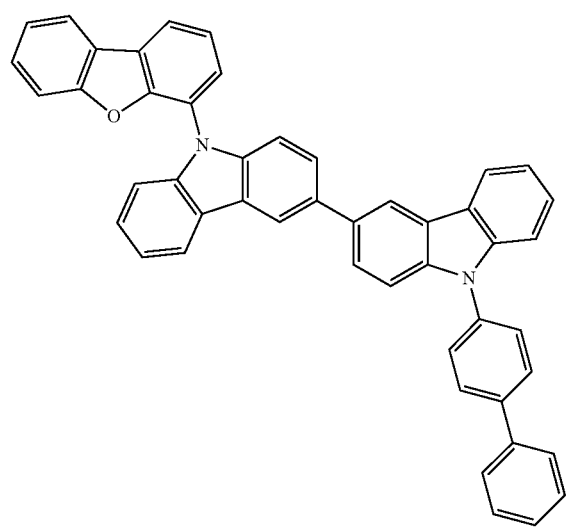
[B-45]
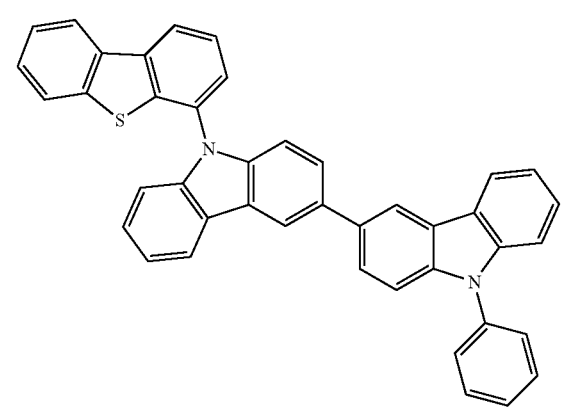
-continued
[B-46]
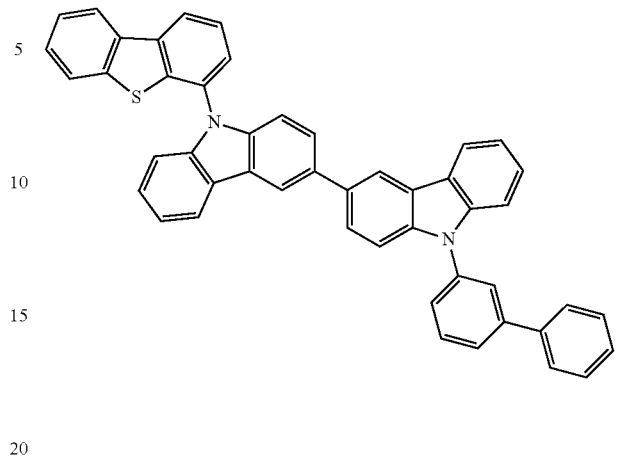
[B-47]
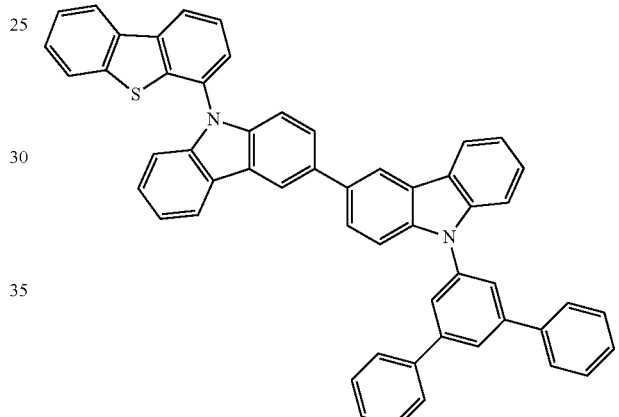
[B-48]
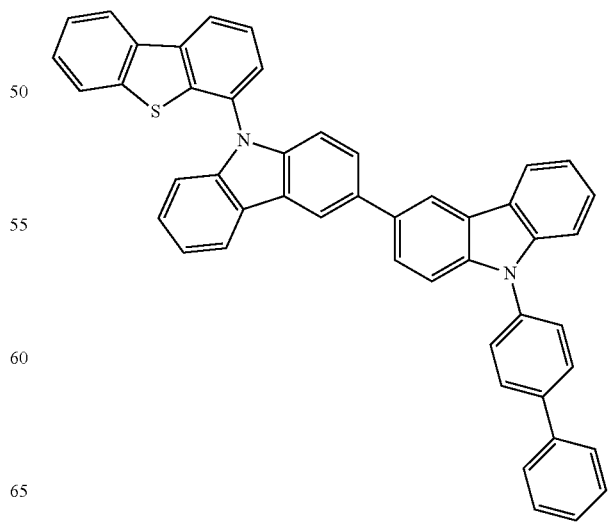

[B-49]
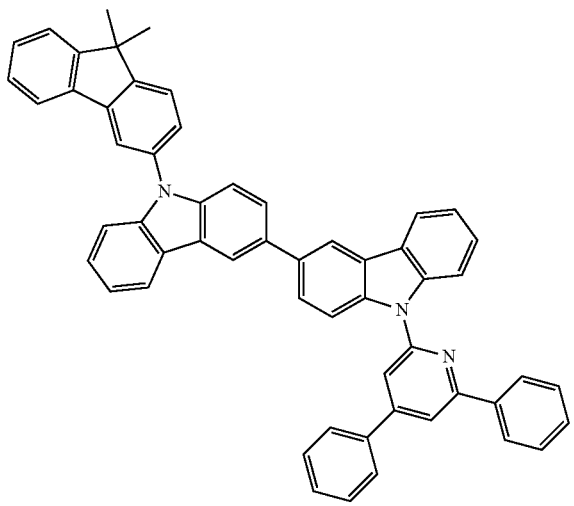
[B-50]
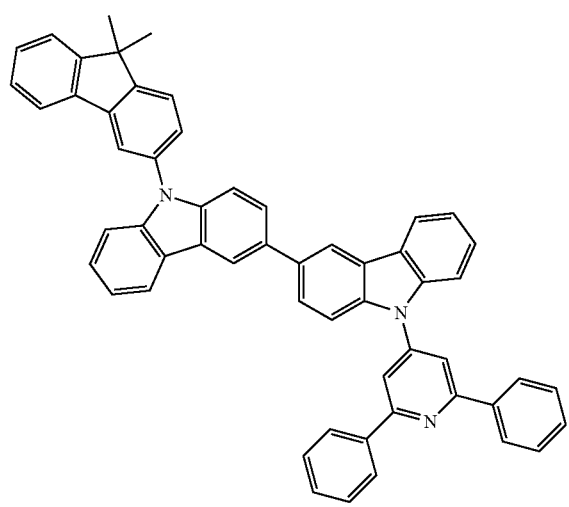
[B-51]
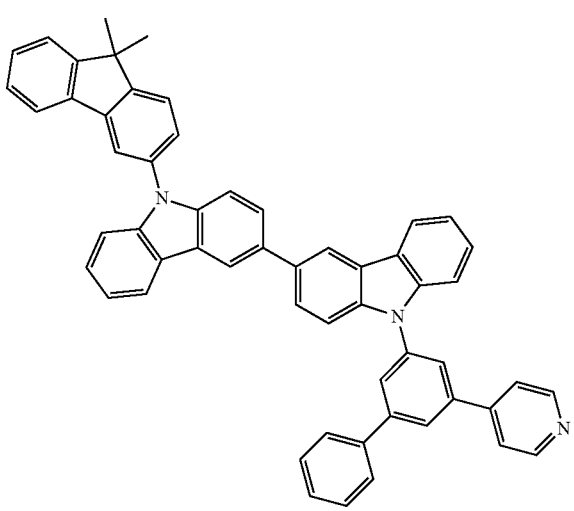
[B-52]
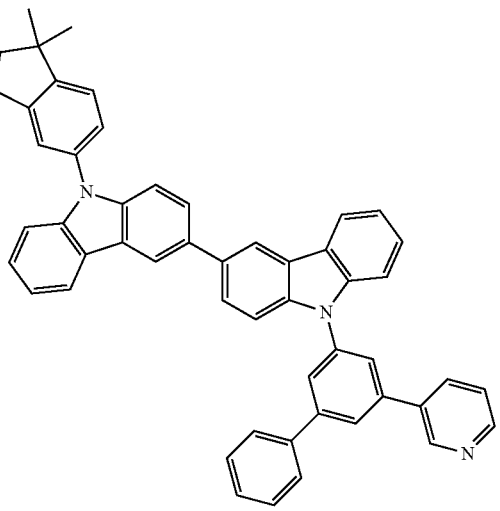
[B-53]
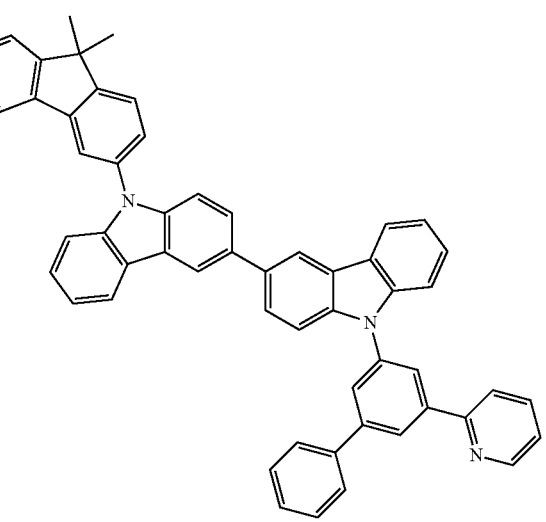
[B-54]
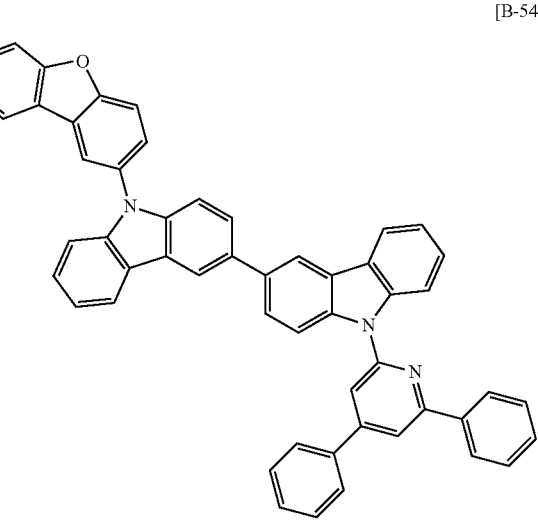

[B-55]
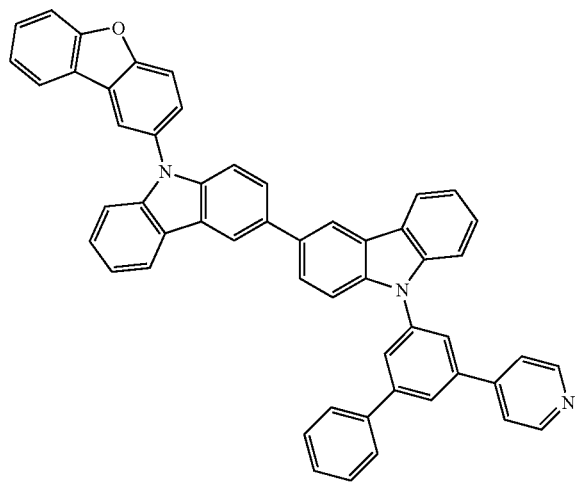
[B-58]
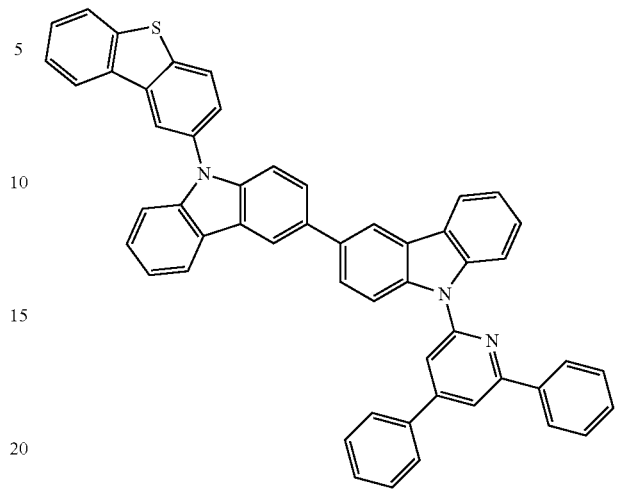
[B-56]
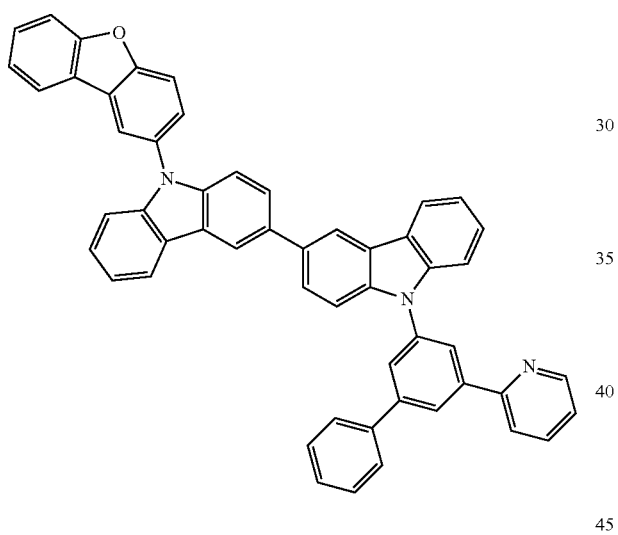
[B-59]
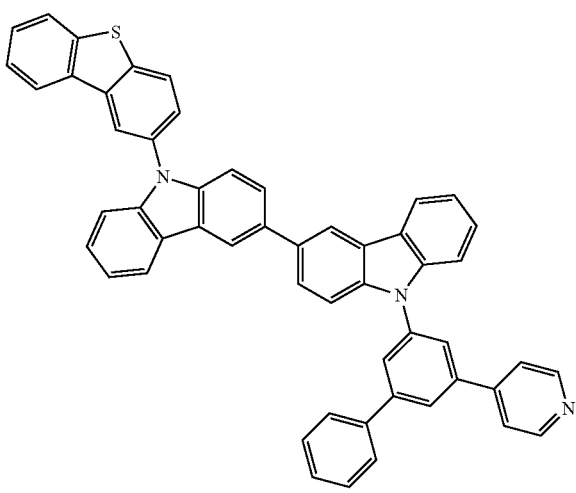
[B-57]
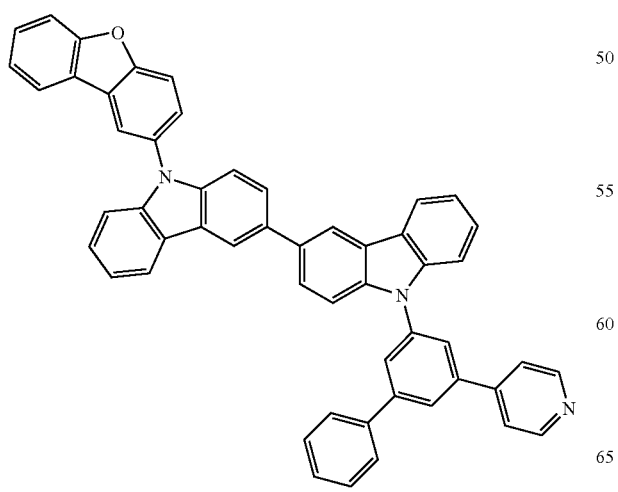
[B-60]
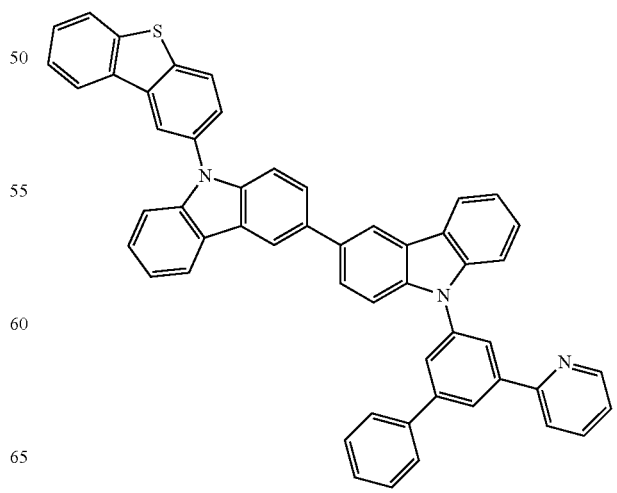

[B-61]
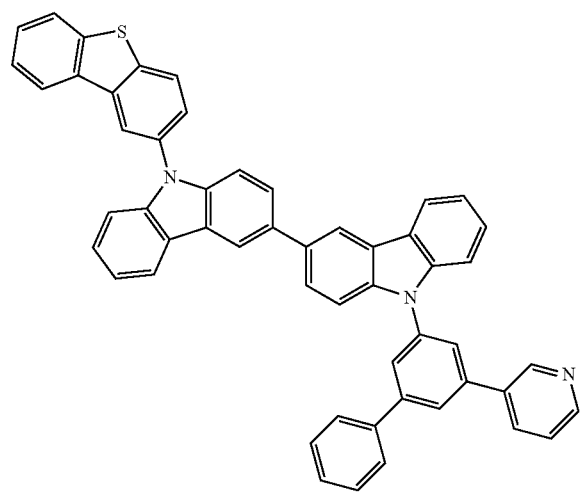
[B-62]
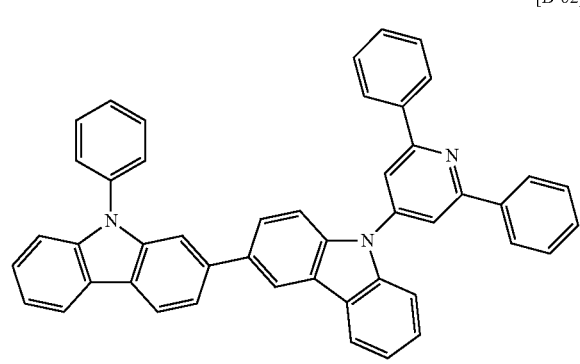
[B-63]
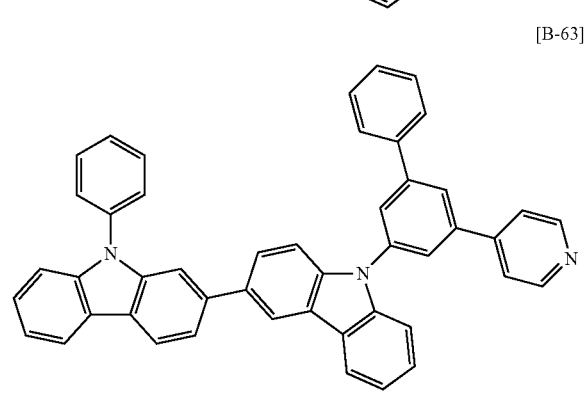
[B-64]
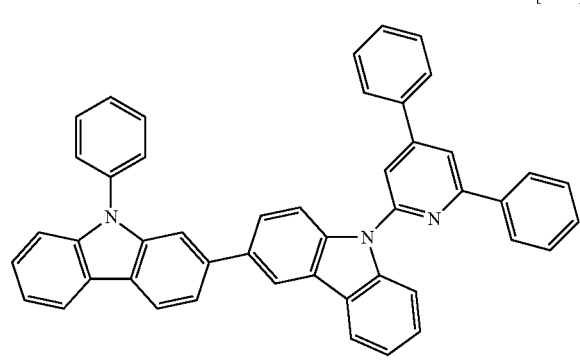
[B-65]
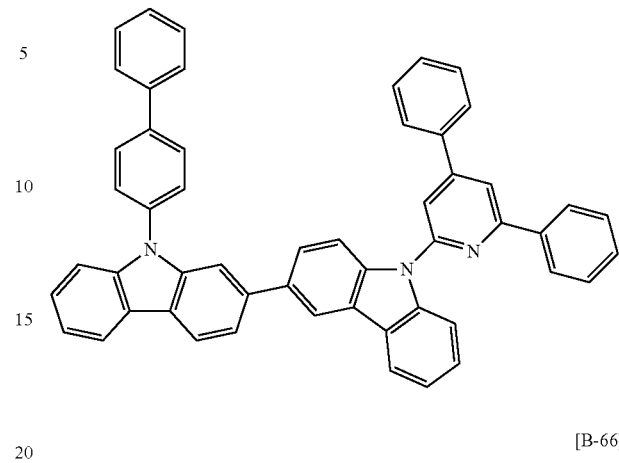
[B-66]
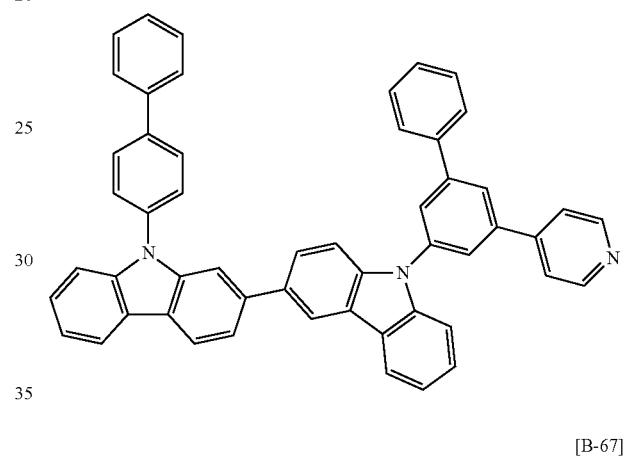
[B-67]
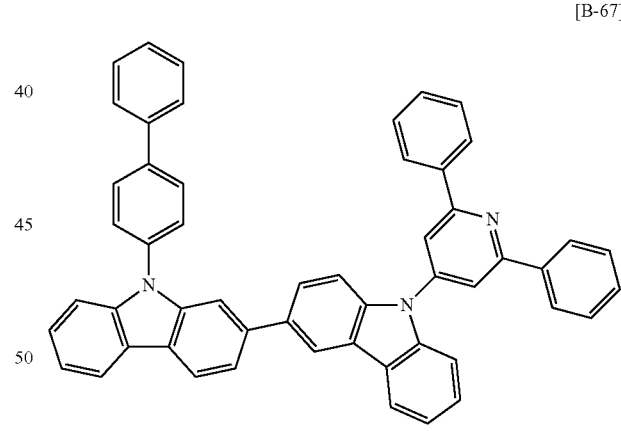
[B-68]
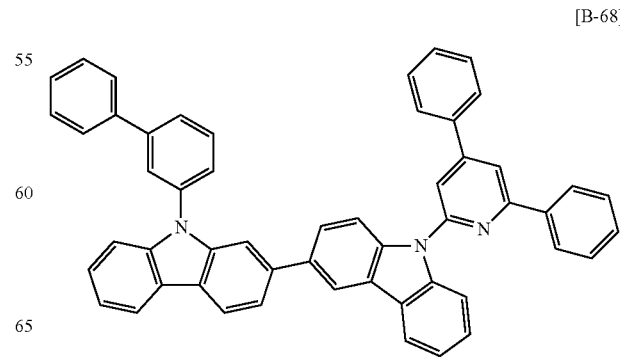

[B-69]
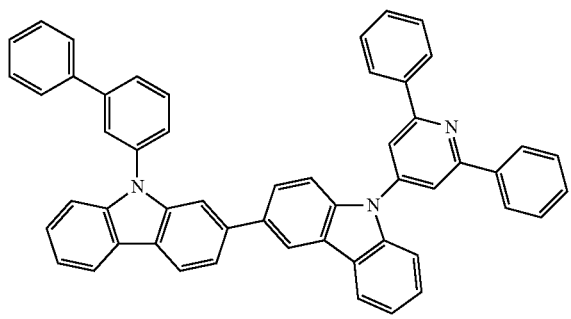
[B-73]
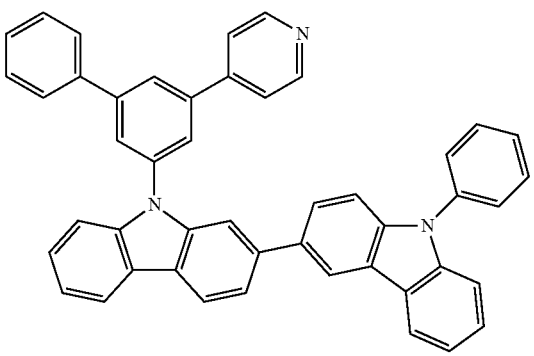
[B-70]
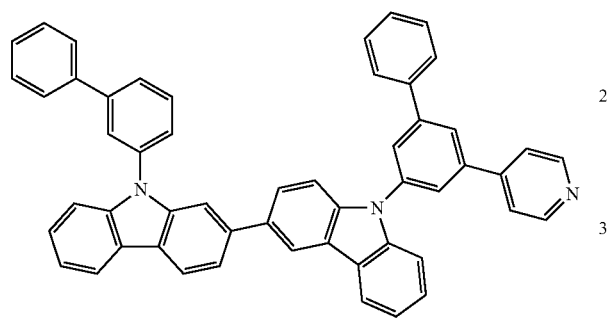
[B-74]
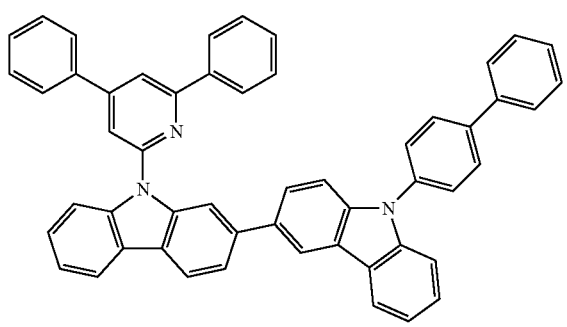
[B-71]
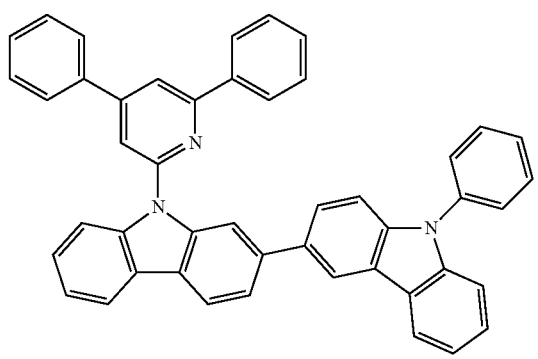
[B-75]
[B-72]
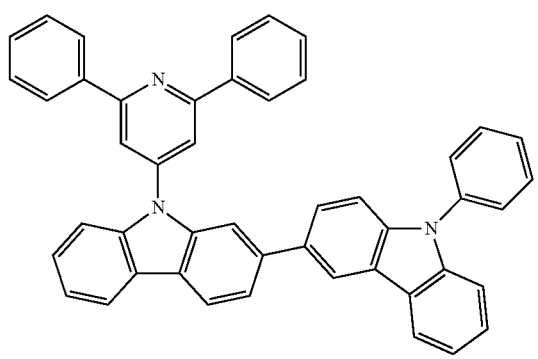
[B-76]
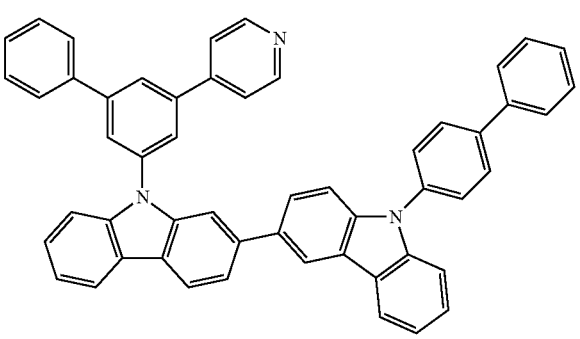

[B-77]
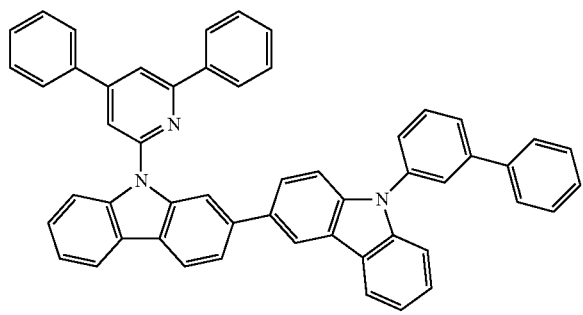
[B-81]
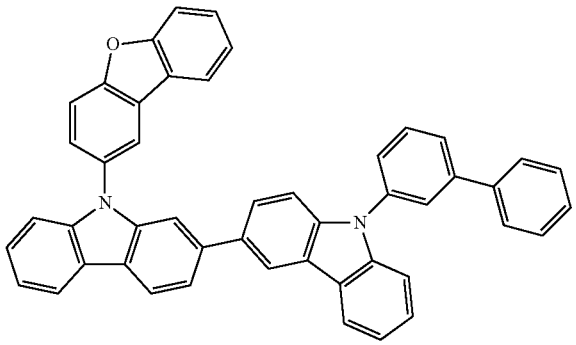
[B-78]
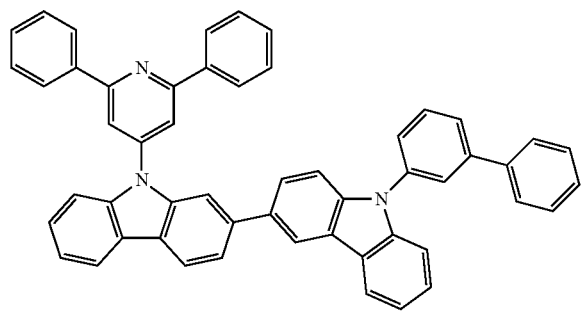
[B-82]
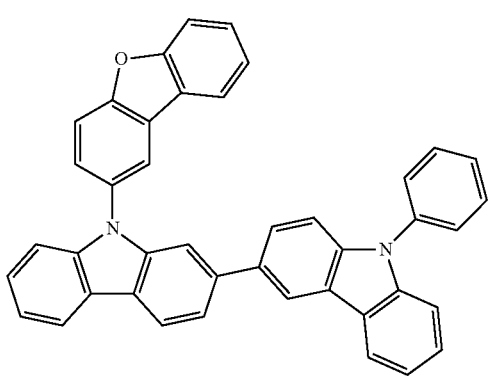
[B-79]
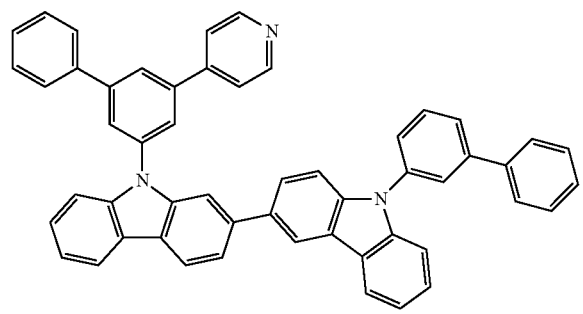
[B-83]
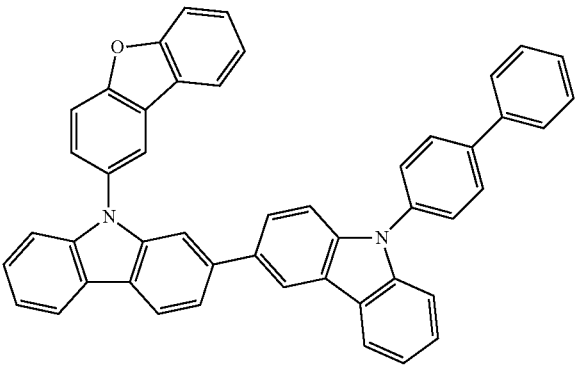
[B-80]
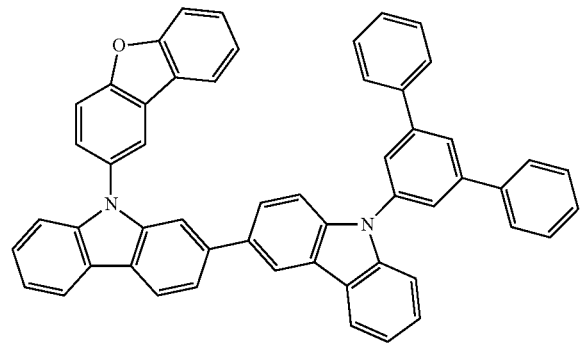
[B-84]
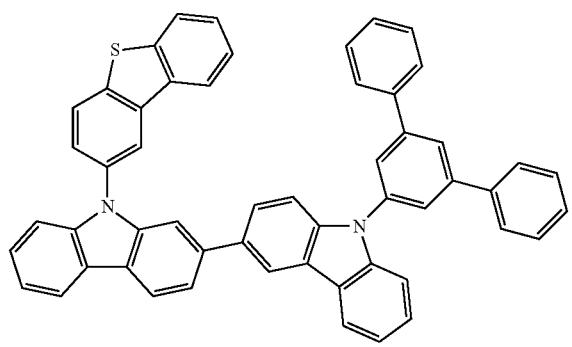

[B-85]
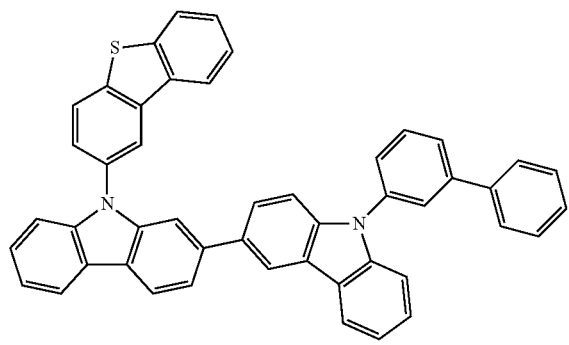
[B-89]
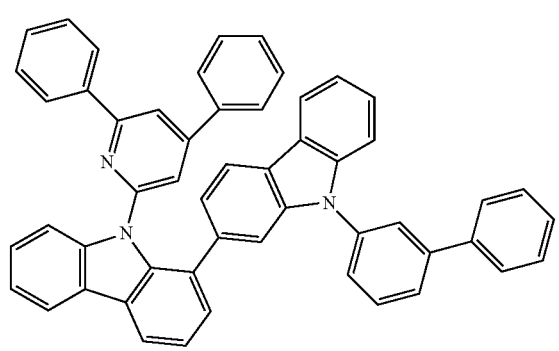
[B-86]
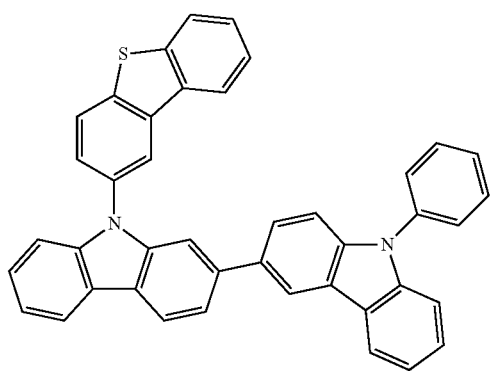
[B-90]
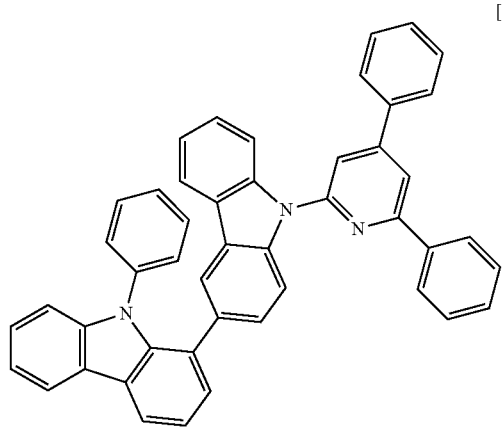
[B-87]
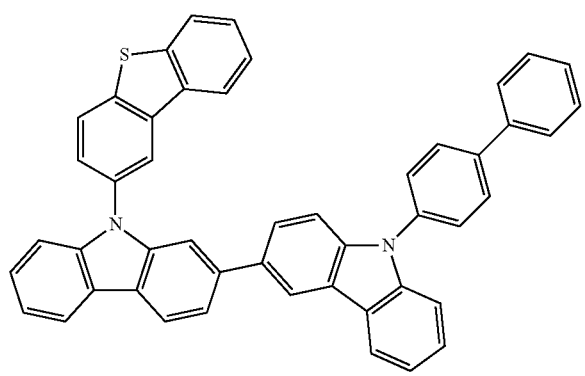
[B-91]
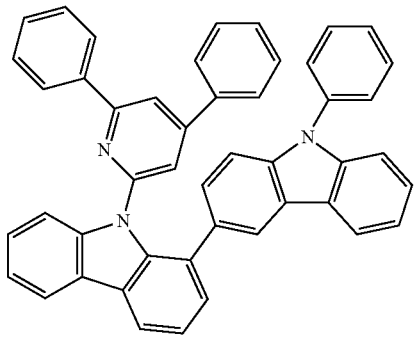
[B-88]
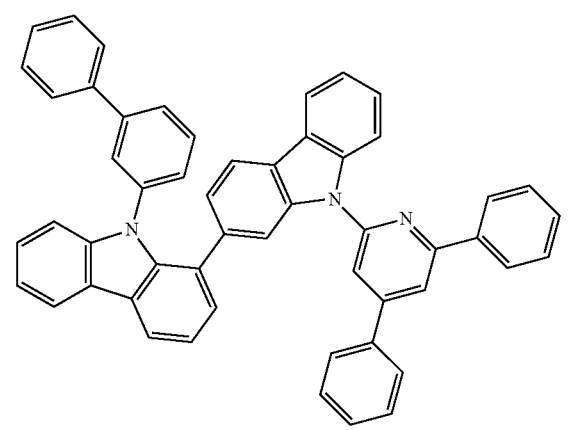
[B-92]
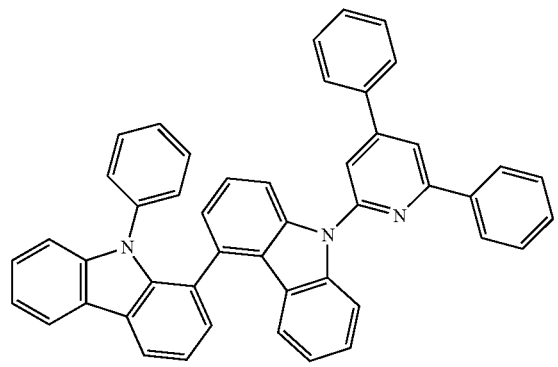

[B-93]
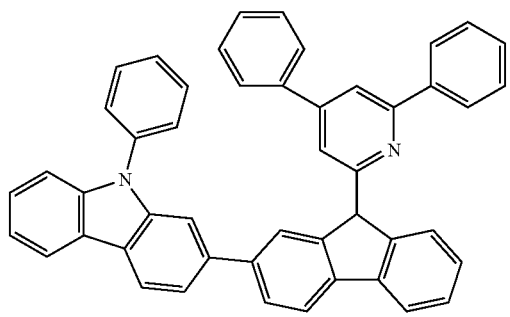
[B-97]
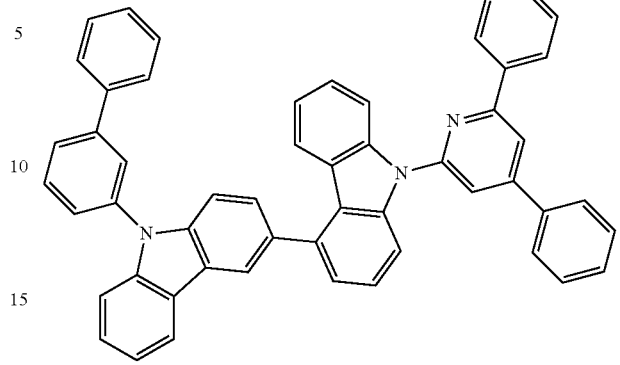
[B-94]
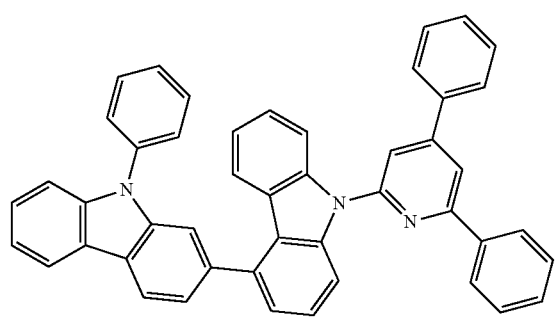
[B-98]
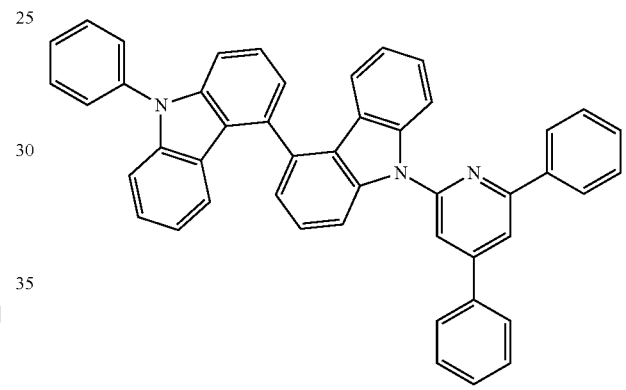
[B-95]
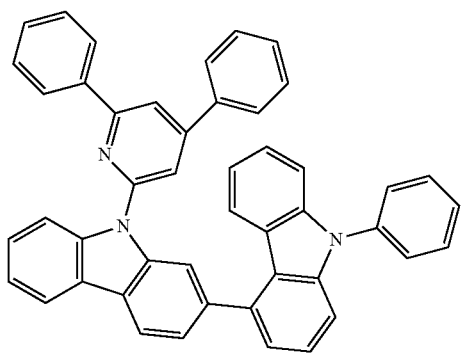
[B-99]
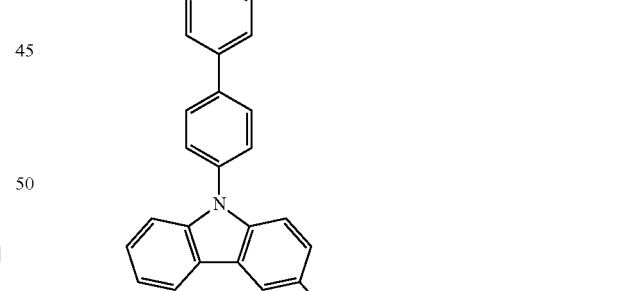
[B-96]
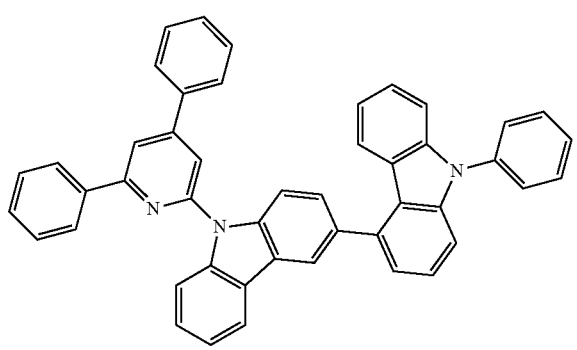
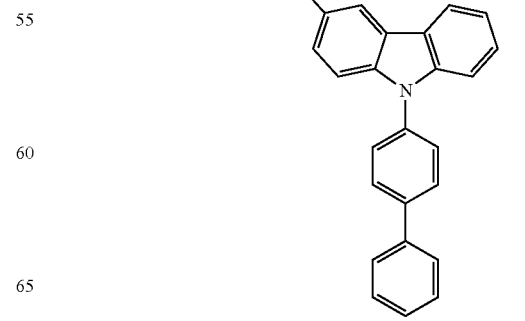

-continued
[B-100]
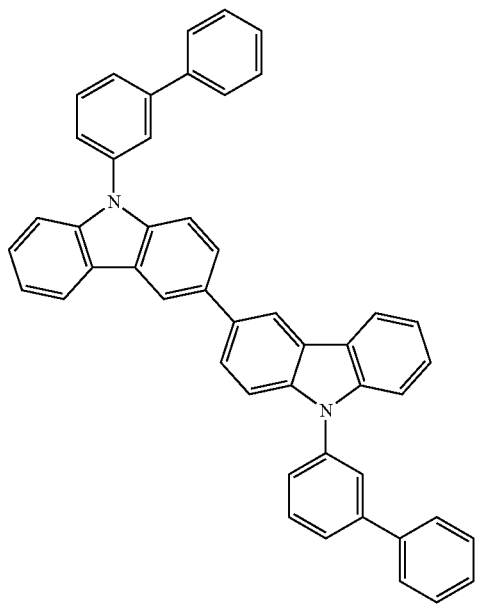
[B-101]
[B-102]
[B-103]
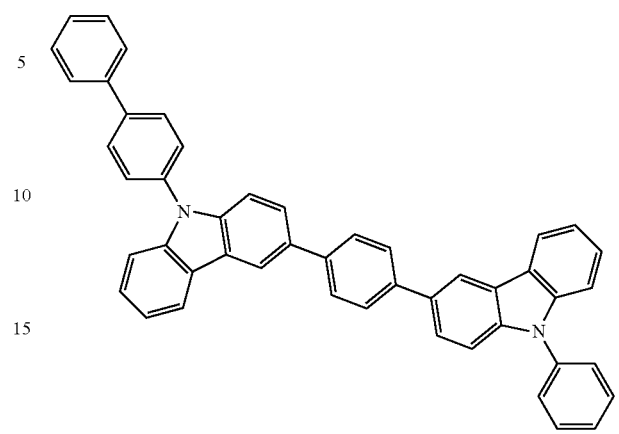
[B-104]
[B-105]
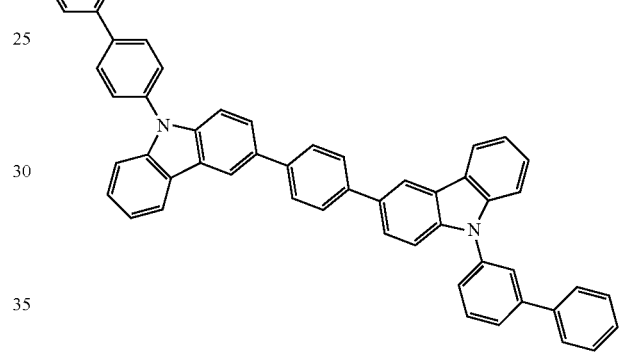
[B-106]
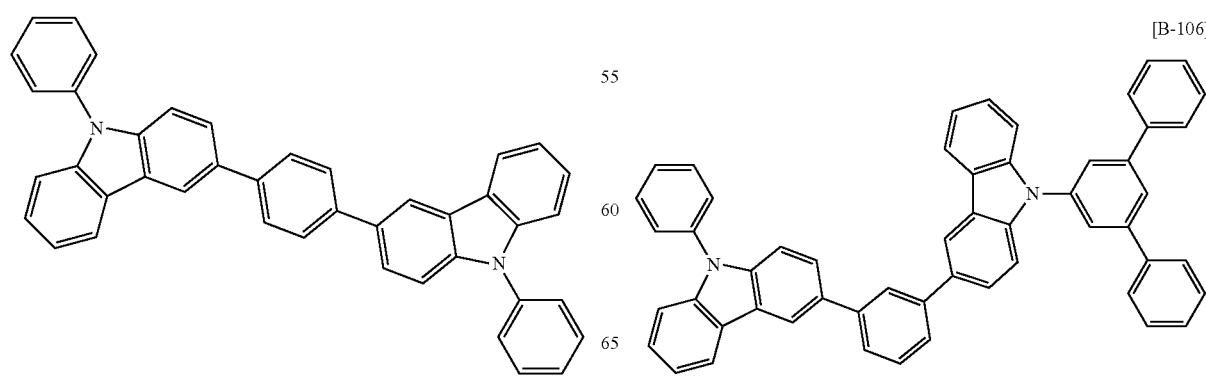

[B-107]
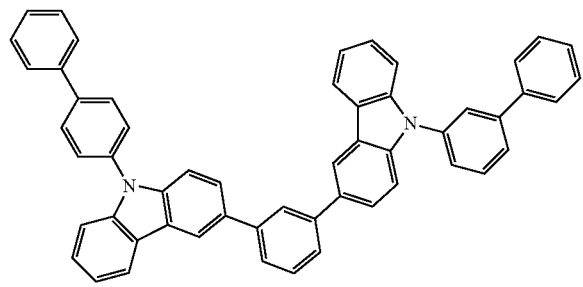
[B-108]
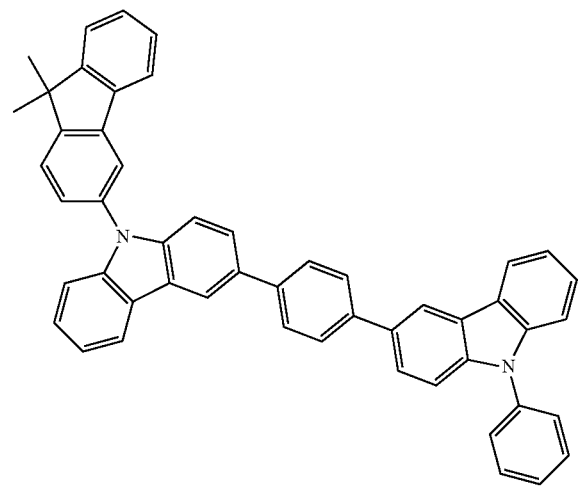
[B-109]
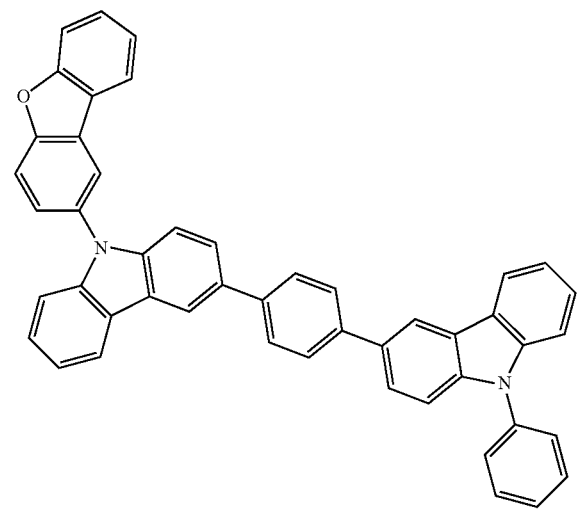
[B-110]
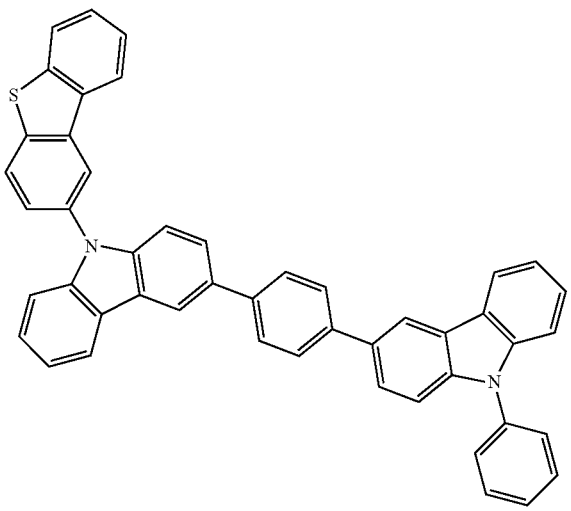
[B-111]
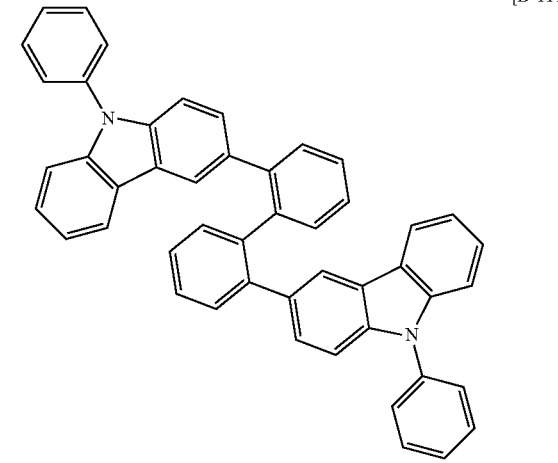
[B-112]
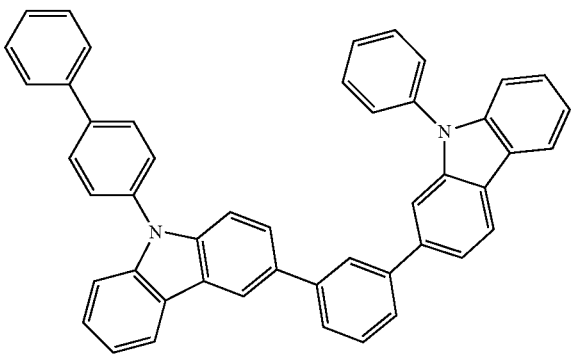

[B-113]
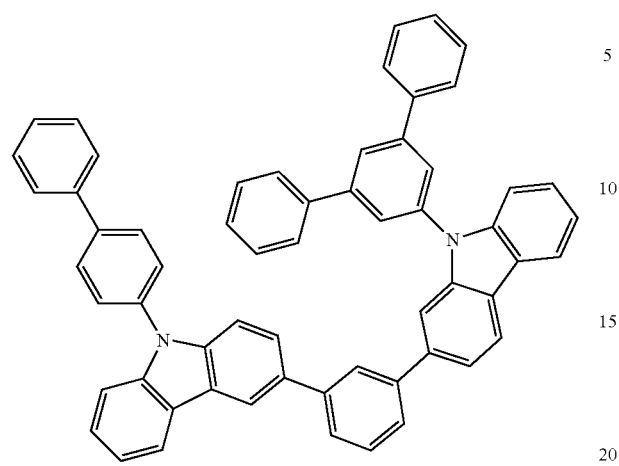
[B-114]
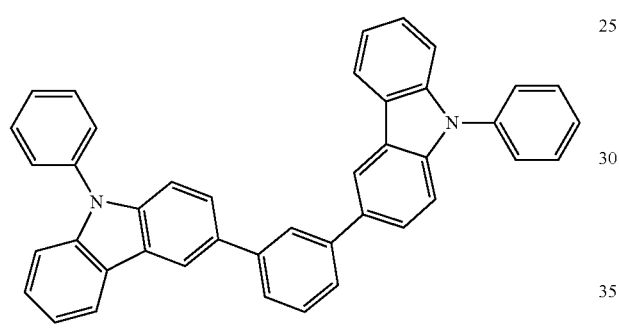
[B-115]
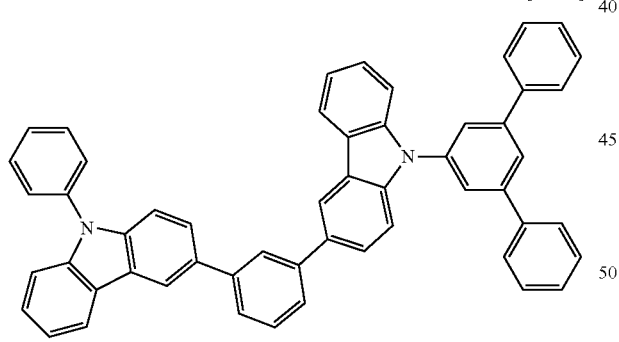
[B-116]
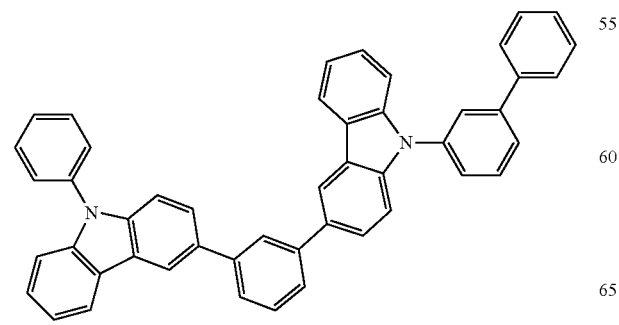
[B-117]
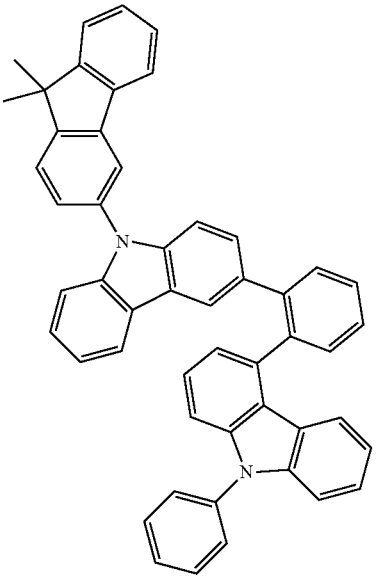
[B-118]
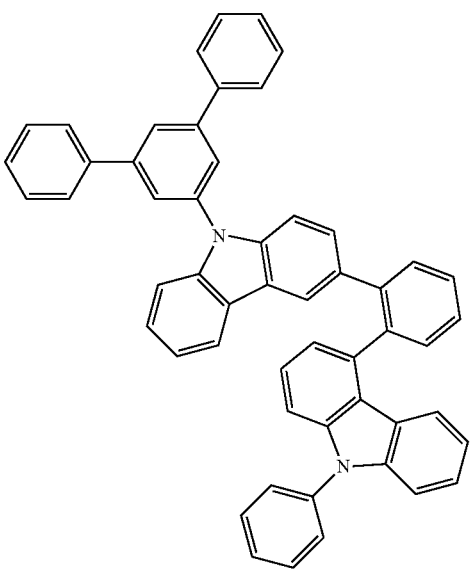

[B-119]
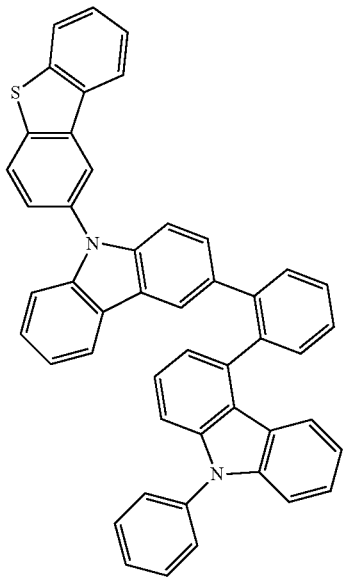
[B-122]
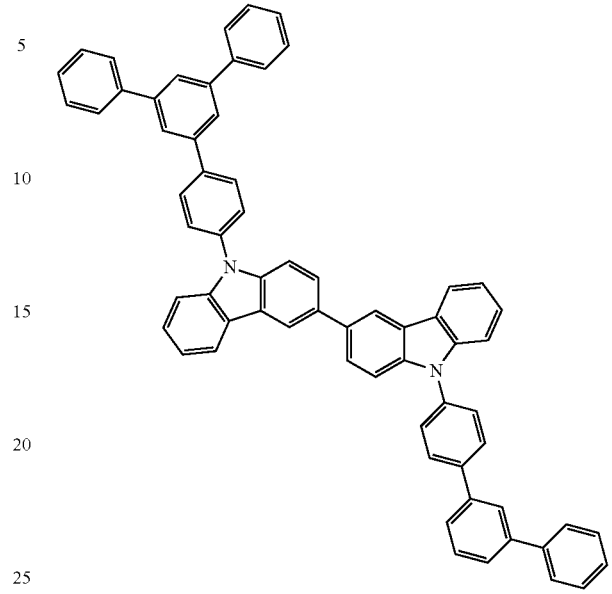
[B-120]
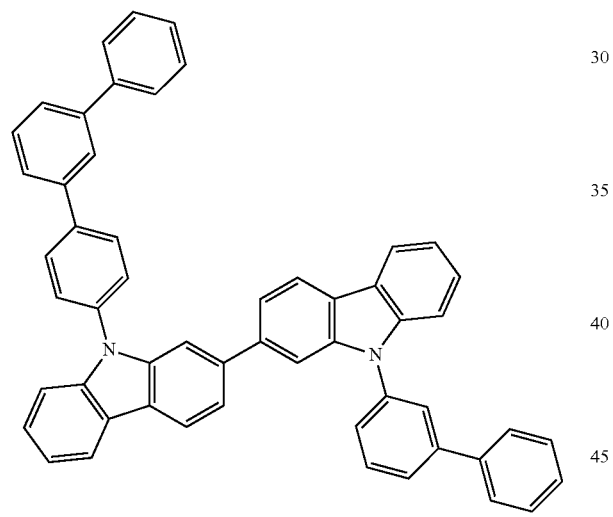
[B-121]
[B-123]
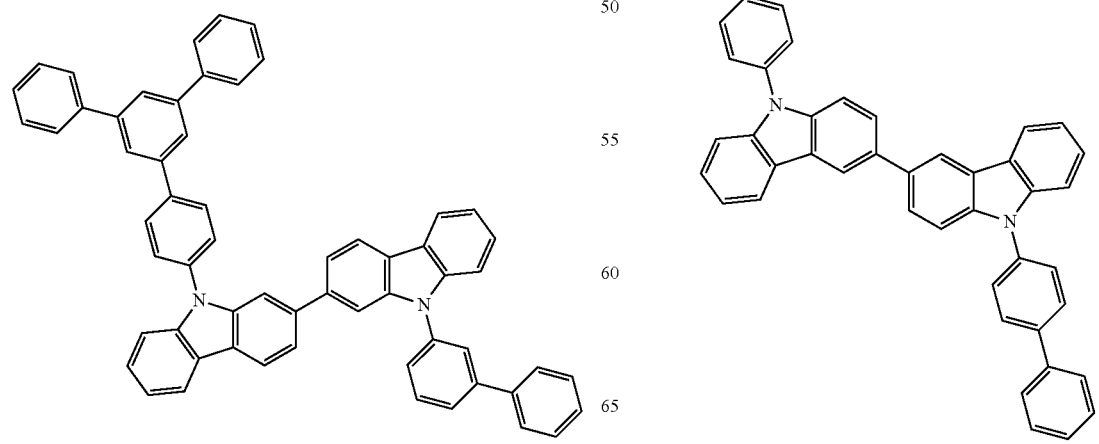

[B-124]
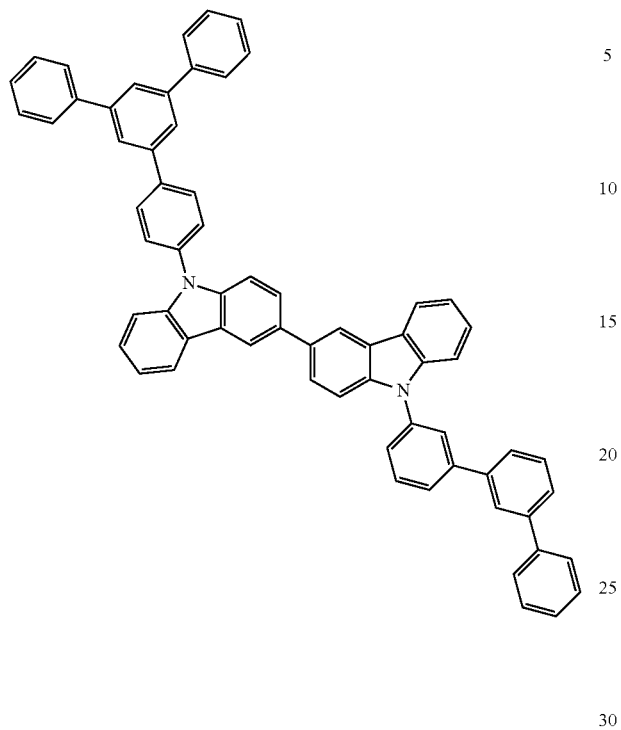
[B-125]
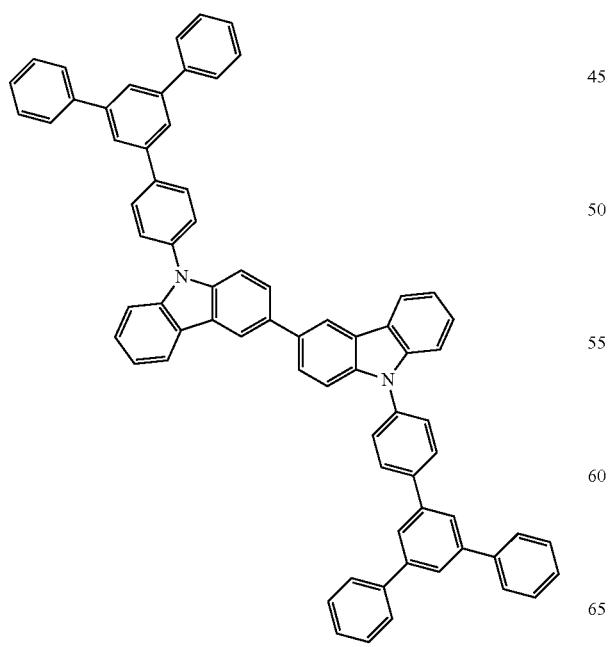
[B-126]
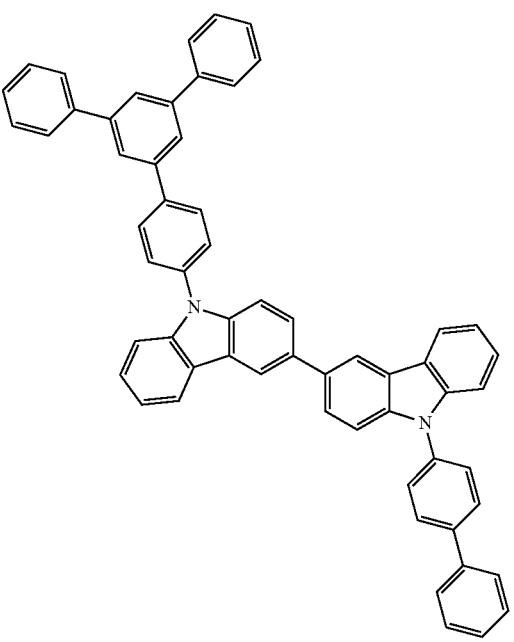
[B-127]
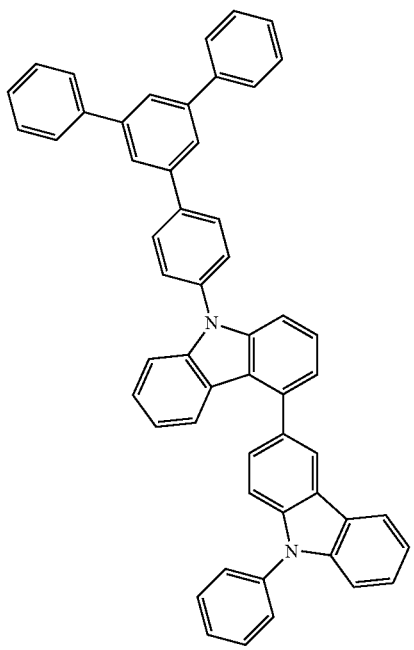

[B-128]
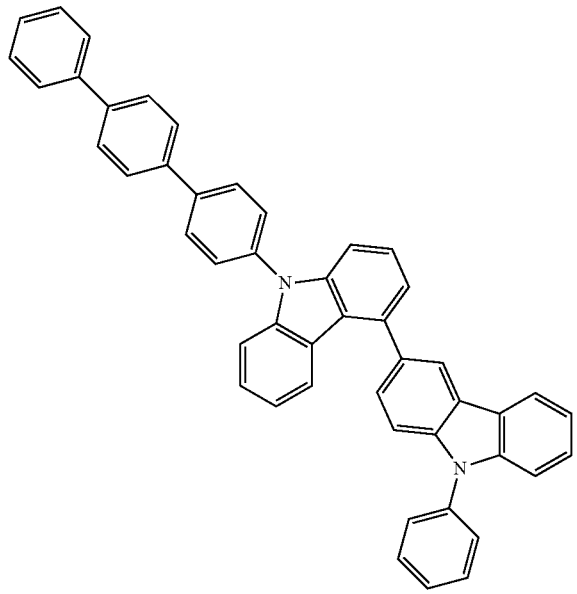
[B-130]
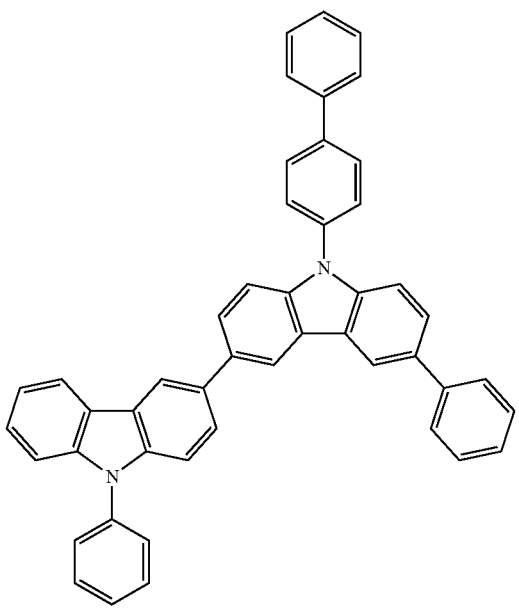
[B-131]
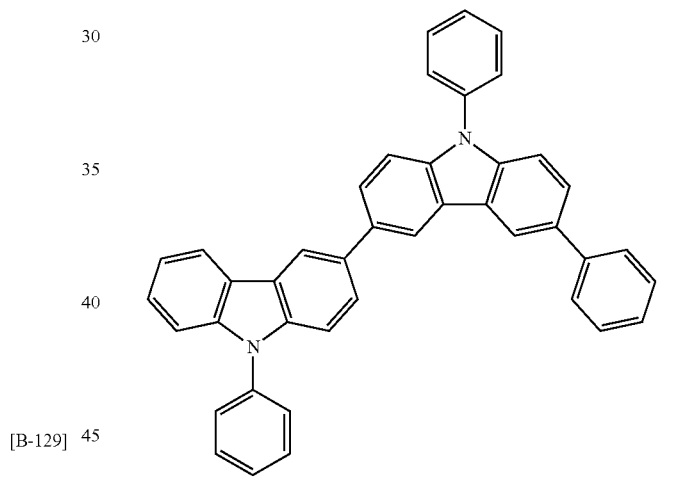
[B-129]
[B-132]
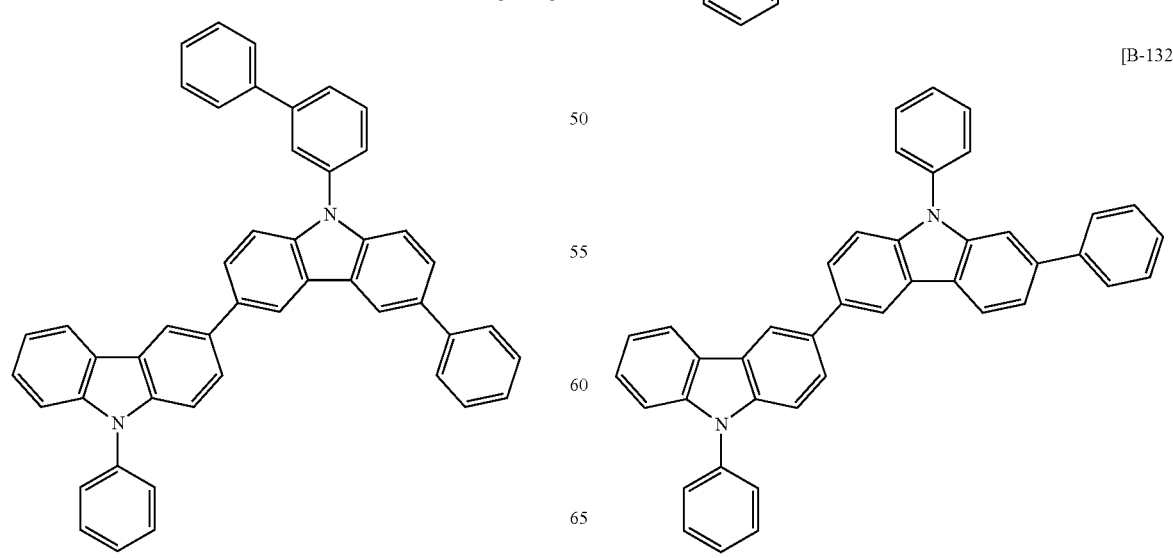

[B-133]
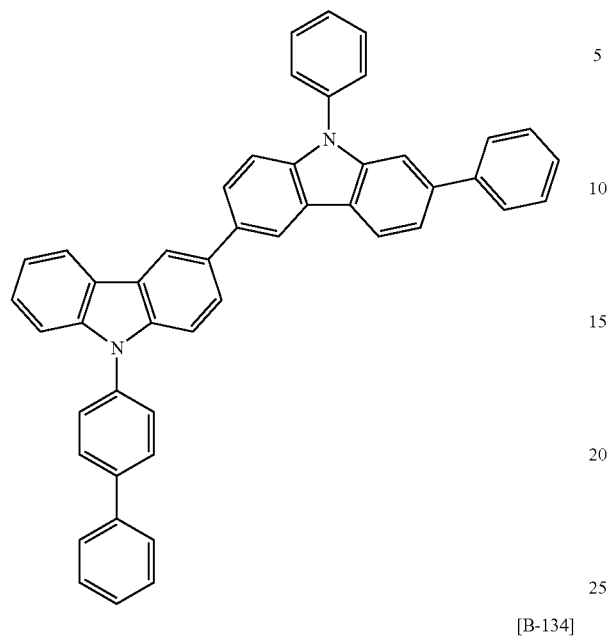
[B-134]
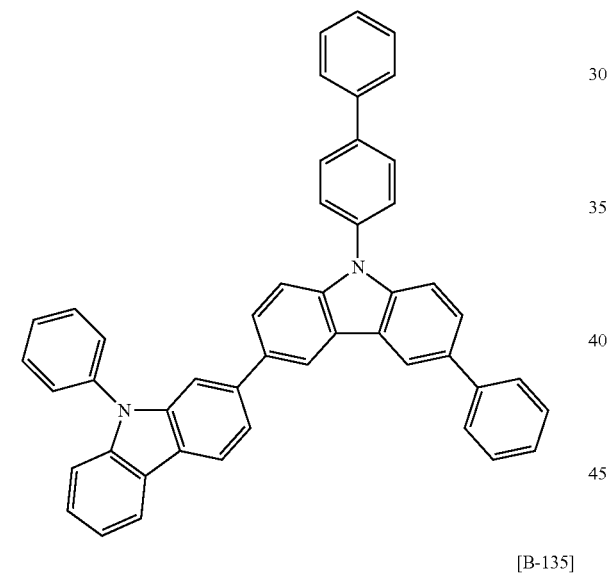
[B-135]
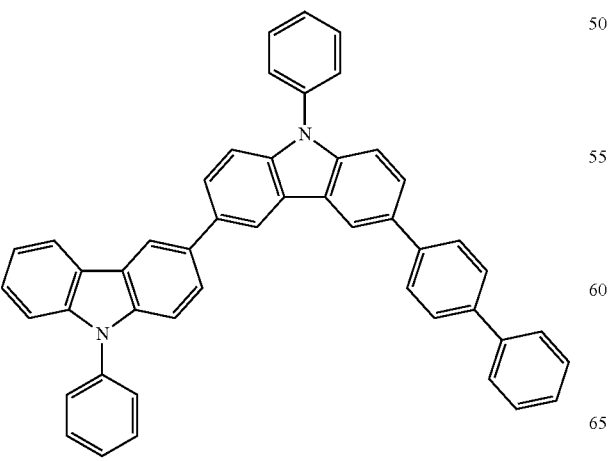
[B-136]
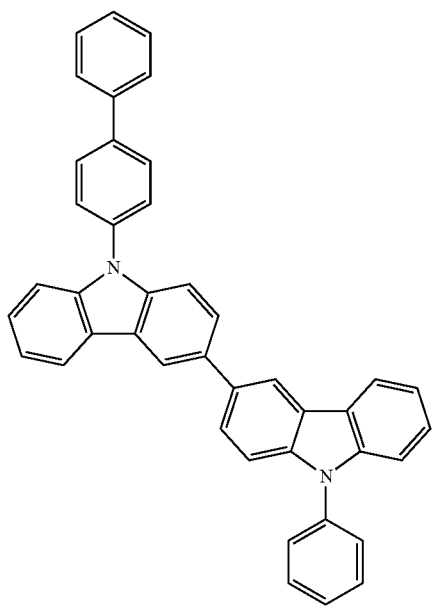
[B-137]
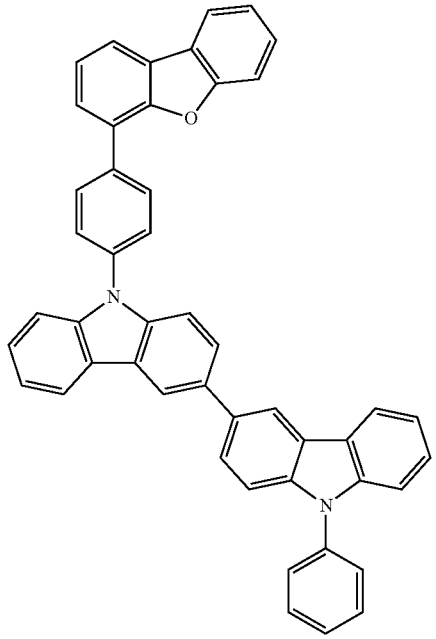

[B-138]
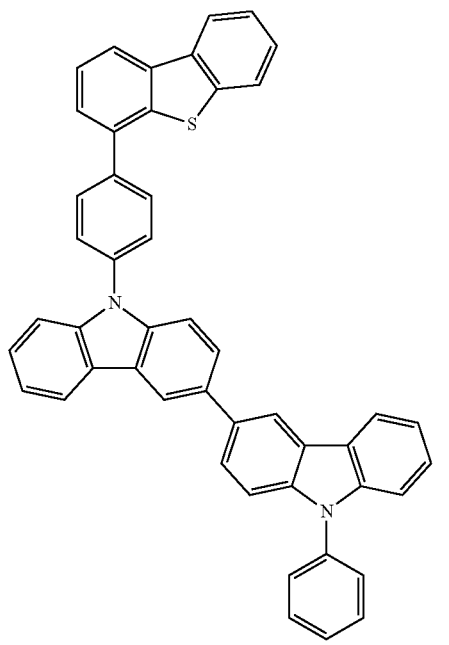
[C-1]
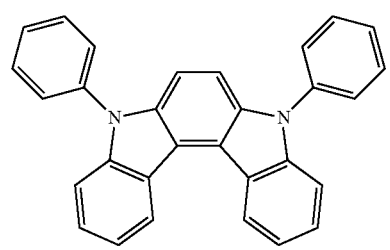
[C-2]
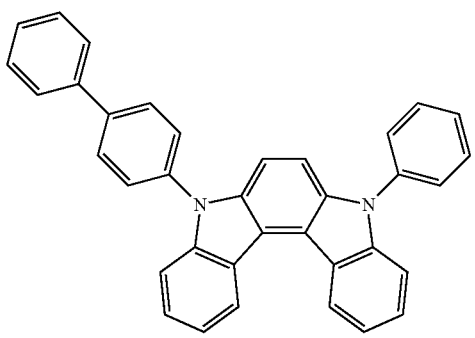
[C-3]
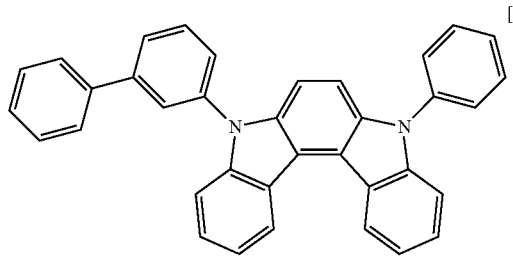
[C-4]
[C-5]
[C-6]
[C-7]
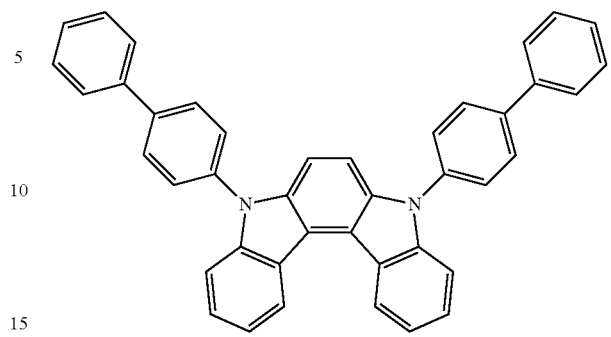
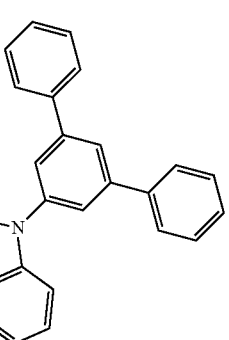

[C-8]
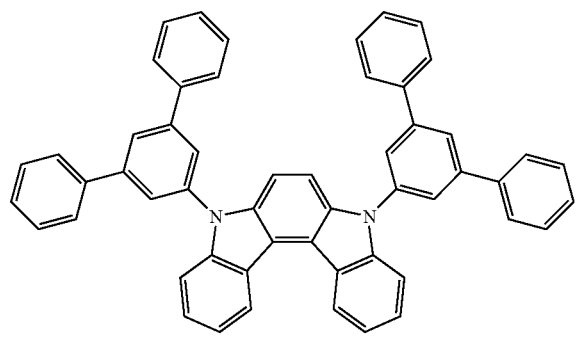
[C-9]
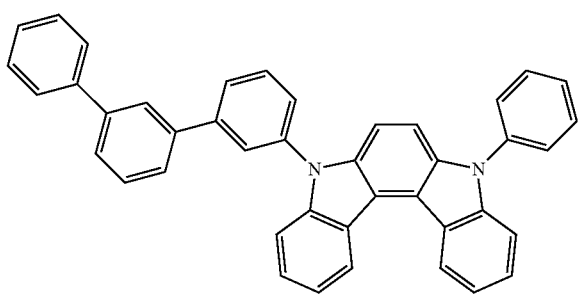
[C-10]
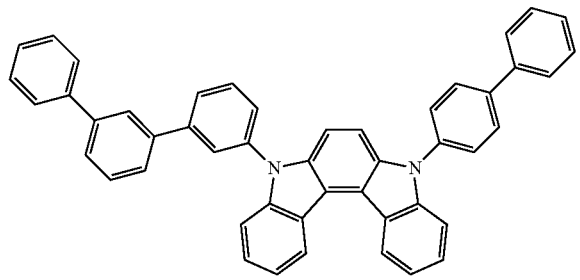
[C-11]
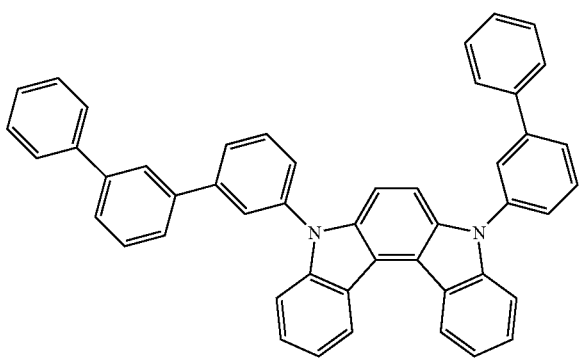
[C-12]
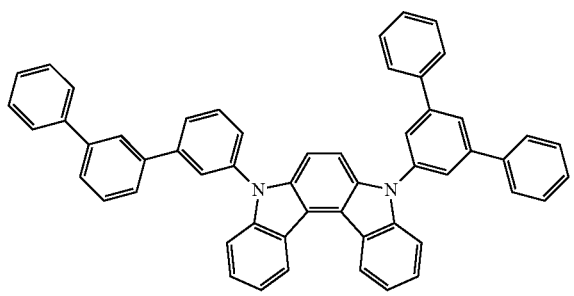
[C-13]
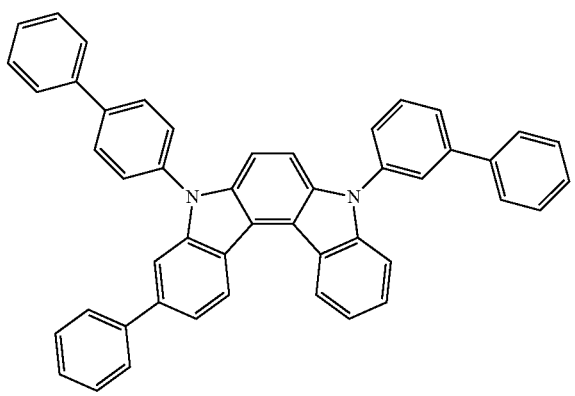
[C-14]
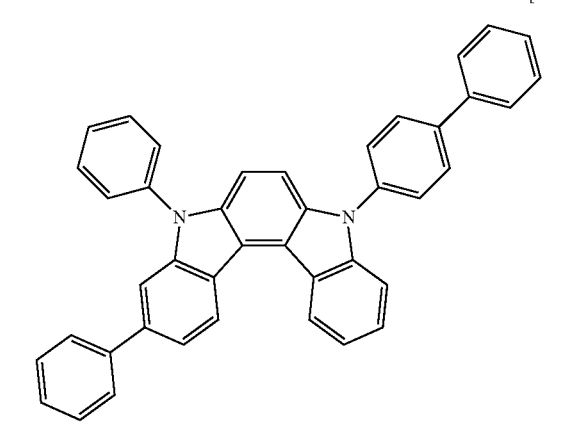
[C-15]
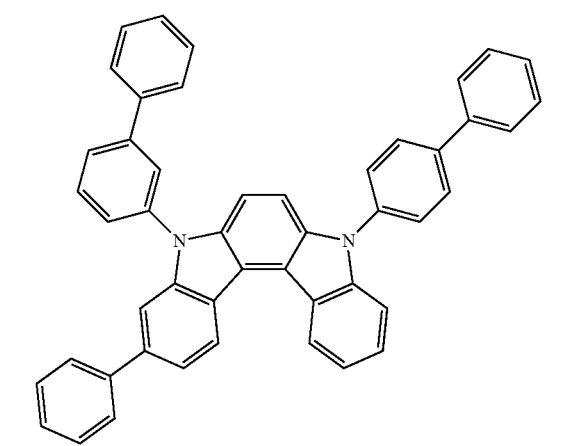

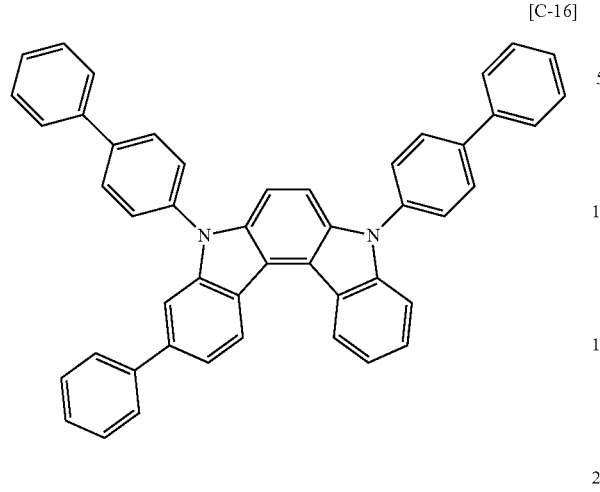
[C-16]
[C-17]
[C-18]
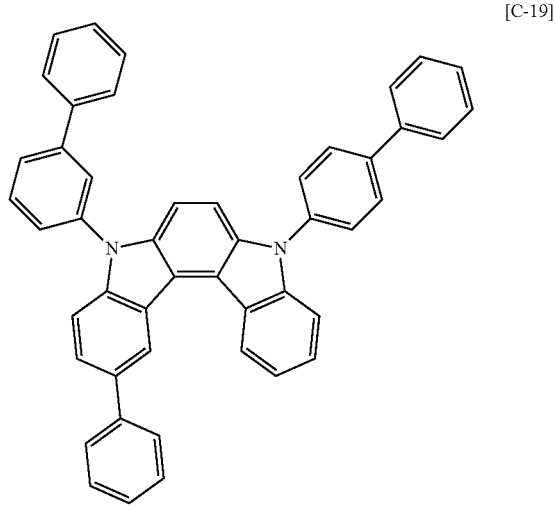
[C-19]
[C-20]
[C-21]
[C-22]

-continued
[C-23]
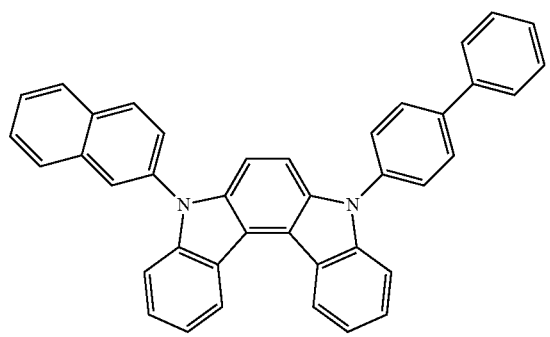
[C-24]
[C-25]
[C-26]
-continued
[C-27]
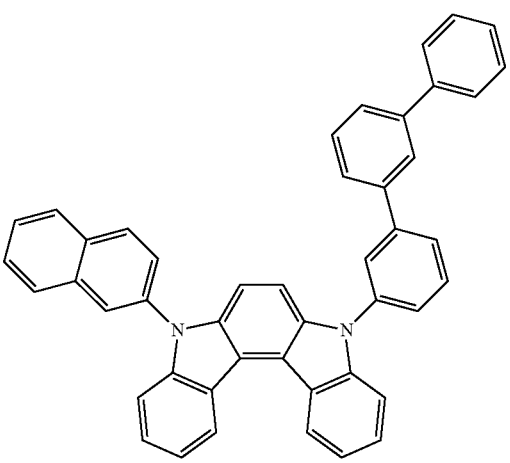
[C-28]
[C-29]
[C-30]
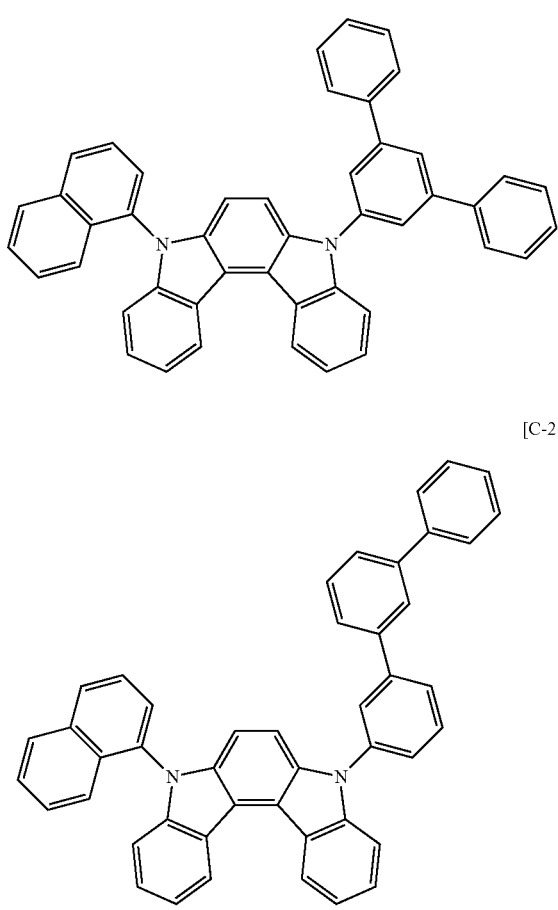

[C-31]
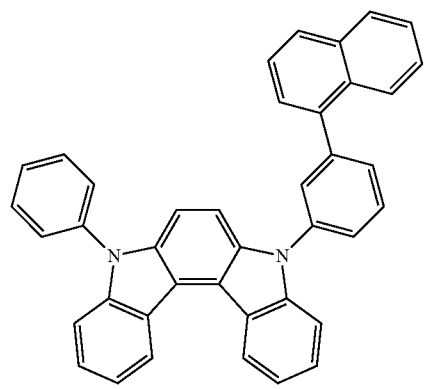
[C-32]
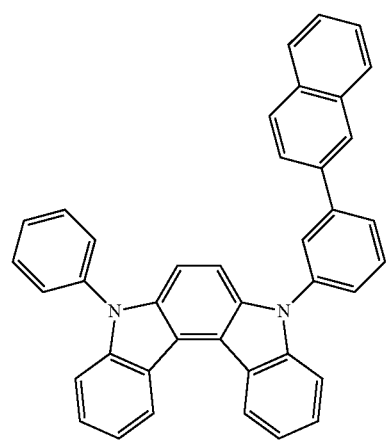
[C-33]
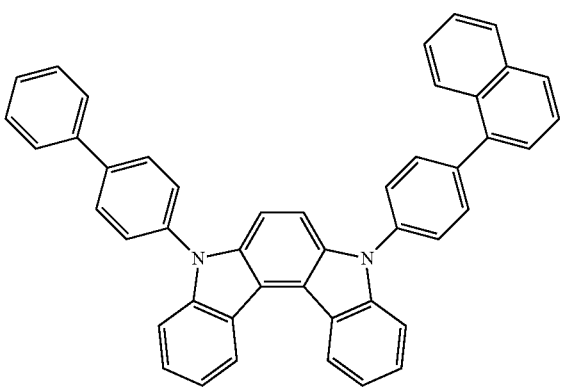
[C-34]
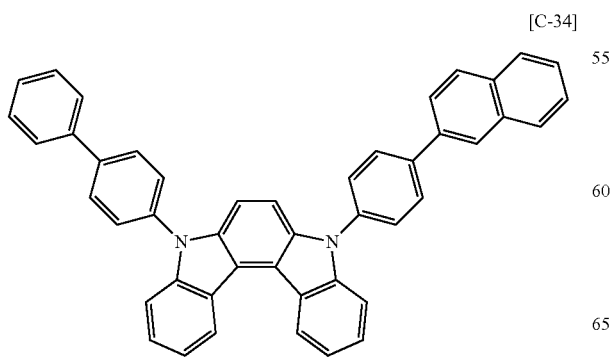
[C-35]
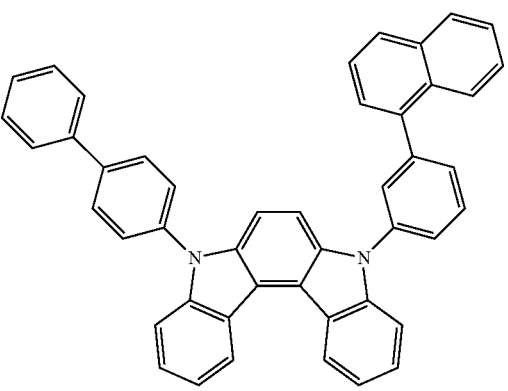
[C-36]
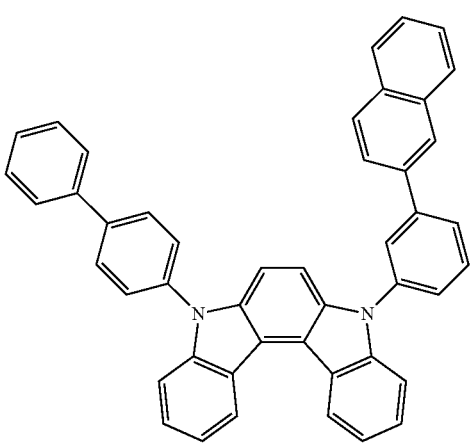
[C-37]
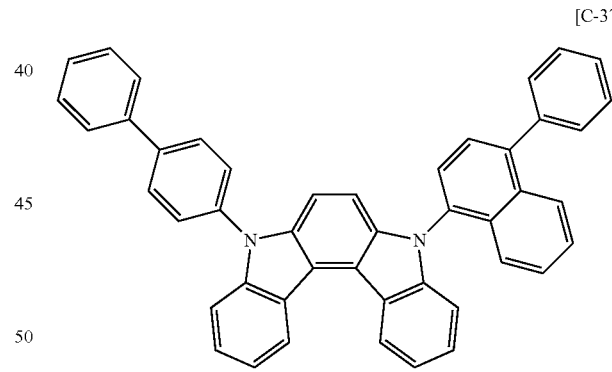
[C-38]
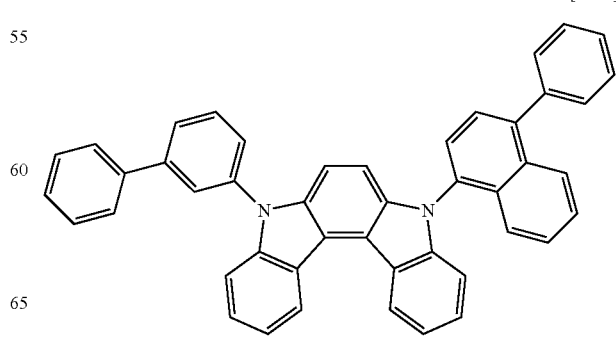

[C-39]
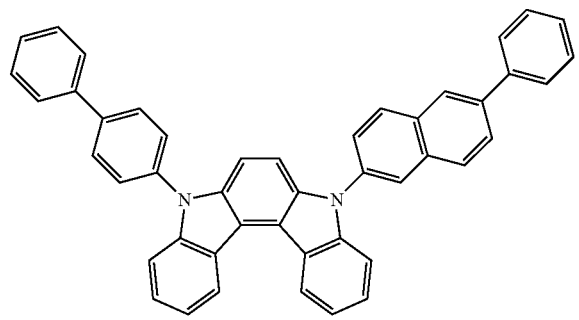
[C-40]
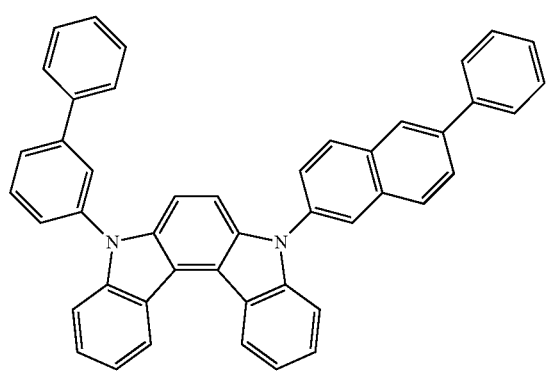
[C-41]
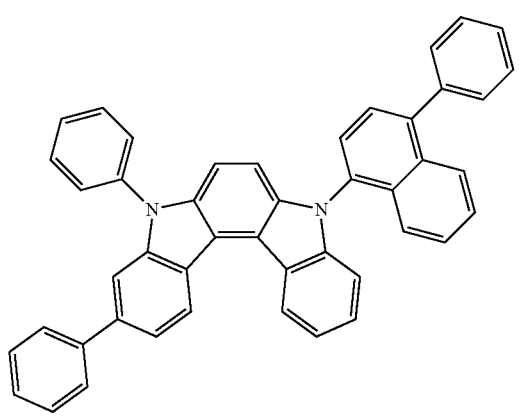
[C-42]
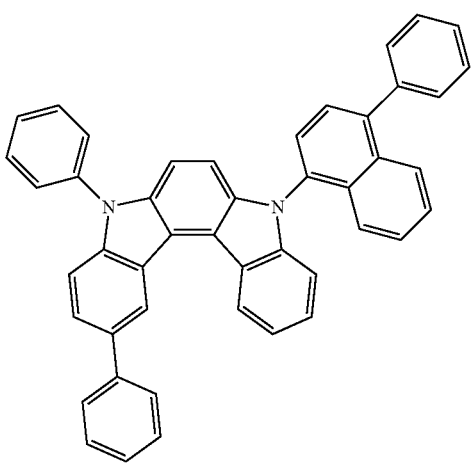
[C-43]
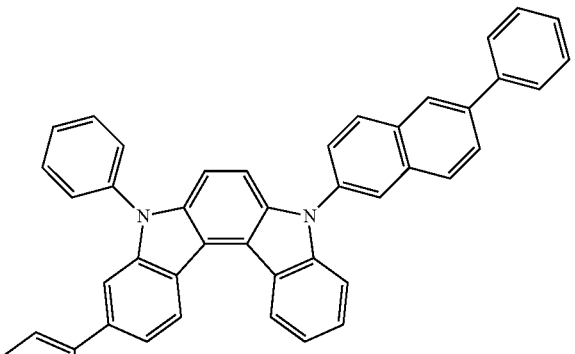
[C-44]
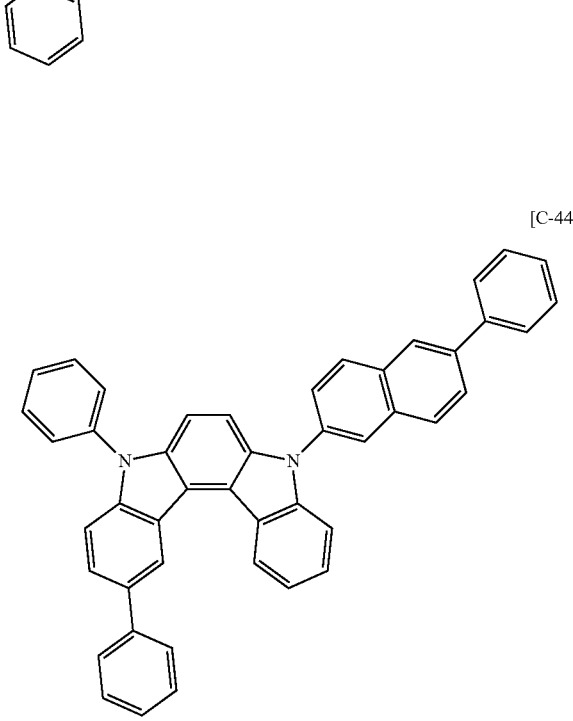
[C-45]
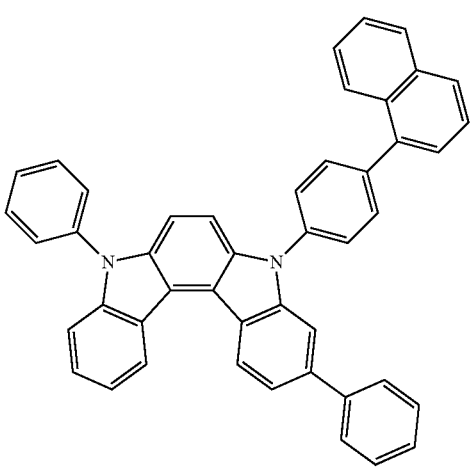

[C-46]
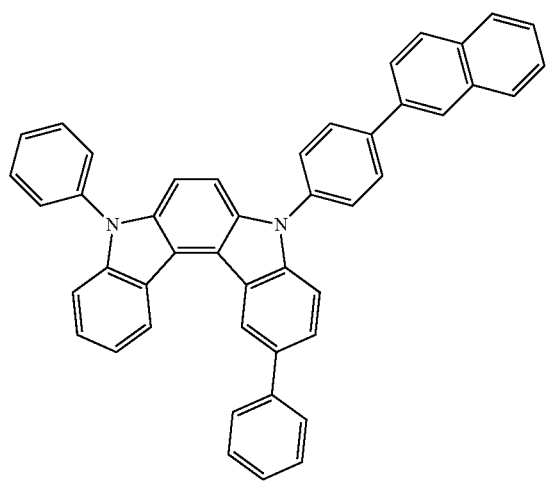
[C-47]
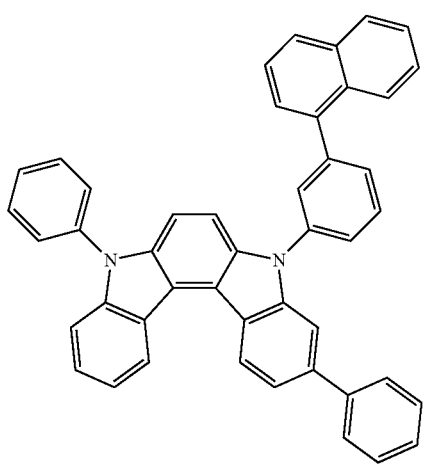
[C-48]
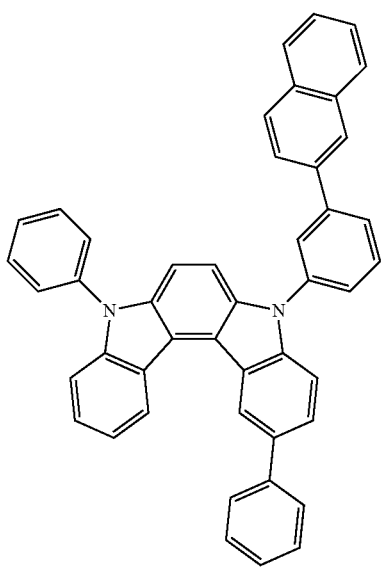
[C-49]
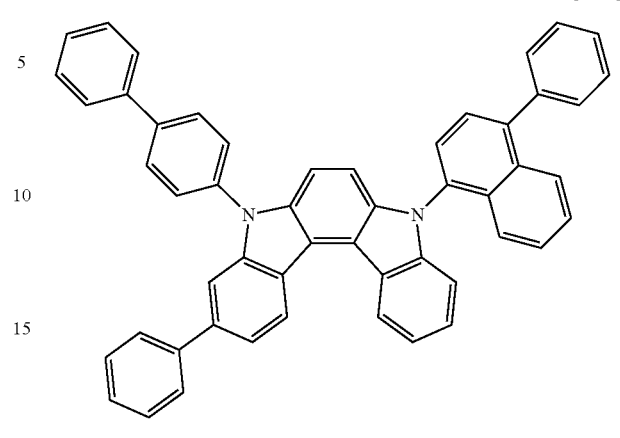
[C-50]
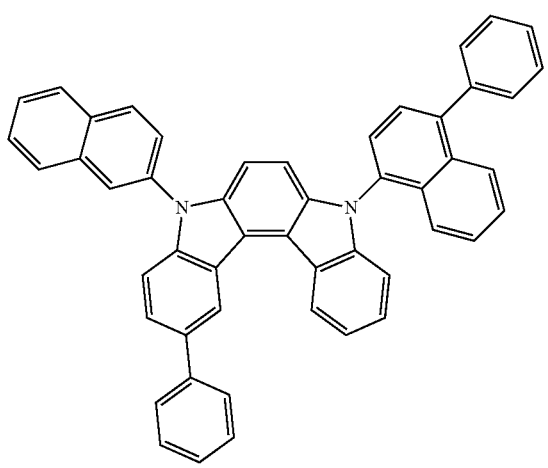
[C-51]
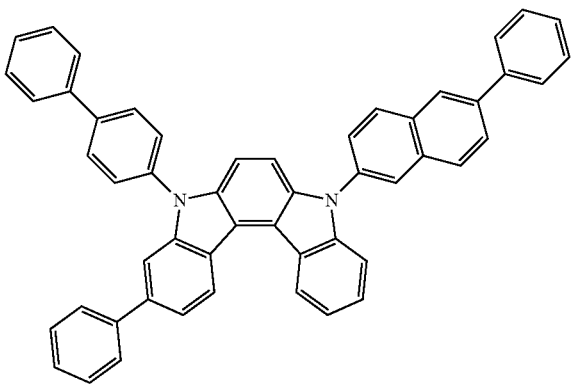

[C-52]

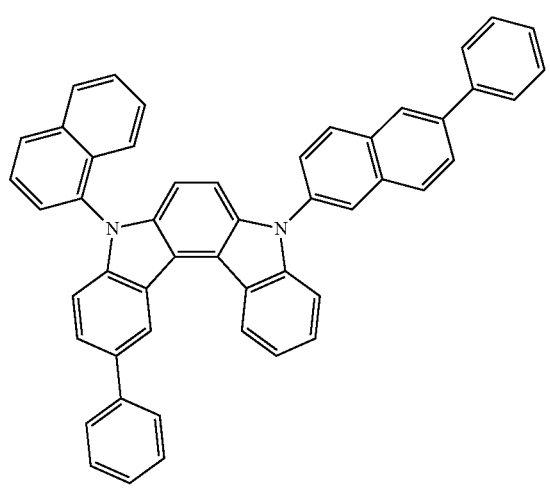

[C-55]

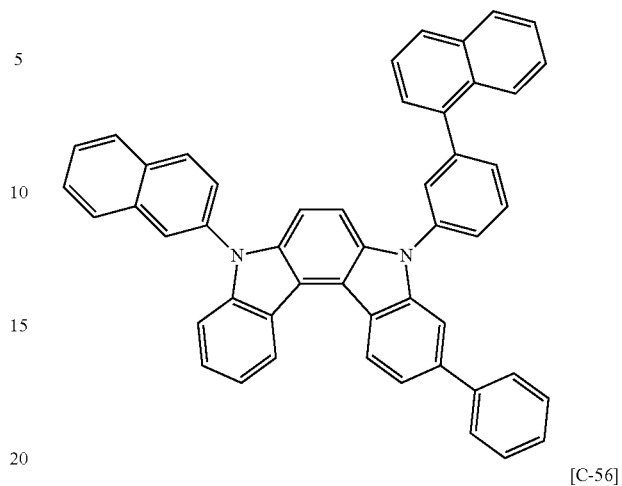

[C-53]

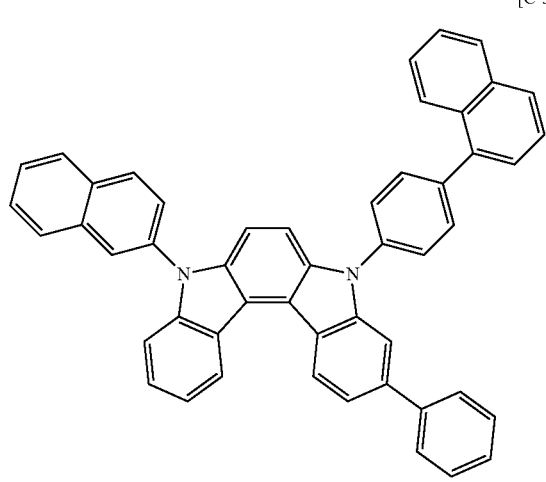

[C-56]

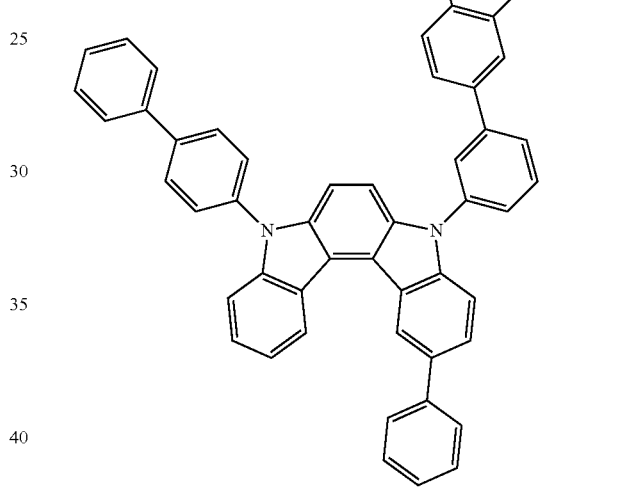

[C-54]

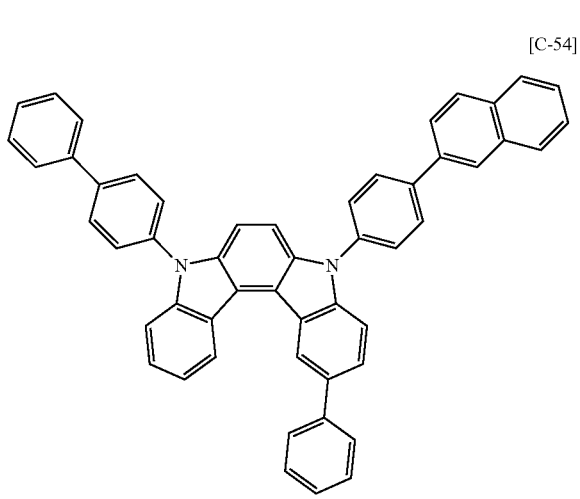

The first compound for the organic optoelectronic device and the second compound for the organic optoelectronic device may be included in a weight ratio of 1:99 to 99:1. Within the range, an appropriate weight ratio may be adjusted using electron transport capability of the first compound for the organic optoelectronic device and hole transport capability of the second compound for the organic optoelectronic device to implement bipolar characteristics and to improve efficiency and life-span. Within the range, they may be included, e.g., in a weight ratio of about 10:90 to about 90:10, about 20:80 to about 80:20, for example about 20:80 to about 70:30, about 20:80 to about 60:40, or about 20:80 to about 50:50. For example, they may be included in a weight ratio of about 20:80 to about 40:60, for specific example about 30:70, 40:60 or about 50:50.

In an implementation, the first compound for the organic optoelectronic device and the second compound for the organic optoelectronic device may be included in a weight ratio of about 30:70 or about 50:50.

In an implementation, at least one additional compound may be further included in addition to the aforementioned first compound for the organic optoelectronic device and second compound for the organic optoelectronic device.

The aforementioned compound for the organic optoelectronic device or composition for the organic optoelectronic device may be a composition further including a dopant.

The dopant may be, e.g., a phosphorescent dopant, for example, a red, green or blue phosphorescent dopant, and may be, e.g., a red or green phosphorescent dopant.

The dopant may be mixed with the compound or composition for the organic optoelectronic device in small amount to facilitate light emission and may be generally a material such as a metal complex that emits light by multiple excitation into a triplet or more. The dopant may be, e.g., an inorganic, organic, or organic/inorganic compound, and one or more types thereof may be used.

An example of the dopant may include a phosphorescent dopant, and examples of the phosphorescent dopant may include organometallic compounds including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$$L^6MX^a \qquad \text{[Chemical Formula Z]}$$

In Chemical Formula Z, M may be a metal, and $L^6$ and $X^a$ may each independently be a ligand to form a complex compound with M.

M may be, e.g., Ir, Pt, Os, Ti, Zr, Hf, Eu, Tb, Tm, Fe, Co, Ni, Ru, Rh, Pd, or a combination thereof and L and X may be, e.g., a bidendate ligand.

The aforementioned compound for the organic optoelectronic device or composition for the organic optoelectronic device may be formed or deposited by a dry film forming method such as chemical vapor deposition.

The organic optoelectronic device may be a suitable device to convert electrical energy into photoenergy and vice versa, and may be, e.g., an organic photoelectric device, an organic light emitting diode, an organic solar cell, and an organic photo conductor drum, or the like.

An organic optoelectronic device according to another embodiment may include an anode and a cathode facing each other, and an organic layer between the anode and the cathode. The organic layer may include at least one of a hole injection layer, a hole transport layer, a light emitting layer, an electron injection layer, and an electron transport layer, and at least one of the light emitting layer, the electron injection layer, and the electron transport layer may include the aforementioned compound for the organic optoelectronic device.

Herein, an organic light emitting diode, which is an example of an organic optoelectronic device, is described with reference to the drawings.

Figure 2:
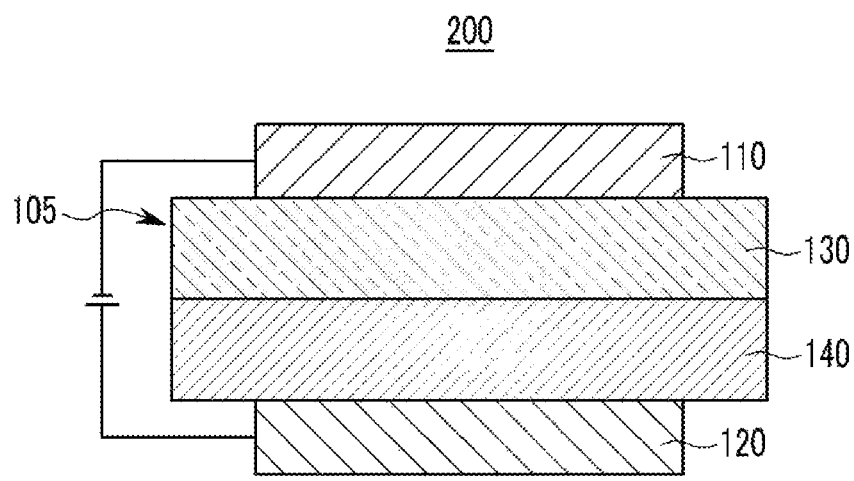

FIGS. 1 and 2 are cross-sectional views illustrating an organic light emitting diode according to an embodiment.

Referring to FIG. 1, an organic light emitting diode 100 according to an embodiment may include an anode 120 and a cathode 110 facing each other, and an organic layer 105 between the anode 120 and the cathode 110.

The anode 120 may be a conductor having a large work function to facilitate hole injection, and may be, e.g., a metal, a metal oxide, or a conductive polymer. The anode 120 may be, e.g., a metal such as nickel, platinum, vanadium, chromium, copper, zinc, gold, and the like or an alloy thereof; a metal oxide such as zinc oxide, indium oxide, indium tin oxide (ITO), indium zinc oxide (IZO), and the like; a combination of metal and oxide such as ZnO and Al or $SnO_2$ and Sb; a conductive polymer such as poly(3-methylthiophene), poly(3,4-(ethylene-1,2-dioxy)thiophene) (PEDOT), polypyrrole, and polyaniline.

The cathode 110 may be a conductor having a small work function to facilitate electron injection, and may be, e.g., metal, metal oxide, a conductive polymer. The cathode 110 may be, e.g., a metal or an alloy thereof such as magnesium, calcium, sodium, potassium, titanium, indium, yttrium, lithium, gadolinium, aluminum, silver, tin, lead, cesium, barium, and the like; a multi-layer structure material such as LiF/Al, $LiO_2$/Al, LiF/Ca, LiF/Al and $BaF_2$/Ca.

The organic layer 105 may include the aforementioned compound for the organic optoelectronic device or composition for the organic optoelectronic device.

In an implementation, the organic layer 105 may include at least one of a hole injection layer, a hole transport layer, a light emitting layer 130, an electron injection layer, and an electron transport layer.

In an implementation, the light emitting layer 130 may include the aforementioned compound for the organic optoelectronic device or composition for the organic optoelectronic device.

The aforementioned compound for the organic optoelectronic device or composition for the organic optoelectronic device may be included in the light emitting layer 130 as a host, e.g., a phosphorescent host.

The organic layer may further include an auxiliary layer in addition to the light emitting layer.

The auxiliary layer may be, e.g., an electronic auxiliary layer.

The electron auxiliary layer may be, e.g., an electron transport auxiliary layer between the electron transport layer and the light emitting layer, and the electron transport auxiliary layer may include the aforementioned compound for the organic optoelectronic device.

In an implementation, the auxiliary layer may be, e.g., a hole auxiliary layer 140.

Referring to FIG. 2, the organic light emitting diode 200 may further include a hole auxiliary layer 140 in addition to the light emitting layer 130. The hole auxiliary layer 140 may help further increase hole injection and/or hole mobility and block electrons between the anode 120 and the light emitting layer 130.

In an implementation, the hole auxiliary layer 140 may include a hole transport layer between the anode 120 and the light emitting layer 130, and a hole transport auxiliary layer between the light emitting layer 130 and the hole transport layer. In an implementation, a compound of Group E may be included in the hole transport auxiliary layer.

[Group E]
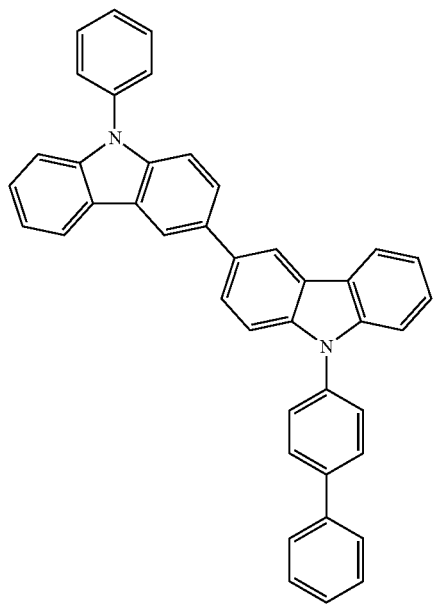
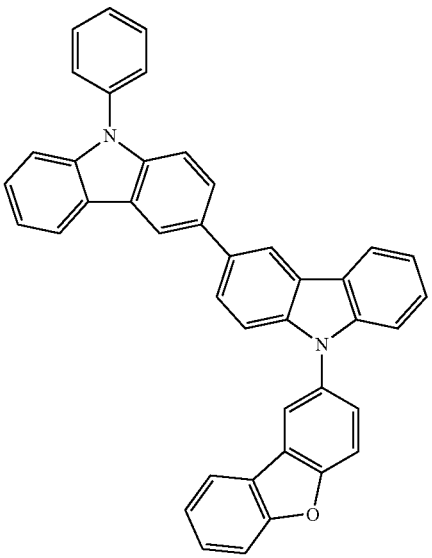
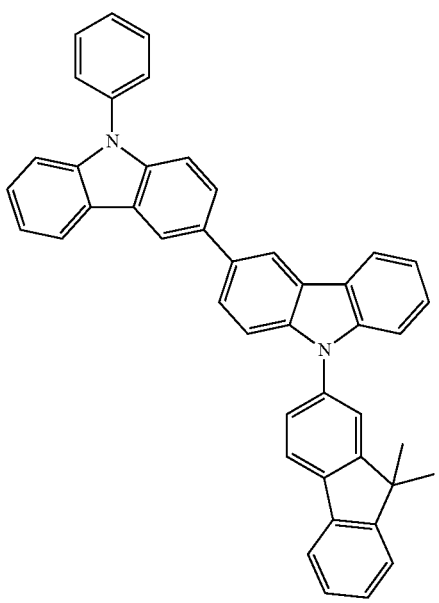
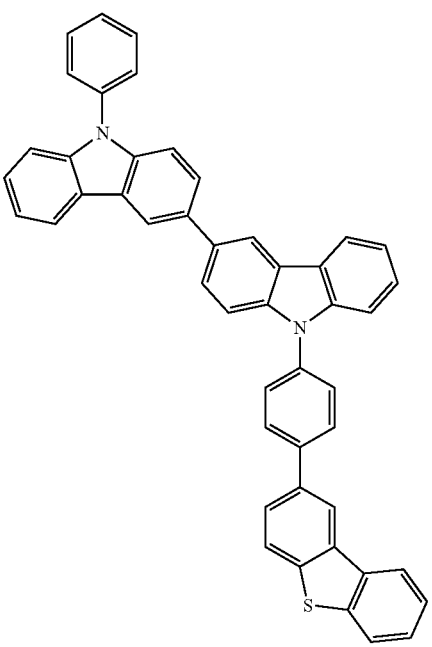

139
-continued
140
-continued
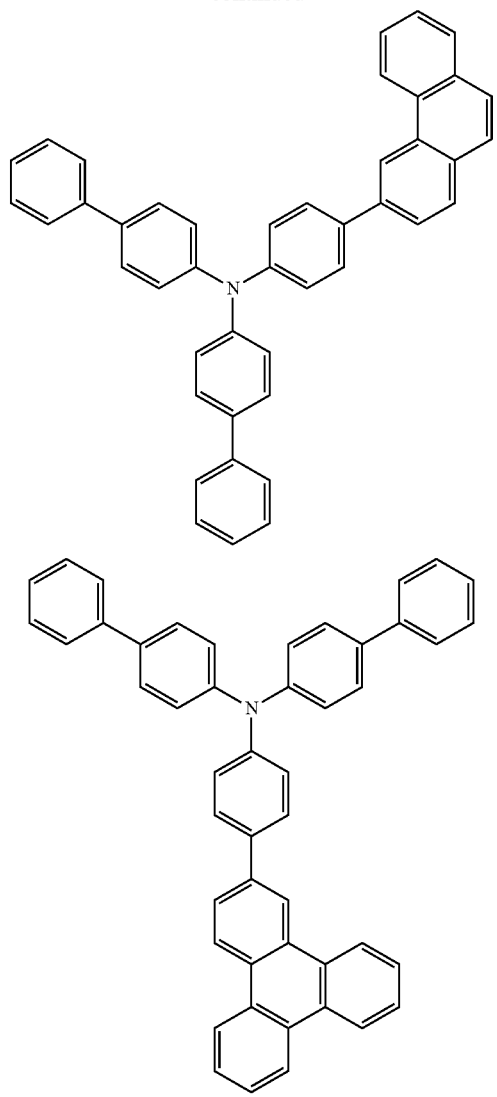
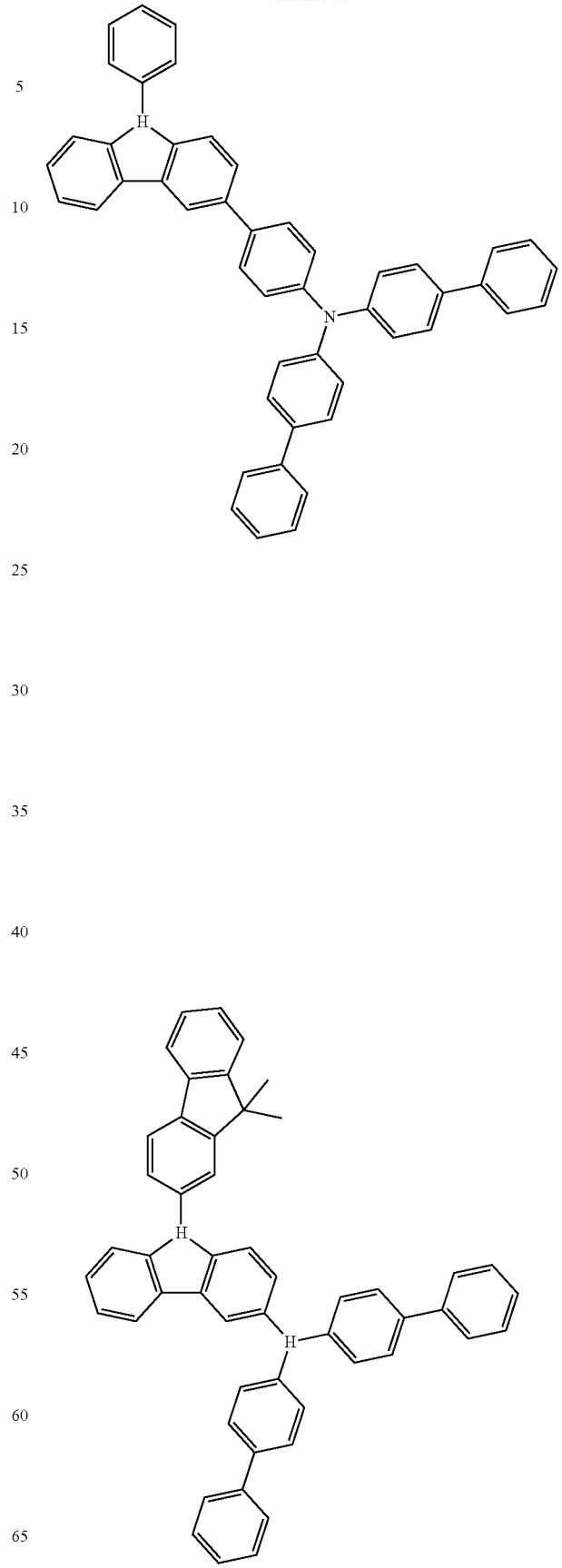

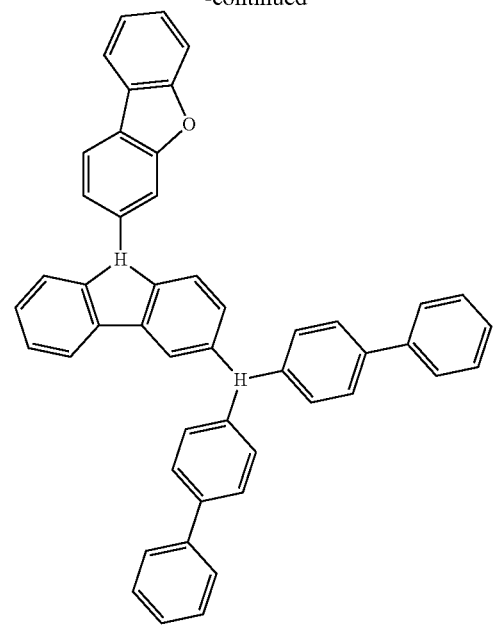
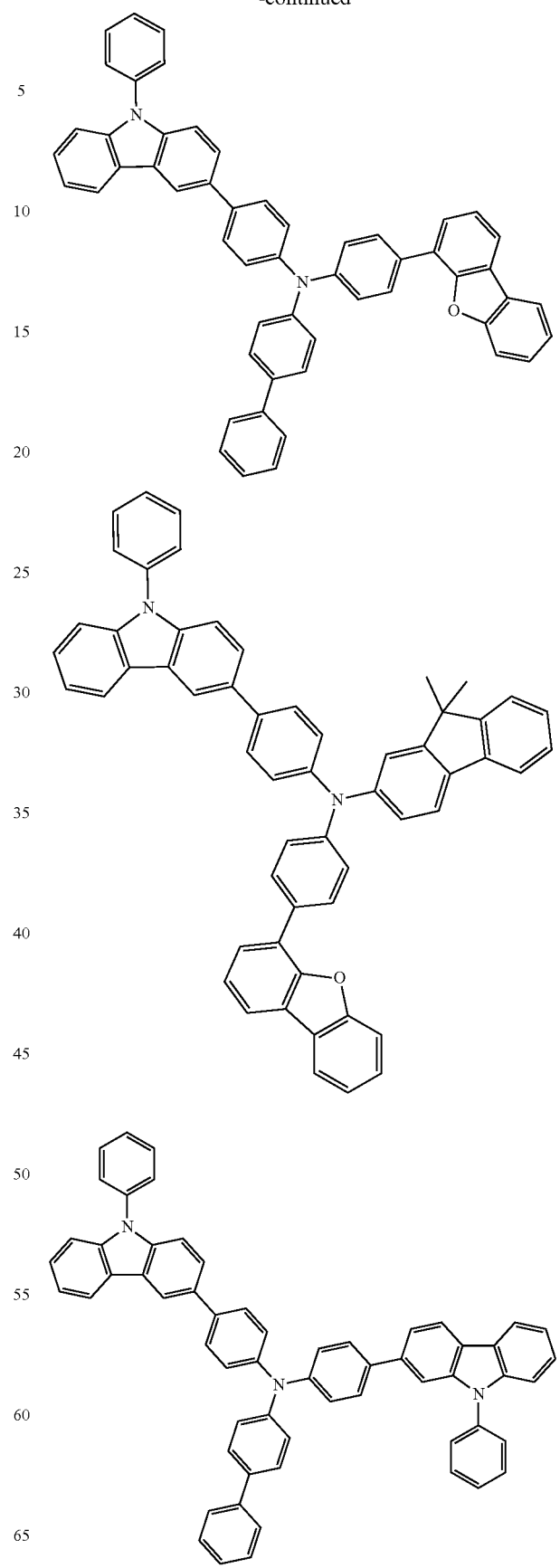

143
-continued
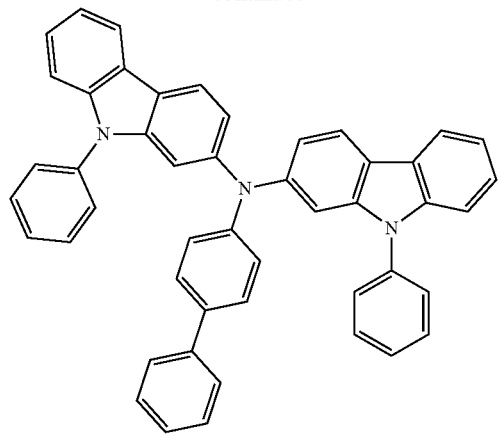
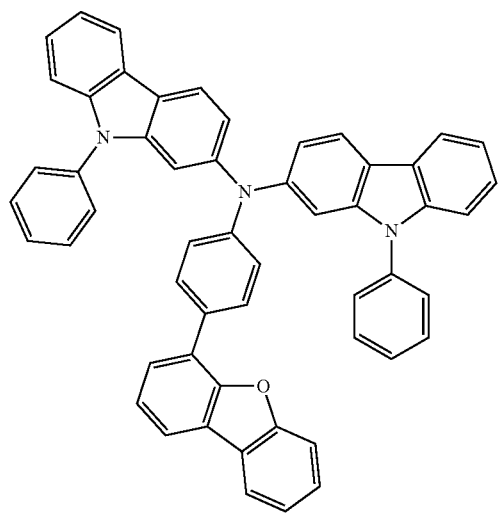
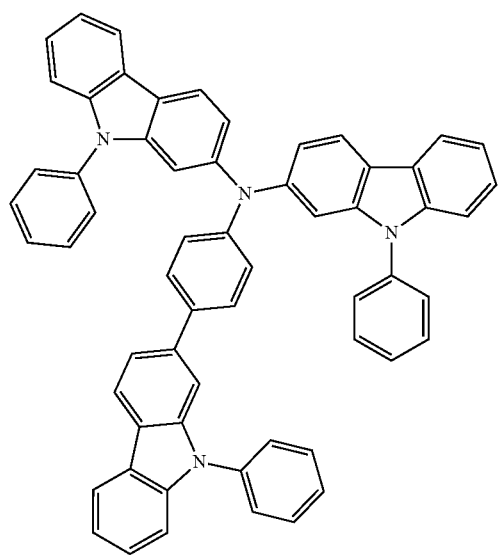
144
-continued
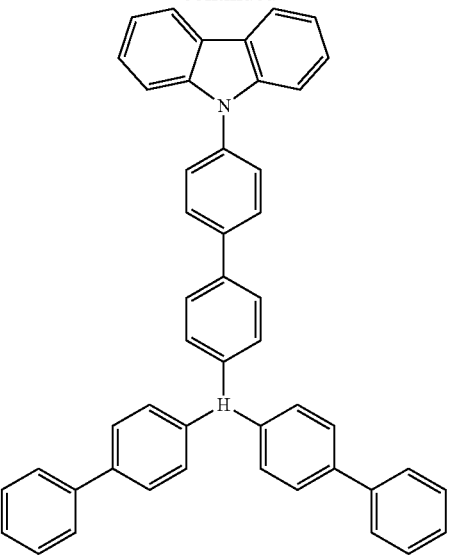
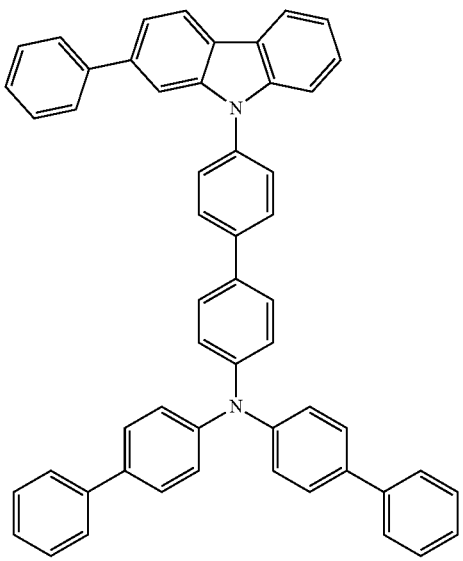
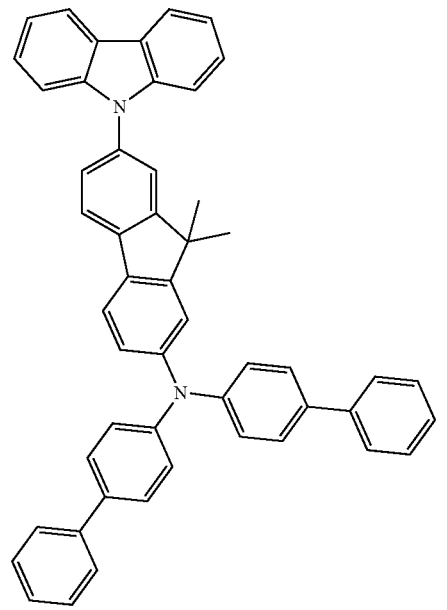

145
-continued
146
-continued
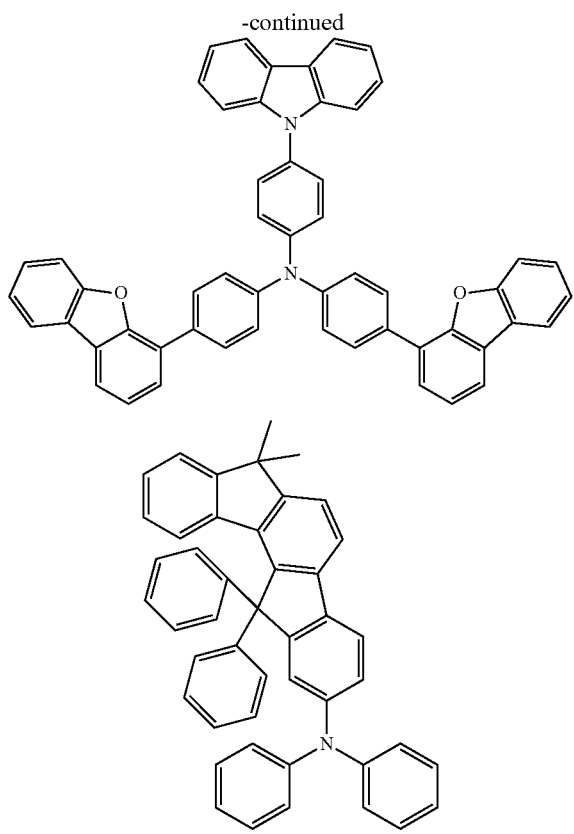
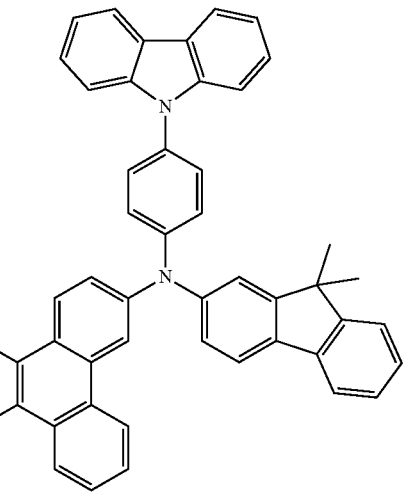
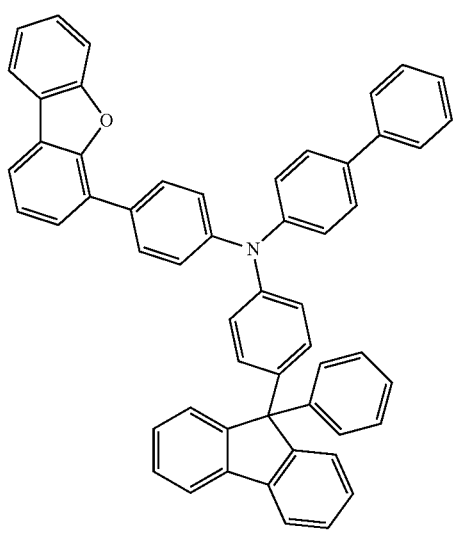
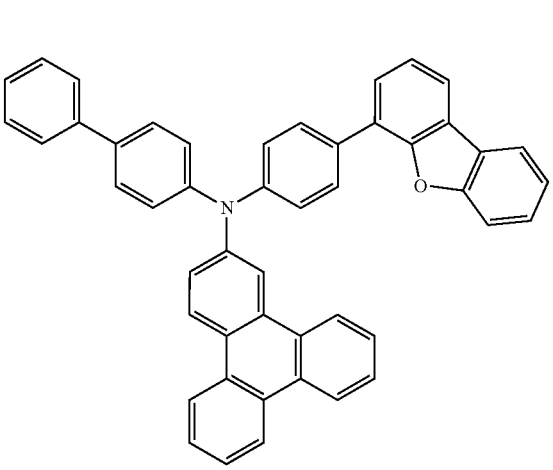

147
-continued
148
-continued
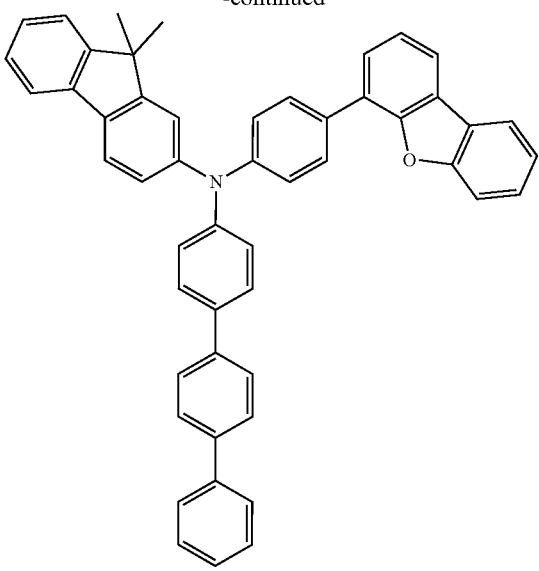
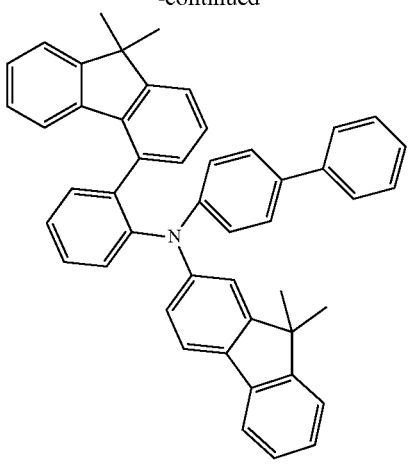
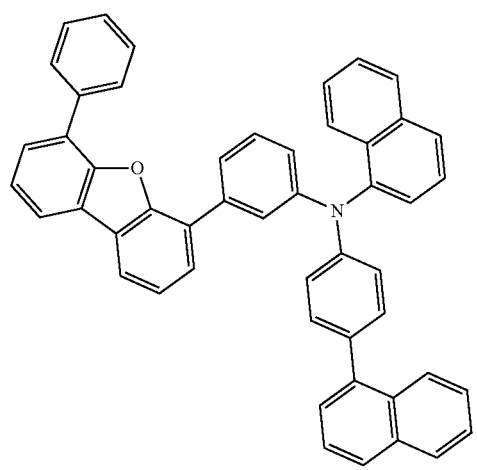
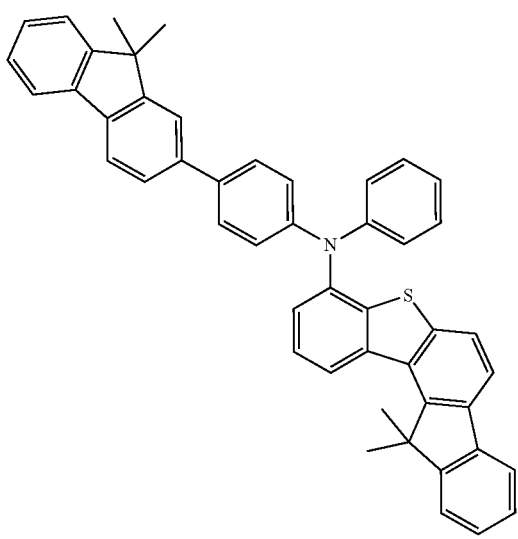
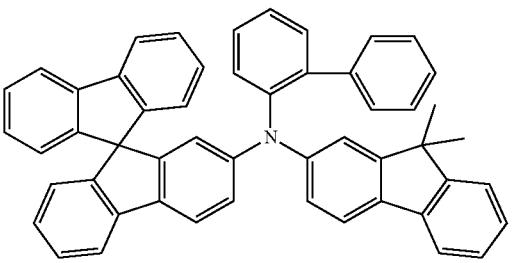

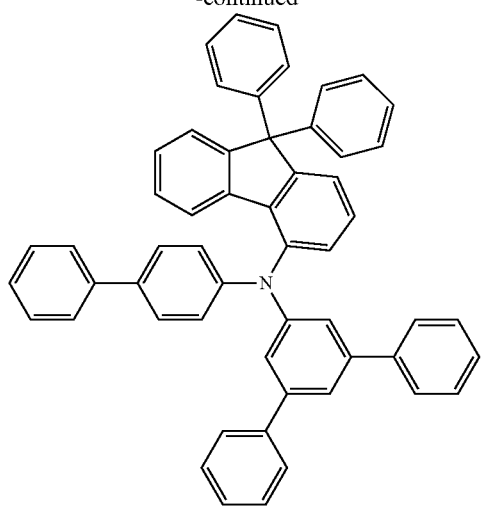
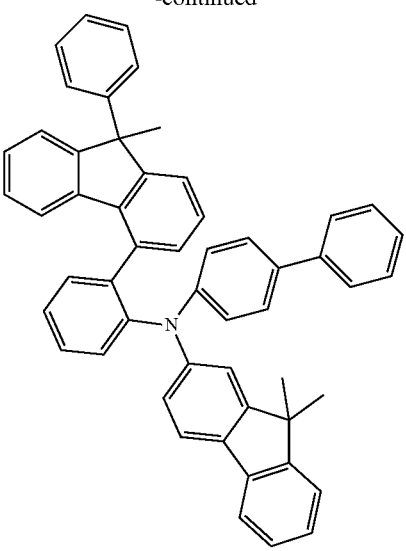

151
-continued
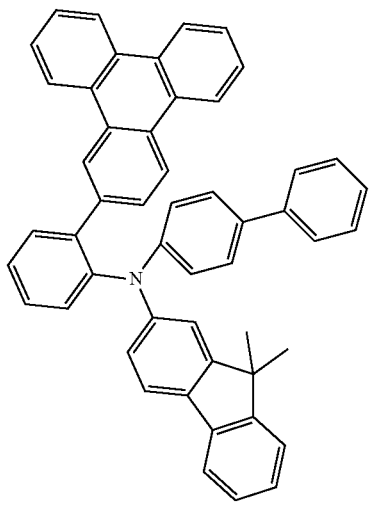
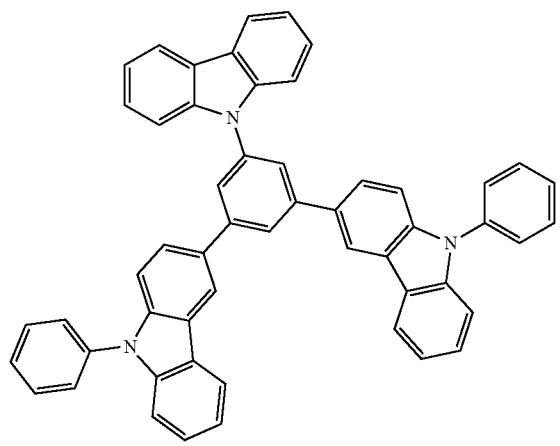
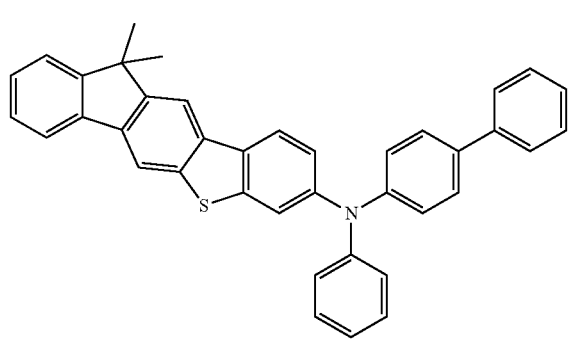
152
-continued
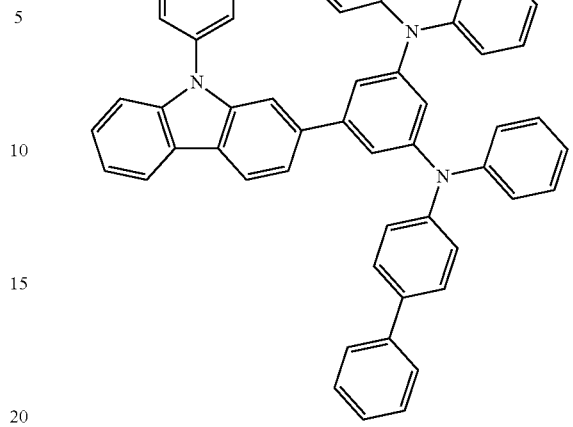
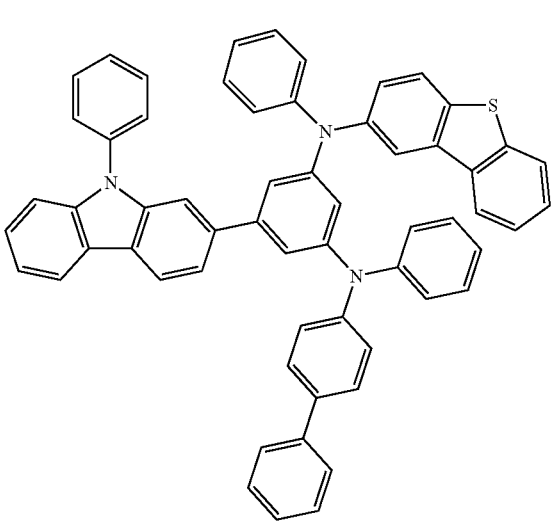
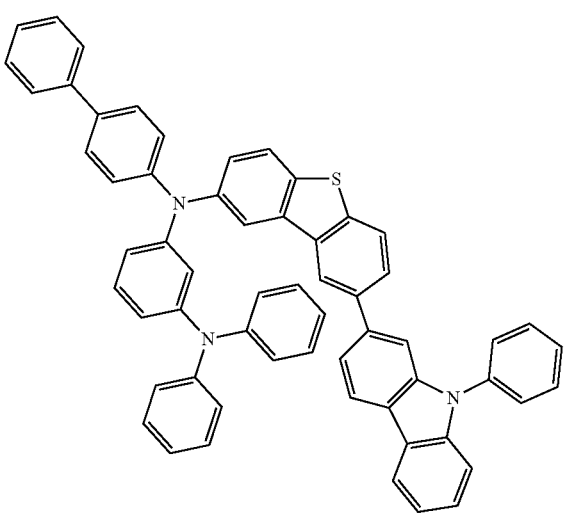

153
-continued
154
-continued
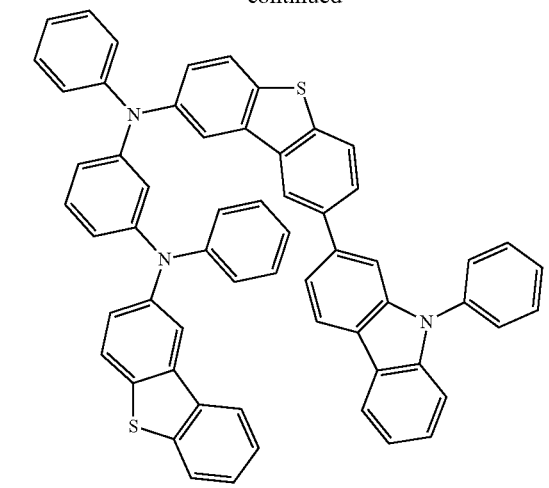
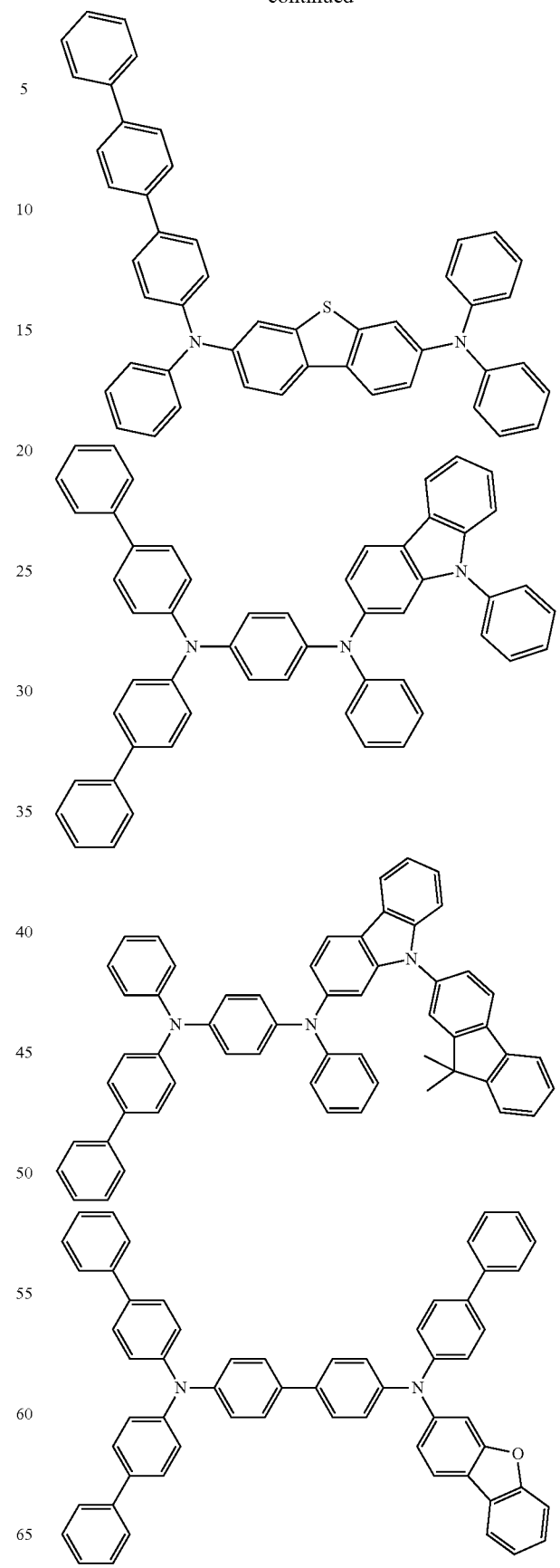

155
-continued
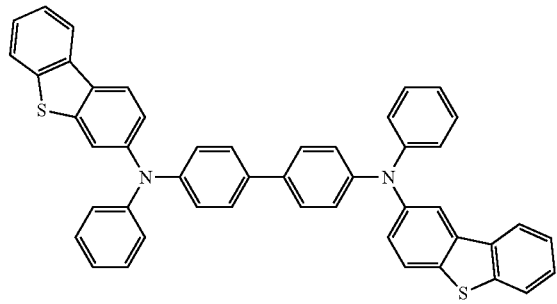
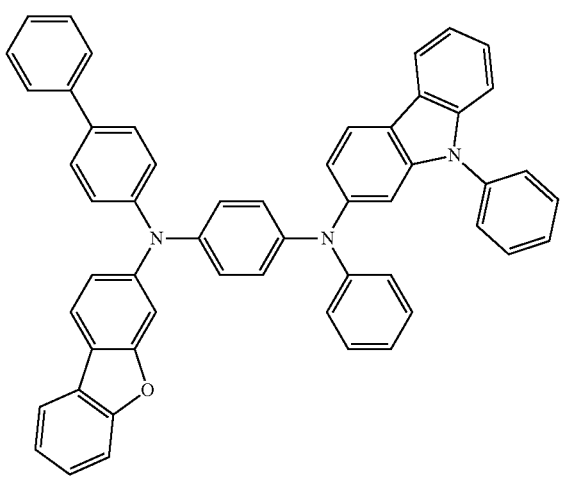
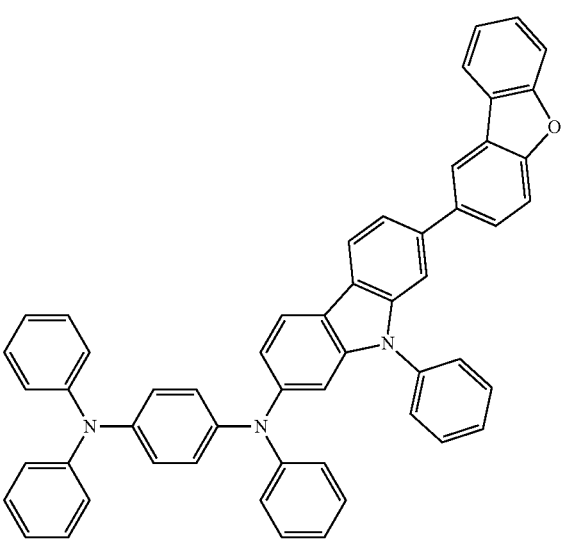
156
-continued
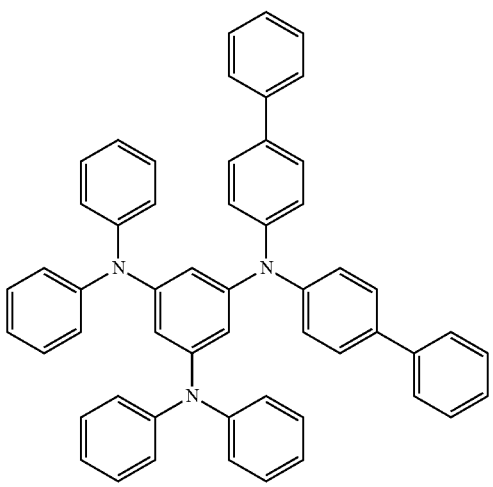
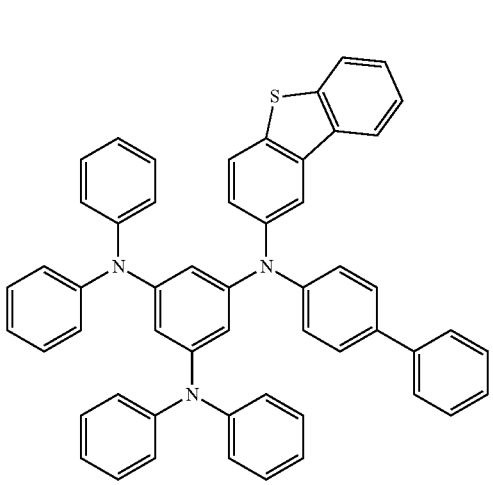
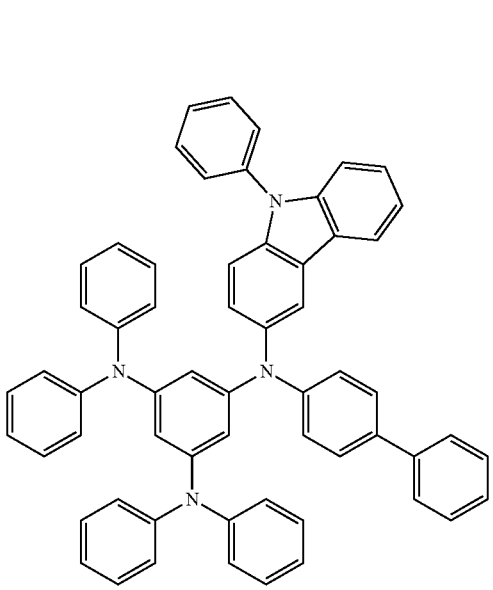

157
-continued
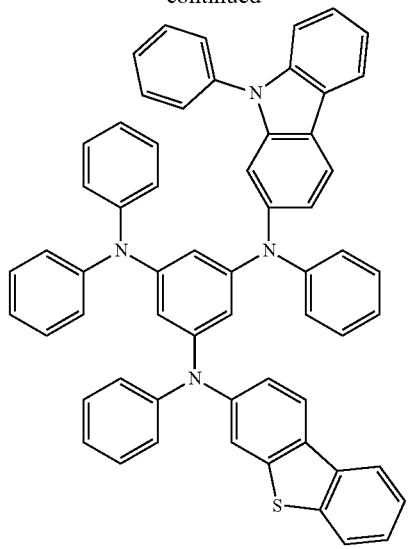
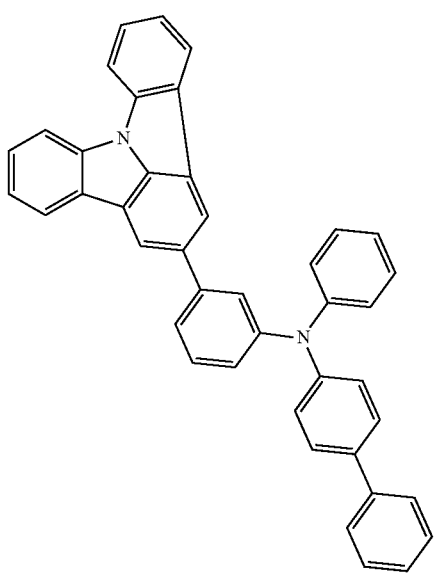
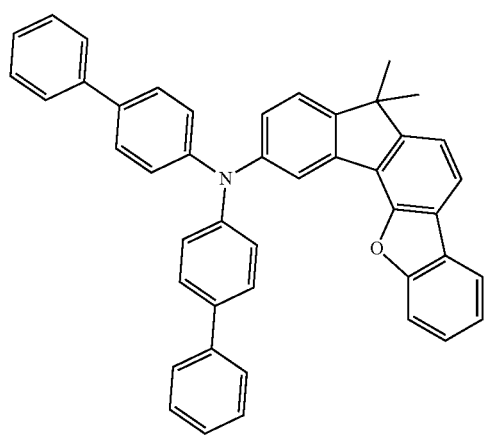
158
-continued
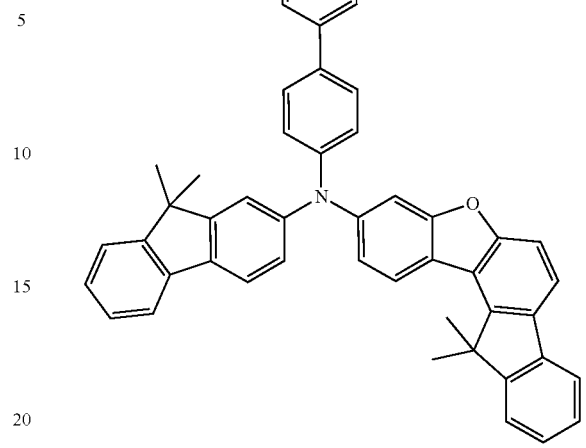
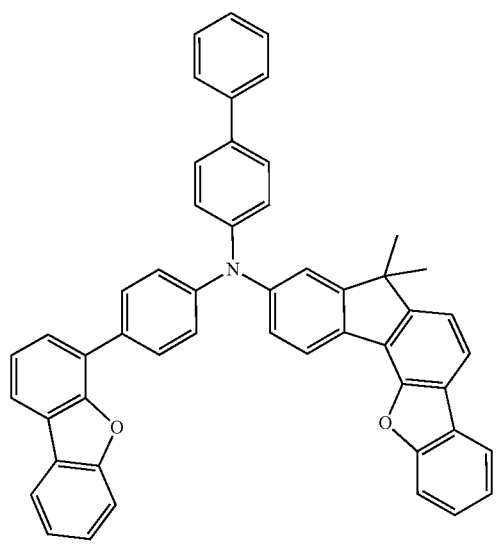

-continued
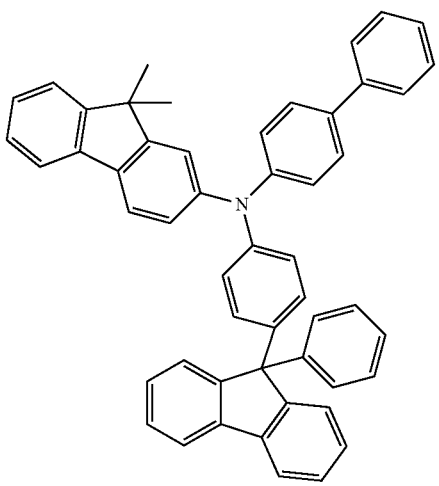
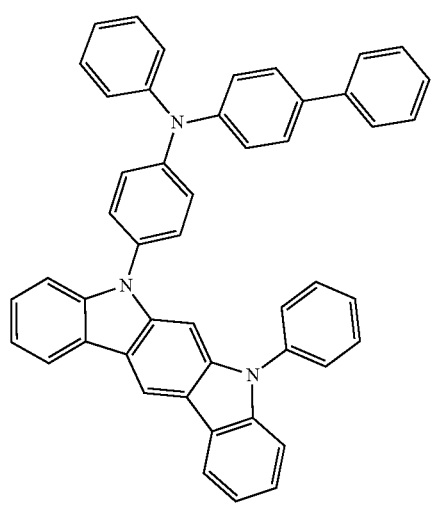
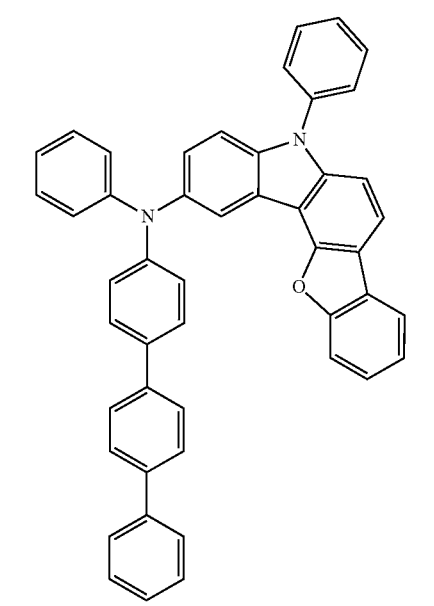
-continued
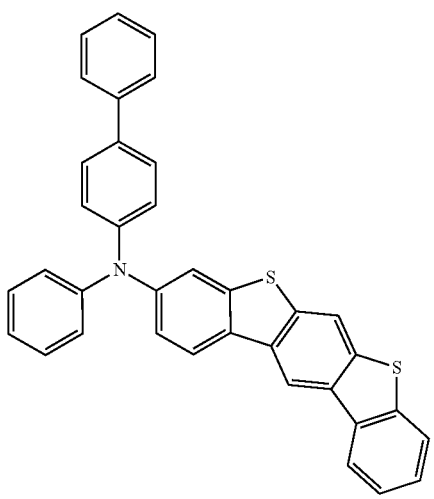
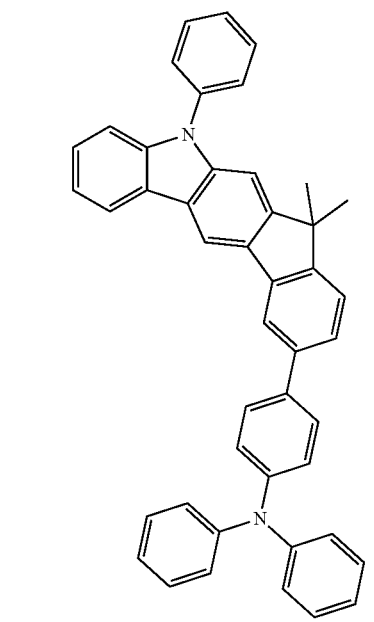
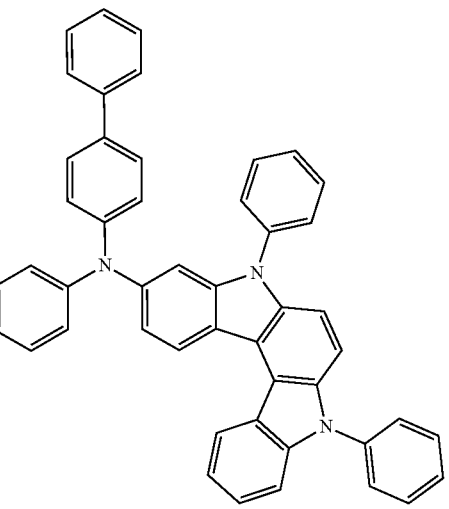

-continued

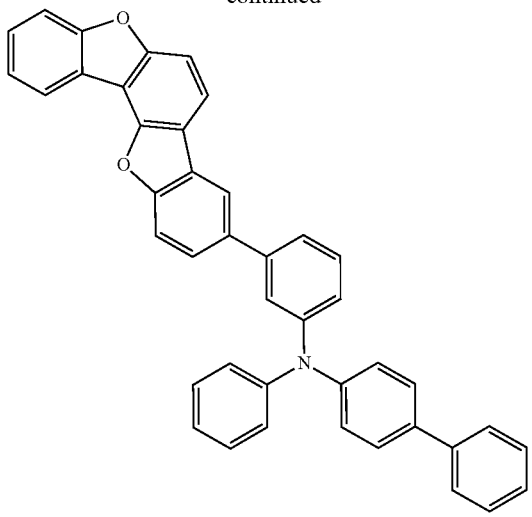

In an implementation, in the hole transport auxiliary layer, compounds disclosed in U.S. Pat. No. 5,061,569A, JP1993-009471A, WO1995-009147A1, JP1995-126615A, JP1998-095973A, or the like, and compounds similar thereto may be included in addition to the compound.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in Examples and Synthesis Examples were purchased from Sigma-Aldrich Co. Ltd., TCI Inc., Tokyo chemical industry or P&H tech as far as there in no particular comment or were synthesized by suitable methods.

(Preparation of First Compound for Organic Optoelectronic Device)

The compounds below were synthesized through the following steps.

Synthesis Example 1: Synthesis of Compound A-1

[Reaction Scheme 1]

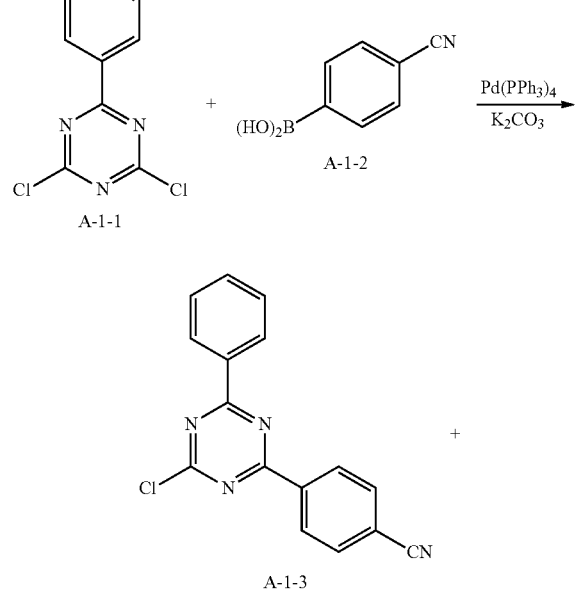

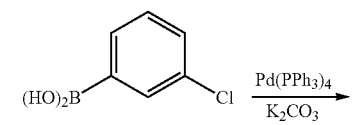

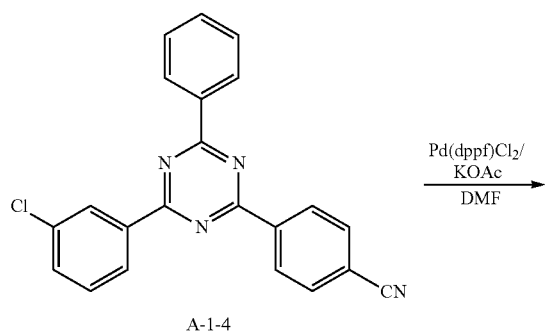

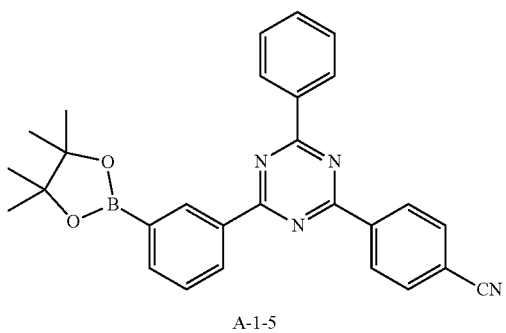

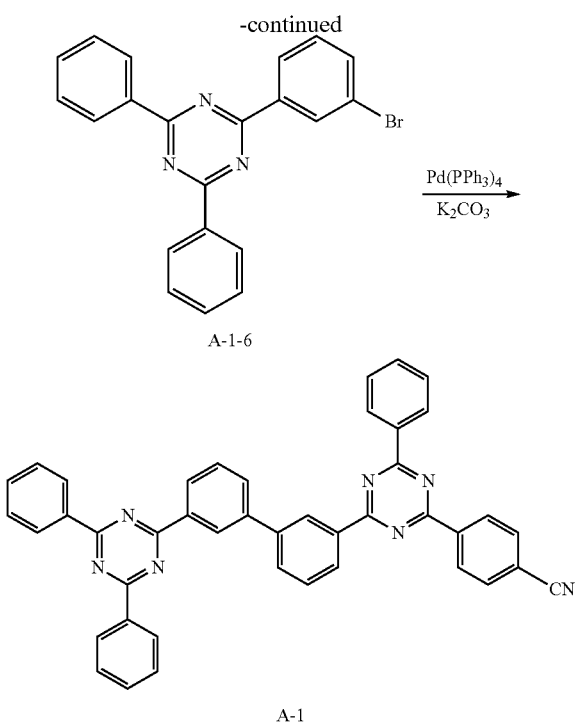

A-1-6

A-1

1st Step: Synthesis of Intermediate A-1-3

In a 5 L flask, Intermediate A-1-1 (150.0 g, 0.663 mol), Intermediate A-1-2 (97.50 g, 0.663 mol), potassium carbonate (229.29 g, 1.66 mol), and tetrakis(triphenylphosphine) palladium (0) (38.34 g, 33.18 mmol) were added to 2 L of 1,4-dioxane and 1 L of water, and then heated to 70° C. for 12 hours under a nitrogen stream. The organic layer was separated, 2 L of methanol was added thereto, crystallized solids were filtered, dissolved in toluene, filtered through silica gel/Celite, an appropriate amount of organic solvent was removed, and then the resultant was recrystallized with toluene to obtain Intermediate A-1-3 (145.68 g, Yield: 75%).

2nd Step: Synthesis of Intermediate A-1-4

In a 5 L flask, Intermediate A-1-3 (145.0 g, 0.495 mol), 3-chlorophenylboronic acid (77.46 g, 0.495 mol), potassium carbonate (171.15 g, 1.24 mol), and tetrakis(triphenylphosphine) palladium (0) (28.62 g, 24.77 mmol) were added to 1.6 L of 1,4-dioxane and 800 mL of water, followed by heating at 70° C. for 12 hours under a nitrogen stream. The organic layer was separated, 1.6 L of methanol was added, crystallized solids were filtered, dissolved in toluene, filtered through silica gel/Celite, an appropriate amount of the organic solvent was removed, and then the resultant was recrystallized with toluene to obtain Intermediate A-1-4 (142.5 g, Yield: 78%).

3rd Step: Synthesis of Intermediate A-1-5

After dissolving the Intermediate A-1-4 (142 g, 0.385 mol) in 1.5 L of dimethylformamide (DMF) under a nitrogen atmosphere, bis(pinacolato)diboron (117.32 g, 0.46 mol), (1,1'-bis(diphenylphosphine)ferrocene)dichloropalladium (II) (15.72 g, 19.3 mmol), potassium acetate (75.6 g, 0.77 mol), and tricyclohexylphosphine (32.4 g) were added and the mixture was heated under reflux at 150° C. for 24 hours. After completion of the reaction, water was added to the reaction solution and the mixture was filtered, and dried in a vacuum oven. The obtained residues were dissolved in monochlorobenzene and filtered through silica to volatilize an organic solvent to obtain 148 g (83%) of Intermediate A-1-5.

4th Step: Synthesis of Compound A-1

In a 100 mL flask, Intermediate A-1-5 (5.0 g, 10.86 mmol), Intermediate A-1-6 (4.22 g, 10.86 mmol), potassium carbonate (3.75 g, 27.15 mol), and tetrakis(triphenylphosphine) palladium (0) (0.63 g, 0.54 mmol) was added to 40 mL of 1,4-dioxane and 20 mL of water, followed by heating at 70° C. for 12 hours under a nitrogen stream. The organic layer was separated, 40 mL of methanol was added thereto, crystallized solids were filtered, dissolved in 1,2-dichlorobenzene, filtered through silica gel/Celite, and an appropriate amount of organic solvent was removed, and then the resultant was recrystallized with 1,2-dichlorobenzene to obtain Compound A-1 (4.81 g, Yield: 69%).

calcd. C43H27N7: C, 80.48; H, 4.24; N, 15.28; found: C, 80.47; H, 4.24; N, 15.29.

Synthesis Examples 2 to 21

Each of the following compounds was synthesized in the same manner as Compound A-1 of Synthesis Example 1, using Intermediate A shown in Table 1 instead of Intermediate A-1-5, and using Intermediate B shown in Table 1 instead of Intermediate A-1-6.

TABLE 1

| Synthesis Examples | Intermediate A | Intermediate B | Final product | Yield | Properties data of final products |
|---|---|---|---|---|---|
| Synthesis Example 2 | A-1-7 | A-1-6 | A-5 | 5.35 g 73% | calcd. C43H27N7: C, 80.48; H, 4.24; N, 15.28; found: C, 80.48; H, 4.24; N, 15.28 |
| Synthesis Example 3 | A-1-7 | B-1-1 | A-6 | 4.61 g 68% | calcd. C44H28N6: C, 82.48; H, 4.40; N, 13.12; found: C, 82.48; H, 4.41; N, 13.11 |
| Synthesis Example 4 | A-1-8 | A-1-6 | A-8 | 4.57 g 70% | calcd. C44H28N6: C, 82.48; H, 4.40; N, 13.12; found: C, 82.47; H, 4.40; N, 13.13 |
| Synthesis Example 5 | A-1-9 | A-1-6 | A-13 | 3.38 g 70% | calcd. C47H29N7: C, 81.60; H, 4.23; N, 14.17; found: C, 81.61; H, 4.22; N, 14.17 |
| Synthesis Example 6 | A-1-10 | A-1-6 | A-14 | 4.90 g 75% | calcd. C47H29N7: C, 81.60; H, 4.23; N, 14.17; found: C, 81.61; H, 4.23; N, 14.18 |
| Synthesis Example 7 | A-1-11 | A-1-6 | A-15 | 3.99 g 69% | calcd. C47H29N7: C, 81.60; H, 4.23; N, 14.17; found: C, 81.60; H, 4.23; N, 14.17 |
| Synthesis Example 8 | A-1-12 | A-1-6 | A-16 | 7.48 g 65% | calcd. C49H31N7: C, 81.99; H, 4.35; N, 13.66; found: C, 81.99; H, 4.35; N, 13.66 |

TABLE 1-continued

| Synthesis Examples | Intermediate A | Intermediate B | Final product | Yield | Properties data of final products |
|---|---|---|---|---|---|
| Synthesis Example 13 | A-1-13 | A-1-6 | A-17 | 3.07 g 74% | calcd. C49H31N7: C, 81.99; H, 4.35; N, 13.66; found: C, 81.98; H, 4.35; N, 13.67 |
| Synthesis Example 14 | A-1-7 | B-1-2 | A-22 | 5.73 g 70% | calcd. C49H31N7: C, 81.99; H, 4.35; N, 13.66; found: C, 81.99; H, 4.35; N, 13.66 |
| Synthesis Example 15 | A-1-14 | B-1-3 | A-33 | 4.48 g 72% | calcd. C43H27N7: C, 80.48; H, 4.24; N, 15.28; found: C, 80.47; H, 4.25; N, 15.28 |
| Synthesis Example 16 | A-1-15 | B-1-3 | A-37 | 6.33 g 78% | calcd. C43H27N7: C, 80.48; H, 4.24; N, 15.28; found: C, 80.48; H, 4.24; N, 15.28 |
| Synthesis Example 17 | A-1-15 | B-1-4 | A-54 | 4.96 g 76% | calcd. C49H31N7: C, 81.99; H, 4.35; N, 13.66; found: C, 82.01; H, 4.34; N, 13.65 |
| Synthesis Example 18 | A-1-7 | B-1-3 | A-69 | 6.35 g 74% | calcd. C43H27N7: C, 80.48; H, 4.24; N, 15.28; found: C, 80.47; H, 4.25; N, 15.28 |
| Synthesis Example 19 | A-1-9 | B-1-3 | A-77 | 4.55 g 78% | calcd. C47H29N7: C, 81.60; H, 4.23; N, 14.17; found: C, 81.60; H, 4.23; N, 14.17 |
| Synthesis Example 20 | A-1-15 | A-1-6 | A-101 | 3.71 g 65% | calcd. C43H27N7: C, 80.48; H, 4.24; N, 15.28; found: C, 80.48; H, 4.24; N, 15.28 |
| Synthesis Example 21 | A-1-16 | A-1-6 | A-109 | 3.99 g 69% | calcd. C47H29N7: C, 81.60; H, 4.23; N, 14.17; found: C, 81.60; H, 4.23; N, 14.17 |

Intermediate A:

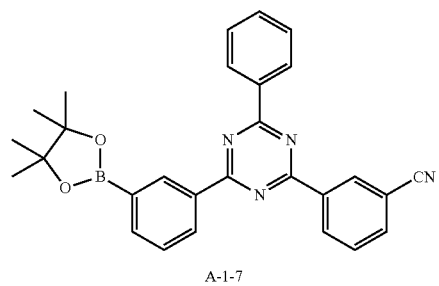 [SMILES: CC1(C)OB(c2cccc(-c3nc(-c4ccccc4)nc(-c4cccc(C#N)c4)n3)c2)OC1(C)C]

A-1-7

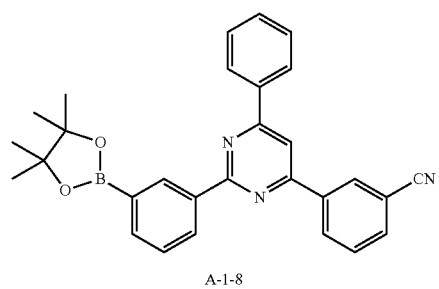 [SMILES: CC1(C)OB(c2cccc(-c3nc(-c4ccccc4)cc(-c4cccc(C#N)c4)n3)c2)OC1(C)C]

A-1-8

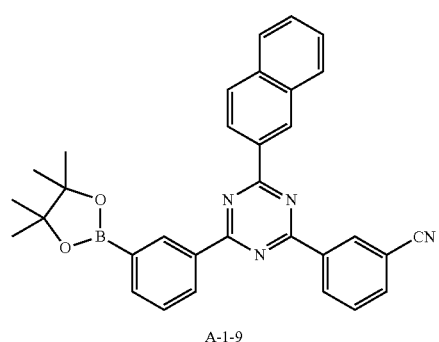 [SMILES: CC1(C)OB(c2cccc(-c3nc(-c4cccc(C#N)c4)nc(-c4ccc5ccccc5c4)n3)c2)OC1(C)C]

A-1-9

TABLE 1-continued
| Synthesis Examples | Intermediate A | Intermediate B | Final product | Yield | Properties data of final products |
|---|---|---|---|---|---|
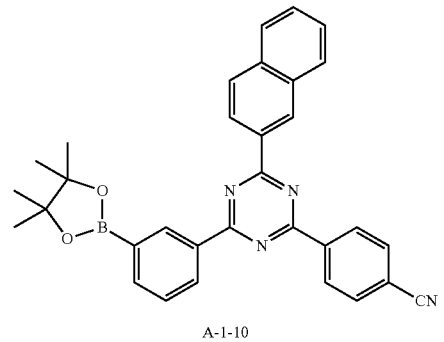 [SMILES: CC1(C)OB(c2cccc(-c3nc(-c4ccc(C#N)cc4)nc(-c4ccc5ccccc5c4)n3)c2)OC1(C)C]
A-1-10
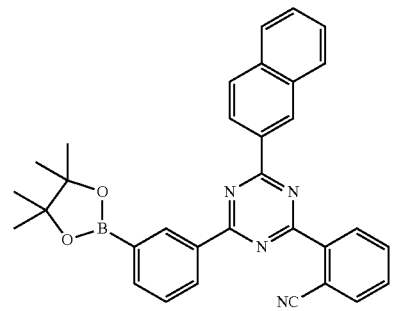
A-1-11
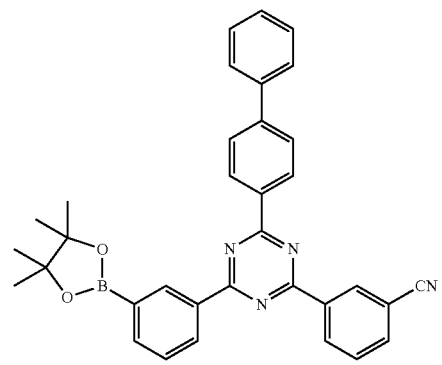
A-1-12
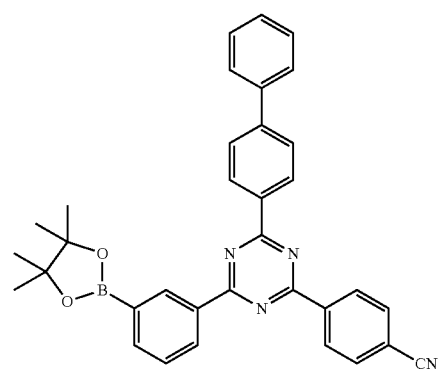
A-1-13

TABLE 1-continued
| Synthesis Examples | Intermediate A | Intermediate B | Final product | Yield | Properties data of final products |
|---|---|---|---|---|---|
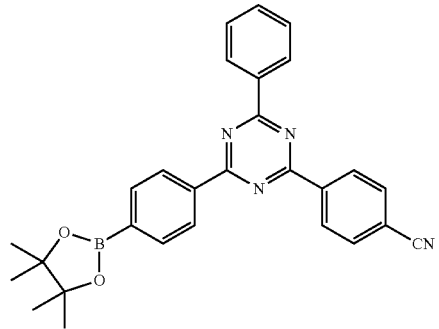
A-1-14
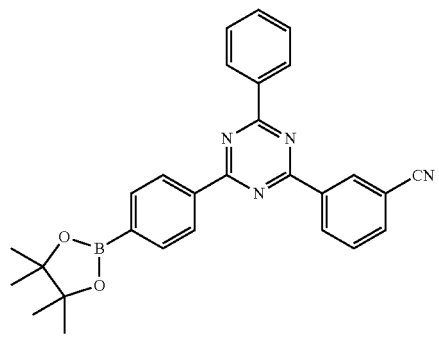
A-1-15
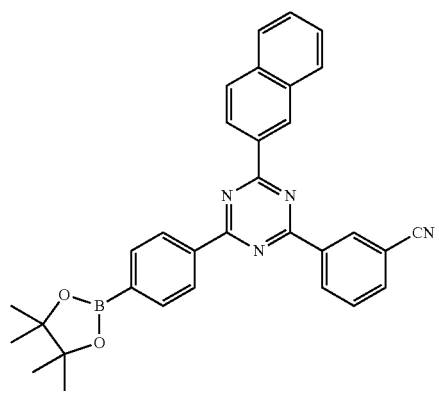
A-1-16
Intermediate B:
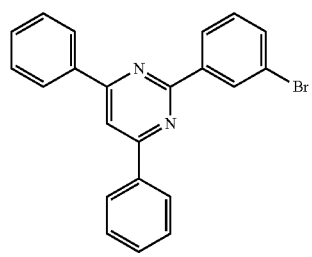
B-1-1

TABLE 1-continued
| Synthesis Examples | Intermediate A | Intermediate B | Final product | Yield | Properties data of final products |
| --- | --- | --- | --- | --- | --- |
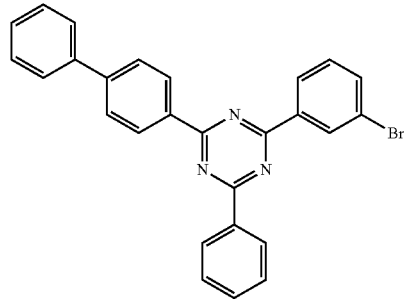
B-1-2
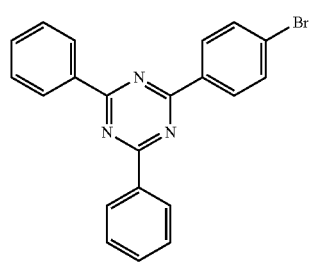
B-1-3
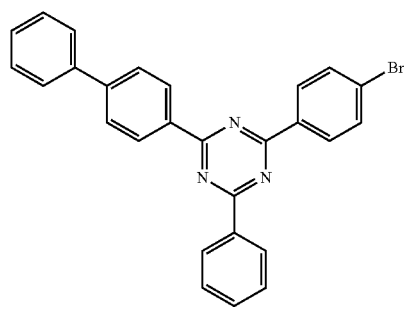
B-1-4

Preparation of Second Compound for Organic Optoelectronic Device

Synthesis Example 22: Synthesis of Compound B-99

Compound B-99 was synthesized in the same method as disclosed in US 2017-0317293A1.

Synthesis Example 23: Synthesis of Compound C-4

[Reaction Scheme 2]

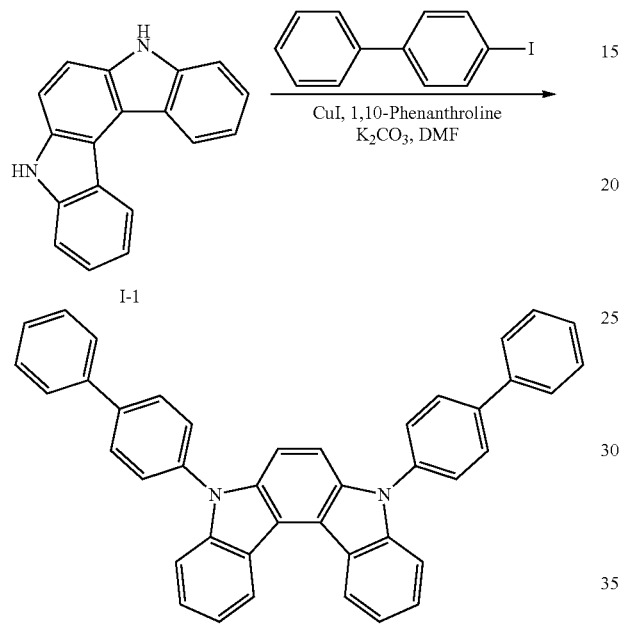

In a round-bottom flask, 8 g (31.2 mmol) of Intermediate I-1, 20.5 g (73.32 mmol) of 4-iodobiphenyl, 1.19 g (6.24 mmol) of CuI, 1.12 g (6.24 mmol) of 1,10-phenanthroline, and 12.9 g (93.6 mmol) of $K_2CO_3$ were added, 50 ml of DMF was added thereto, and the mixture was stirred under reflux for 24 hours under a nitrogen atmosphere. After completion of the reaction, distilled water was added thereto to precipitate crystals and filter the resultant. The solids were dissolved in 250 ml of xylene, filtered through silica gel, and precipitated as a white solid to synthesize 16.2 g (Yield: 93%) of Compound C-4.

LC/MS calculated for: C42H28N2 Exact Mass: 560.2252 found for: 561.23.

Comparative Synthesis Examples 1 to 6

Each of the following compounds was synthesized in the same manner as Compound A-1 of Synthesis Example 1, using Intermediate C shown in Table 2 instead of Intermediate A-1-5, and using Intermediate B shown in Table 2 instead of Intermediate A-1-6.

TABLE 2

| Comparative Synthesis Examples | Intermediate C | Intermediate B | Comparative Compound Product | Yield | Properties data of final products |
|---|---|---|---|---|---|
| Comparative Synthesis Example 1 | C-1-1 | B-1-3 | Comparative Compound 1 | 8.39 g 77% | calcd. C42H28N6: C, 81.80; H, 4.58; N, 13.63; found: C, 81.80; H, 4.57; N, 13.64 |
| Comparative Synthesis Example 2 | C-1-1 | A-1-6 | Comparative Compound 2 | 7.05 g 74% | calcd. C42H28N6: C, 81.80; H, 4.58; N, 13.63; found: C, 81.80; H, 4.58; N, 13.63 |
| Comparative Synthesis Example 3 | C-1-2 | B-1-3 | Comparative Compound 3 | 9.57 g 74% | calcd. C42H28N6: C, 81.80; H, 4.58; N, 13.63; found: C, 81.81; H, 4.58; N, 13.62 |
| Comparative Synthesis Example 4 | C-1-3 | | Comparative Compound 4 | 2.36 g 65% | calcd. C46H36N6O4: C, 74.98; H, 4.92; N, 11.41; O, 8.69; found: C, 74.98; H, 4.92; N, 11.41; O, 8.69 |
| Comparative Synthesis Example 5 | C-1-4 | | Comparative Compound 5 | 1.76 g 57% | calcd. C58H52F8N6: C, 70.72; H, 5.32; F, 15.43; N, 8.53; found: C, 70.71; H, 5.32; F, 15.43; N, 8.54 |
| Comparative Synthesis Example 6 | C-1-5 | B-1-5 | Comparative Compound 6 | 4.47 g 70% | calcd. C37H23N7: C, 78.57; H, 4.10; N, 17.33; found: C, 78.57; H, 4.09; N, 17.34 |

TABLE 2-continued
| Comparative Synthesis Examples | Intermediate C | Intermediate B | Comparative Compound Product | Yield | Properties data of final products |
|---|---|---|---|---|---|
Intermediate B:
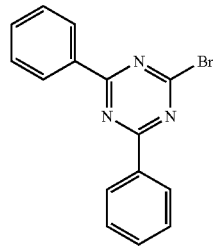
B-1-5
Intermediate C:
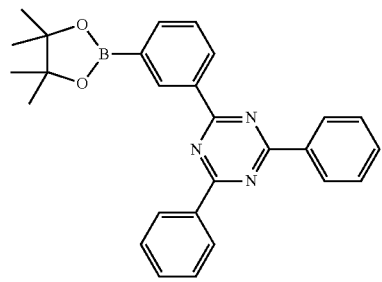
C-1-1
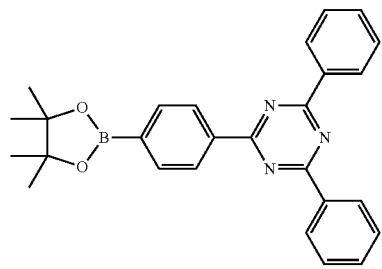
C-1-2
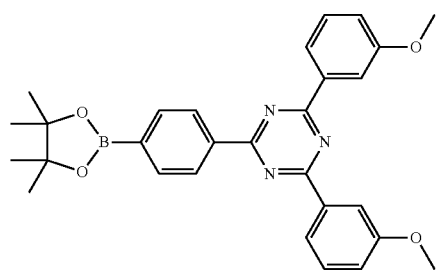
C-1-3

TABLE 2-continued
| Comparative Synthesis Examples | Intermediate C | Intermediate B | Comparative Compound Product | Yield | Properties data of final products |
|---|---|---|---|---|---|
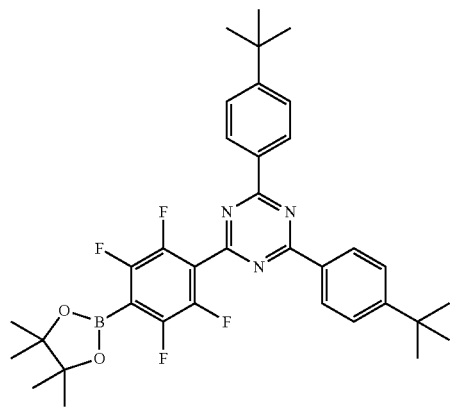
C-1-4
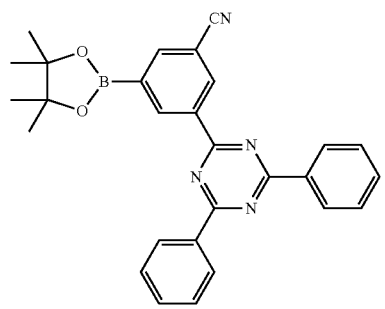
C-1-5
Comparative Compounds:
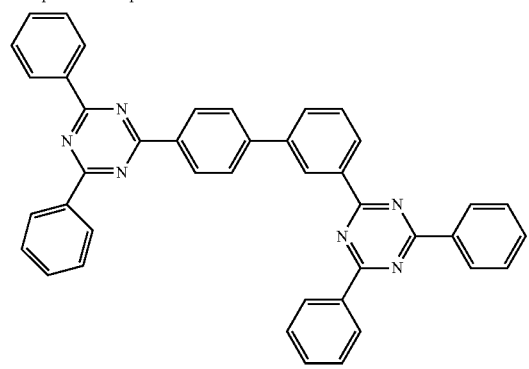
Comparative Compound 1
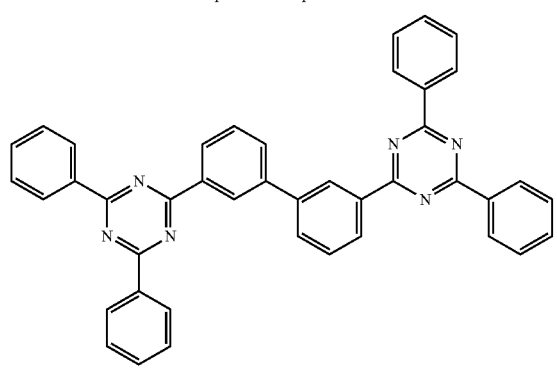
Comparative Compound 2

TABLE 2-continued
| Comparative Synthesis Examples | Intermediate C | Intermediate B | Comparative Compound Product | Yield | Properties data of final products |
|---|---|---|---|---|---|
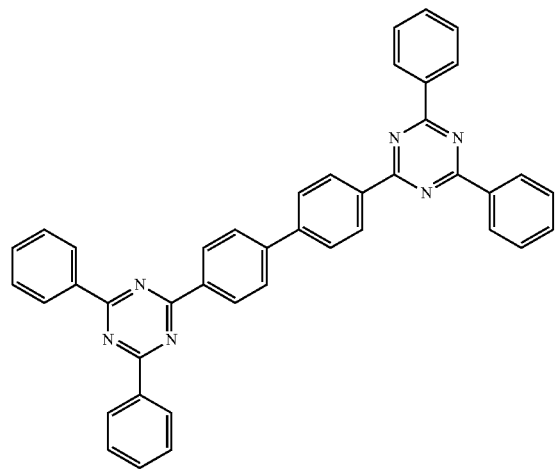
Comparative Compound 3
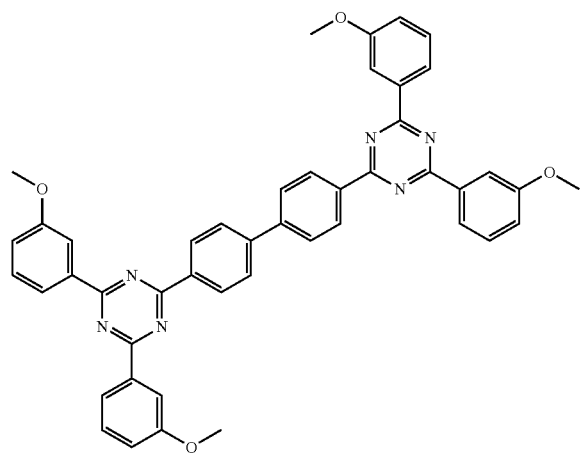
Comparative Compound 4
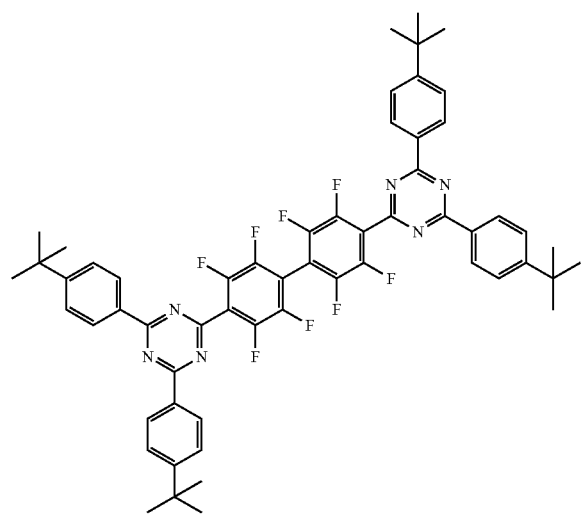
Comparative Compound 5

TABLE 2-continued

| Comparative Synthesis Examples | Intermediate C | Intermediate B | Comparative Compound Product | Yield | Properties data of final products |
|---|---|---|---|---|---|
| | | | 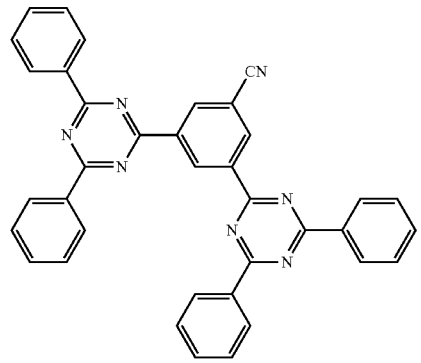<br>Comparative Compound 6 | | |

Manufacture of Organic Light Emitting Diode I—Green

Example 1

A glass substrate coated with ITO (indium tin oxide) as a 1,500 Å-thick film was washed with distilled water. After washing with the distilled water, the glass substrate was ultrasonic wave-washed with isopropyl alcohol, acetone, or methanol, and dried and then, moved to a plasma cleaner, cleaned by using oxygen plasma for 10 minutes, and moved to a vacuum depositor. This obtained ITO transparent electrode was used as an anode, Compound A was vacuum-deposited on the ITO substrate to form a 700 Å-thick hole injection layer, Compound B was deposited to be 50 Å thick on the injection layer, and Compound C was deposited to be 1,020 Å thick to form a hole transport layer. On the hole transport layer, a 400 Å-thick light emitting layer was formed by vacuum-depositing Compound A-1 obtained in Synthesis Example 1 and Compound B-99 obtained in Synthesis Example 22 simultaneously as a host doped with 10 wt % of tris(2-phenylpyridine)iridium(III) [Ir(ppy)$_3$] as a dopant. Herein, Compound A-1 and Compound B-99 were included in a weight ratio of 3:7. Subsequently, on the light emitting layer, a 300 Å-thick electron transport layer was formed by simultaneously vacuum-depositing Compound D and Liq in a weight ratio of 1:1, and on the electron transport layer, Liq and Al were sequentially vacuum-deposited to be 15 Å thick and 1200 Å thick, manufacturing an organic light emitting diode.

The organic light emitting diode had a five-layered organic thin layer, and specifically the following structure.

ITO/Compound A (700 Å)/Compound B (50 Å)/Compound C (1,020 Å)/EML[Compound A-1:Compound B-99:Ir(ppy)$_3$=3:7:10%](400 Å)/Compound D:Liq (300 Å)/Liq (15 Å)/Al (1,200 Å).(X=weight ratio)

Compound A: N4,N4'-diphenyl-N4,N4'-bis(9-phenyl-9H-carbazol-3-yl)biphenyl-4,4'-diamine
Compound B: 1,4,5,8,9,11-hexaazatriphenylene-hexacarbonitrile (HAT-CN),
Compound C: N-(biphenyl-4-yl)-9,9-dimethyl-N-(4-(9-phenyl-9H-carbazol-3-yl)phenyl)-9H-fluoren-2-amine
Compound D: 8-(4-(4,6-di(naphthalen-2-yl)-1,3,5-triazin-2-yl)phenyl)quinoline

Examples 2 to 13 and Comparative Examples 1 to 6

Each organic light emitting diode was manufactured in the same method as in Example 1, except that the composition was changed into the compositions shown in Table 3.
Green Diode Evaluation
Life-span characteristics of the organic light emitting diodes according to Examples 1 to 13 and Comparative Examples 1 to 6 were evaluated.
Specific measurement methods are as follows, and the results are shown in Table 3.
(1) Measurement of Current Density Change Depending on Voltage Change
For the produced organic light emitting diodes, while increasing the voltage from 0 V to 10 V, current values flowing through the unit device were measured using a current-voltmeter (Keithley 2400), and the measured current values were divided by each area to obtain results.
(2) Measurement of Luminance Change Depending on Voltage Change
For the produced organic light emitting diodes, the luminance was measured at that time using a luminance meter (Minolta Cs-1000A) while increasing the voltage from 0 V to 10 V, and the results were obtained.
(3) Measurement of Life-Span
The results were obtained by measuring a time when current efficiency (cd/A) was decreased down to 97%, while luminance (cd/m$^2$) was maintained to be 6,000 cd/m$^2$.

TABLE 3

| Nos. | First host | Second host | Host ratio (wt:wt) | Color | Life-span T97 (h) |
|---|---|---|---|---|---|
| Example 1 | A-1 | B-99 | 3:7 | Green | 137% |
| Example 2 | A-5 | B-99 | 3:7 | Green | 145% |
| Example 3 | A-6 | B-99 | 3:7 | Green | 117% |
| Example 4 | A-8 | B-99 | 3:7 | Green | 115% |
| Example 5 | A-16 | B-99 | 3:7 | Green | 138% |
| Example 7 | A-17 | B-99 | 3:7 | Green | 135% |
| Example 8 | A-22 | B-99 | 3:7 | Green | 136% |
| Example 9 | A-33 | B-99 | 3:7 | Green | 128% |
| Example 10 | A-37 | B-99 | 3:7 | Green | 130% |
| Example 11 | A-54 | B-99 | 3:7 | Green | 127% |
| Example 12 | A-69 | B-99 | 3:7 | Green | 132% |
| Example 13 | A-101 | B-99 | 3:7 | Green | 130% |

TABLE 3-continued

| Nos. | First host | Second host | Host ratio (wt:wt) | Color | Life-span T97 (h) |
|---|---|---|---|---|---|
| Comparative Example 1 | Comparative Compound 1 | B-99 | 3:7 | Green | 80% |
| Comparative Example 2 | Comparative Compound 2 | B-99 | 3:7 | Green | 86% |
| Comparative Example 3 | Comparative Compound 3 | B-99 | 3:7 | Green | 73% |
| Comparative Example 4 | Comparative Compound 4 | B-99 | 3:7 | Green | 65% |
| Comparative Example 5 | Comparative Compound 5 | B-99 | 3:7 | Green | 58% |
| Comparative Example 6 | Comparative Compound 6 | B-99 | 3:7 | Green | 100% |

Referring to Table 3, life-spans of the compounds for an organic optoelectronic device according to the Examples were significantly improved compared with those of the Comparative Examples.

Manufacture of Organic Light Emitting Diode II—Red

Example 14

An organic light-emitting device was manufactured using the same method as in Example 1, except that the light emitting layer was formed by co-depositing (piq)$_2$Ir(acac) (dopant), Compound A-13 (first host), and Compound C-4 (second host) at a weight ratio of 3:48.5:48.5 to have a thickness of 400 Å, on the hole transport layer.

Examples 15 to 18 and Comparative Examples 7 and 8

Each organic light emitting diode was manufactured in the same method as in Example 14, except that the first host and the second host were respectively used as shown in Table 4 when forming the light emitting layer.

Red Device Evaluation

Life-span characteristics of the organic light emitting diodes according to Examples 14 to 18 and Comparative Examples 7 and 8 were evaluated.

Specific measurement methods were as follows, and the results are shown in Table 4.

(1) Measurement of Current Density Change Depending on Voltage Change

For the produced organic light emitting diodes, while increasing the voltage from 0 V to 10 V, current values flowing through the unit device were measured using a current-voltmeter (Keithley 2400), and the measured current values were divided by each area to obtain results.

(2) Measurement of Luminance Change Depending on Voltage Change

For the produced organic light emitting diodes, the luminance was measured at that time using a luminance meter (Minolta Cs-1000A) while increasing the voltage from 0V to 10V, and the results were obtained.

(3) Measurement of Life-Span

The results were obtained by measuring a time when current efficiency (cd/A) was decreased down to 97%, while luminance (cd/m$^2$) was maintained to be 6,000 cd/m$^2$.

TABLE 4

| Nos. | First host | Second host | Host ratio (wt:wt) | Color | Life-span T97 (h) |
|---|---|---|---|---|---|
| Example 14 | A-13 | C-4 | 5:5 | Red | 151% |
| Example 15 | A-14 | C-4 | 5:5 | Red | 132% |
| Example 16 | A-15 | C-4 | 5:5 | Red | 120% |
| Example 17 | A-77 | C-4 | 5:5 | Red | 135% |
| Example 18 | A-109 | C-4 | 5:5 | Red | 129% |
| Comparative Example 7 | Comparative Compound 2 | C-4 | 5:5 | Red | 90% |
| Comparative Example 8 | Comparative Compound 6 | C-4 | 5:5 | Red | 100% |

Referring to Table 4, the organic light emitting diodes of Examples 14 to 18 exhibited longer life-spans than the organic light emitting diodes of the Comparative Examples.

One or more embodiments may provide a compound for an organic optoelectronic device capable of realizing an organic optoelectronic device having high efficiency and long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:
   a first compound represented by Chemical Formula 1A; and
   a second compound represented by Chemical Formula 2-8, the first compound and the second compound being included in a weight ratio of 30:70 to 50:50:

[Chemical Formula 1A]

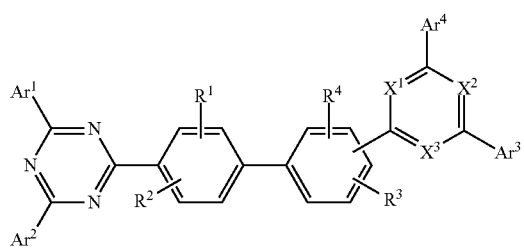

wherein, in Chemical Formula 1A,
$X^1$ to $X^3$ are all N,
$R^1$ to $R^4$ are independently hydrogen, deuterium, an unsubstituted C1 to C10 alkyl group, or an unsubstituted C6 to C20 aryl group,
$Ar^1$ to $Ar^4$ of Chemical Formula 1A are independently a substituted or unsubstituted phenyl group, a substituted or unsubstituted biphenyl group, or a substituted or unsubstituted naphthyl group, and at least one of $Ar^1$ to $Ar^4$ is a substituted phenyl group represented by Chemical Formula a2 or Chemical Formula a3:

[Chemical Formula a2]

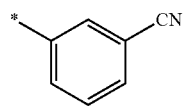

[Chemical Formula a3]

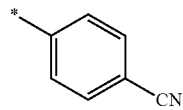

in Chemical Formula a2 and Chemical Formula a3, * is a linking point,

[Chemical Formula 2-8]

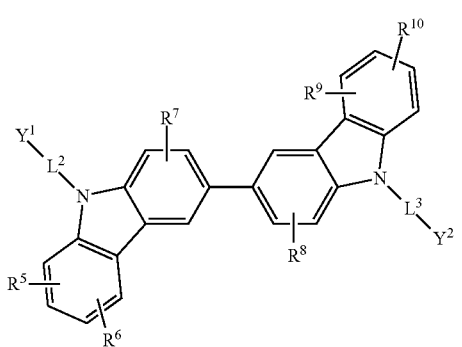

wherein, in Chemical Formula 2-8, $R^5$ to $R^{10}$ are independently hydrogen, deuterium, or a substituted or unsubstituted C6 to C12 aryl group, and

*-$L^2$-$Y^1$ and *-$L^3$-$Y^2$ are each a moiety represented by D-2 or D-3:

D-2

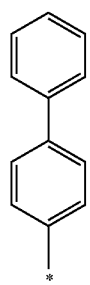

D-3

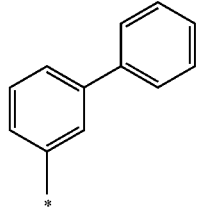

in D-2 and D-3 * is a linking point.

2. The composition as claimed in claim 1, wherein:

the first compound is represented by Chemical Formula 1A-1 or Chemical Formula 1A-4:

[Chemical Formula 1A-1]

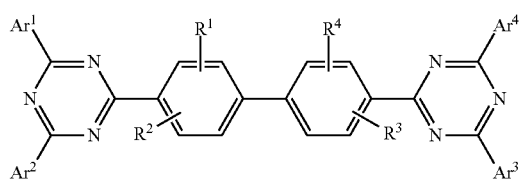

[Chemical Formula 1A-4]

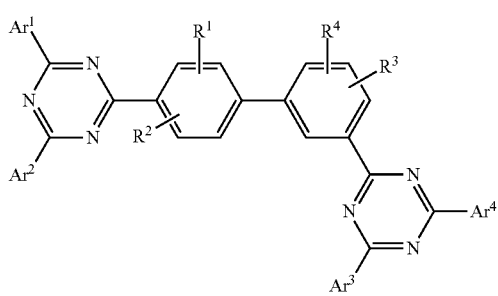

in Chemical Formula 1A-1 and Chemical Formula 1A-4,
$R^1$ to $R^4$ and $Ar^1$ to $Ar^4$ are defined the same as those of Chemical Formula 1A.

3. The composition as claimed in claim 1, wherein the first compound is a compound of Group 1:
[Group 1]
A-33
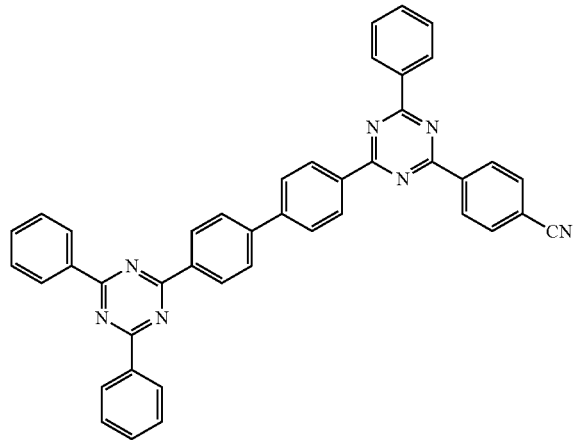
A-37
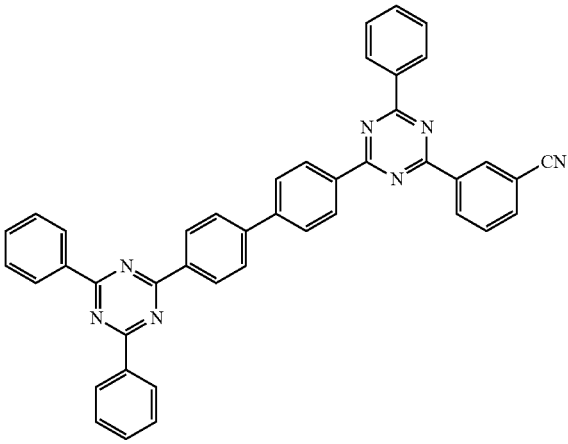
A-45
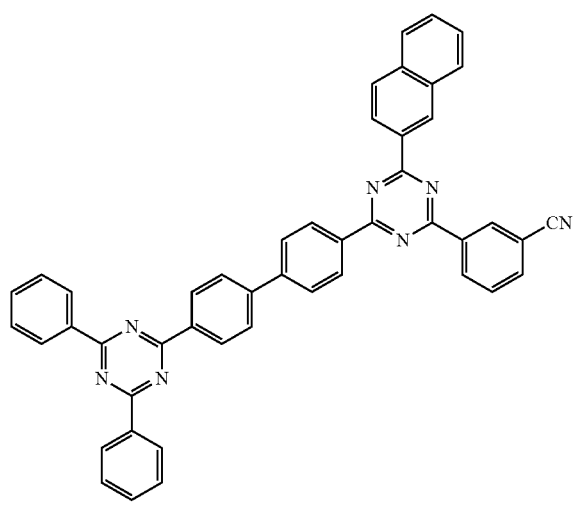
A-46
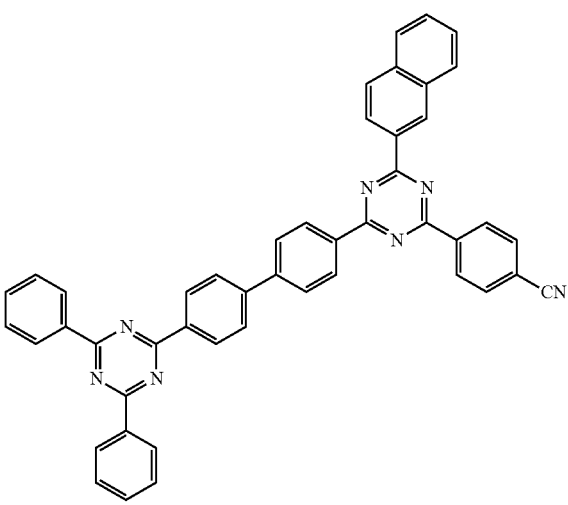
A-48
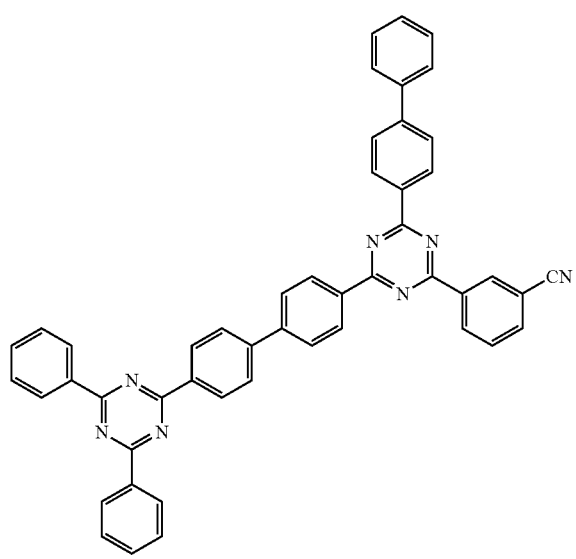
A-49
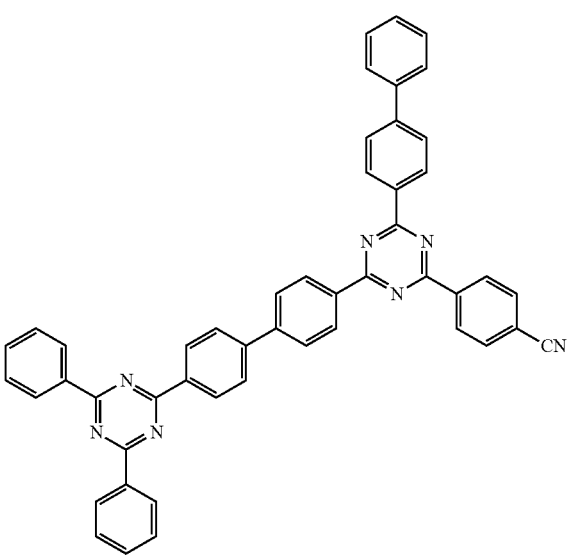

-continued
A-51
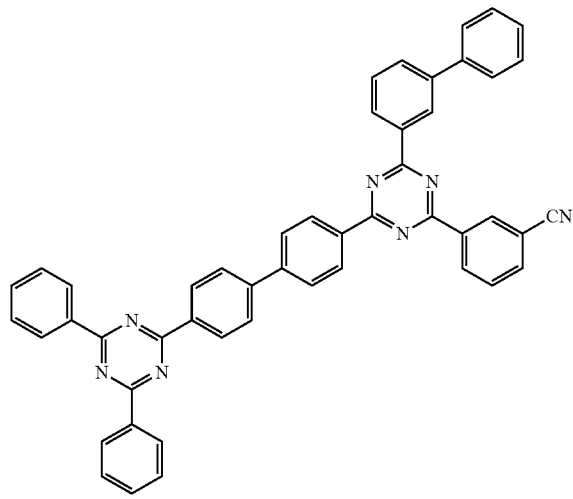
A-52
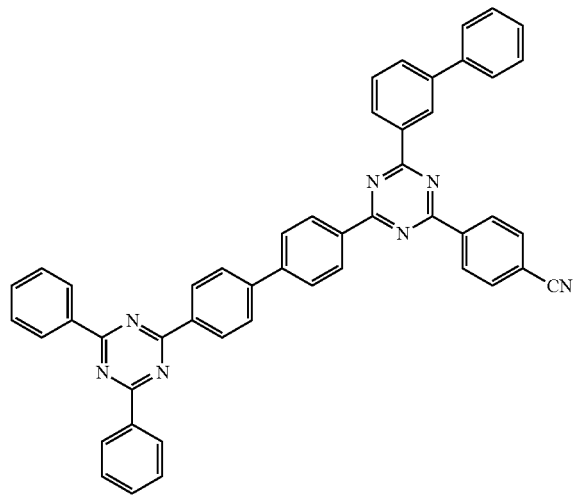
A-54
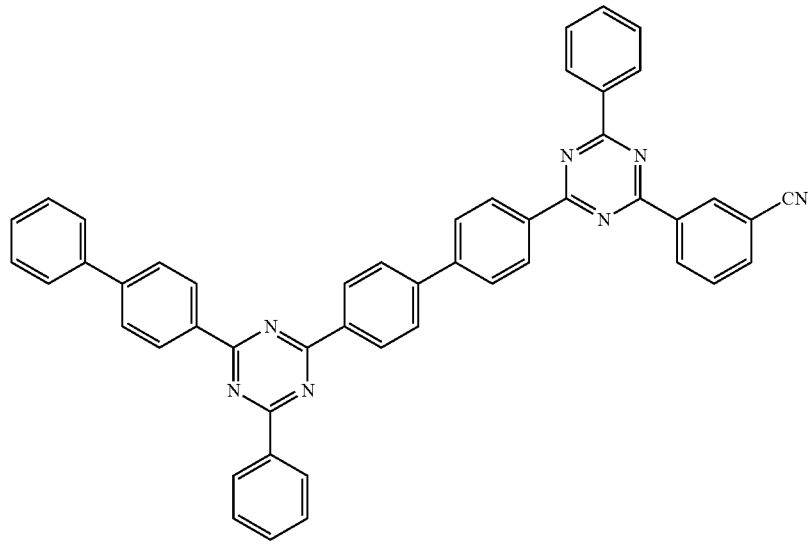
A-55
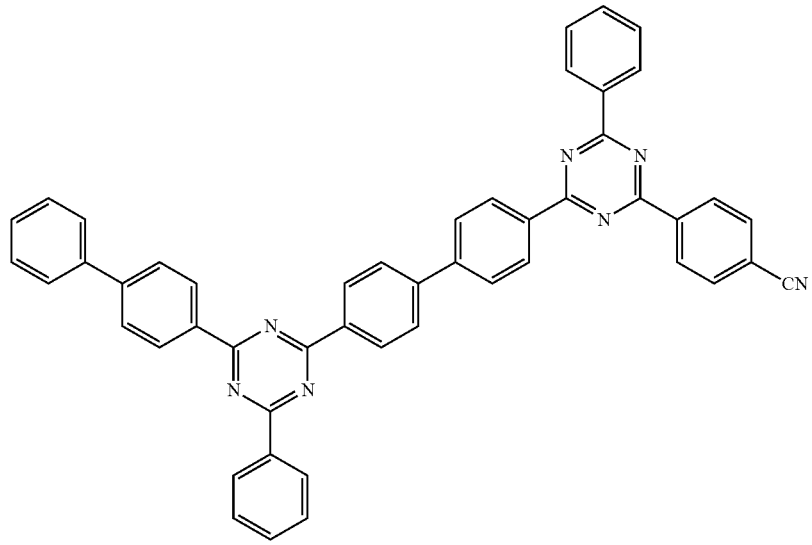

-continued
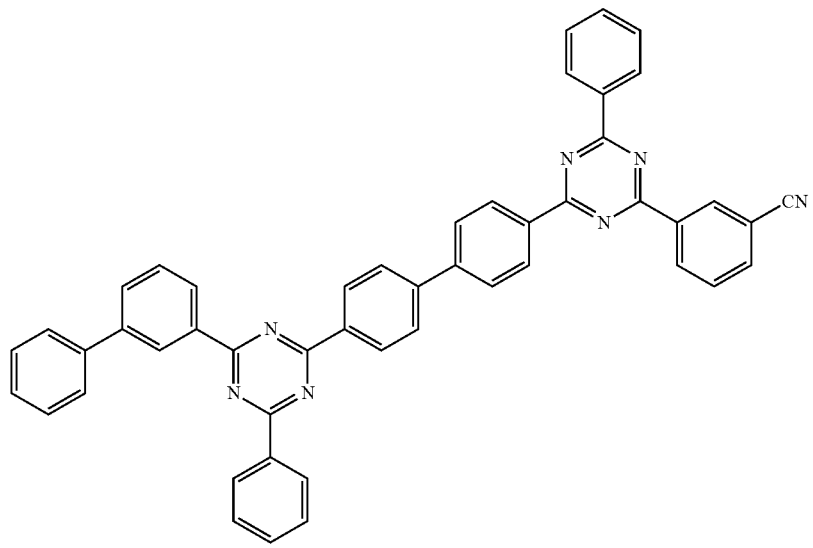
A-57
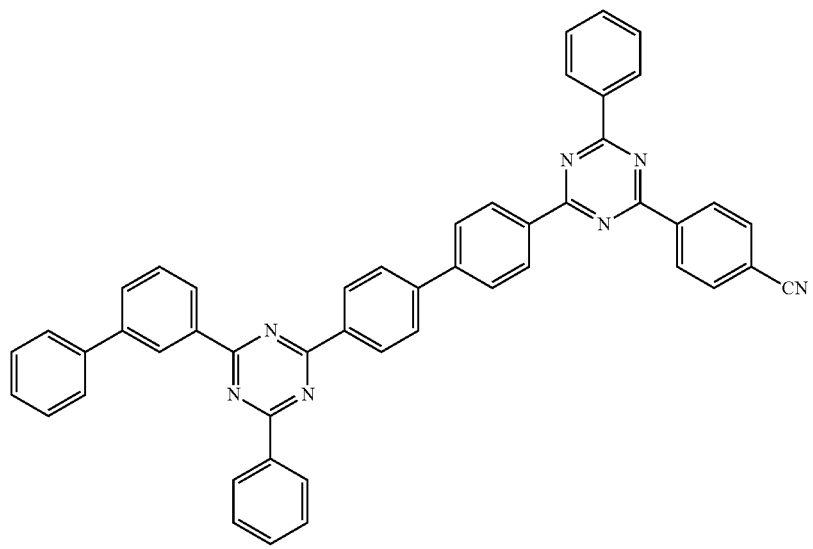
A-58
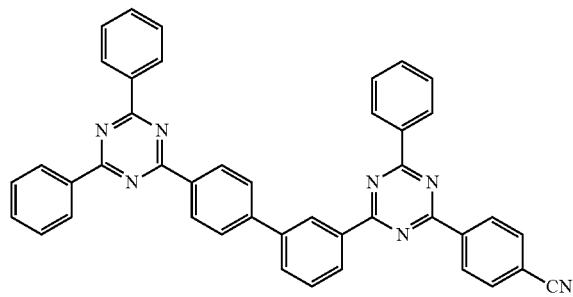
A-65

-continued
A-69
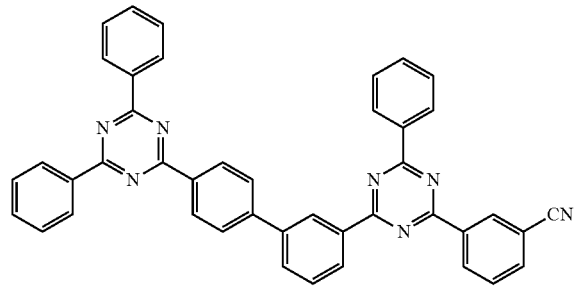
A-77
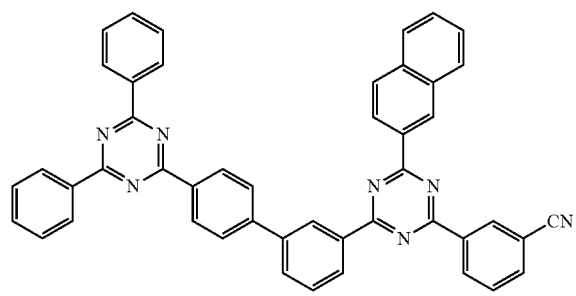
A-78
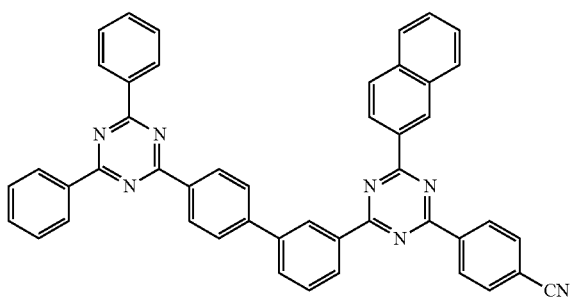
A-80
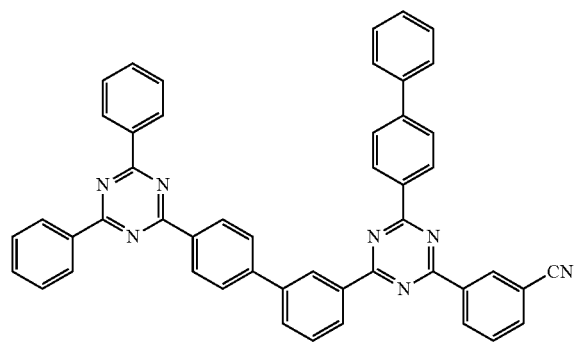
A-81
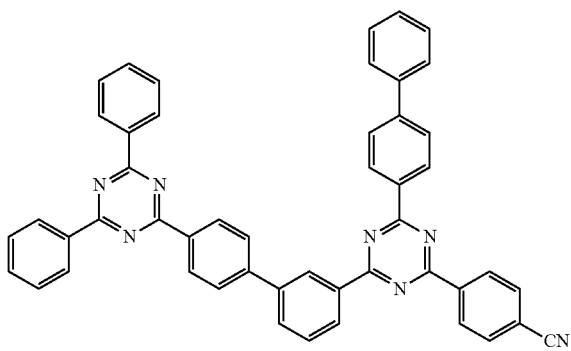
A-83
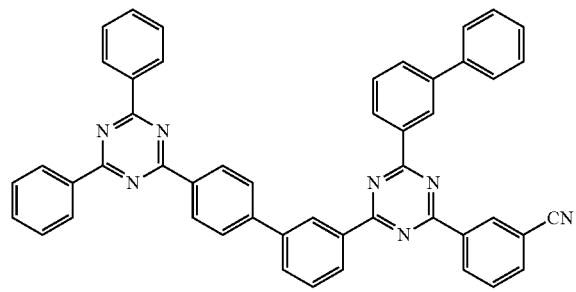
A-84
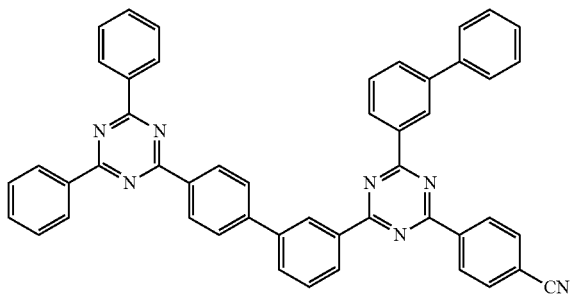

A-86
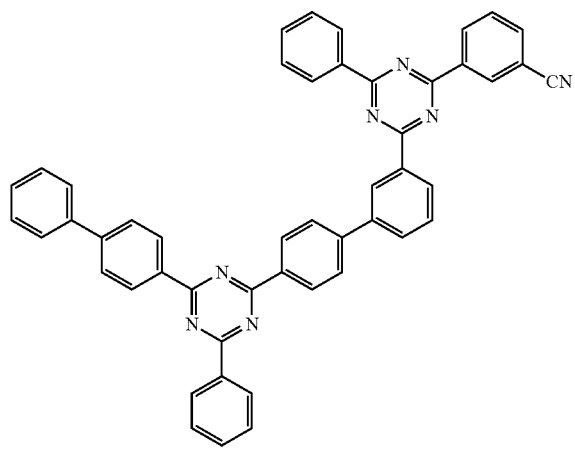
A-87
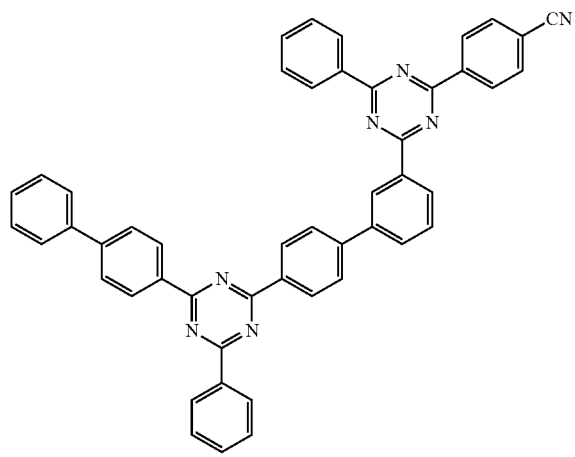
A-89
A-90
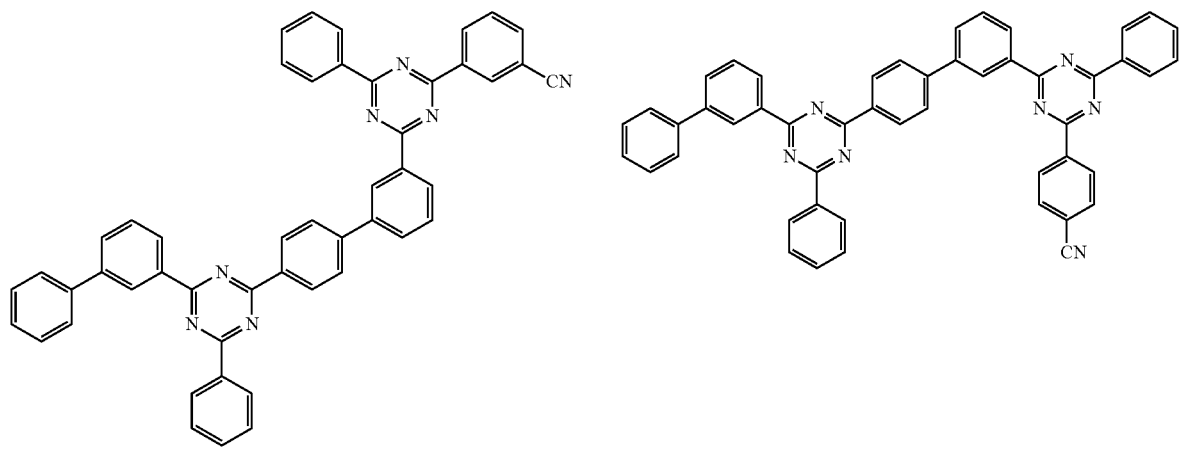

-continued
A-97
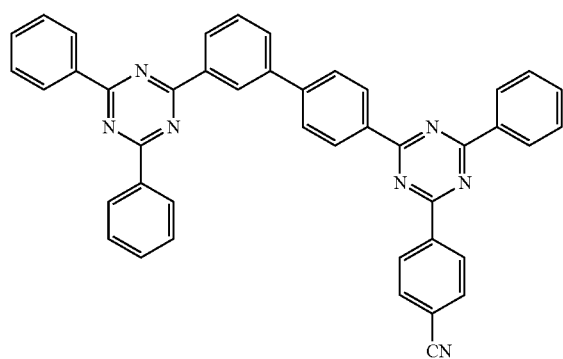
A-101
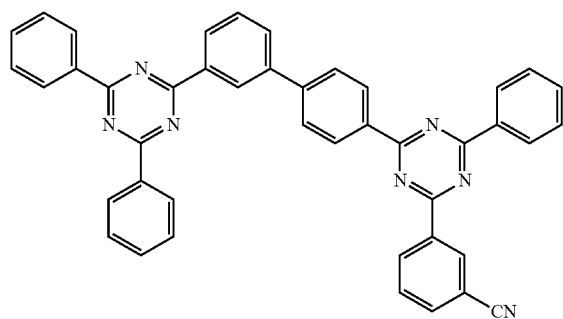
A-109
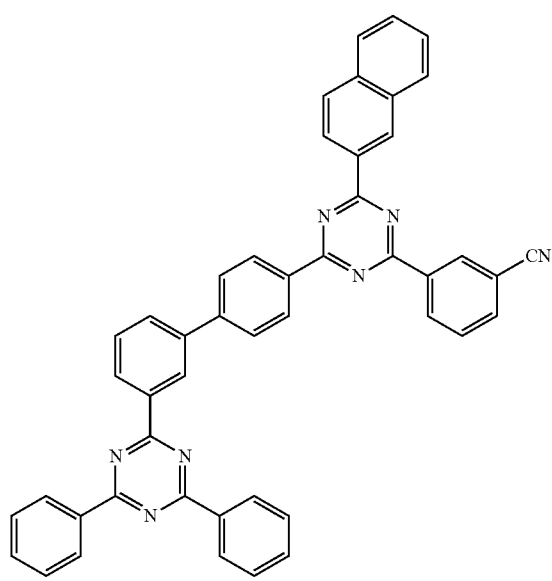
A-110
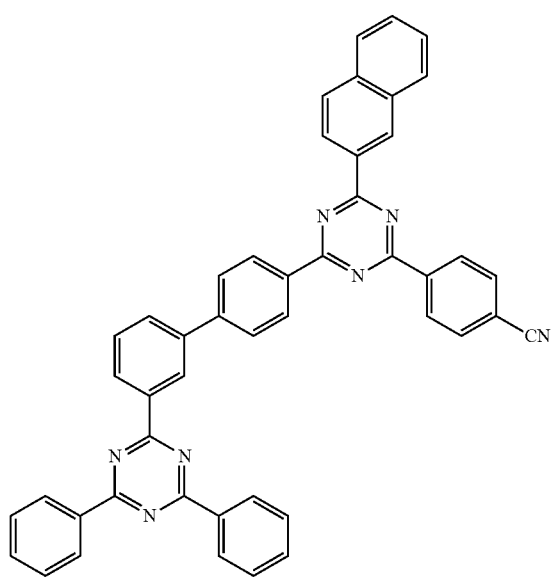

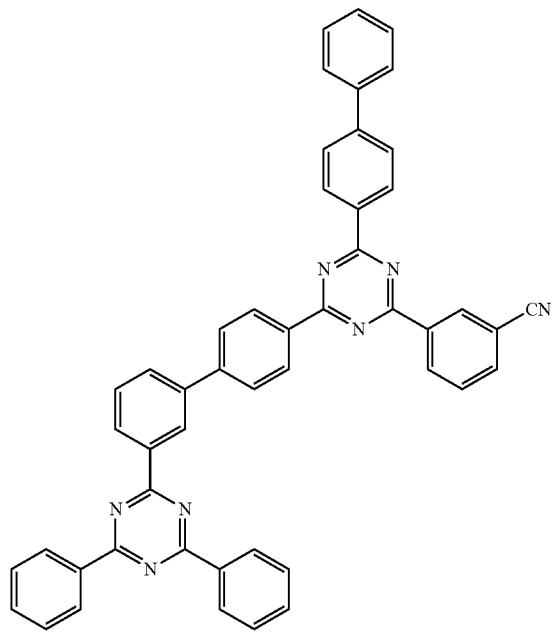
A-112
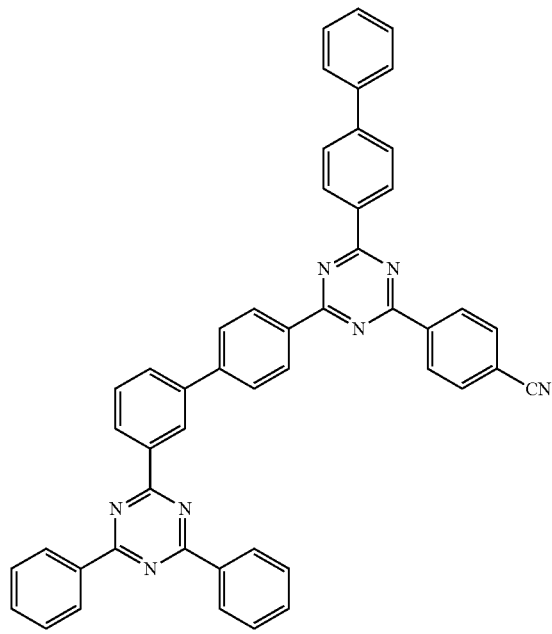
A-113

-continued
A-115
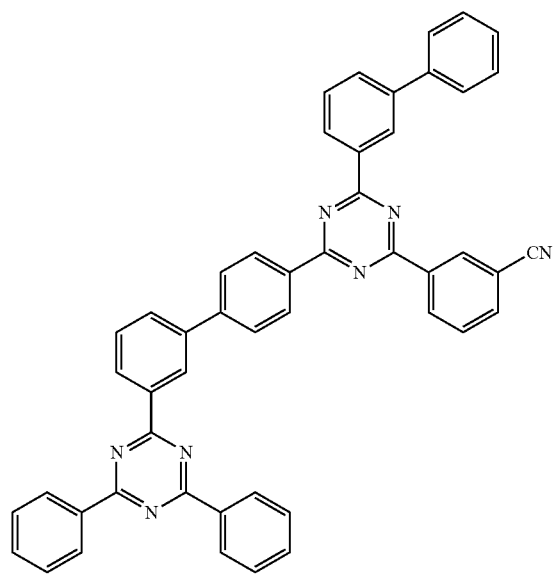
A-116
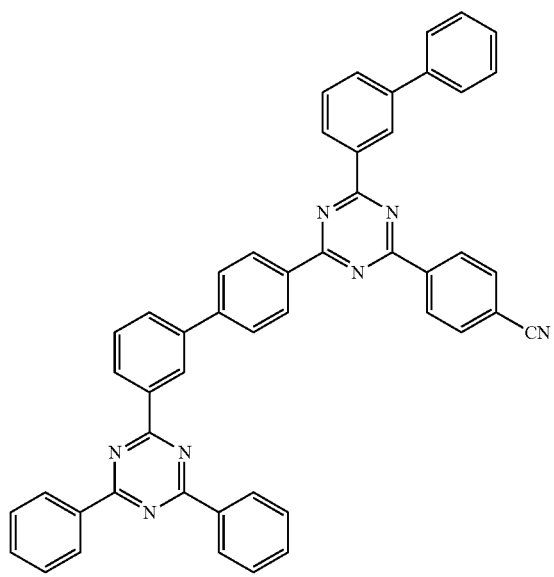
A-118
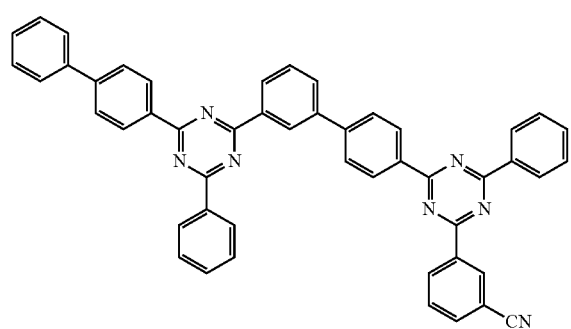
A-121
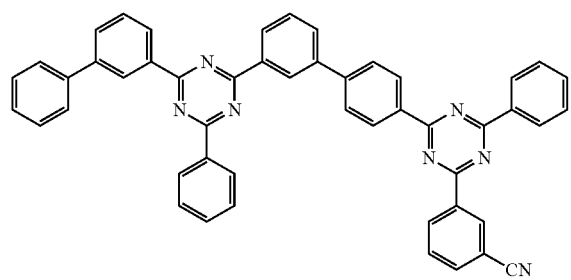
A-122
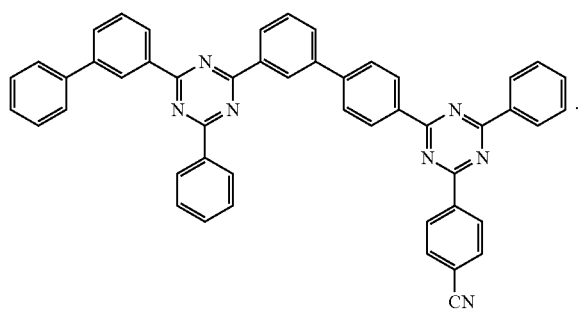
A-123
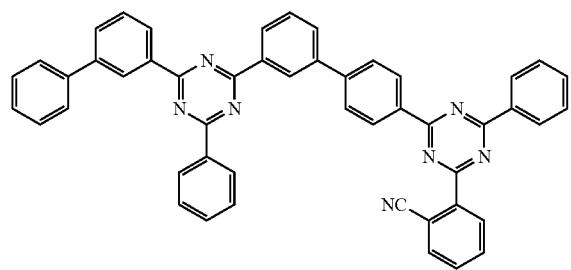
A-124
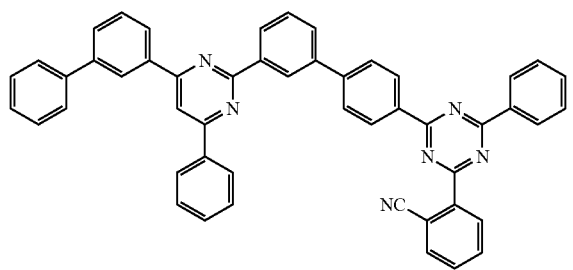

-continued

A-125
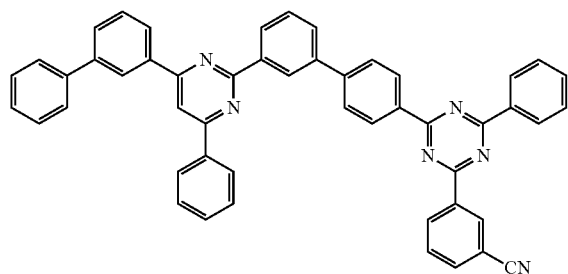

A-126
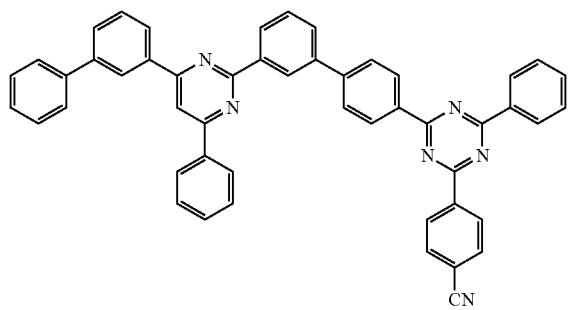

A-127
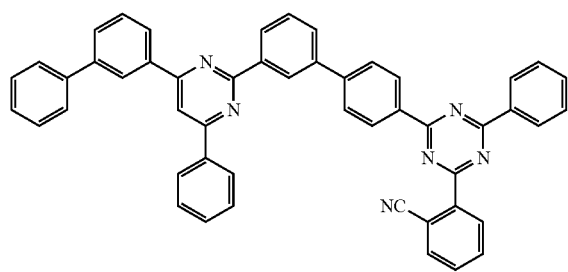

A-128
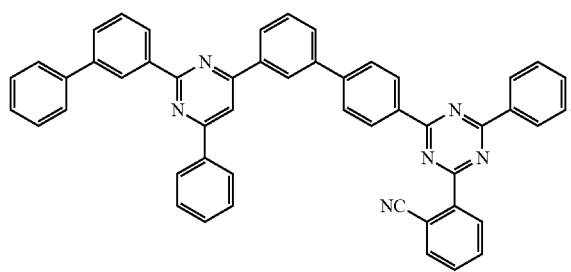

4. An organic optoelectronic device, comprising:
an anode and a cathode facing each other, and
an organic layer between the anode and the cathode,
wherein:
the organic layer includes a light emitting layer, and
the light emitting layer includes the composition for an organic optoelectronic device as claimed in claim 1.

5. The organic optoelectronic device as claimed in claim 4, wherein the light emitting layer further includes a dopant.

6. A display device comprising the organic optoelectronic device as claimed in claim 4.

7. The composition as claimed in claim 1, wherein the first compound is a compound of Group 1':

[Group 1']

A-33
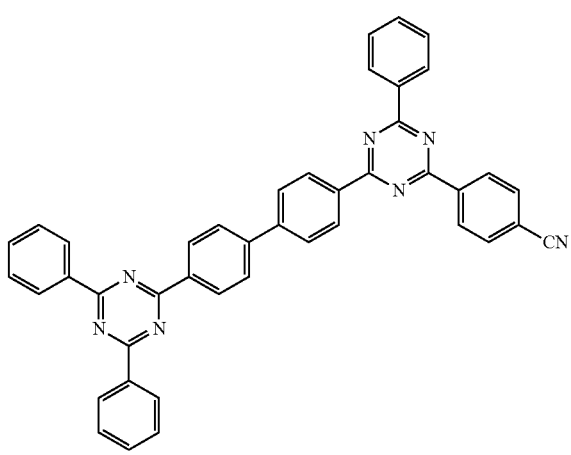

-continued

A-37
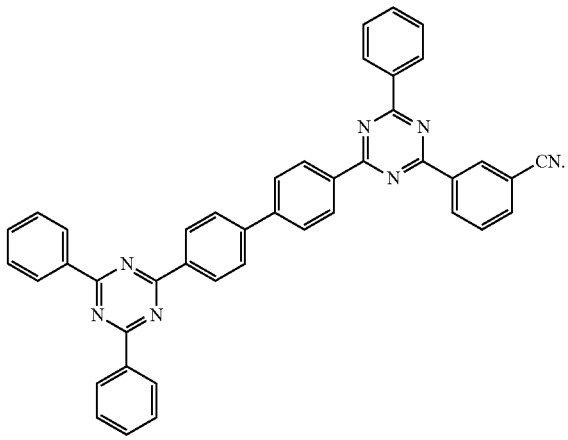

8. A composition for an organic optoelectronic device, the composition comprising:

a first compound represented by a compound of Group A; and a second compound represented by Chemical Formula 3C, the first compound and the second compound being included in a weight ratio of 30:70 to 50:50:

[Group A]

A-13
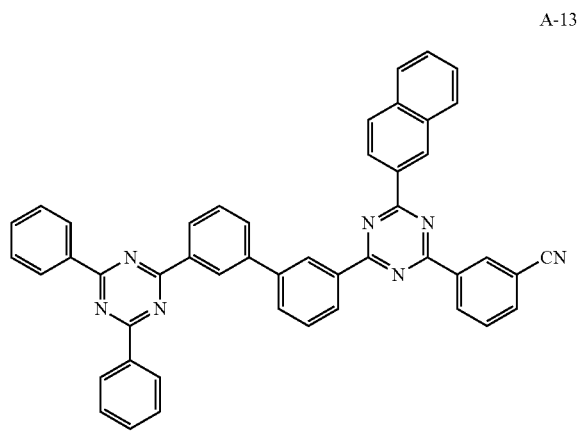

A-14
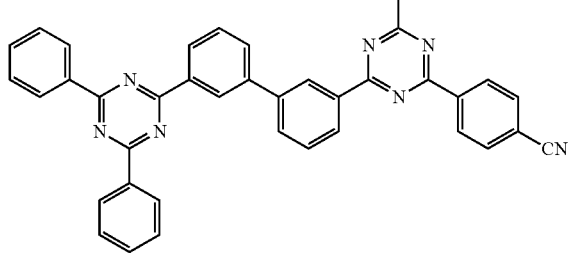

A-15
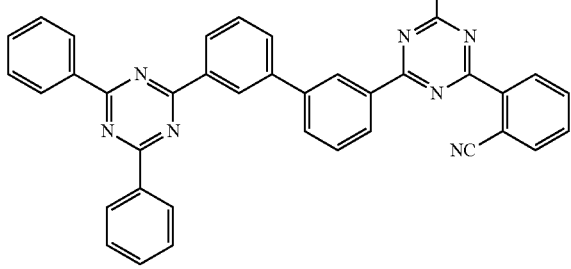

A-77
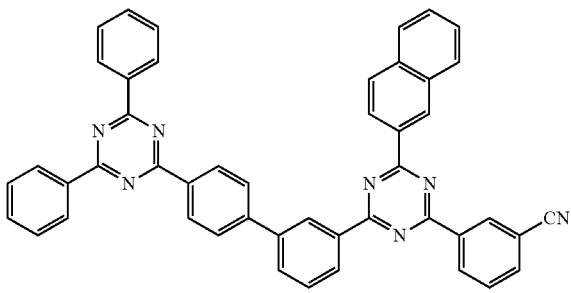

A-109
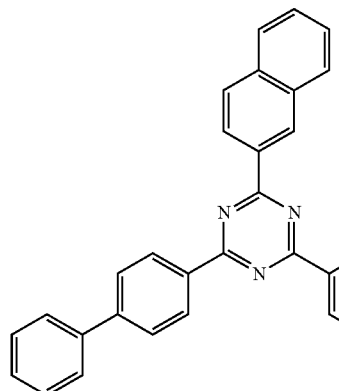

[Chemical Formula 3C]

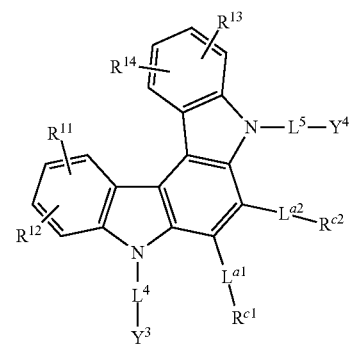

wherein, in Chemical Formula 3C, $R^{c1}$, $R^{c2}$ and $R^{11}$ to $R^{14}$ are independently hydrogen, deuterium, a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group, $L^{a1}$ and $L^{a2}$ are independently a single bond or a substituted or unsubstituted C6 to C20 arylene group, and

*-$L^4$-$Y^3$ and *-$L^5$-$Y^4$ are each a moiety represented by D-2 or D-3:

D-2
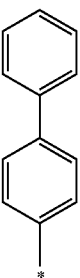

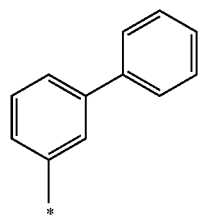
in D-2 and D-3 * is a linking point.
* * * * *